US012593606B2

(12) United States Patent
Kim et al.

(10) Patent No.: US 12,593,606 B2
(45) Date of Patent: Mar. 31, 2026

(54) ORGANIC LIGHT-EMITTING DEVICE

(71) Applicant: Samsung Electronics Co., Ltd., Suwon-si (KR)

(72) Inventors: Jong Soo Kim, Hanam-si (KR); Eunsuk Kwon, Suwon-si (KR); Hwang Suk Kim, Suwon-si (KR); Yeon Sook Chung, Seoul (KR); Yongsik Jung, Seoul (KR); Soonok Jeon, Suwon-si (KR); Hyeongmin Kim, Suwon-si (KR); Heechoon Ahn, Seoul (KR); Hyunah Um, Seoul (KR); Yeseul Lee, Busan (KR); Hosuk Kang, Suwon-si (KR); Joonghyuk Kim, Seoul (KR); Jiwhan Kim, Seoul (KR); Sungho Nam, Daegu (KR); Sangho Park, Anyang-si (KR); Youngmok Son, Hwaseong-si (KR); Sooghang Ihn, Hwaseong-si (KR); Hyeonho Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 880 days.

(21) Appl. No.: 17/860,399

(22) Filed: Jul. 8, 2022

(65) Prior Publication Data

US 2023/0097701 A1  Mar. 30, 2023

(30) Foreign Application Priority Data

Jul. 16, 2021 (KR) ........................ 10-2021-0093689
Jun. 23, 2022 (KR) ........................ 10-2022-0077087

(51) Int. Cl.

| | |
|---|---|
| ***H01L 51/54*** | (2006.01) |
| ***C09K 11/06*** | (2006.01) |
| ***H10K 85/30*** | (2023.01) |
| ***H10K 85/40*** | (2023.01) |
| ***H10K 85/60*** | (2023.01) |
| *H10K 50/11* | (2023.01) |
| *H10K 101/00* | (2023.01) |

(52) U.S. Cl.

CPC .............. *H10K 85/40* (2023.02); *C09K 11/06* (2013.01); *H10K 85/346* (2023.02); *H10K 85/6572* (2023.02); *C09K 2211/1044* (2013.01); *C09K 2211/185* (2013.01); *H10K 50/11* (2023.02); *H10K 2101/90* (2023.02)

(58) Field of Classification Search

None

See application file for complete search history.

(56) References Cited

U.S. PATENT DOCUMENTS

| | | | |
|---|---|---|---|
| 6,310,360 B1 | 10/2001 | Forrest et al. | |
| 6,515,298 B2 | 2/2003 | Forrest et al. | |
| 6,894,307 B2 | 5/2005 | Forrest et al. | |
| 8,476,823 B2 | 7/2013 | Kuma et al. | |
| 8,643,268 B2 | 2/2014 | Ogiwara et al. | |
| 9,153,790 B2 | 10/2015 | Kuma et al. | |
| 9,385,329 B2 | 7/2016 | Li et al. | |
| 9,493,698 B2 | 11/2016 | Beers et al. | |
| 9,905,779 B2 | 2/2018 | Ogiwara et al. | |
| 10,069,077 B2 | 9/2018 | Park et al. | |
| 10,090,483 B2 | 10/2018 | Kim et al. | |
| 10,957,863 B2 | 3/2021 | Lee et al. | |
| 2009/0134784 A1 | 5/2009 | Lin et al. | |
| 2015/0207079 A1 | 7/2015 | Cho et al. | |
| 2017/0062718 A1 | 3/2017 | Numata et al. | |
| 2017/0077418 A1 | 3/2017 | Stoessel et al. | |
| 2017/0077421 A1 | 3/2017 | Ihn et al. | |
| 2017/0125699 A1 | 5/2017 | Ahn et al. | |
| 2017/0163010 A1 | 6/2017 | Nakanotani et al. | |
| 2017/0170408 A1 | 6/2017 | Park et al. | |
| 2018/0130959 A1 | 5/2018 | Ogiwara et al. | |
| 2019/0058124 A1* | 2/2019 | Hatakeyama | H10K 85/631 |
| 2019/0119312 A1* | 4/2019 | Chen | C07F 15/0086 |
| 2019/0225636 A1 | 7/2019 | Bae et al. | |
| 2020/0083458 A1 | 3/2020 | Jeon et al. | |

(Continued)

FOREIGN PATENT DOCUMENTS

| | | | |
|---|---|---|---|
| EP | 3438104 | A1 | 2/2019 |
| JP | 2002193952 | A | 7/2002 |
| JP | 2011176250 | A | 9/2011 |
| KR | 1502316 | B1 | 3/2015 |
| KR | 1020150086721 | A | 7/2015 |
| KR | 1020160010373 | A | 1/2016 |
| KR | 1020170025990 | A | 3/2017 |
| KR | 1020170032148 | A | 3/2017 |
| KR | 1020180098809 | A | 9/2018 |
| KR | 1020190089626 | A | 7/2019 |
| WO | 2016158540 | A1 | 10/2016 |

OTHER PUBLICATIONS

English Abstract of JP 2002-193952.

Extended European Search Report dated Dec. 8, 2022, issued in EP Patent Application No. 22183255.3, 7 pp.

*Primary Examiner* — Andrew K Bohaty

(74) *Attorney, Agent, or Firm* — CANTOR COLBURN LLP

(57) ABSTRACT

An organic light-emitting device including: a first electrode and a second electrode each having a surface opposite the other; and an intermediate layer disposed between the first electrode and the second electrode, the intermediate layer including a first compound and a second compound, wherein the first compound includes a first silyl group-containing group and at least two carbazole-derived groups, wherein one carbazole-derived group of the at least two carbazole-derived groups is bonded via a N atom to another carbazole-derived group, the second compound includes a second silyl group-containing group, a triazine group, and a carbazole-derived group, and at least one of the first compound or the second compound has a triplet ($T_1$) energy level of 2.81 eV or more.

20 Claims, 4 Drawing Sheets

(56) References Cited

U.S. PATENT DOCUMENTS

| | | | | |
|---|---|---|---|---|
| 2020/0321537 | A1 | 10/2020 | Jeon et al. | |
| 2020/0392173 | A1 | 12/2020 | Bae et al. | |
| 2020/0395560 | A1 | 12/2020 | Bae et al. | |
| 2021/0098721 | A1 | 4/2021 | Jung et al. | |
| 2021/0167299 | A1 | 6/2021 | Chung et al. | |
| 2021/0210700 | A1* | 7/2021 | Fleetham | H10K 85/40 |
| 2021/0249610 | A1 | 8/2021 | Kim et al. | |
| 2022/0106345 | A1 | 4/2022 | Bae et al. | |
| 2022/0149287 | A1 | 5/2022 | Kim et al. | |
| 2023/0090659 | A1 | 3/2023 | Kwon et al. | |
| 2023/0097942 | A1 | 3/2023 | Kim et al. | |

* cited by examiner

ORGANIC LIGHT-EMITTING DEVICE

CROSS-REFERENCE TO RELATED APPLICATION

This application claims priority to Korean Patent Application Nos. 10-2021-0093689, filed on Jul. 16, 2021, and 10-2022-0077087, filed on Jun. 23, 2022, in the Korean Intellectual Property Office, and all the benefits accruing therefrom under 35 U.S.C. § 119, the disclosures of which are herein incorporated by reference in their entirety.

BACKGROUND

1. Field

The present disclosure relates to organic light-emitting devices.

2. Description of the Related Art

Organic light-emitting devices are self-emissive devices that exhibit many desirable display characteristics, e.g., wide viewing angles, short response times, and/or excellent characteristics in terms of luminance, driving voltage, and response rate. The organic light-emitting devices also produce high contrast, full-color images.

An organic light-emitting device includes an anode, a cathode, and one or more organic layers disposed between the anode and the cathode one of which is an emission layer. A hole transport region may be disposed between the anode and the emission layer, and an electron transport region may be disposed between the emission layer and the cathode. Holes provided from the anode move toward the emission layer through the hole transport region, and electrons provided from the cathode move toward the emission layer through the electron transport region. The holes and the electrons recombine in the emission layer to produce excitons. As these excitons localize on a dopant emitter compound the excitons transition from an excited state to a ground state and light is emitted.

SUMMARY

Provided are relatively long-life organic light-emitting devices that include a select combination of novel host compounds in an intermediate layer. Additional aspects will be set forth in part in the description, which follows and, in part, will be apparent from the description, or may be learned by practice of the presented embodiments of the disclosure.

According to an aspect of an embodiment, an organic light-emitting device includes: a first electrode and a second electrode each having a surface opposite the other; and an intermediate layer disposed between the first electrode and the second electrode, the intermediate layer including a first compound and a second compound, wherein the first compound includes a first silyl group-containing group and at least two carbazole-derived groups, wherein one carbazole-derived group of the at least two carbazole-derived groups is bonded via a N atom to another carbazole-derived group, the second compound includes a second silyl group-containing group, a triazine group, and a carbazole-derived group, and at least one of the first compound or the second compound has a triplet ($T_1$) energy level of 2.81 eV or more.

According to an aspect of another embodiment, an organic light-emitting device includes: a first electrode and a second electrode each having a surface opposite the other; and an intermediate layer disposed between the first electrode and the second electrode, the intermediate layer including an emission layer including a first compound, a second compound, and a third compound, wherein the first compound includes a first silyl group-containing group and at least two carbazole-derived groups, wherein one carbazole-derived group of the at least two carbazole-derived groups is bonded via a N atom to another carbazole-derived group, the second compound includes a second silyl group-containing group, a triazine group, and a carbazole-derived group, and the third compound includes an organometallic compound represented by Formula 3 or Formula 5 as described herein.

According to an aspect of another embodiment, an organic light-emitting device includes: a first electrode and a second electrode each having a surface opposite the other; and an intermediate layer disposed between the first electrode and the second electrode, the intermediate layer including an emission layer including a first compound, a second compound, and a fourth compound, wherein the first compound includes a first silyl group-containing group and at least two carbazole-derived groups, wherein one carbazole-derived group of the at least two carbazole-derived groups is bonded via a N atom to another carbazole-derived group, the second compound includes a second silyl group-containing group, a triazine group, and a carbazole-derived group, and the fourth compound includes a polycyclic compound represented by Formula 4 as described herein.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
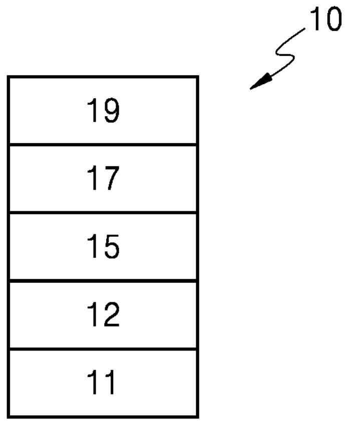
FIG. 1 is a schematic cross-sectional view of an organic light-emitting device according to an embodiment.

Reference will now be made in detail to embodiments, examples of which are illustrated in the accompanying drawings, wherein like reference numerals refer to like elements throughout the specification. In this regard, the present embodiments may have different forms and should not be construed as being limited to the descriptions set forth herein. Accordingly, the embodiments are merely described below, by referring to the figures, to explain aspects. It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, compound, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

An aspect of the present disclosure provides an organic light-emitting device including: a first electrode and a second electrode each having a surface opposite the other; and an intermediate layer disposed between the first electrode and the second electrode, the intermediate layer including a first compound and a second compound, wherein the first compound may include a first silyl group-containing group and at least two carbazole-derived groups, wherein one carbazole-derived group of the at least two carbazole-derived groups may be bonded via a N atom to another carbazole-derived group, the second compound may include a second silyl group-containing group, a triazine group, and a carbazole-derived group, and at least one of the first compound or the second compound may have a triplet ($T_1$) energy level of 2.81 eV or more.

Because at least one compound of the first compound or the second compound has a $T_1$ energy level of 2.81 eV or more, the migration or transfer of excitons, which may generate in a host material, to a blue light-emitting emitter compound may be facilitated, and thereby, suppress device deterioration. As a result, an organic light-emitting device having high efficiency and a relatively greater lifespan may be manufactured.

In an embodiment, the intermediate layer may include an emission layer, and the emission layer may include the first compound and the second compound.

For example, the first compound and the second compound may have different structures from each other. The first compound may be a hole-transporting host compound, and the second compound may be an electron-transporting host compound.

In an embodiment, the first compound and the second compound may form an exciplex host. In the exciplex host, due to mixing of molecular orbitals of the first compound and the second compound, an energy level of an excited energy state may be decreased or lowered, and thus, the rate of exciton migration to a dopant may be increased, e.g., the exciton migration may be facilitated, thereby improving efficiency and lifespan of the light emitting device.

In an embodiment, the emission layer may further include at least one dopant compound.

For example, the dopant compound may include a third compound, a fourth compound, or a combination thereof. In this regard, the third compound may be an organometallic compound, e.g., for example, an organometallic phosphorescent compound, and the fourth compound may be a polycyclic compound, e.g., for example, a fluorescent compound, details of which are described herein.

In an embodiment, the second compound and the dopant compound may form an exciplex. Accordingly, relatively low-energy exciplexes may be formed such that the relaxation or transition of excitons present in the device, e.g., in the intermediate layer of the device, to a ground state may be facilitated or enhanced, and as a result, device deterioration may be suppressed because the higher energy excited state is relatively short-lived. The result of which provides a manufacture of a light-emitting device having a relatively longer lifespan and higher or greater efficiency.

Hereinafter, the first compound, the second compound, the third compound, and the fourth compound will be described.

First Compound

As described above, the first compound as a hole-transporting host compound may include a first silyl group-containing group, and at least two carbazole-derived groups, and may have a structure in which one carbazole-derived group of the at least two carbazole-derived groups is bonded via a N atom to another carbazole-derived group.

The first compound may be represented by Formula 1-1 or 1-2:

Formula 1-1

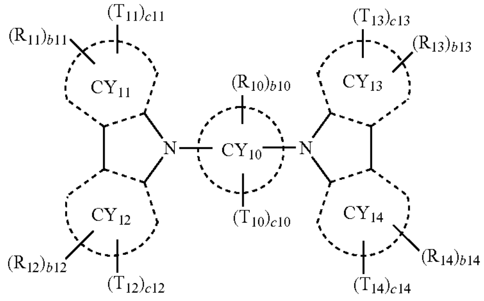

-continued

Formula 1-2

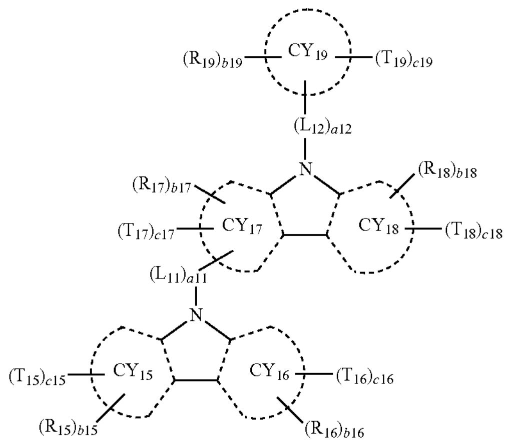

Formula A

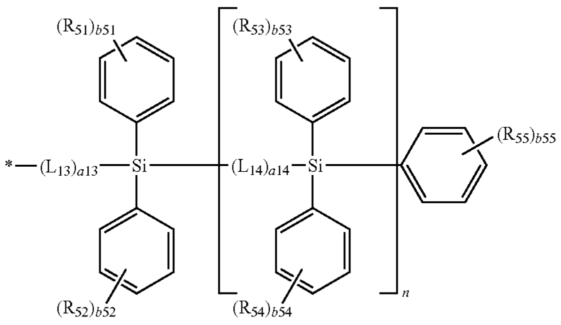

wherein, in Formula 1-1, Formula 1-2, and Formula A, $CY_{10}$ to $CY_{19}$ may each independently a $C_5$-$C_{30}$ carbocyclic group or a $C_1$-$C_{30}$ heterocyclic group, $L_{11}$ to $L_{14}$ may each independently be a substituted or unsubstituted $C_1$-$C_{20}$ alkylene group, a substituted or unsubstituted $C_2$-$C_{20}$ alkenylene group, a substituted or unsubstituted $C_5$-$C_{60}$ carbocyclic group, or a substituted or unsubstituted $C_1$-$C_{60}$ heterocyclic group, a11 to a14 may each independently be an integer from 0 to 5, when a11 is 0, $L_{11}$ may not be present, and the N atom of one carbazole-derived group may be directly bonded to $CY_{17}$, when a12 is 0, $L_{12}$ may not be present, and the N atom of one carbazole-derived group may be directly bonded to $CY_{19}$, when a13 is 0, $L_{13}$ may not be present, and a Si atom of the first silyl group-containing group of Formula A may be directly bonded to $CY_{10}$ to $CY_{19}$, or when a14 is 0, $L_{14}$ may not be present, and a Si atom of the first silyl group-containing group of Formula A may be directly bonded to a neighboring Si atom of the first silyl group-containing group of Formula A, $T_{10}$ to $T_{19}$ may each independently be a group represented by Formula A, c10 to c19 may each independently be an integer from 0 to 10 or from 0 to 5, the sum of c10, c11, c12, c13, and c14 may be 1 or more, e.g., 1 to 10, or 1 to 6, the sum of c15, c16, c17, c18, and c19 may be 1 or more, e.g., 1 to 10, or 1 to 6, n may be an integer from 0 to 3, $R_{10}$ to $R_{19}$ and $R_{51}$ to $R_{55}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$, b10 to b19 may each independently be an integer from 0 to 10, e.g., 1 to 5, b51 to b55 may each independently be an integer from 0 to 5, and a substituent of each of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, and any combination thereof;

—$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

In an embodiment, $CY_{10}$ to $CY_{19}$ may each independently be a benzene group, a naphthalene group, an anthracene group, a phenanthrene group, a pyrene group, a furan group, a thiophene group, a pyrrole group, a silole group, a benzofuran group, a benzothiophene group, an indole group, an indene group, a benzosilole group, a dibenzofuran group, a dibenzothiophene group, a carbazole group, a fluorene group, a dibenzosilole group, an azabenzofuran group, an azabenzothiophene group, an azaindole group, an azaindene group, an azabenzosilole group, an azadibenzofuran group, an azadibenzothiophene group, an azacarbazole group, an azafluorene group, or an azadibenzosilole group.

For example, $CY_{10}$ to $CY_{19}$ may each independently be a benzene group, a benzofuran group, a benzothiophene group, an indole group, a benzosilole group, a dibenzofuran group, a dibenzothiophene group, a carbazole group, a fluorene group, or a dibenzosilole group.

For example, $CY_{10}$ may be a benzene group.

In an embodiment, $L_{11}$ to $L_{14}$ may each independently be:

a $C_1$-$C_{20}$ alkylene group or a $C_2$-$C_{20}$ alkenylene group, each unsubstituted or substituted with deuterium, —F, —Cl, —Br, —I, a $C_1$-$C_{20}$ alkyl group, a $C_1$-$C_{20}$ alkoxy group, or a combination thereof; or a phenylene group, a pentalenylene group, a naphthylene group, an azulenylene group, a phenalenylene group, a phenanthrenylene group, an anthracenylene group, a fluoranthenylene group, a triphenylenylene group, a pyrenylene group, a chrysenylene group, or a naphthacenylene group, each unsubstituted or substituted with deuterium, —F, —Cl, —Br, —I, a $C_1$-$C_{20}$ alkyl group, a $C_1$-$C_{20}$ alkoxy group, a phenyl group, a pentalenyl group, a naphthyl group, an azulenyl group, a phenalenyl group, a phenanthrenyl group, an anthracenyl group, a fluoranthenyl group, a triphenylenyl group, a pyrenyl group, a chrysenyl group, a naphthacenyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, —$P(Q_{38})(Q_{39})$ or a combination thereof, wherein $Q_{31}$ to $Q_{39}$ may each independently be a $C_1$-$C_{10}$ alkyl group, a $C_1$-$C_{10}$ alkoxy group, a phenyl group, a biphenyl group, a terphenyl group, or a naphthyl group.

For example, in an embodiment, $L_{11}$ to $L_{14}$ may each independently be a phenylene group, a naphthylene group, a phenanthrenylene group, or an anthracenylene group, each unsubstituted or substituted with deuterium, —F, —Cl, —Br, —I, a $C_1$-$C_{20}$ alkyl group, a $C_1$-$C_{20}$ alkoxy group, a phenyl group, a naphthyl group, a phenanthrenyl group, an anthracenyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, —$P(Q_{38})(Q_{39})$, or a combination thereof, wherein $Q_{31}$ to $Q_{39}$ may each independently be a phenyl group, a biphenyl group, a terphenyl group, or a naphthyl group.

In an embodiment, a11 and a12 may each be 0.

In an embodiment, a13 may be 0 or 1, and n may be 0.

In an embodiment, in Formula 1-1, c10 may be 1, and c11 to c14 may each be 0.

In an embodiment, in Formula 1-2, c15 may be 1, and c16, c17, c18, and c19 may each be 0; c16 may be 1, and c15, c17, c18, and c19 may each be 0; c17 may be 1, and c15, c16, c18, and c19 may each be 0; c18 may be 1, and c15, c16, c17, and c19 may each be 0; or c19 may be 1, and c15, c16, c17, and c18 may each be 0.

In an embodiment, n may be 0.

In an embodiment, $R_{10}$ to $R_{19}$ and $R_{51}$ to $R_{55}$ may each independently be:

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group (CN), a nitro group, or an amino group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a dibenzofuranyl group, a dibenzothiophenyl group, a dibenzoselenophenyl group, a dibenzosilole group, or a carbazolyl group, each unsubstituted or substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a dibenzofuranyl group, a dibenzothiophenyl group, a carbazolyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$.

For example, $R_{10}$ to $R_{19}$ and $R_{51}$ to $R_{55}$ may each independently be:

hydrogen, deuterium, —F, —Cl, —Br, —I, a hydroxyl group, a cyano group (CN), a nitro group, an amino group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, a hydroxyl group, a cyano group (CN), a nitro group, an amino group, or a combination thereof;

a phenyl group, a biphenyl group, a naphthyl group, a fluorenyl group, a phenanthrenyl group, an anthracenyl group, a dibenzofuranyl group, a dibenzothiophenyl group, a dibenzoselenophenyl group, a dibenzosilole group, or a carbazolyl group, each unsubstituted or substituted with at least one of deuterium, —F, —Cl, —Br, —I, a hydroxyl group, a cyano group (CN), a nitro group, an amino group, a $C_1$-$C_{20}$ alkyl group, a $C_1$-$C_{20}$ alkoxy group, a phenyl group, a biphenyl group, a naphthyl group, a fluorenyl group, a phenanthrenyl group, an anthracenyl group, a dibenzofuranyl group, a dibenzothiophenyl group, a dibenzoselenophenyl group, a dibenzosilole group, a carbazolyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, and —$P(Q_{38})(Q_{39})$; or —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$.

In an embodiment, the first compound may be represented by Formula 1-1-1, 1-1-2, 1-2-1, 1-2-2, 1-2-3, or 1-2-4:

Formula 1-1-1

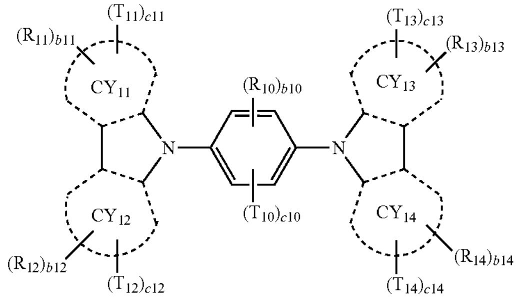

Formula 1-1-2

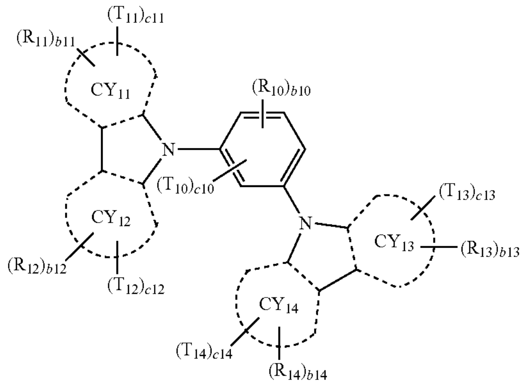

Formula 1-2-1

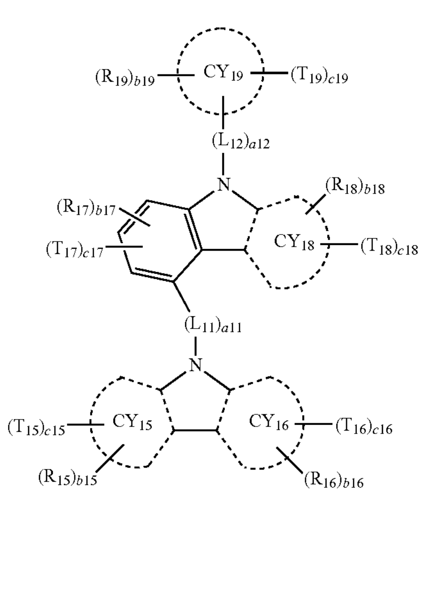

-continued

Formula 1-2-2

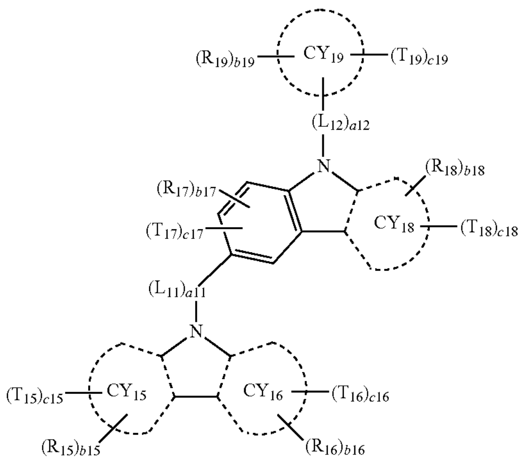

Formula 1-2-3

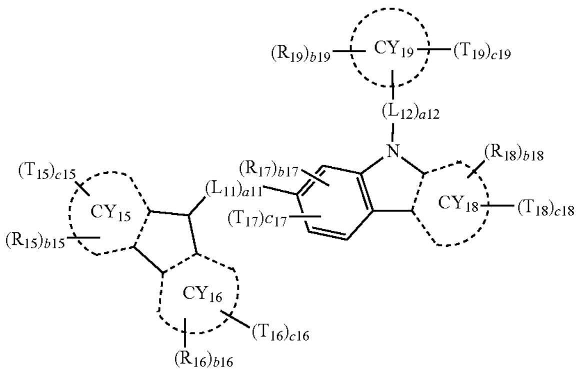

Formula 1-2-4

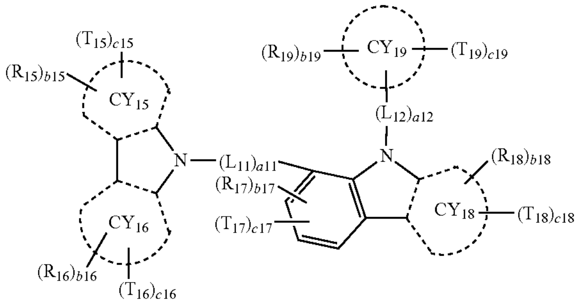

wherein, in Formulae 1-1-1, 1-1-2, 1-2-1, 1-2-2, 1-2-3, and 1-2-4, $CY_{11}$ to $CY_{16}$, $CY_{13}$, $CY_{19}$, $R_{10}$ to $R_{19}$, $T_{10}$ to $T_{19}$, $L_{11}$, $L_{12}$, a11, a12, b11 to b16, b18, b19, c11 to c16, c18, and c19 are each the same as described above, b10 may be an integer from 0 to 4, c10 may be an integer from 0 to 4, and the sum of b10 and c10 may be 4, and b17 may be an integer from 0 to 3, c17 may be an integer from 0 to 3, and the sum of b17 and c17 may be 3.

For example, in Formula 1-1-1 and Formula 1-1-2, c10 may be 1, and c11 to c14 may each be 0;

in Formulae 1-2-1 to 1-2-4, c19 may be 1, and c15, c16, and c18 may each be 0;

in Formulae 1-2-1 to 1-2-4, c15 may be 1, and c16, c18, and c19 may each be 0;

in Formulae 1-2-1 to 1-2-4, c18 may be 1, and c15, c16, and c19 may each be 0; or in Formulae 1-2-1 to 1-2-4, c16 may be 1, and c15, c18, and c19 may each be 0.

In an embodiment, the first compound may be one or more of Compounds H1 to H23:

H1

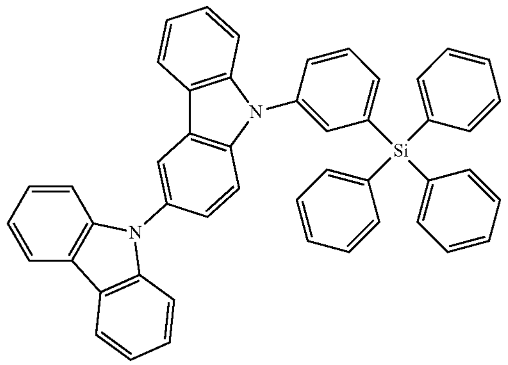

H2

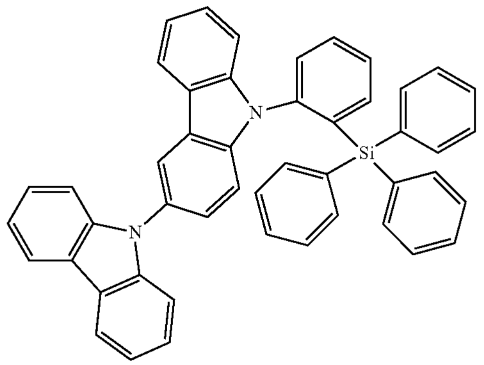

H3

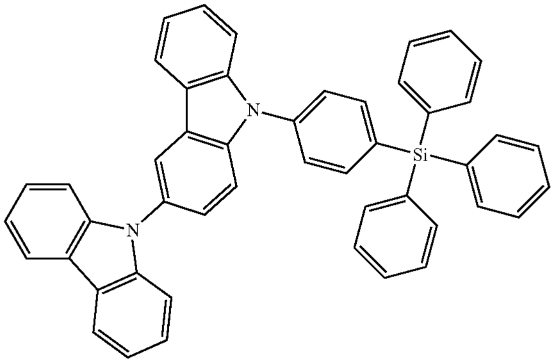

-continued
H4
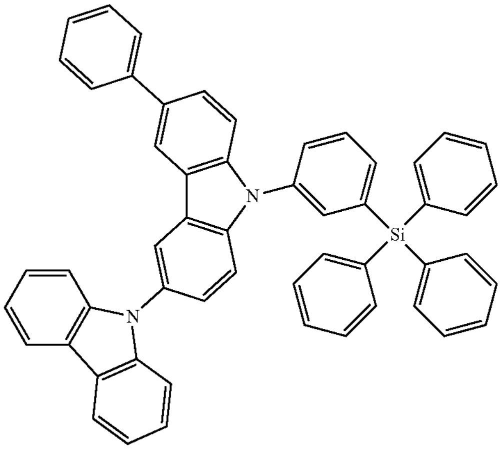
H5
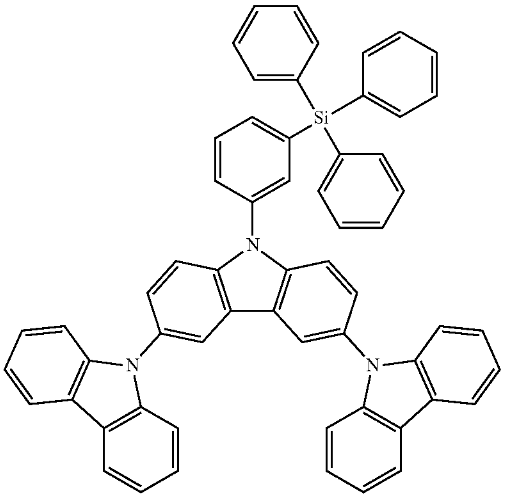
H6
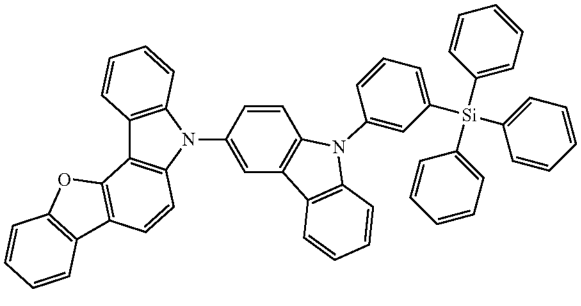
-continued
H7
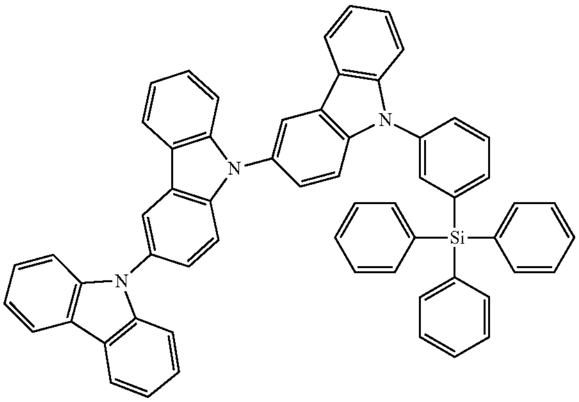
H8
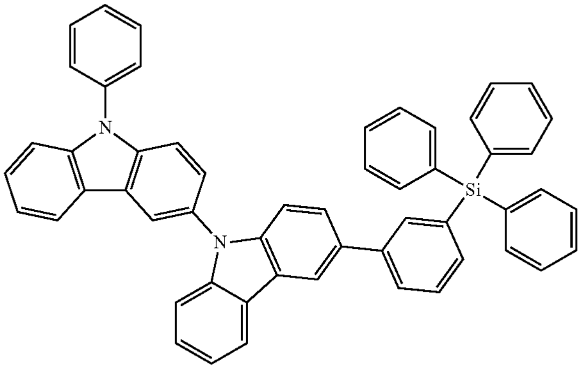
H9
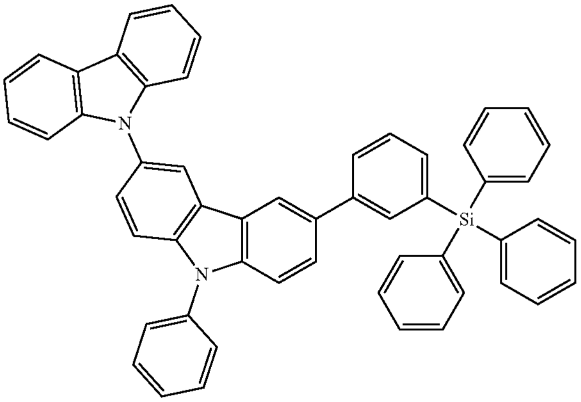
H10
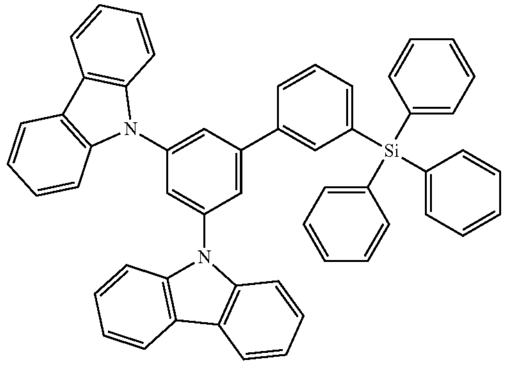

-continued
H11
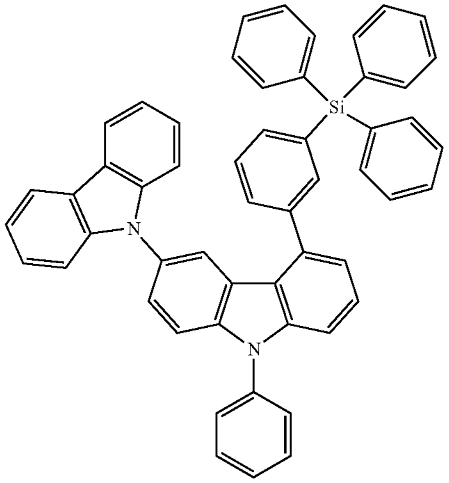
H12
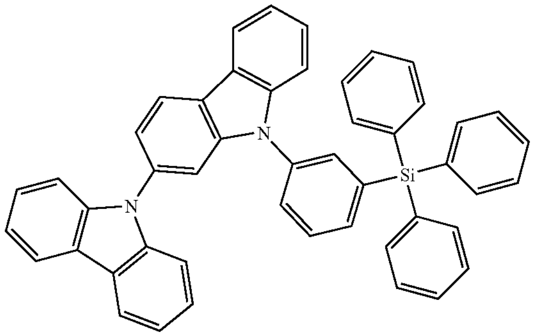
H13
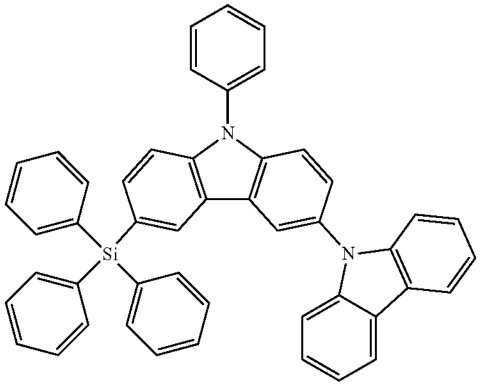
-continued
H14
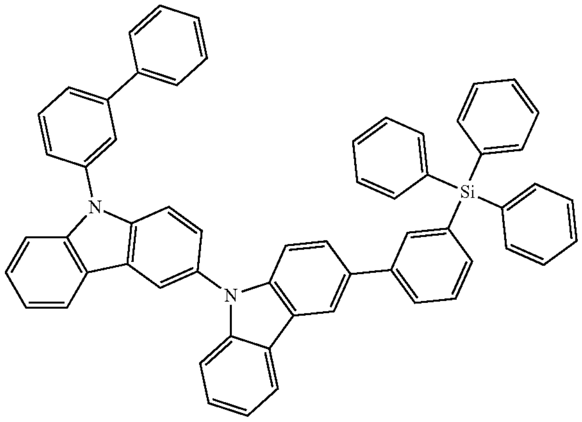
H15
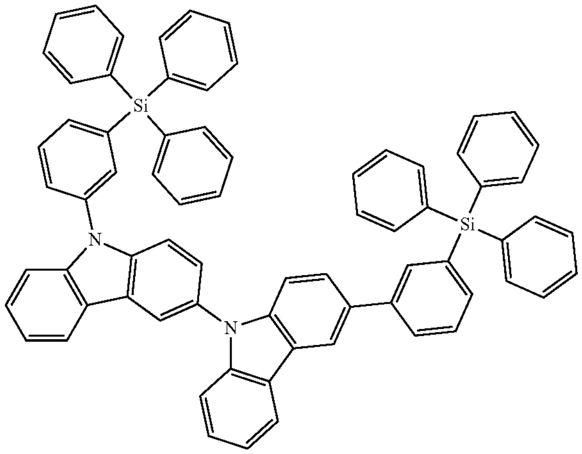
H16
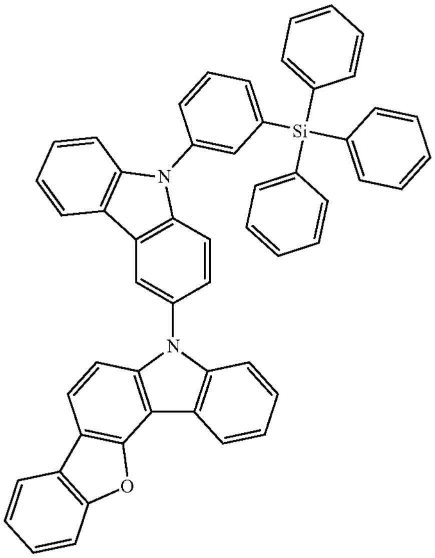

-continued
H17
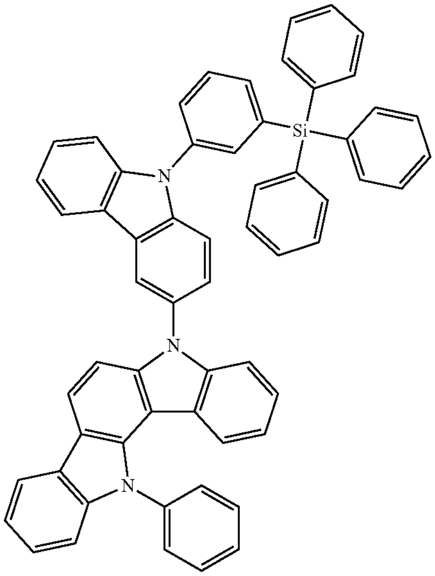
H18
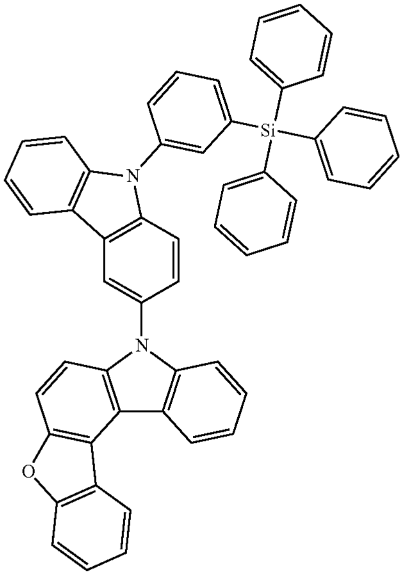
-continued
H19
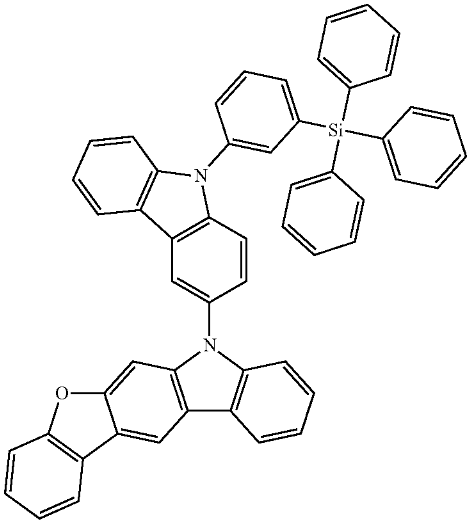
H20
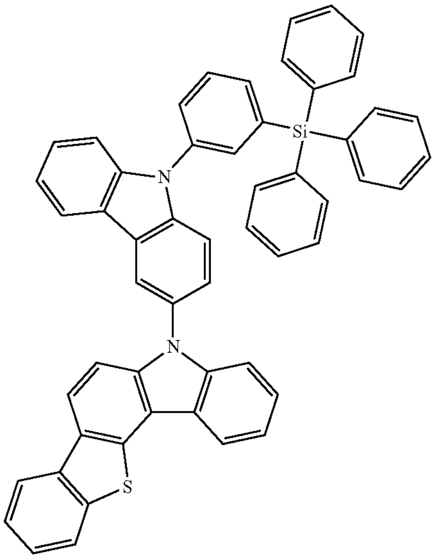
H21
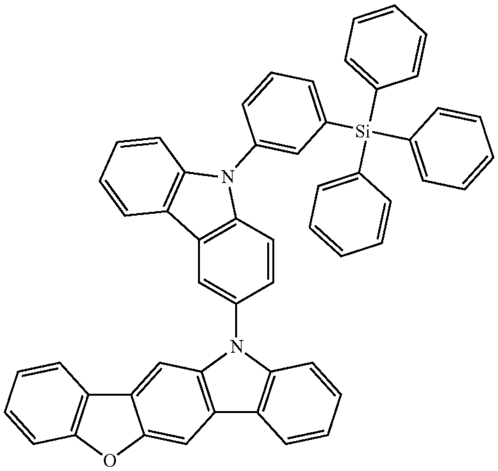

-continued

H22

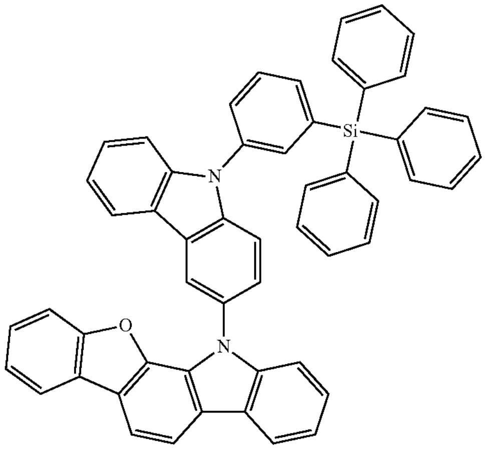

H23

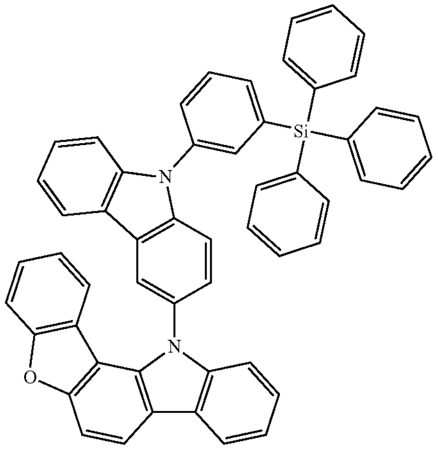

Second Compound

As described above, the second compound as an electron-transporting host compound may include a second silyl group-containing group, a triazine group, and a carbazole-derived group.

In an embodiment, the second compound may have a structure in which a second silyl group-containing group is bonded to a ring carbon of the triazine group. For example, in the second compound, the second silyl group-containing group may be bonded to two of the three ring carbons of the triazine group, and the carbazole-derived group may be bonded to the remaining ring carbon of the triazine group; the second silyl group-containing group may be bonded to one ring carbon, and the carbazole-derived group may be bonded to the remaining two carbons, of the triazine group; or the second silyl group-containing group may be bonded to one ring carbon, the carbazole-derived group may be bonded to another ring carbon, and an $R_{23}$ group described below may be bonded to the remaining ring carbon, of the triazine group.

In an embodiment, second compound may be represented by Formula 2-1:

Formula 2-1

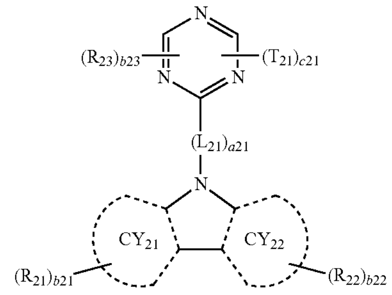

Formula A

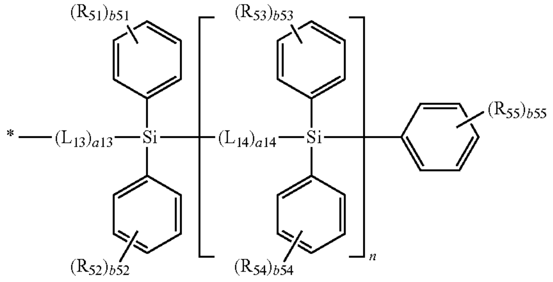

wherein, in Formula 2-1 and Formula A, $CY_{21}$ and $CY_{22}$ may each independently be a $C_5$-$C_{30}$ carbocyclic group or a $C_1$-$C_{30}$ heterocyclic group, $L_{13}$, $L_{14}$, and $L_{21}$ may each independently be a substituted or unsubstituted $C_1$-$C_{20}$ alkylene group, a substituted or unsubstituted $C_2$-$C_{20}$ alkenylene group, a substituted or unsubstituted $C_5$-$C_{60}$ carbocyclic group, or a substituted or unsubstituted $C_1$-$C_{60}$ heterocyclic group, a13, a14, and a21 may each independently be an integer from 0 to 5, when a13 is 0, $L_{13}$ may not be present, and an Si atom of the second silyl group-containing group of Formula A may be directly bonded to a ring carbon of the triazine group, when a14 is 0, $L_{14}$ may not be present, and an Si atom of the second silyl group-containing group of Formula A may be directly bonded to a neighboring Si atom of the second silyl group-containing group of Formula A, or when a21 is 0, $L_{21}$ may not be present, and an N atom of the carbazole-derived group may be directly bonded to a ring carbon of the triazine group, $T_{21}$ may be a group represented by Formula A, c21 may be 1 or 2, n may be an integer from 0 to 3, $R_{21}$ to $R_{23}$ and $R_{51}$ to $R_{55}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Ge($Q_3$)($Q_4$)($Q_5$), —B($Q_6$)($Q_7$), —P(═O)($Q_8$)($Q_9$), or —P($Q_8$)($Q_9$), b21 and b22 may each independently be an integer from 0 to 10, b23 may be 0 or 1, b51 to b55 may each independently be an integer from 0 to 5, and a substituent of each of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

In an embodiment in Formula 2-1, $CY_{21}$ and $CY_{22}$ may each independently be: a benzene group, a naphthalene group, an anthracene group, a phenanthrene group, a pyrene group, a furan group, a thiophene group, a pyrrole group, a silole group, a benzofuran group, a benzothiophene group, an indole group, an indene group, a benzosilole group, a dibenzofuran group, a dibenzothiophene group, a carbazole group, a fluorene group, a dibenzosilole group, an azabenzofuran group, an azabenzothiophene group, an azaindole group, an azaindene group, an azabenzosilole group, an azadibenzofuran group, an azadibenzothiophene group, an azacarbazole group, an azafluorene group, or an azadibenzosilole group.

For example, $CY_{21}$ and $CY_{22}$ may each independently be a benzene group, a benzofuran group, a benzothiophene group, an indole group, a benzosilole group, a dibenzofuran group, a dibenzothiophene group, a carbazole group, a fluorene group, or a dibenzosilole group.

$L_{13}$, $L_{14}$, a13, a14, $R_{51}$ to $R_{55}$, b51 to b55, and n are the same as described above in connection with the first compound.

In an embodiment, $L_{21}$ may be:

a $C_1$-$C_{20}$ alkylene group or a $C_2$-$C_{20}$ alkenylene group, each unsubstituted or substituted with deuterium, —F, —Cl, —Br, —I, a $C_1$-$C_{20}$ alkyl group, a $C_1$-$C_{20}$ alkoxy group, or a combination thereof; or a phenylene group, a pentalenylene group, a naphthylene group, an azulenylene group, a phenalenylene group, a phenanthrenylene group, an anthracenylene group, a fluoranthenylene group, a triphenylenylene group, a pyrenylene group, a chrysenylene group, or a naphthacenylene group, each unsubstituted or substituted with deuterium, —F, —Cl, —Br, —I, a $C_1$-$C_{20}$ alkyl group, a $C_1$-$C_{20}$ alkoxy group, a phenyl group, a pentalenyl group, a naphthyl group, an azulenyl group, a phenalenyl group, a phenanthrenyl group, an anthracenyl group, a fluoranthenyl group, a triphenylenyl group, a pyrenyl group, a chrysenyl group, a naphthacenyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, —$P(Q_{38})(Q_{39})$, or a combination thereof, wherein $Q_{31}$ to $Q_{39}$ may each independently be a $C_1$-$C_{10}$ alkyl group, a $C_1$-$C_{10}$ alkoxy group, a phenyl group, a biphenyl group, a terphenyl group, or a naphthyl group.

For example, $L_{21}$ may be a phenylene group, a naphthylene group, a phenanthrenylene group, or an anthracenylene group, each unsubstituted or substituted with deuterium, —F, —Cl, —Br, —I, a $C_1$-$C_{20}$ alkyl group, a $C_1$-$C_{20}$ alkoxy group, a phenyl group, a naphthyl group, a phenanthrenyl group, an anthracenyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, —$P(Q_{38})(Q_{39})$, or a combination thereof, wherein $Q_{31}$ to $Q_{39}$ may each independently be a phenyl group, a biphenyl group, a terphenyl group, or a naphthyl group.

In an embodiment, a21 may be 0.

In an embodiment, c21 may be 1 and b23 may be 1, or c21 may be 2 and b23 may be 0.

In an embodiment, $R_{21}$ to $R_{23}$ may each independently be:

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group (CN), a nitro group, or an amino group;

a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzoselenophenyl group, a dibenzosilole group, or a carbazolyl group, each unsubstituted or substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a carbazolyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$.

For example, $R_{21}$ to $R_{23}$ may each independently be:

hydrogen, deuterium, —F, —Cl, —Br, —I, a hydroxyl group, a cyano group (CN), a nitro group, an amino group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, a hydroxyl group, a cyano group (CN), a nitro group, an amino group, or a combination thereof;

a phenyl group, a biphenyl group, a naphthyl group, a fluorenyl group, a phenanthrenyl group, an anthracenyl group, a dibenzofuranyl group, a dibenzothiophenyl group, a dibenzoselenophenyl group, a dibenzosilole group, a triazinyl group, or a carbazolyl group, each unsubstituted or substituted with at least one of deuterium, —F, —Cl, —Br, —I, a hydroxyl group, a cyano group (CN), a nitro group, an amino group, a $C_1$-$C_{20}$ alkyl group, a $C_1$-$C_{20}$ alkoxy group, a phenyl group, a biphenyl group, a naphthyl group, a fluorenyl group, a phenanthrenyl group, an anthracenyl group, a dibenzofuranyl group, a dibenzothiophenyl group, a dibenzoselenophenyl group, a dibenzosilole group, a triazinyl group, a carbazolyl group, —$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$.

In an embodiment, the second compound may be represented by Formula 2-1-1 or Formula 2-2-2:

Formula 2-1-1

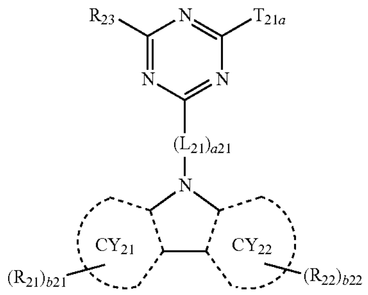

-continued

Formula 2-2-2

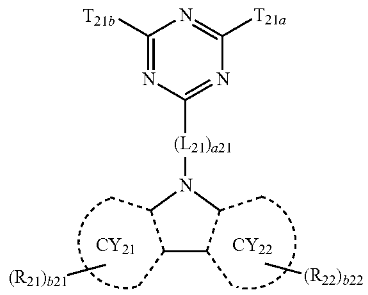

wherein, in Formula 2-1-1 and Formula 2-2-2, $CY_{21}$, $CY_{22}$, $L_{21}$, a21, $R_{21}$, $R_{22}$, b21, b22, and $R_{23}$ are each the same as described above in Formula 2-1, and $T_{21a}$ and $T_{21b}$ are each the same as described above in connection with $T_{21}$.

For example, in Formula 2-1-1 and Formula 2-2-2, $CY_{21}$ and $CY_{22}$ may each be a benzene group, a21 may be 0, and $R_{23}$, $R_{21}$, and $R_{22}$ may each independently be:

hydrogen, a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group; or a phenyl group, a biphenyl group, a naphthyl group, a fluorenyl group, a phenanthrenyl group, an anthracenyl group, a dibenzofuranyl group, a dibenzothiophenyl group, a dibenzoselenophenyl group, a dibenzosilole group, a triazinyl group, or a carbazolyl group, each unsubstituted or substituted with deuterium, —F, —Cl, —Br, —I, a hydroxyl group, a cyano group (CN), a nitro group, an amino group, a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or a combination thereof.

In an embodiment, the second compound may be represented by one or more of Compounds E1 to E17:

E1

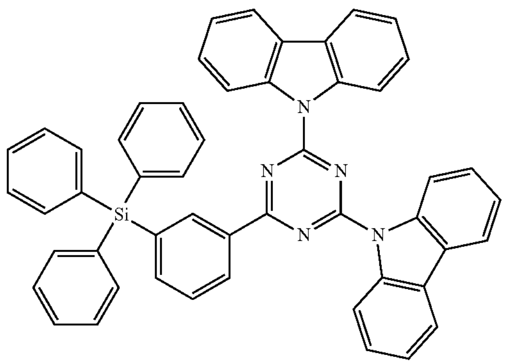

E2

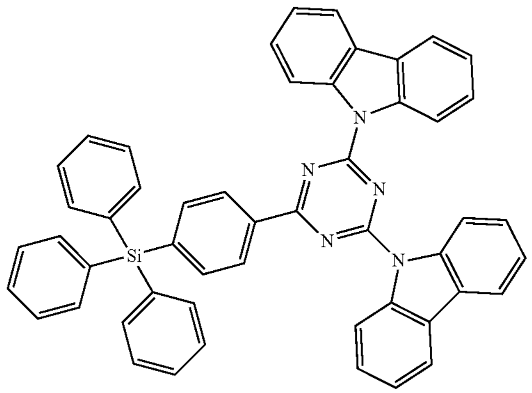

E3

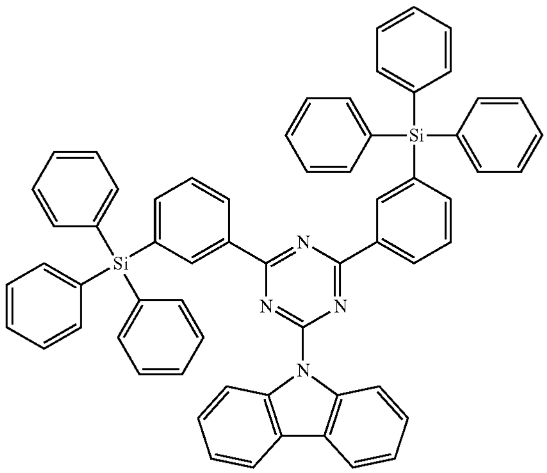

-continued
E4
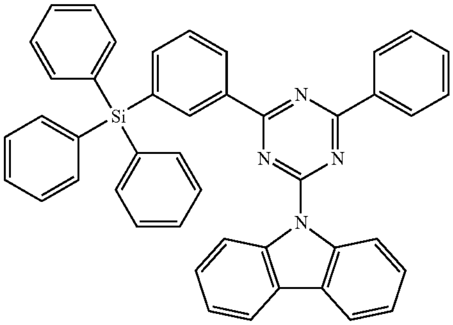
E5
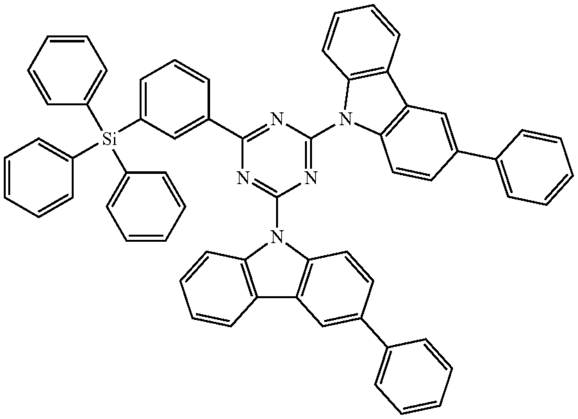
E6
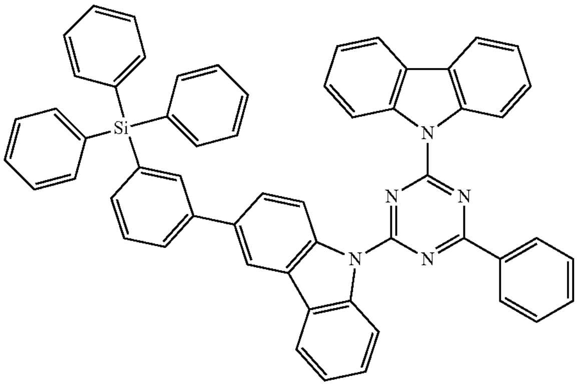
-continued
E7
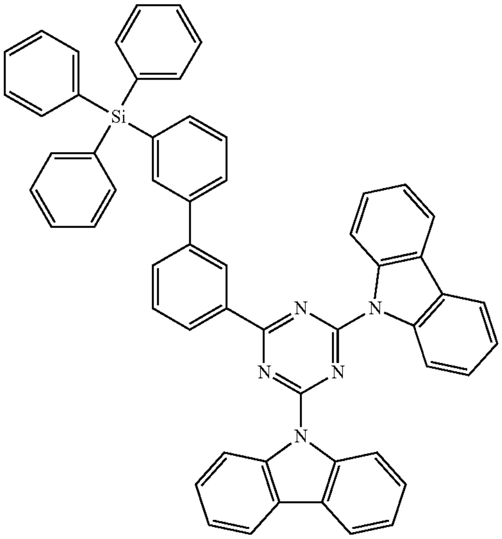
E8
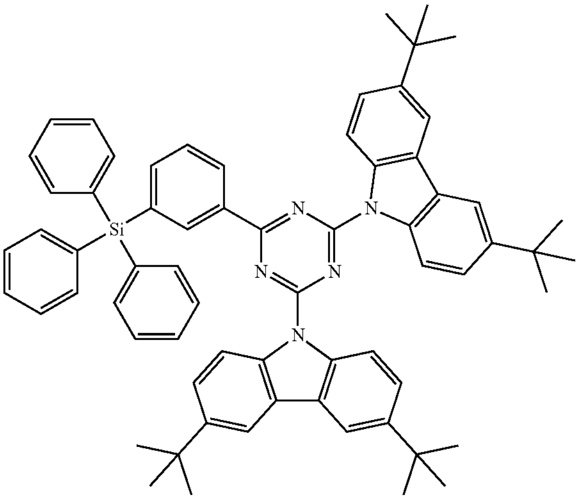

-continued
E9
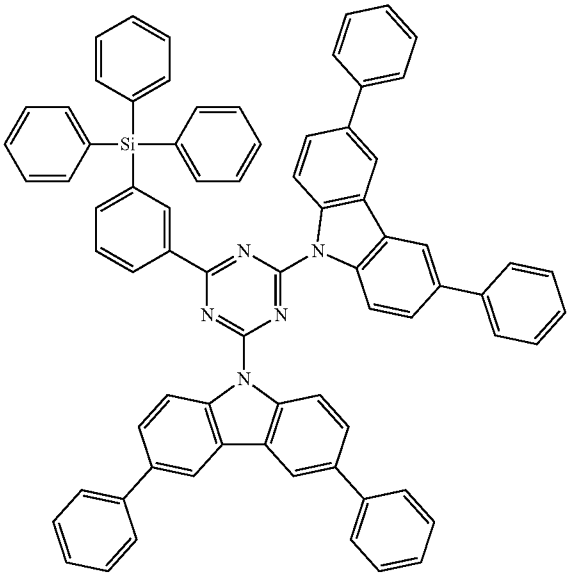
E10
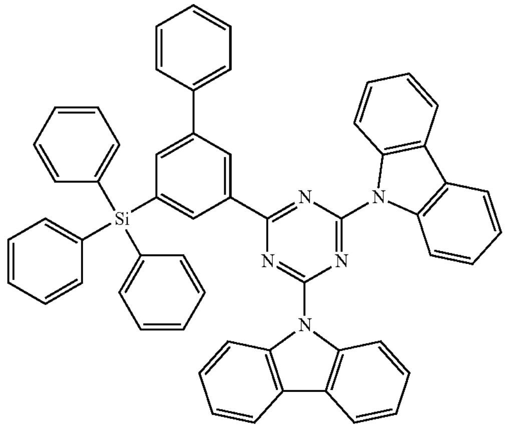
E11
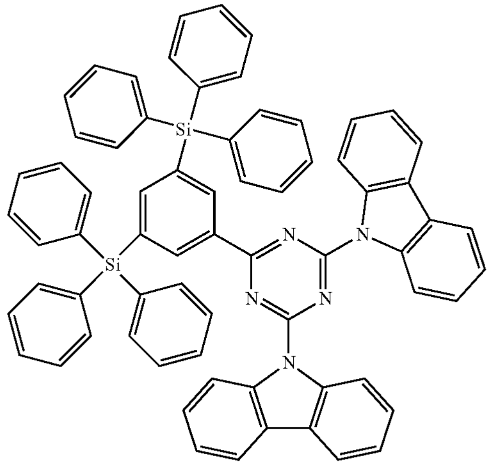
-continued
E12
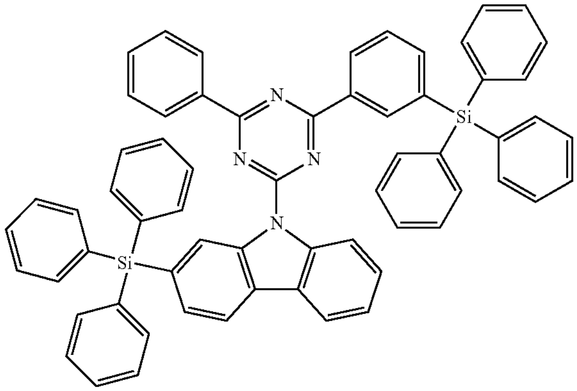
E13
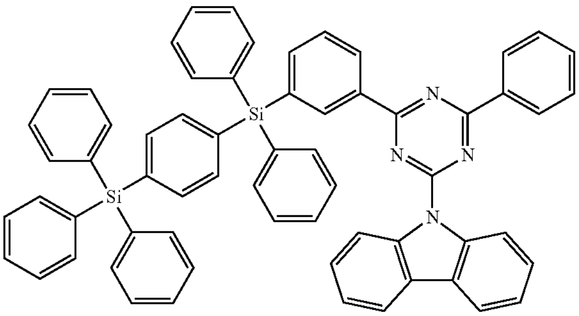
E14
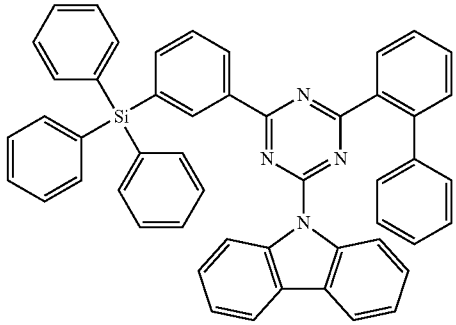
E15
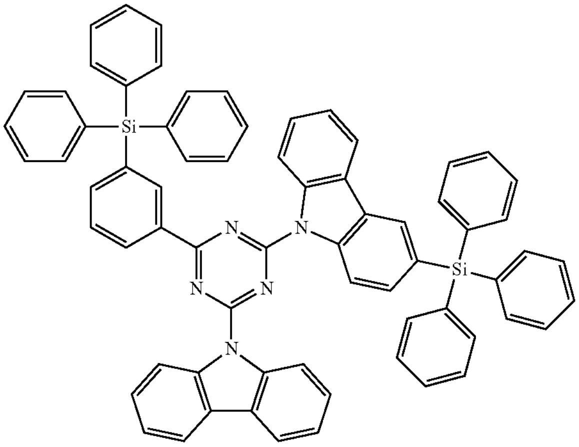

-continued

E16

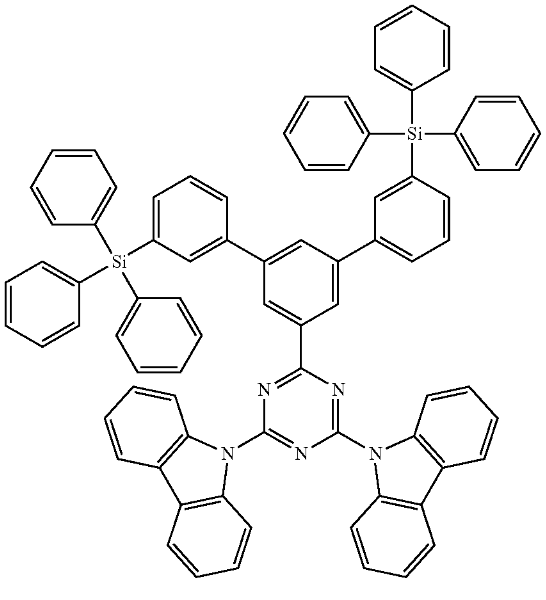

E17

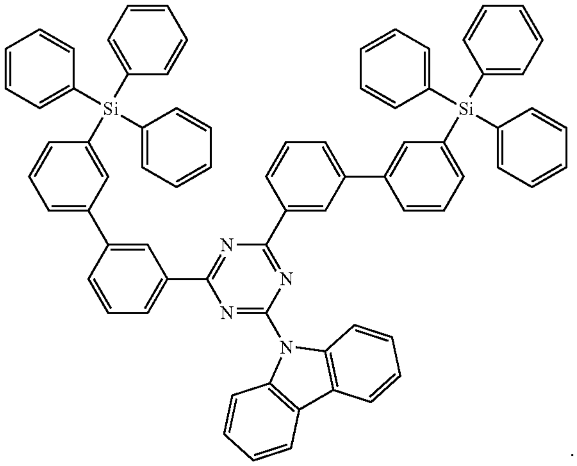

.

Third Compound

As described above, the third compound as an organometallic compound may be a phosphorescent dopant. The phosphorescent dopant may be a blue phosphorescent dopant. For example, the third compound may be a blue phosphorescent dopant including platinum.

In one or more embodiments, the third compound as an organometallic compound may be a sensitizer compound that is used in combination with other light-emitting dopants to facilitate transfer of excitons from a host compound or material to a light-emitting dopant as described.

In an embodiment, the third compound may include a transition metal, e.g., Pt, Pd, or Au, and a tetradentate ligand. The tetradentate ligand can be open (forming three rings with the transition metal) or closed (forming four rings with the transition metal).

For example, the third compound may include an organometallic compound represented by Formula 3:

Formula 3

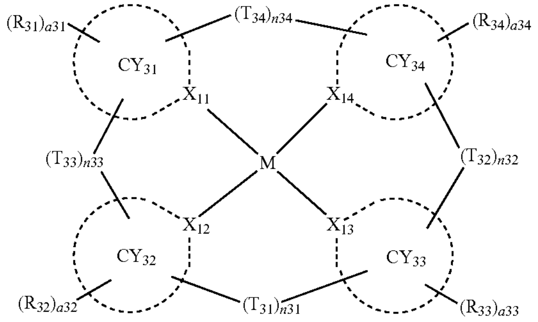

wherein, in Formula 3,

M may be a transition metal, $X_{11}$ to $X_{14}$ may each independently be C or N, where two bonds of a bond between $X_{11}$ and M, a bond between $X_{12}$ and M, a bond between $X_{13}$ and M, and a bond between $X_{14}$ and M, may be coordinate bonds and two bonds may be covalent bonds, ring $CY_{31}$ to ring $CY_{34}$ may each independently be a $C_5$-$C_{30}$ carbocyclic group or a $C_1$-$C_{30}$ heterocyclic group, $T_{31}$ may be a single bond, a double bond, *—N($R_{35a}$)—*', *—B($R_{35a}$)—*', *—P($R_{35a}$)—*', *—C($R_{35a}$)($R_{35b}$)—*', *—Si($R_{35a}$)($R_{35b}$)—*', *—Ge($R_{35a}$)($R_{35b}$)—*', *—S—*', *—Se—*', *—O—*', *—C(═O)—*', *—S(═O)—*', S(═O)$_2$*', *—C($R_{35a}$)═*', *═C($R_{35a}$)—*', *—C($R_{35a}$)═C($R_{35b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_{32}$ may be a single bond, a double bond, *—N($R_{36a}$)—*', *—B($R_{36a}$)—*', *—P($R_{36a}$)—*', *—C($R_{36a}$)($R_{36b}$)—*', *—Si($R_{36a}$)($R_{36b}$)—*', *—Ge($R_{36a}$)($R_{36b}$)—*', *—S—*', *—Se—*', *—O—*', *—C(═O)—*', *—S(═O)—*', S(═O)$_2$*', *—C($R_{36a}$)═*', *═C($R_{36a}$)—*', *—C($R_{36a}$)═C($R_{36b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_{33}$ may be a single bond, a double bond, *—N($R_{37a}$)—*', *—B($R_{37a}$)—*', *—P($R_{37a}$)—*', *—C($R_{37a}$)($R_{37b}$)—*', *—Si($R_{37a}$)($R_{37b}$)—*', *—Ge($R_{37a}$)($R_{37b}$)—*', *—S—*', *—Se—*', *—O—*', *—C(═O)*', *—S(═O)—*', S(═O)$_2$*', *—C($R_{37a}$)═*', *═C($R_{37a}$)—*', *—C($R_{37a}$)═C($R_{37b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_{34}$ may be a single bond, a double bond, *—N($R_{38a}$)—*', *—B($R_{38a}$)—*', *—P($R_{38a}$)—*', *—C($R_{38a}$)($R_{38b}$)—*', *—Si($R_{38a}$)($R_{38b}$)—*', *—Ge($R_{38a}$)($R_{38b}$)—*', *—S—*', *—Se—*', *—O—*', *—C(═O)*', *—S(═O)—*', S(O)$_2$*', *—C($R_{38a}$)═*', *═C($R_{38a}$)—*', *—C($R_{38a}$)═C($R_{38b}$)—*', *—C(═S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, n31 to n34 may each independently be an integer from 0 to 5, and three or more of n31 to n34 may each independently be an integer from 1 to 5, when n31 is 0, $T_{31}$ may not be present, when n32 is 0, $T_{32}$ may not be present, when n33 is 0, $T_{33}$ may not be present, and when n34 is 0, $T_{34}$ may not be present, when n31 is 2 or more, two or more of $T_{31}$(s) may be identical to or different from each other, when n32 is 2 or more, two or more of $T_{32}$(s) may be identical to or different from each other, when n33 is 2 or more, two or more of $T_{33}$(s) may be identical to or different from each other, and when n34 is 2 or more, two or more of $T_{34}$(s) may be identical to or different from each other, $R_{31}$ to $R_{34}$, $R_{35a}$, $R_{35b}$, $R_{36a}$, $R_{36b}$, $R_{37a}$, $R_{37b}$, $R_{38a}$, and $R_{38b}$ may each independently be hydrogen, deuterium, —F, —Cl, —Br, —I, —$CD_3$, —$CD_2H$, —$CDH_2$, —$CF_3$, —$CF_2H$, —$CFH_2$, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), a31 to a34 may each independently be an integer from 0 to 20, two or more adjacent $R_{31}$(s) may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more adjacent $R_{32}$(s) may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more adjacent $R_{33}$(s) may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more adjacent $R_{34}$(s) may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{31}$, $R_{32}$, $R_{33}$, $R_{34}$, $R_{35a}$, $R_{35b}$, $R_{36a}$, $R_{36b}$, $R_{37a}$, $R_{37b}$, $R_{38a}$, and $R_{38b}$ of adjacent rings and/or T groups may optionally be bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as described in connection with $R_{31}$,

* and *' each indicate a binding site to a neighboring atom, and a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

In an embodiment, M in Formula 3 may be Pt, Pd, or Au.

In one or more embodiments, in Formula 3, a bond between $X_{11}$ and M may be a coordinate bond.

In one or more embodiments, in Formula 3, $X_{11}$ may be C, and a bond between $X_{11}$ and M may be a coordinate bond. That is, $X_{11}$ in Formula 3 may be C in a carbene moiety.

In one or more embodiments, ring $CY_{31}$ to ring $CY_{34}$ in Formula 3 may each independently be i) a first ring, ii) a second ring, iii) a condensed ring in which two or more first rings are condensed with each other, iv) a condensed ring in which two or more second rings are condensed with each other, or v) a condensed ring in which at least one first ring is condensed with at least one second ring, wherein the first ring may be a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasiline group.

In an embodiment, $R_{31}$ to $R_{34}$, $R_{35a}$, $R_{35b}$, $R_{36a}$, $R_{36b}$, $R_{37a}$, $R_{37b}$, $R_{38a}$, and $R_{35b}$ may each independently be:

hydrogen, deuterium, —F, —Cl, —Br, —I, $—CD_3$, $—CD_2H$, $—CDH_2$, $—CF_3$, $—CF_2H$, $—CFH_2$, a cyano group (CN), a nitro group, an amino group, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with at least one of deuterium, —F, —Cl, —Br, —I, $—CD_3$, $—CD_2H$, $—CDH_2$, $—CF_3$, $—CF_2H$, $—CFH_2$, a cyano group (CN), a nitro group, an amino group, and a phenyl group; or a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, or an anthracenyl group, each unsubstituted or substituted with at least one of deuterium, —F, —C, —Br, —I, $—CD_3$, $—CD_2H$, $—CDH_2$, $—CF_3$, $—CF_2H$, $—CFH_2$, a cyano group (CN), a nitro group, an amino group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, and an anthracenyl group.

In one or more embodiments, the third compound may be a phosphorescent dopant compound represented by Formula 5:

$$M_{51}(L_{51})_{n51}(L_{52})_{n52} \quad \text{Formula 5}$$

wherein, in Formula 5, $M_{51}$ may be a transition metal.

For example, $M_{51}$ may be a Period 1 transition metal, a Period 2 transition metal, or a Period 3 transition metal.

In one or more embodiments, $M_{51}$ may be iridium (Ir), platinum (Pt), osmium (Os), titanium (Ti), zirconium (Zr), hafnium (Hf), europium (Eu), terbium (Tb), thulium (Tm), or rhodium (Rh).

In an embodiment, $M_{51}$ may be Ir, Pt, Os, or Rh.

In Formula 5, $L_{51}$ may be a ligand represented by Formula 5A, and $L_{52}$ may be a ligand represented by Formula 5B:

Formula 5A

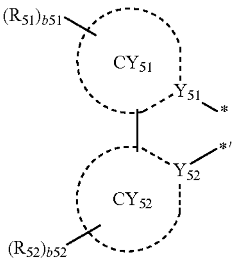

Formula 5B

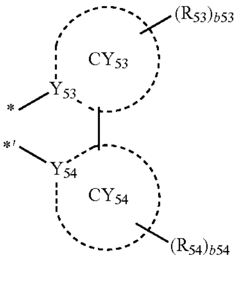

wherein the variables of Formulae 5A and 5B are each as described in the present specification below.

In addition, n51 in Formula 5 may be 1, 2, or 3, wherein, when n51 is 2 or more, two or more of $L_{51}$(s) may be identical to or different from each other; and n52 in Formula 5 may be 0, 1, or 2, wherein, when n52 is 2, two $L_{52}$(s) may be identical to or different from each other.

The sum of n51 and n52 in Formula 5 may be 2 or 3. For example, the sum of n51 and n52 may be 3.

In an embodiment, in Formula 5, i) $M_{51}$ may be Ir, and the sum of n51 and n52 may be 3; or ii) $M_{51}$ may be Pt, and the sum of n51 and n52 may be 2.

In one or more embodiments, in Formula 5, $M_{51}$ may be Ir, and i) n51 may be 1, and n52 may be 2, or ii) n51 may be 2, and n52 may be 1.

$L_{51}$ and $L_{52}$ in Formula 5 may be different from each other.

$Y_{51}$ to $Y_{54}$ in Formulae 5A and 5B may each independently be C or N. For example, $Y_{51}$ and $Y_{53}$ may each be N, and $Y_{52}$ and $Y_{54}$ may each be C.

Ring $CY_{51}$ to ring $CY_{54}$ in Formulae 5A and 5B may each independently be a $C_5$-$C_{30}$ carbocyclic group or a $C_1$-$C_{30}$ heterocyclic group.

For example, ring $CY_{51}$ to ring $CY_{54}$ in Formulae 5A and 5B may each independently include i) a third ring, ii) a fourth ring, iii) a condensed ring in which two or more third rings are condensed with each other, iv) a condensed ring in which two or more fourth rings are condensed with each other, or v) a condensed ring in which at least one third ring is condensed with at least one fourth ring, the third ring may be a cyclopentane group, a cyclopentene group, a furan group, a thiophene group, a pyrrole group, a silole group, a borole group, a phosphole group, a germole group, a selenophene group, an oxazole group, an oxadiazole group, an oxatriazole group, a thiazole group, a thiadiazole group, a thiatriazole group, a pyrazole group, an imidazole group, a triazole group, a tetrazole group, or an azasilole group, and the fourth ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one or more embodiments, ring $CY_{51}$ to ring $CY_{54}$ in Formulae 5A and 5B may each independently be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, a pyrrole group, a furan group, a thiophene group, a silole group, a borole group, a phosphole group, a germole group, a selenophene group, an indene group, an indole group, a benzofuran group, a benzothiophene group, a benzosilole group, a benzoborole group, a benzophosphole group, a benzogermole group, a benzoselenophene group, a fluorene group, a carbazole group, a dibenzofuran group, a dibenzothiophene group, a dibenzosilole group, a dibenzoborole group, a dibenzophosphole group, a dibenzogermole group, a dibenzoselenophene group, a benzofluorene group, a benzocarbazole group, a naphthobenzofuran group, a naphthobenzothiophene group, a naphthobenzosilole group, a naphthobenzoborole group, a naphthobenzophosphole group, a naphthobenzogermole group, a naphthobenzoselenophene group, a dibenzofluorene group, a dibenzocarbazole group, a dinaphthofuran group, a dinaphthothiophene group, a dinaphthosilole group, a dinaphthoborole group, a dinaphthophosphole group, a dinaphthogermole group, a dinaphthoselenophene group, an indenophenanthrene group, an indolophenanthrene group, a phenanthrobenzofuran group, a phenanthrobenzothiophene group, a phenanthrobenzosilole group, a phenanthrobenzoborole group, a phenanthrobenzophosphole group, a phenanthrobenzogermole group, a phenanthrobenzoselenophene group, a dibenzothiophene 5-oxide group, a 9H-fluorene-9-one group, a dibenzothiophene 5,5-dioxide group, an azaindene group, an azaindole group, an azabenzofuran group, an azabenzothiophene group, an azabenzosilole group, an azabenzoborole group, an azabenzophosphole group, an azabenzogermole group, an azabenzoselenophene group, an azafluorene group, an azacarbazole group, an azadibenzofuran group, an azadibenzothiophene group, an azadibenzosilole group, an azadibenzoborole group, an azadibenzophosphole group, an azadibenzogermole group, an azadibenzoselenophene group, an azabenzofluorene group, an azabenzocarbazole group, an azanaphthobenzofuran group, an azanaphthobenzothiophene group, an azanaphthobenzosilole group, an azanaphthobenzoborole group, an azanaphthobenzophosphole group, an azanaphthobenzogermole group, an azanaphthobenzoselenophene group, an azadibenzofluorene group, an azadibenzocarbazole group, an azadinaphthofuran group, an azadinaphthothiophene group, an azadinaphthosilole group, an azadinaphthoborole group, an azadinaphthophosphole group, an azadinaphthogermole group, an azadinaphthoselenophene group, an azaindenophenanthrene group, an azaindolophenanthrene group, an azaphenanthrobenzofuran group, an azaphenanthrobenzothiophene group, an azaphenanthrobenzosilole group, an azaphenanthrobenzoborole group, an azaphenanthrobenzophosphole group, an azaphenanthrobenzogermole group, an azaphenanthrobenzoselenophene group, an azadibenzothiophene 5-oxide group, an aza9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a benzoquinoline group, a benzoisoquinoline group, a benzoquinoxaline group, a benzoquinazoline group, a phenanthroline group, a phenanthridine group, a pyrrole group, a pyrazole group, an imidazole group, a triazole group, an oxazole group, an isoxazole group, a thiazole group, an isothiazole group, an oxadiazole group, a thiadiazole group, an azasilole group, an azaborole group, an azaphosphole group, an azagermole group, an azaselenophene group, a benzopyrrole group, a benzopyrazole group, a benzimidazole group, a benzoxazole group, a benzisoxazole group, a benzothiazole group, a benzisothiazole group, a benzoxadiazole group, a benzothiadiazole group, a pyridinopyrrole group, a pyridinopyrazole group, a pyridinoimidazole group, a pyridinooxazole group, a pyridinoisoxazole group, a pyridinothiazole group, a pyridinoisothiazole group, a pyridinooxadiazole group, a pyridinothiadiazole group, a pyrimidinopyrrole group, a pyrimidinopyrazole group, a pyrimidinoimidazole group, a pyrimidinooxazole group, a pyrimidinoisoxazole group, a pyrimidinothiazole group, a pyrimidinoisothiazole group, a pyrimidinooxadiazole group, a pyrimidinothiadiazole group, a 5,6,7,8-tetrahydroisoquinoline group, a 5,6,7,8-tetrahydroquinoline group, an adamantane group, a norbornane group, a norbornene group, a benzene group condensed with a cyclohexane group, a benzene group condensed with a norbornane group, a pyridine group condensed with a cyclohexane group, or a pyridine group condensed with a norbornane group.

For example, ring $CY_{51}$ and ring $CY_{53}$ in Formulae 5A and 5B may be different from each other.

In one or more embodiments, ring $CY_{52}$ and ring $CY_{54}$ in Formulae 5A and 5B may be different from each other.

In one or more embodiments, ring $CY_{51}$ to ring $CY_{54}$ in Formulae 5A and 5B may be different from each other.

$R_{51}$ to $R_{54}$ in Formulae 5A and 5B may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_{51})(Q_{52})$, —$Si(Q_{53})(Q_{54})(Q_{55})$, —$Ge(Q_{53})(Q_{54})(Q_{55})$, —$B(Q_{56})(Q_{57})$, —$P(=O)(Q_{58})(Q_{59})$, or —$P(Q_{58})(Q_{59})$. $Q_{51}$ to $Q_{59}$ are each the same as described in the present specification.

In an embodiment, $R_{51}$ to $R_{54}$ in Formulae 5A and 5B may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, a $C_1$-$C_{20}$ alkoxy group, or a $C_1$-$C_{20}$ alkylthio group;

a $C_1$-$C_{20}$ alkyl group, a $C_1$-$C_{20}$ alkoxy group, or a $C_1$-$C_{20}$ alkylthio group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a (phenyl)$C_1$-$C_{10}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or —$N(Q_{51})(Q_{52})$, —$Ge(Q_{53})(Q_{54})(Q_{55})$, —$B(Q_{56})(Q_{57})$, —$P(=O)(Q_{58})(Q_{59})$, or —$P(Q_{58})(Q_{59})$, wherein $Q_{51}$ to $Q_{59}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In one or more embodiments, $R_{51}$ to $R_{54}$ may each independently be:

hydrogen, deuterium, —F, or a cyano group;

a $C_1$-$C_{20}$ alkyl group unsubstituted or substituted with deuterium, a cyano group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof;

a $C_3$-$C_{10}$ cycloalkyl group, a $C_1$-$C_{10}$ heterocycloalkyl group, a phenyl group, or a biphenyl group, each unsubstituted or substituted with deuterium, a cyano group, a $C_1$-$C_{20}$ alkyl group, a deuterated $C_1$-$C_{20}$ alkyl group, fluorinated $C_1$-$C_{20}$ alkyl group, a $C_1$-$C_{20}$ alkoxy group, a deuterated $C_1$-$C_{20}$ alkoxy group, a fluorinated $C_1$-$C_{20}$ alkoxy group, a $C_3$-$C_{10}$ cycloalkyl group, a deuterated $C_3$-$C_{10}$ cycloalkyl group, a fluorinated $C_3$-$C_{10}$ cycloalkyl group, a ($C_1$-$C_{20}$ alkyl)$C_3$-$C_{10}$ cycloalkyl group, a $C_1$-$C_{10}$ heterocycloalkyl group, a deuterated $C_1$-$C_{10}$ heterocycloalkyl group, a fluorinated $C_1$-$C_{10}$ heterocycloalkyl group, a ($C_1$-$C_{20}$ alkyl)$C_1$-$C_{10}$ heterocycloalkyl group, a phenyl group, a deuterated phenyl group, a fluorinated phenyl group, a ($C_1$-$C_{20}$ alkyl)phenyl group, a biphenyl group, a deuterated biphenyl group, a fluorinated biphenyl group, a ($C_1$-$C_{20}$ alkyl)biphenyl group, a dibenzofuranyl group, a deuterated dibenzofuranyl group, a fluorinated dibenzofuranyl group, a ($C_1$-$C_{20}$ alkyl)dibenzofuranyl group, a dibenzothiophenyl group, a deuterated dibenzothiophenyl group, a fluorinated dibenzothiophenyl group, a ($C_1$-$C_{20}$ alkyl)dibenzothiophenyl group, or any combination thereof; or —$Si(Q_{53})(Q_{54})(Q_{55})$ or —$Ge(Q_{53})(Q_{54})(Q_{55})$.

b51 to b54 in Formulae 5A and 5B indicate the numbers of $R_{51}$ to $R_{54}$, respectively, and may each independently be an integer from 0 to 20. When b51 is 2 or more, two or more of $R_{51}$(s) may be identical to or different from each other, when b52 is 2 or more, two or more of $R_{52}$(s) may be identical to or different from each other, when b53 is 2 or more, two or more of $R_{53}$(s) may be identical to or different from each other, and when b54 is 2 or more, two or more of $R_{54}$(s) may be identical to or different from each other. For example, b51 to b54 may each independently be an integer from 0 to 8.

In an embodiment, the third compound may be represented by one or more of Compounds P1 to P42:

P1

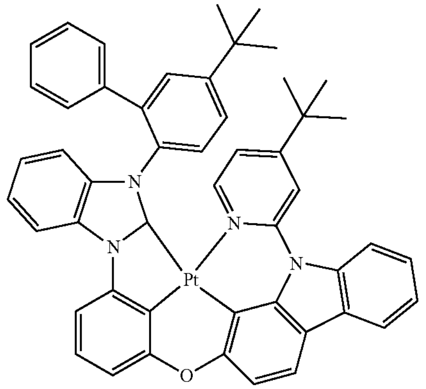

P2

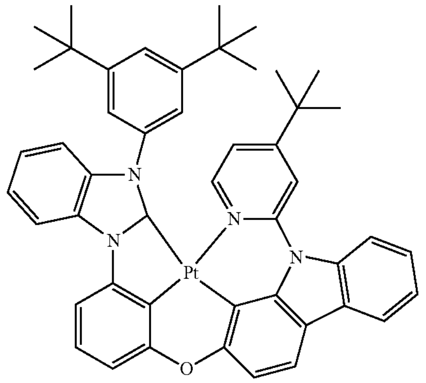

P3

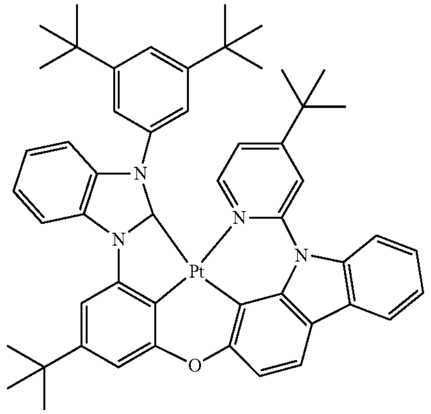

-continued
P4
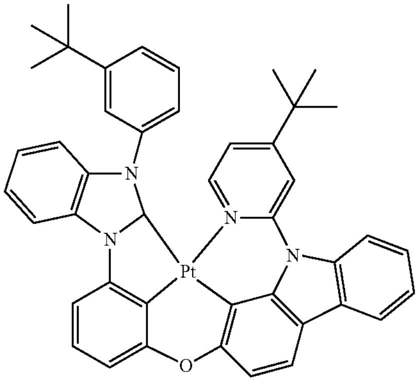
P5
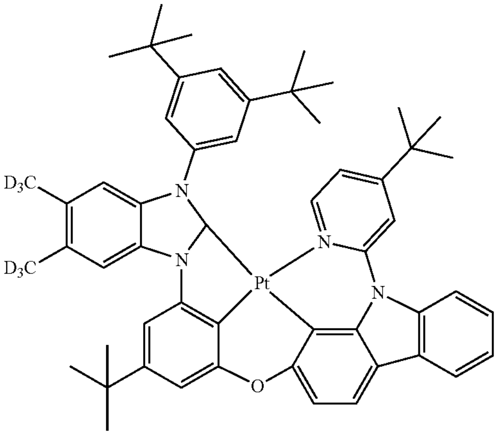
P6
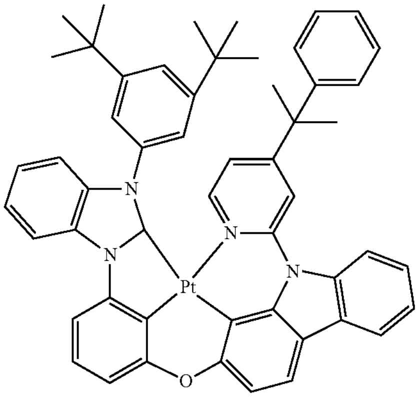
P7
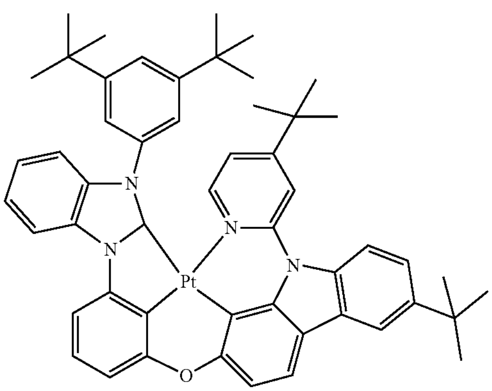
-continued
P8
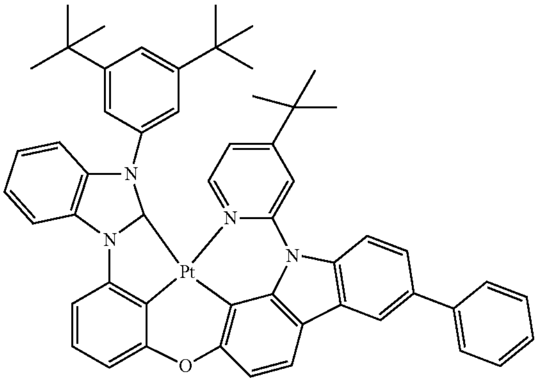
P9
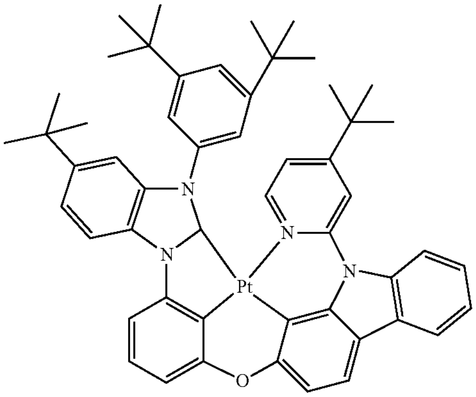
P10
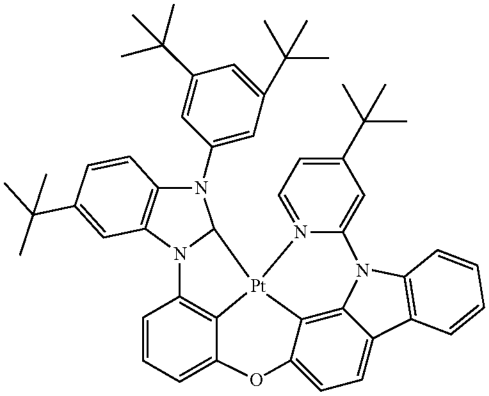
P11
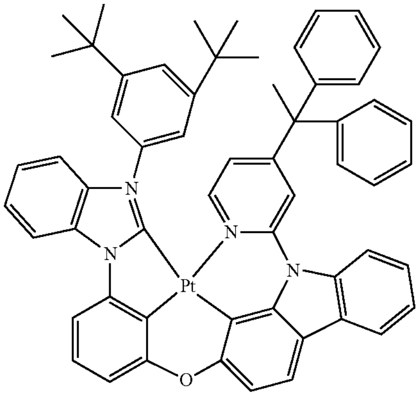

-continued
P12
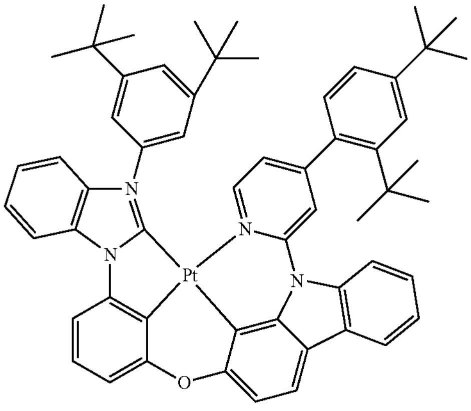
P13
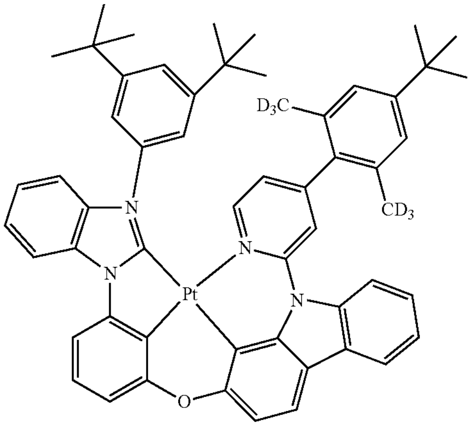
P14
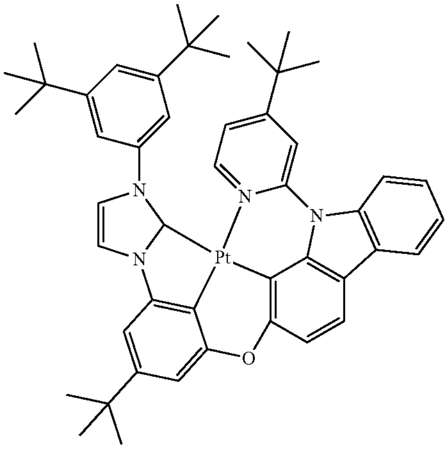
P15
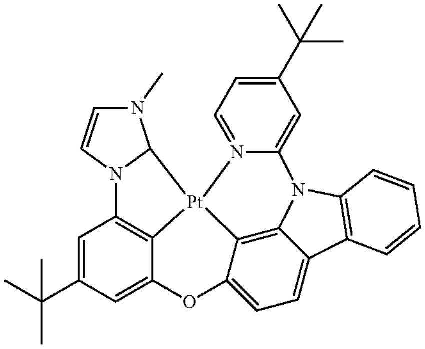
-continued
P16
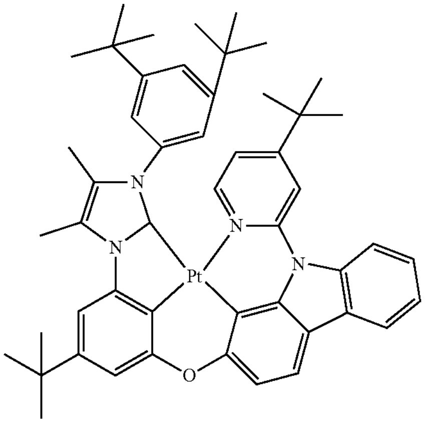
P17
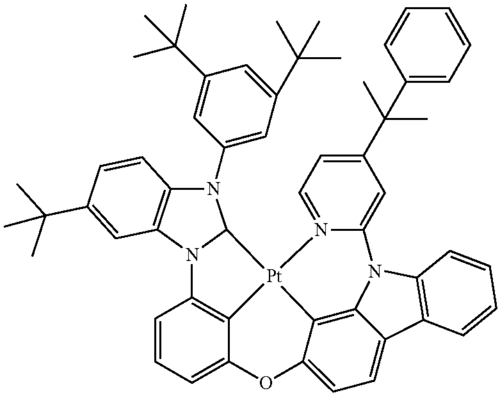
P18
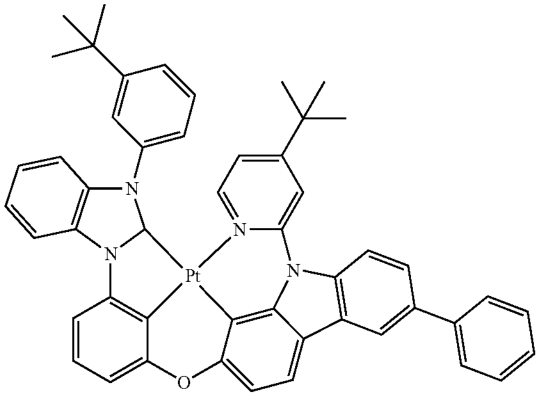

-continued
P19
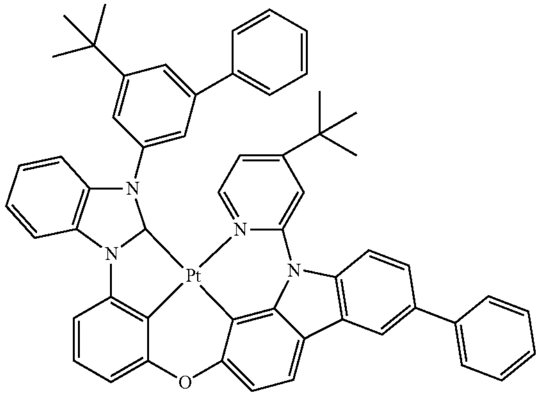
P20
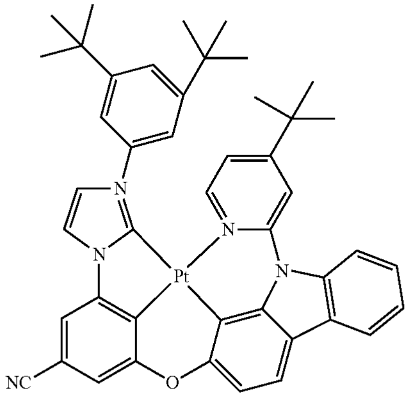
P21
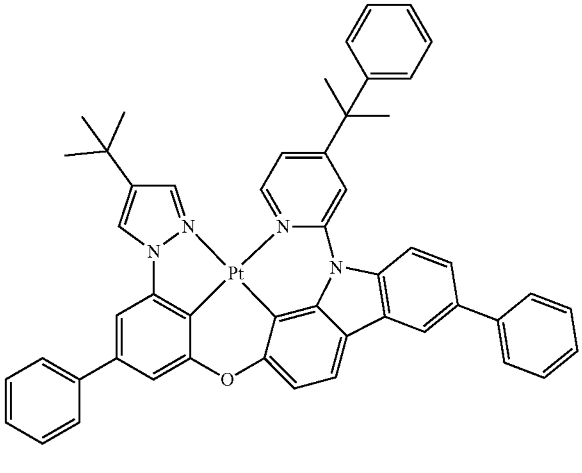
-continued
P22
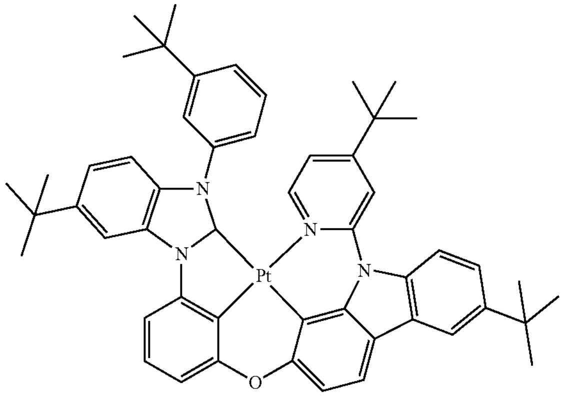
P23
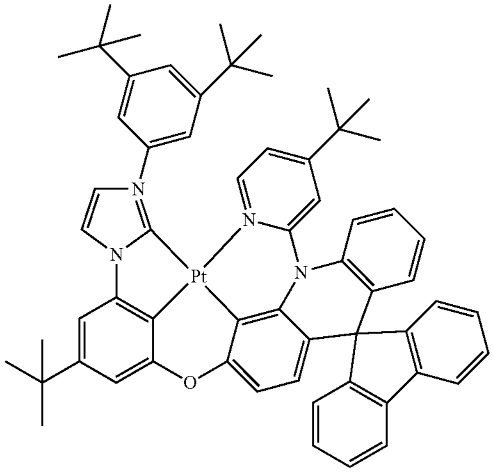
P24
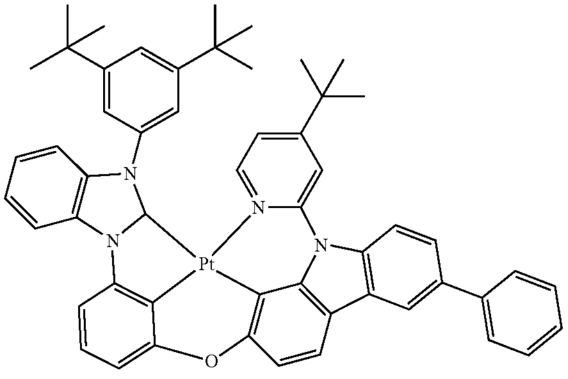

-continued
P25
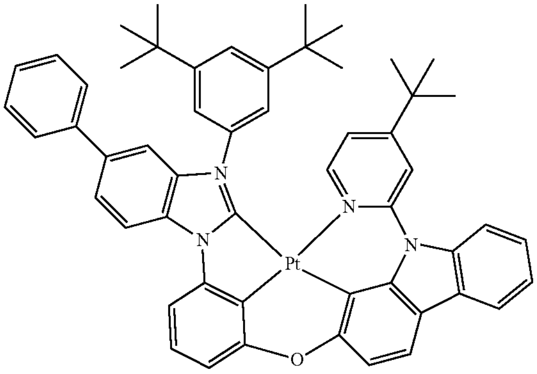
P26
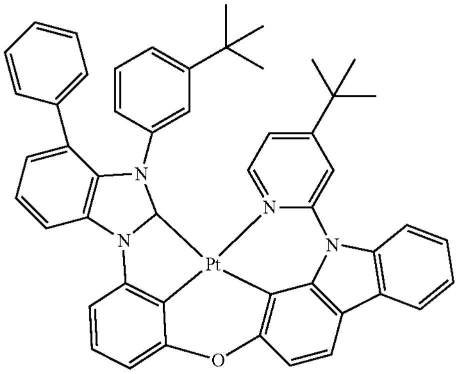
P27
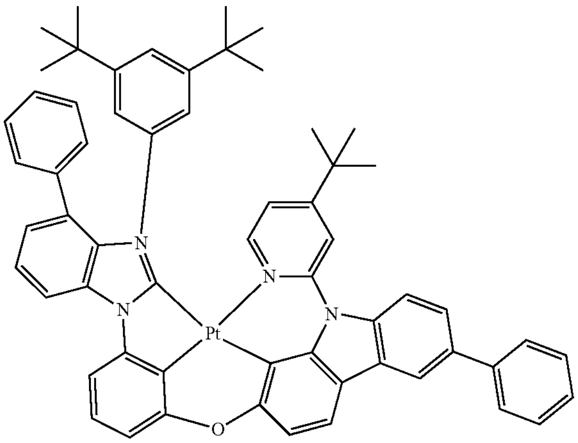
-continued
P28
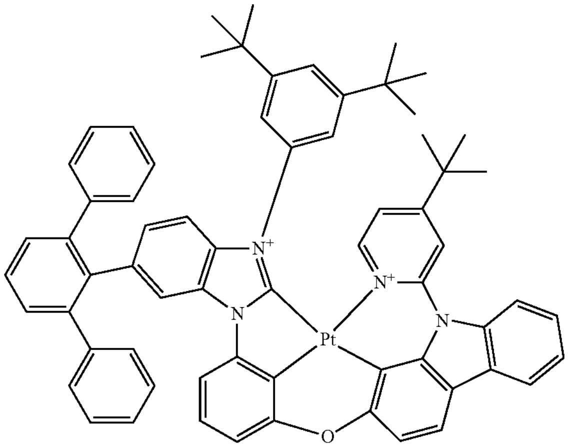
P29
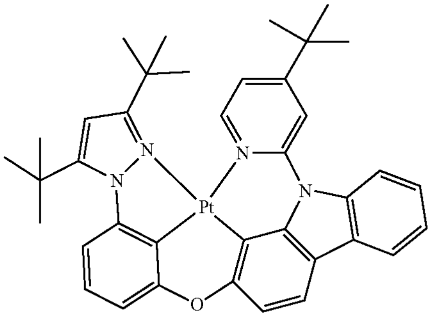
P30
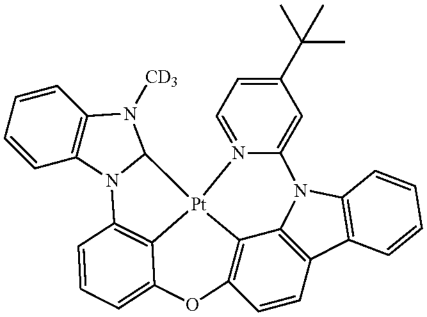
P31
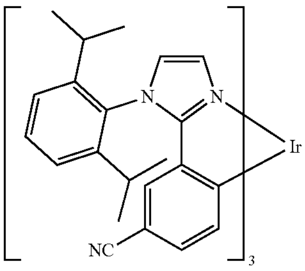

-continued
P32
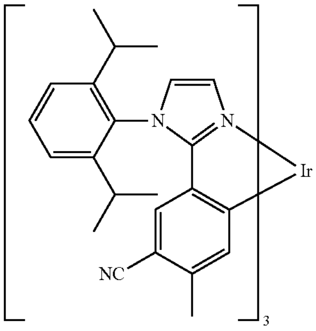
P33
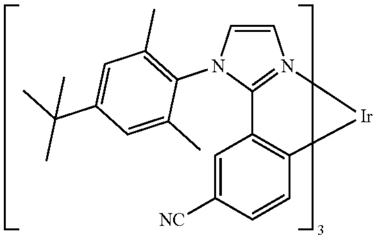
P34
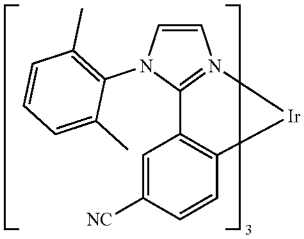
P35
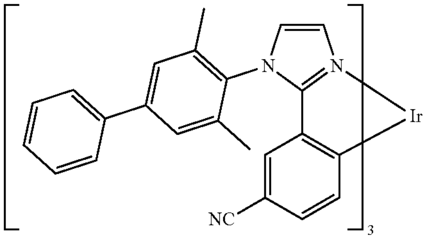
P36
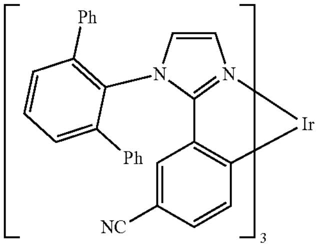
P37
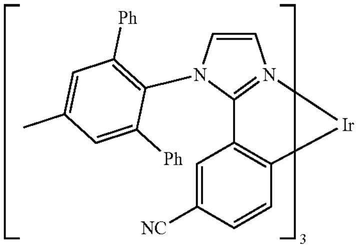
-continued
P38
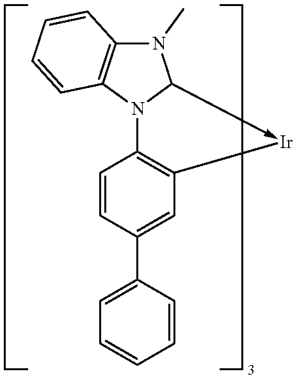
P39
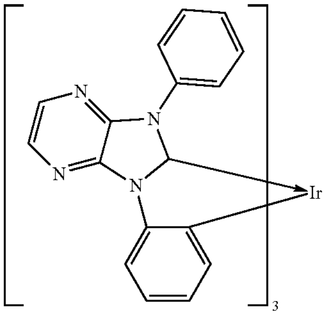
P40
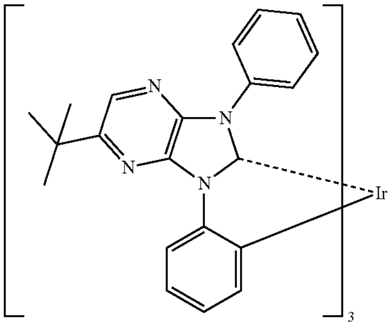
P41
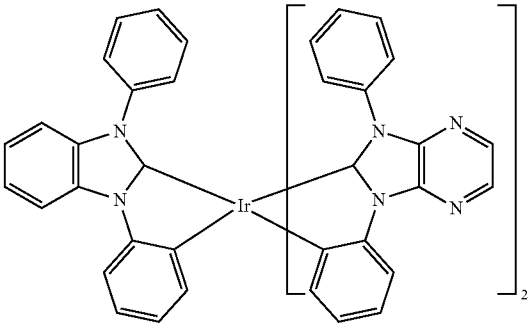

-continued

P42

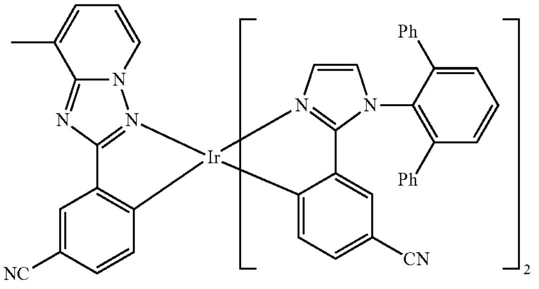

In an embodiment, an amount of the third compound included in the emission layer may be in a range of 0 wt % to about 20 wt %, based on the total weight of the emission layer.

Fourth Compound

As described above, the fourth compound as a polycyclic compound may be a thermally activated delayed fluorescence (TADF) dopant. The fourth compound may be a blue dopant.

In one or more embodiments, the fourth compound as a polycyclic compound may be a sensitizer compound that is used in combination with other light-emitting dopants to facilitate the transfer of excitons received from a host to a light-emitting dopant.

In an embodiment, the fourth compound may be a polycyclic compound represented by Formula 4:

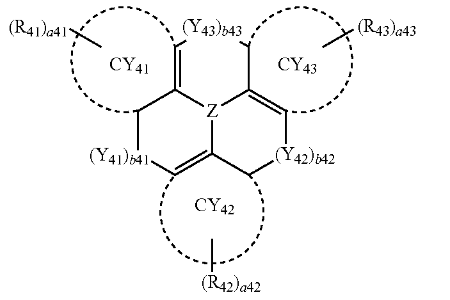

wherein, in Formula 4,

Z may be B or N, ring $CY_{41}$ to ring $CY_{43}$ may each independently be a $C_5$-$C_{30}$ carbocyclic group or a $C_1$-$C_{30}$ heterocyclic group, $Y_{41}$ may be *—N($R_{44}$)—*', *—B($R_{44}$)—*', *—P($R_{44}$)—*', *—C($R_{44}$)($R_{45}$)—*', *—Si($R_{44}$)($R_{45}$)—*', *—Ge($R_{44}$)($R_{45}$)—*', *—O—*', *—S—*', *—Se—*', *—C(═O)—*', or *—S(═O)$_2$—*', $Y_{42}$ may be *—N($R_{46}$)—*', *—B($R_{46}$)—*', *—P($R_{46}$)—*', *—C($R_{46}$)($R_{47}$)—*', *—Si($R_{4s}$)($R_{47}$)*', *—Ge($R_{4s}$)($R_{47}$)—*', *—O—*', *—S—*', *—Se—*', *—C(═O)—*', or *—S(═O)$_2$—*, $Y_{43}$ may be *—N($R_{48}$)—*', *—B($R_{48}$)—*', *—P($R_{48}$)—*', *—C($R_{48}$)($R_{49}$)—*', *—Si($R_{43}$)($R_{49}$)—*, *—Ge($R_{43}$)($R_{49}$)—*', *—O—*', *—S—*', *—Se—*', *—C(═O)—*', or *—S(═O)$_2$—*, b41 to b43 may each independently be 0 or 1, when b41 is 0, $Y_{41}$ may not be present, when b42 is 0, $Y_{42}$ may not be present, and when b43 is 0, $Y_{43}$ may not be present, $R_{41}$ to $R_{49}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), a41 to a43 may each independently be an integer from 0 to 20, two or more adjacent $R_{41}$(s) may optionally be bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more adjacent $R_{42}$(s) may optionally be bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more adjacent $R_{43}$(s) in the number of a43 may optionally be bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more of $R_{41}$ to $R_{49}$ of adjacent rings and/or Y groups may optionally be bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, $R_{10b}$ is the same as described in connection with $R_{41}$,

* and *' each indicate a binding site to a neighboring atom, and a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, and the substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

In an embodiment, $R_{41}$ to $R_{49}$ may each independently be:

hydrogen, deuterium, —F, —Cl, —Br, —I, a hydroxyl group, a cyano group (CN), a nitro group, an amino group, a $C_1$-$C_{60}$ alkyl group, or a $C_1$-$C_{60}$ alkoxy group;

a $C_1$-$C_{60}$ alkyl group or a $C_1$-$C_{60}$ alkoxy group, each substituted with at least one of deuterium, —F, —Cl, —Br, —I, a hydroxyl group, a cyano group (CN), a nitro group, an amino group, a phenyl group, a biphenyl group, a naphthyl group, a fluorenyl group, a phenanthrenyl group, an anthracenyl group, a fluoranthenyl group, a triphenylenyl group, a pyrenyl group, or a chrysenyl group; or a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group, each unsubstituted or substituted with at least one of deuterium, —F, —Cl, —Br, —I, a hydroxyl group, a cyano group (CN), a nitro group, an amino group, a $C_1$-$C_{60}$ alkyl group, a $C_1$-$C_{60}$ alkoxy group, a cyclopentyl group, a cyclohexyl group, a cycloheptyl group, a cyclopentenyl group, a cyclohexenyl group, a cycloheptenyl group, a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, or a carbazolyl group.

In an embodiment, Formula 4 may be Formulae 4-1 to 4-8:

Formula 4-1

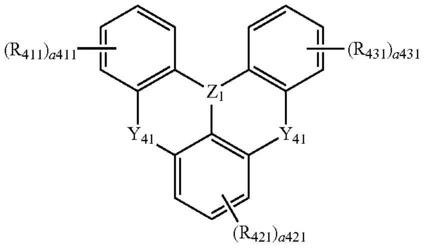

Formula 4-2

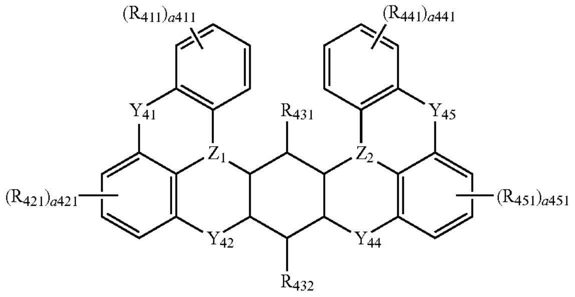

Formula 4-3

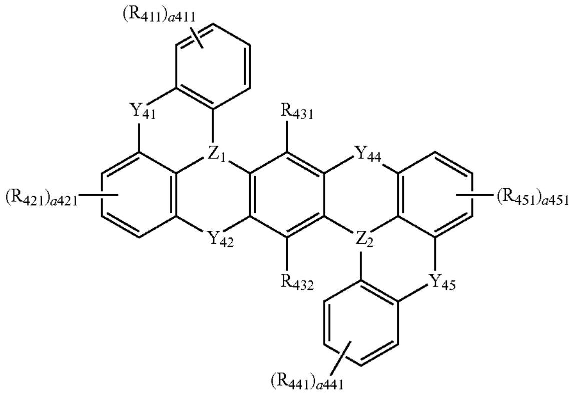

Formula 4-4

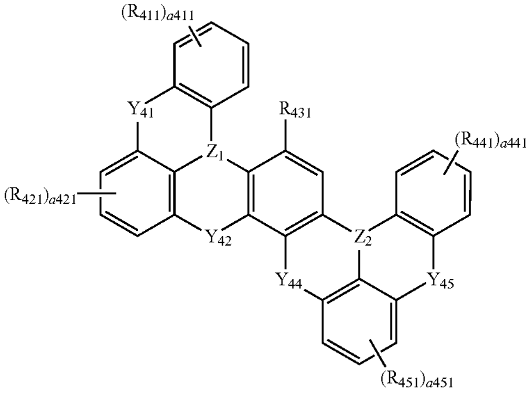

-continued

Formula 4-5

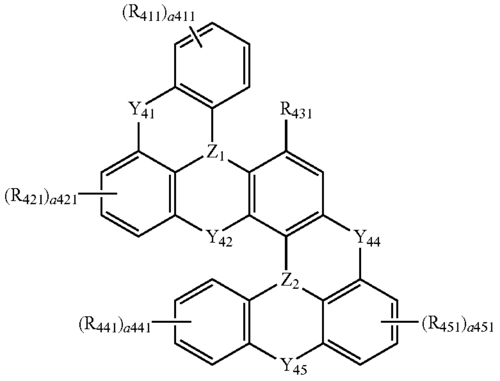

Formula 4-6

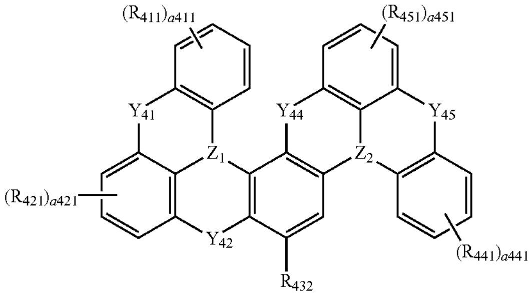

Formula 4-7

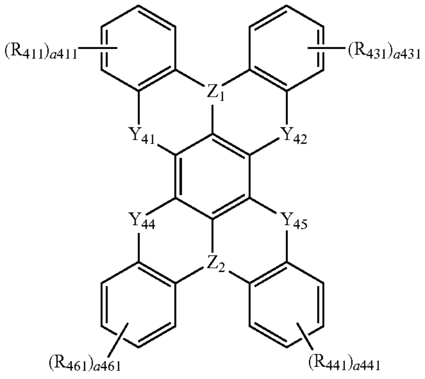

Formula 4-8

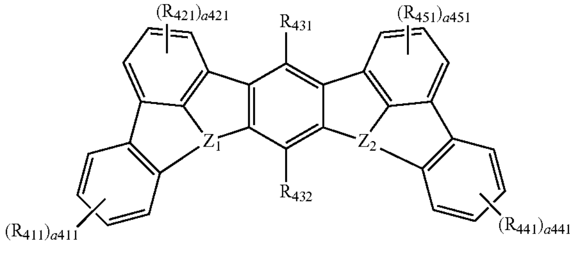

wherein, in Formulae 4-1 to 4-8, $Z_1$ and $Z_2$ are each the same as described in connection with Z, $Y_{41}$ and $Y_{42}$ are the same as described in the present specification, $Y_{44}$ and $Y_{45}$ are the same as described in connection with $Y_{41}$ and $Y_{42}$, respectively, $R_{411}$ is the same as described in connection with $R_{41}$, $R_{421}$ is the same as described in connection with $R_{42}$, $R_{431}$ and $R_{432}$ are each the same as described in connection with $R_{43}$, $R_{441}$ is the same as described in connection with $R_{41}$, $R_{451}$ is the same as described in connection with $R_{42}$, and $R_{461}$ is the same as described in connection with $R_{43}$, a411 may be an integer from 0 to 4, a421 may be an integer from 0 to 3, a431 may be an integer from 0 to 4, a441 may be an integer from 0 to 4, a451 may be an integer from 0 to 3, and a461 may be an integer from 0 to 4.

In an embodiment, the fourth compound may be one or more of Compounds D1 to D30:

D1

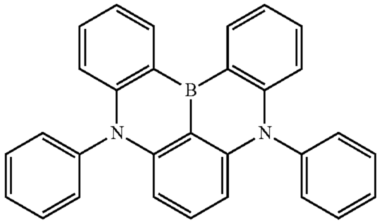

D2

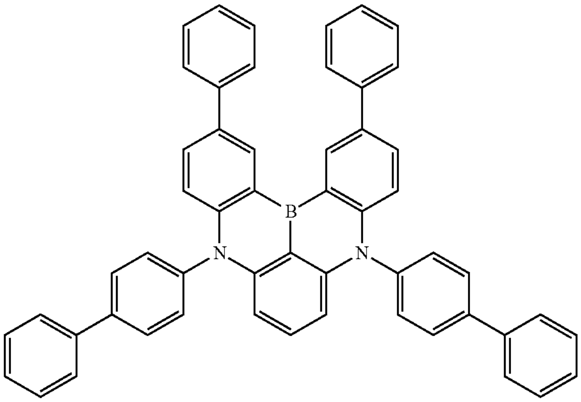

D3

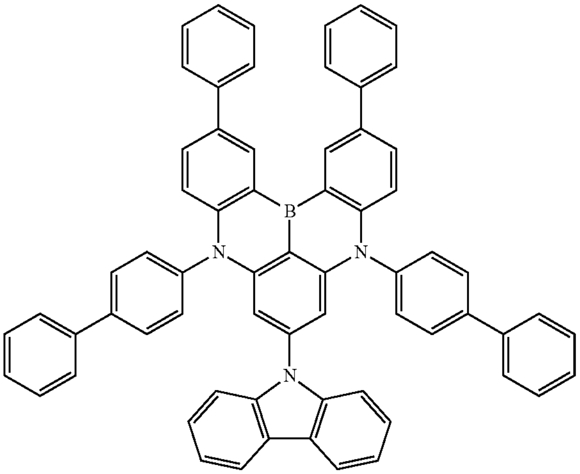

-continued

D4

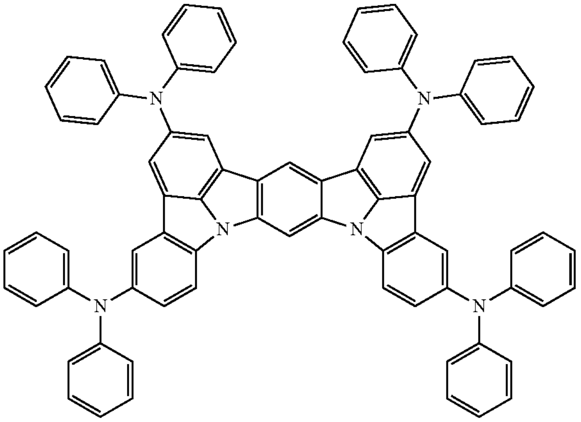

D5

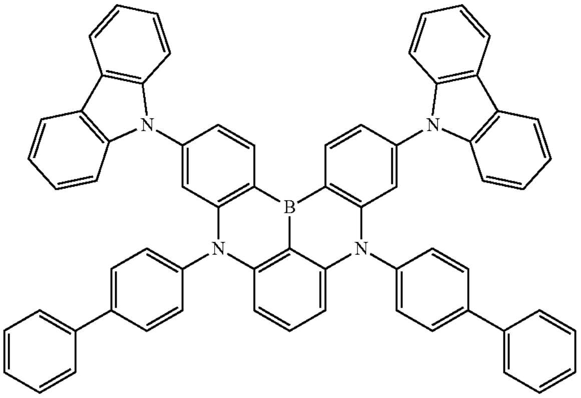

D6

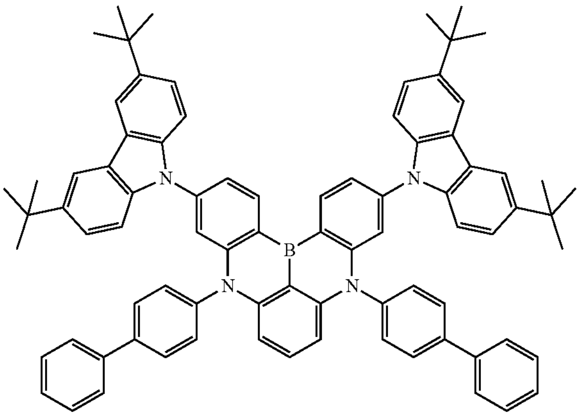

-continued
D7
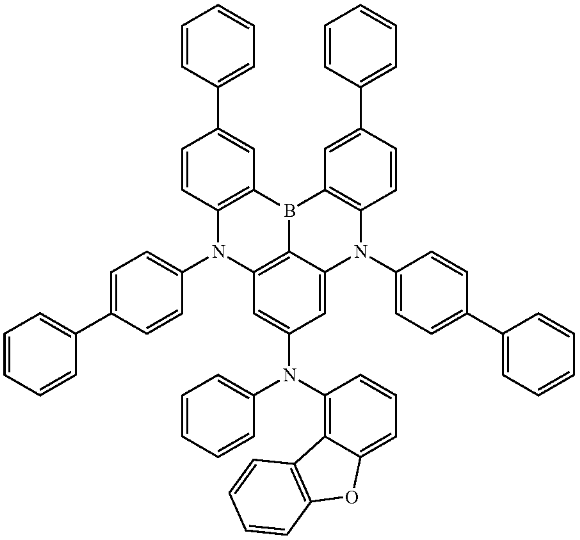
D8
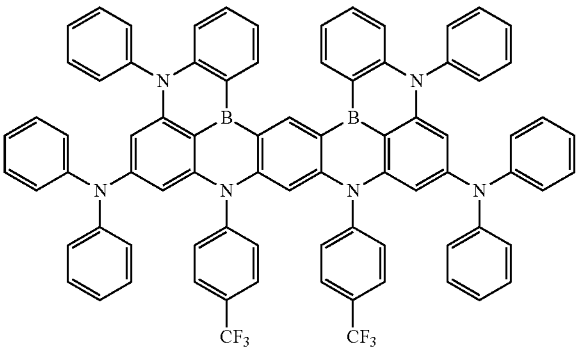
D9
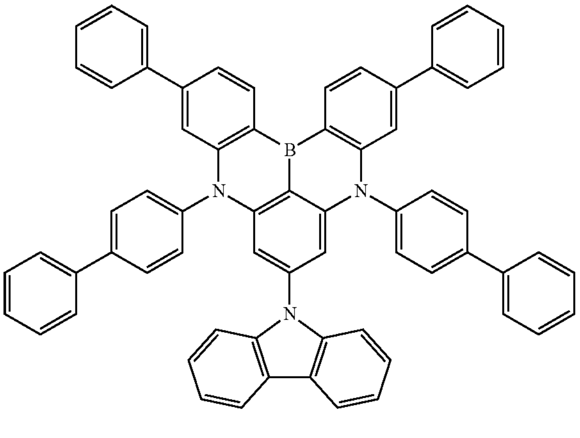
-continued
D10
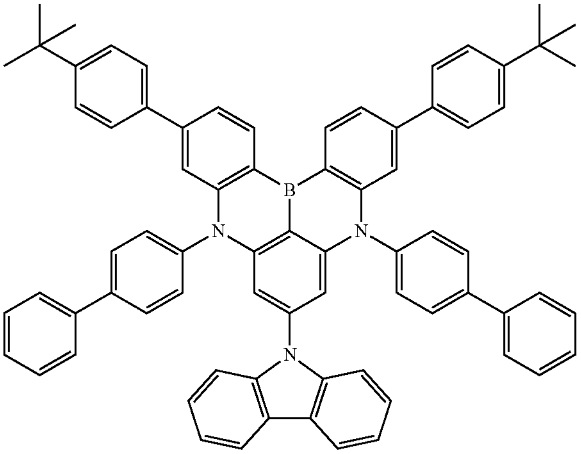
D11
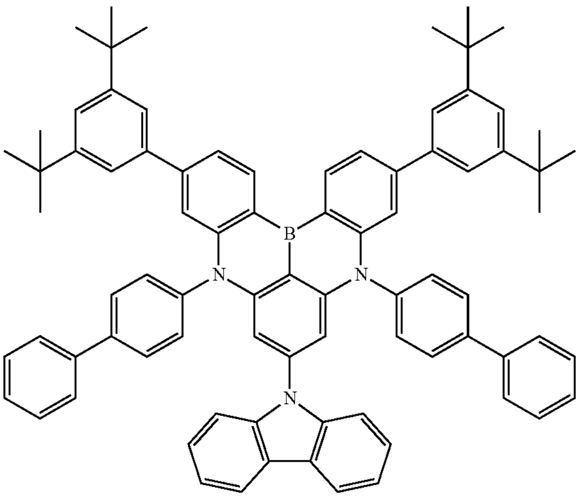
D12
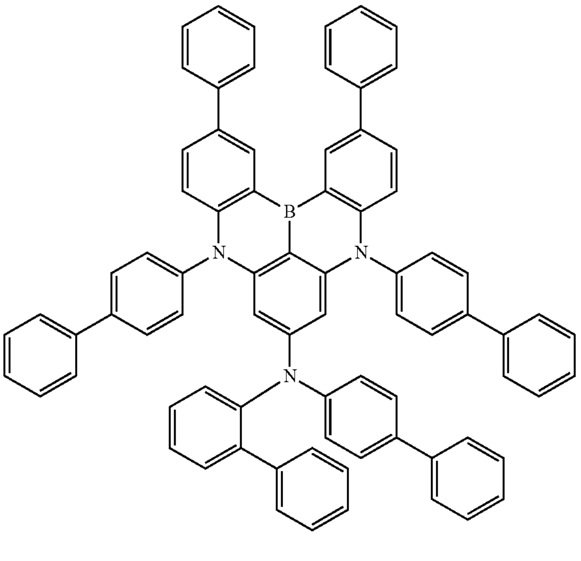

-continued
D13
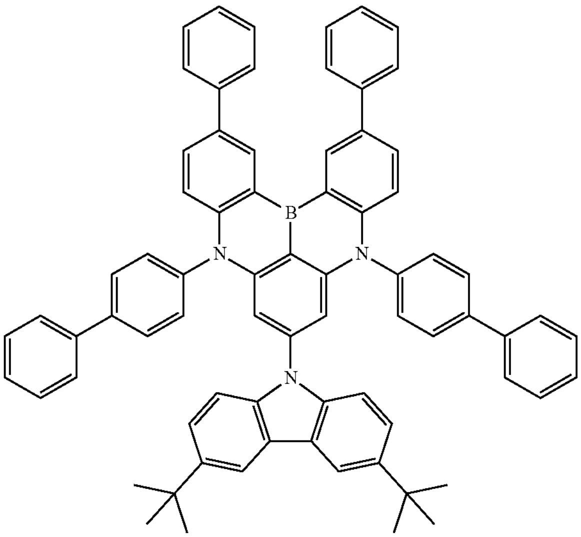
D14
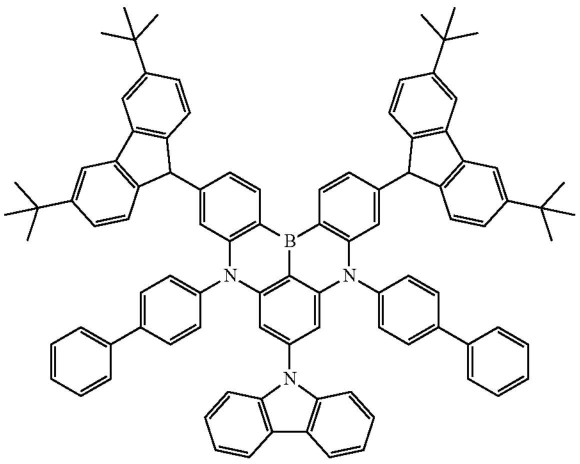
D15
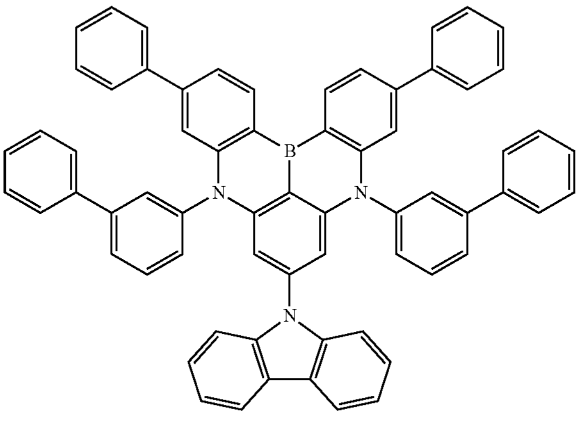
-continued
D16
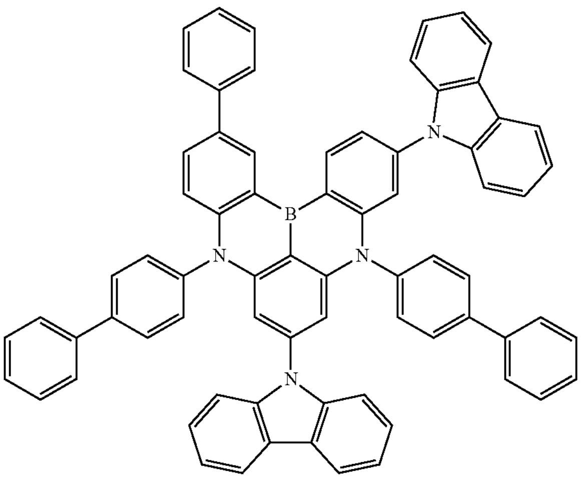
D17
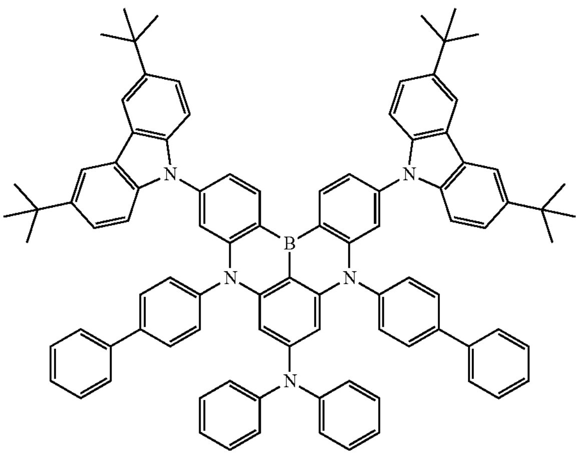
D18
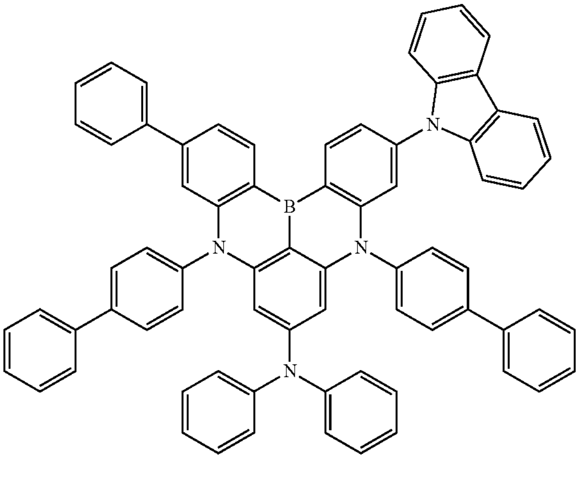

-continued
D19
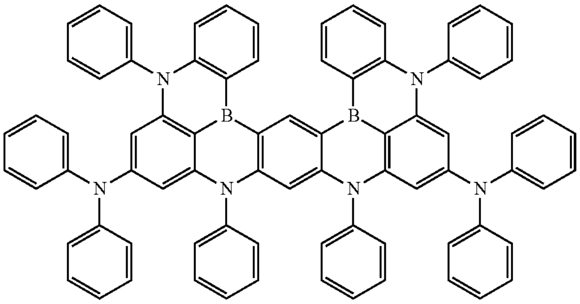
D20
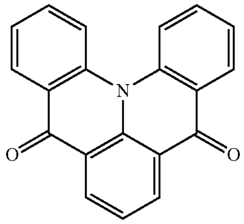
D21
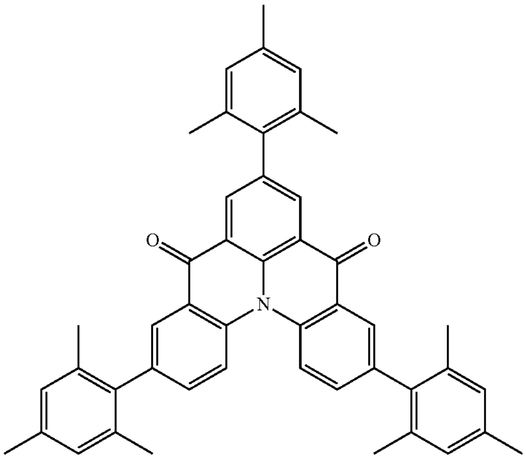
D22
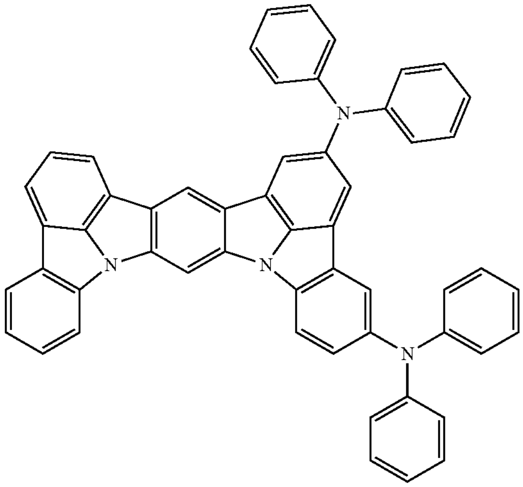
-continued
D23
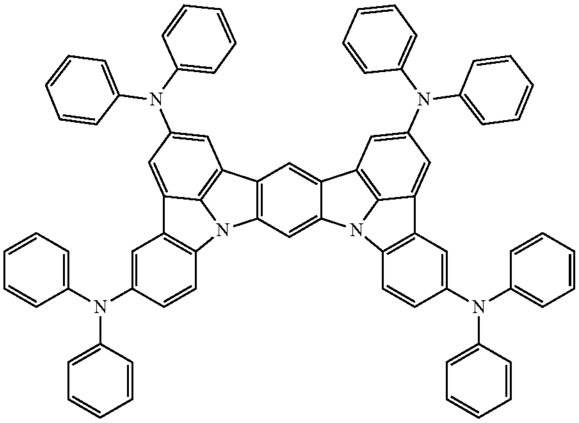
D24
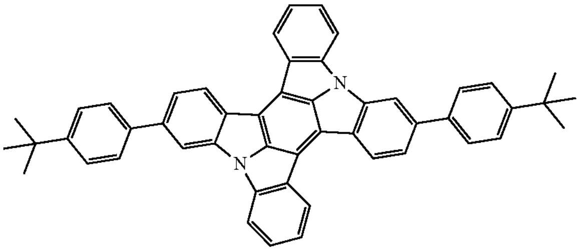
D25
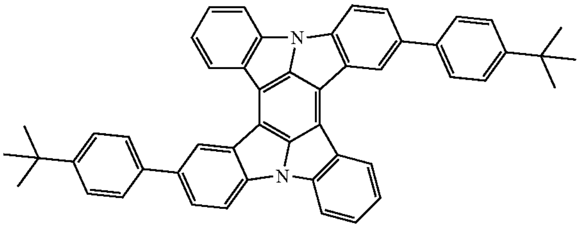
D26
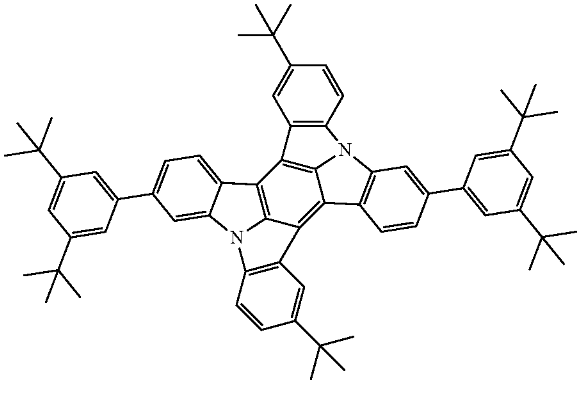

-continued

D27

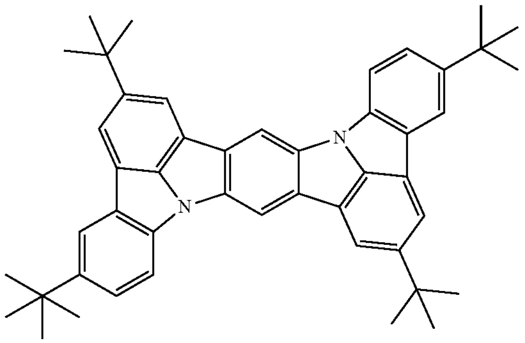

D28

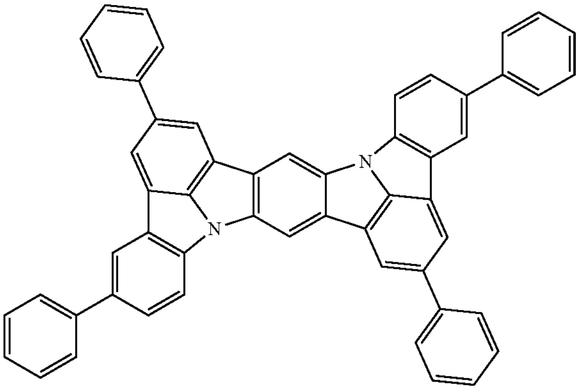

D29

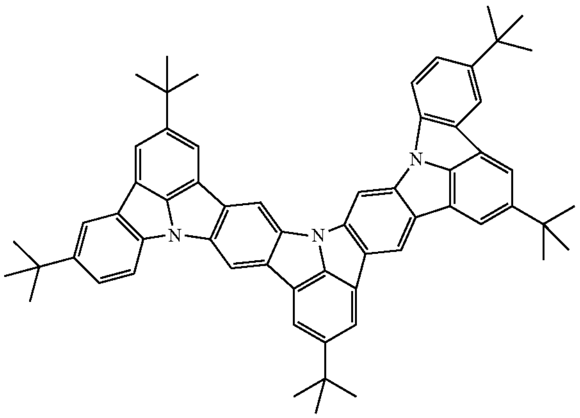

D30

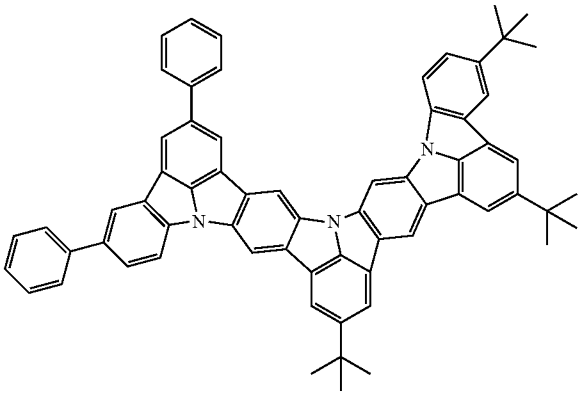

In an embodiment, an amount of the fourth compound included in the emission layer may be in a range of 0 wt % to about 5 wt %, based on the total weight of the emission layer.

Organic Light-Emitting Device

According to an aspect, an organic light-emitting device may include: a first electrode and a second electrode each having a surface opposite the other; and an intermediate layer disposed between the first electrode and the second electrode and including a first compound and a second compound, wherein the first compound may include a first silyl group-containing group and at least two carbazole-derived groups, wherein one carbazole-derived group may be bonded via a N atom to another carbazole-derived group, the second compound may include a second silyl group-containing group, a triazine group, and a carbazole-derived group, and at least one of the first compound or the second compound has a $T_1$ energy level of 2.81 eV or more.

According to another aspect, an organic light-emitting device may include: a first electrode and a second electrode each having a surface opposite the other; and an intermediate layer disposed between the first electrode and the second electrode, and including an emission layer including a first compound, a second compound, and a third compound, wherein the first compound may include a first silyl group-containing group and at least two carbazole-derived groups, wherein one carbazole-derived group of the at least two carbazole-derived groups may be bonded via a N atom to another carbazole-derived group, the second compound may include a second silyl group-containing group, which may be the same or different than the first silyl group-containing group, a triazine group, and a carbazole-derived group, and the third compound may include an organometallic compound represented by Formula 3 described above.

According to another aspect, an organic light-emitting device may include: a first electrode and a second electrode each having a surface opposite the other; and an intermediate layer disposed between the first electrode and the second electrode, the intermediate layer including an emission layer including a first compound, a second compound, and a fourth compound, wherein the first compound may include a first silyl group-containing group and at least two carbazole-derived groups, wherein one carbazole-derived group of the at least two carbazole-derived groups may be bonded via a N atom to another carbazole-derived group, the second compound may include a second silyl group-containing group, a triazine group, and a carbazole-derived group, and the fourth compound may include a polycyclic compound represented by Formula 4.

In this regard, the first compound, the second compound, the third compound, the fourth compound, and Formulae 3 and 4 are the same as described above.

As described above, the organic light-emitting device may include an emission layer including a third compound and/or a fourth compound together with a first compound and a second compound, and thus, may exhibit an improved or greater external quantum efficiency (EQE) and/or an improved or greater lifespan characteristics.

In an embodiment, an organic light-emitting device may include: a first electrode and a second electrode each having a surface opposite the other; and an intermediate layer disposed between the first electrode and the second electrode, the intermediate layer including an emission layer including a first compound, a second compound, a third compound, and a fourth compound, wherein the first compound may include a first silyl group-containing group and at least two carbazole-derived groups, wherein one carbazole-derived group of the at least two carbazole-derived groups may be bonded via a N atom to another carbazole-derived group, the second compound may include a second silyl group-containing group, a triazine group, and a carbazole-derived group, the third compound may include an organometallic compound represented by Formula 3 described above, and the fourth compound may include a polycyclic compound represented by Formula 4 described above.

In this case, the third compound may function as a sensitizer, and the fourth compound may function as a light-emitting dopant. We expect the sensitizer compound may receive excitons from the first compound and the second compound and then transfer the excitons to the light-emitting dopant as described in greater detail below. It is to be understood that the structural or functional roles the sensitizer may contribute to the intermediate layer and the improved performance of a device is not to be limited by this discussion.

In an embodiment, excitons may be transferred from the sensitizer to the light-emitting dopant compound through a dexter energy transfer (DET) or Forster resonance energy transfer (FRET) mechanism. The excitons transferred to the light-emitting dopant compound may then transition to a ground state and emit light. In this regard, the excitons of the sensitizer may be transferred from the host compound (for example, the first compound and/or the second compound) to the dopant by the FRET mechanism, or may be directly transferred from the host to the dopant by the DET mechanism.

As a result, energy transfer between the sensitizer and the light-emitting dopant may be facilitated by the FRET and DET mechanisms, and a high-efficiency organic light-emitting device may be easily manufactured by suppressing triplet-triplet annihilation.

The first compound, the second compound, the third compound, and the fourth compound may be disposed in an intermediate layer that is disposed between a pair of electrodes of an organic light-emitting device. For example, the first compound, the second compound, the third compound, and the fourth compound may be included in an emission layer. In this regard, the first compound and the second compound may function as a host, and may further include the third compound and the fourth compound as a dopant or a sensitizer. The emission layer may emit light, for example, blue light.

In an embodiment, the total amount of the first compound and the second compound may be greater than the total amount of the third compound and the fourth compound.

In an embodiment, the emission layer may include a host and a dopant, and the host may include two different host compounds. The host may include a hole-transporting host compound and an electron-transporting host compound, the first compound may be the hole-transporting host compound, and the second compound may be the electron-transporting compound.

In one or more embodiments, blue light may be emitted from the emission layer.

The dopant may be a fluorescent dopant or a phosphorescent dopant. For example, the phosphorescent dopant may include the third compound described above, and the fluorescent dopant may include the fourth compound described above.

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, in the organic light-emitting device, the first electrode may be an anode, and the second electrode may be a cathode, and the intermediate layer may further include a hole transport region located between the first electrode and the emission layer and an electron transport region located between the emission layer and the second electrode, and the hole transport region may include a hole injection layer, a hole transport layer, an electron blocking layer, an emission auxiliary layer, or any combination thereof, and the electron transport region may include a buffer layer, a hole blocking layer, an electron transport layer, an electron injection layer, or any combination thereof.

The term "intermediate layer" used herein refers to a single layer or a plurality of layers between the first electrode and the second electrode of the organic light-emitting device. The "intermediate layer" may include, in addition to an organic compound, an organometallic complex including metal.

Description of FIG. 1

FIG. 1 is a schematic cross-sectional representation of an organic light-emitting device 10 according to an embodiment. Hereinafter, the structure and manufacturing method of the organic light-emitting device 10 according to an embodiment of the present disclosure will be described in connection with FIG. 1.

The organic light-emitting device 10 of FIG. 1 includes a first electrode 11 and a second electrode 19 each having a surface opposite the other, and an intermediate layer, shown collectively, as layers or regions 12, 15, and 17, disposed between the first electrode 11 and the second electrode 19.

The intermediate layer includes an emission layer 15, a hole transport region 12 is disposed between the first electrode 11 and the emission layer 15, and an electron transport region 17 is disposed between the emission layer 15 and the second electrode 19.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

[First Electrode 11]

The first electrode 11 may be formed by, for example, by depositing or sputtering a material for forming the first electrode 11 on the substrate. The first electrode 11 may be an anode. The material for forming the first electrode 11 may include materials with a high work function to facilitate hole injection.

The first electrode 11 may be a reflective electrode, a semi-transmissive electrode, or a transmissive electrode. When the first electrode 11 is a transmissive electrode, the material for forming the first electrode 11 may include indium tin oxide (ITO), indium zinc oxide (IZO), tin oxide ($SnO_2$), zinc oxide (ZnO), or any combinations thereof. In one or more embodiments, when the first electrode 11 is a semi-transmissive electrode or a reflective electrode, the material for forming the first electrode 11 may include magnesium (Mg), silver (Ag), aluminum (Al), aluminum-lithium (Al—Li), calcium (Ca), magnesium-indium (Mg—In), magnesium-silver (Mg—Ag), or any combination thereof.

The first electrode 11 may have a single-layered structure or a multi-layered structure including two or more layers.

[Emission Layer 15]

A thickness of the emission layer 15 may be in a range of about 100 Å to about 3,000 Å, for example, about 100 Å to about 1,000 Å, or about 200 Å to about 600 Å. When the thickness of the emission layer is within the range described above, excellent luminescence characteristics may be obtained without a substantial increase in driving voltage.

[Host in Emission Layer 15]

A host in the emission layer 15 may include a hole-transporting host compound and an electron-transporting host compound of different structures. For example, the hole-transporting host compound may include the first compound described above, and the electron-transporting host compound may include the second compound described above.

The host may not include a transition metal.

[Dopant in Emission Layer 15]

A dopant in the emission layer may be a phosphorescent or fluorescent dopant. For example, the phosphorescent dopant may include the third compound described above, and the fluorescent dopant may include the fourth compound described above.

An amount (weight) of the dopant in the emission layer 15 may be in a range of about 0.1 parts by weight to about 20 parts by weight based on 100 parts by weight of the emission layer 15.

[Hole Transport Region 12]

The hole transport region 12 is located between the first electrode 11 and the emission layer 15 of the organic light-emitting device 10.

The hole transport region 12 may have a single-layered structure or a multi-layered structure. For example, the hole transport region 12 may have a hole injection layer, a hole transport layer, a hole injection layer/hole transport layer structure, a hole injection layer/first hole transport layer/second hole transport layer structure, a hole injection layer/first hole transport layer/second hole transport layer/electron blocking layer structure, a hole transport layer/organic layer structure, a hole injection layer/hole transport layer/organic layer structure, a hole transport layer/electron blocking layer structure, or a hole injection layer/hole transport layer/electron blocking layer structure.

The hole transport region 12 may include any compound having hole-transporting characteristics.

For example, the hole transport region 12 may include an amine-based compound.

In an embodiment, the hole transport region 12 may include m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), one of compounds represented by Formulae 201 to 205, or any combination thereof:

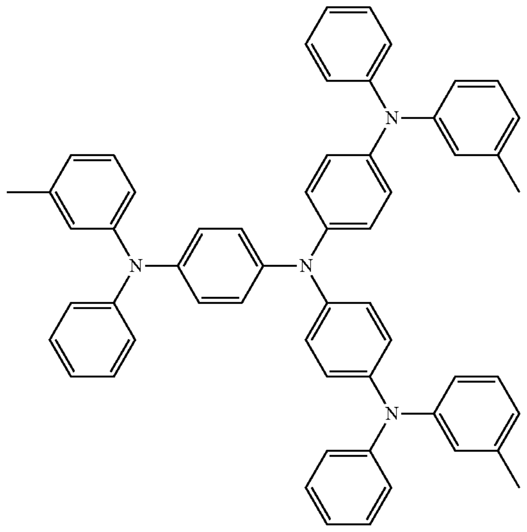

m-MTDATA

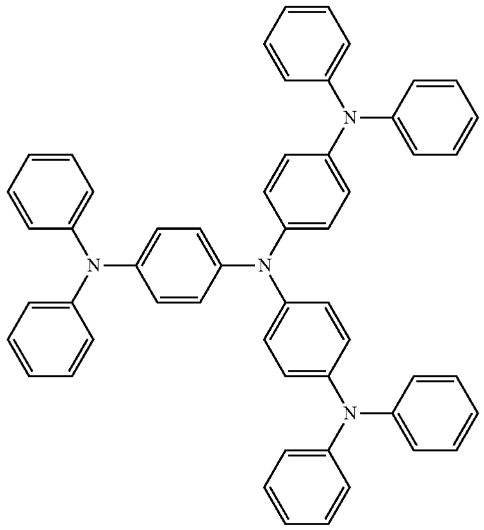

TDATA

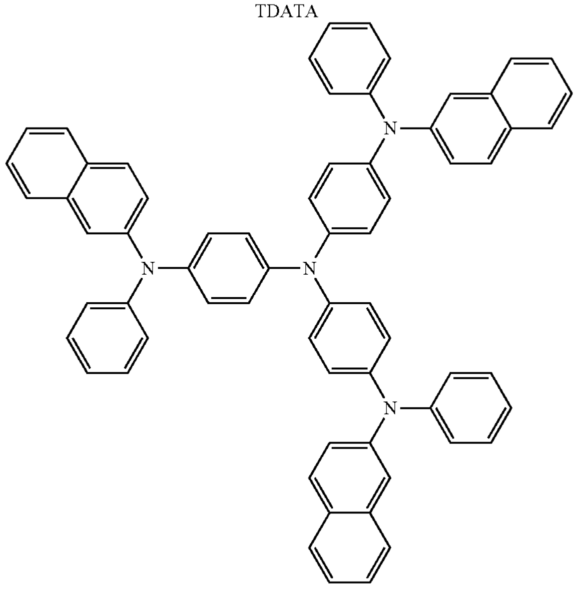

2-TNATA

-continued
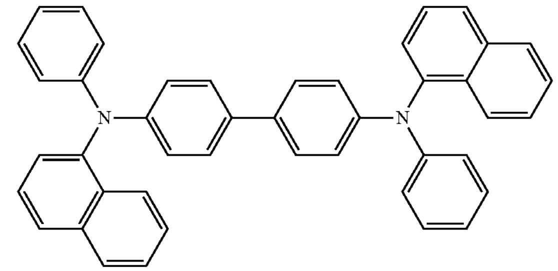
NPB
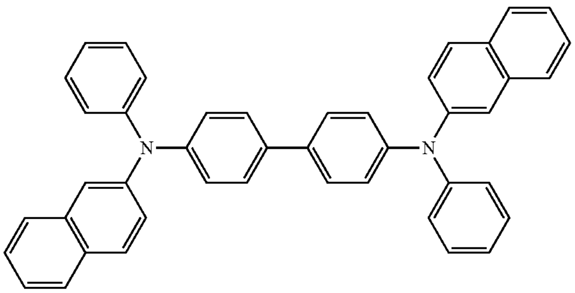
β-NPB
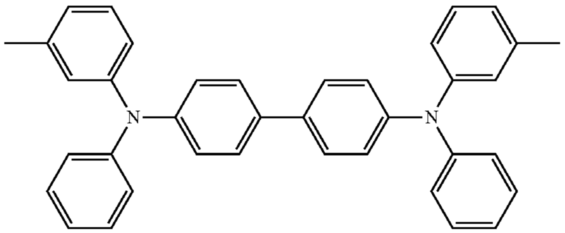
TPD
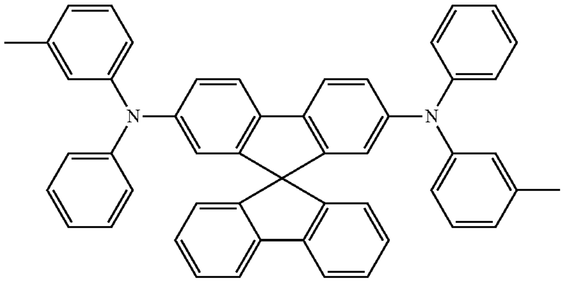
Spiro-TPD
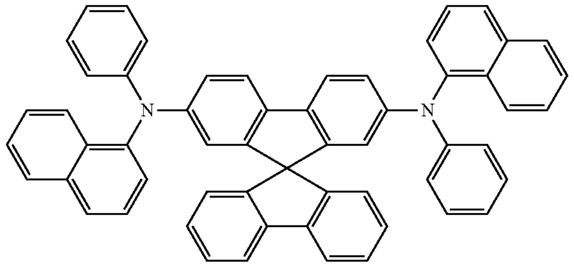
Spiro-NPB
-continued
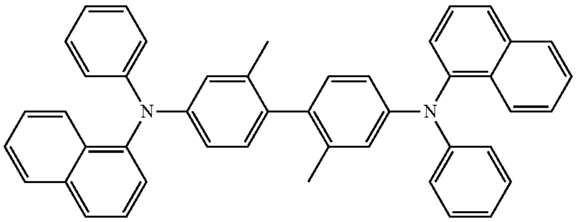
methylated NPB
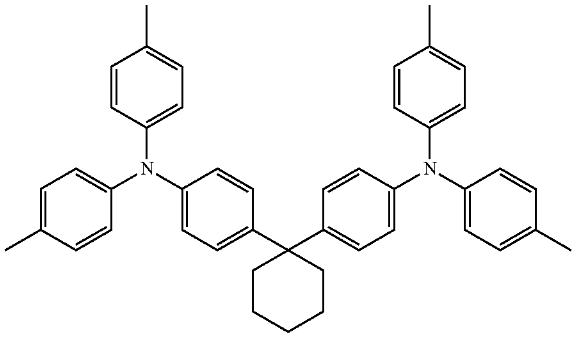
TAPC
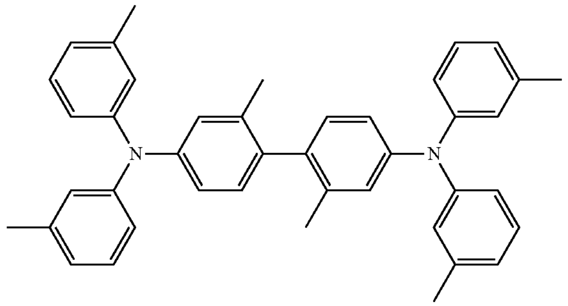
HMTPD
Formula 201
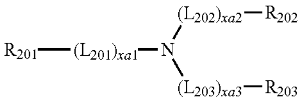
Formula 202
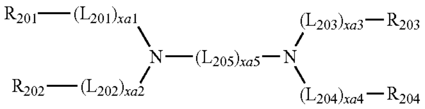
Formula 203
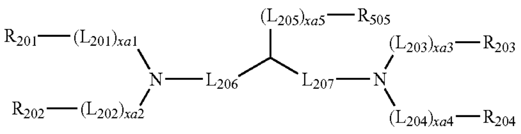
Formula 204
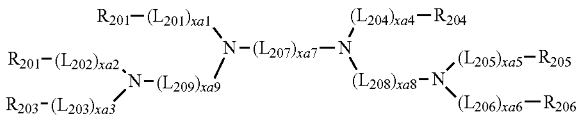

-continued

Formula 205

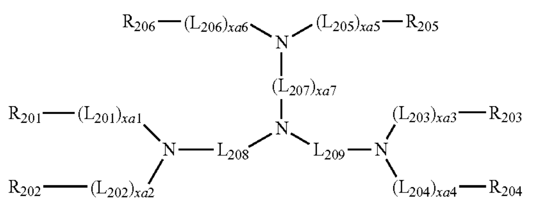

wherein, in Formulae 201 to 205, $L_{201}$ to $L_{209}$ may each independently be *—O—*', *—S—*', a substituted or unsubstituted $C_5$-$C_{60}$ carbocyclic group, or a substituted or unsubstituted $C_1$-$C_{60}$ heterocyclic group, xa1 to xa9 may each independently be an integer from 0 to 5, and $R_{201}$ to $R_{206}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein neighboring two groups of $R_{201}$ to $R_{206}$ may optionally be linked to each other via a single bond, a dimethyl-methylene group, or a diphenyl-methylene group.

$L_{201}$ to $L_{209}$ may each independently be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a corogen group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a quaterphenyl group, —$Si(Q_{11})(Q_{12})(Q_{13})$, or any combination thereof, xa1 to xa9 may each independently be 0, 1, or 2, and $R_{201}$ to $R_{206}$ may each independently be a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an indeno carbazolyl group, an indolocarbazolyl group, a benzofurocarbazolyl group, or a benzothienocarbazolyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —$Si(Q_{31})(Q_{32})(Q_{33})$, —$N(Q_{31})(Q_{32})$, or any combination thereof.

$Q_{11}$ to $Q_{13}$ and $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In an embodiment, the hole transport region 12 may include a carbazole-containing amine-based compound.

In one or more embodiments, the hole transport region 12 may include a carbazole-containing amine-based compound and a carbazole-free amine-based compound.

The carbazole-containing amine-based compound may include, for example, compounds represented by Formula 201 including a carbazole group and further including at least one of a dibenzofuran group, a dibenzothiophene group, a fluorene group, a spiro-bifluorene group, an indenocarbazole group, an indolocarbazole group, a benzofurocarbazole group, or a benzothienocarbazole group.

The carbazole-free amine-based compound may include, for example, compounds represented by Formula 201 not including a carbazole group and including at least one of a dibenzofuran group, a dibenzothiophene group, a fluorene group, a spiro-bifluorene group, an indenocarbazole group, an indolocarbazole group, a benzofurocarbazole group, or a benzothienocarbazole group.

In one or more embodiments, the hole transport region 12 may include a compound represented by Formula 201, a compound represented by Formula 202, or any combination thereof.

In an embodiment, the hole transport region 12 may include a compound represented by Formula 201-1, 202-1, or 201-2, or any combination thereof:

Formula 201-1

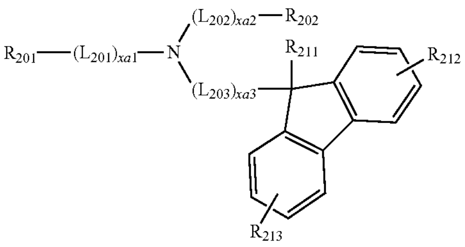

Formula 202-1

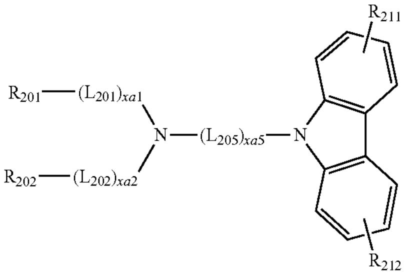

-continued

Formula 201-2

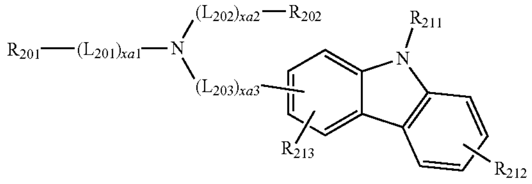

wherein, in Formulae 201-1, 202-1, and 201-2, $L_{201}$ to $L_{203}$, $L_{205}$, xa1 to xa3, xa5, $R_{201}$, and $R_{202}$ are each the same as described in the present specification, and $R_{211}$ to $R_{213}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a dimethylfluorenyl group, a diphenylfluorenyl group, a triphenylenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, or a pyridinyl group.

For example, the hole transport region 12 may include one of Compounds HT1 to HT39 or any combination thereof:

HT1

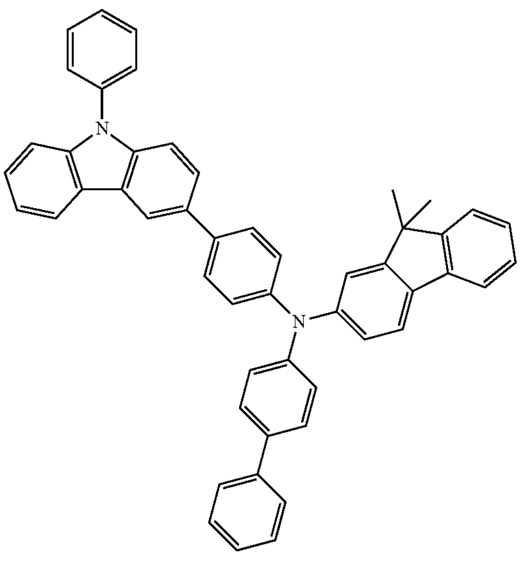

HT2

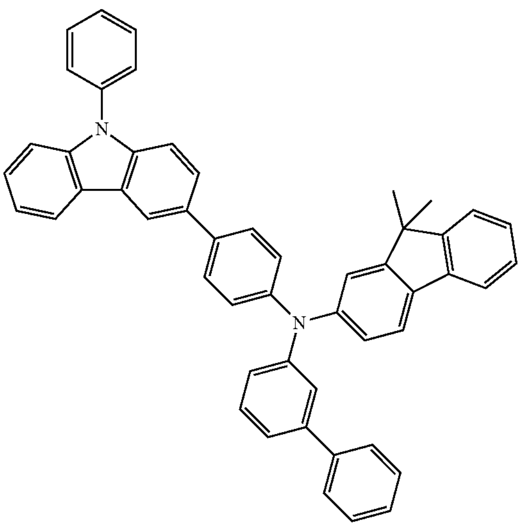

-continued
HT3
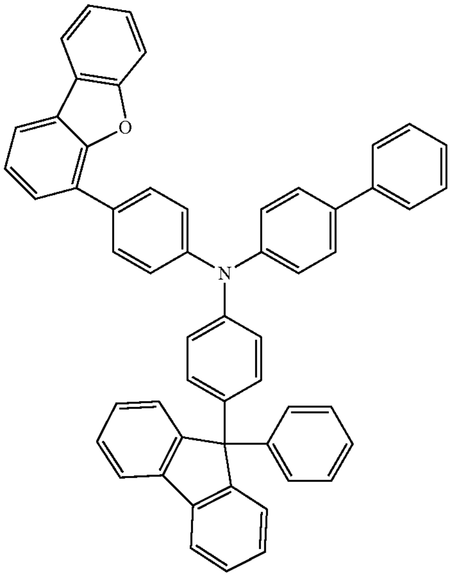
HT4
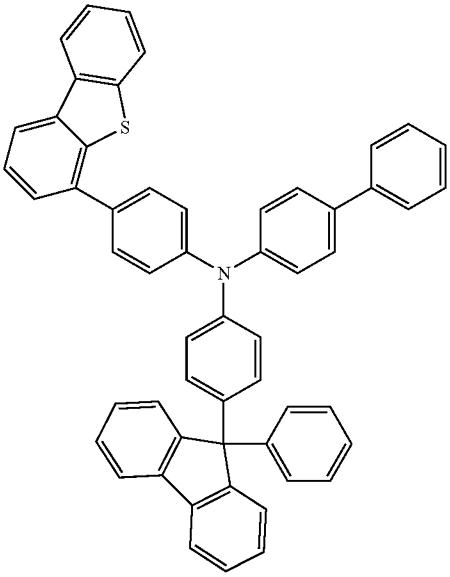
HT5
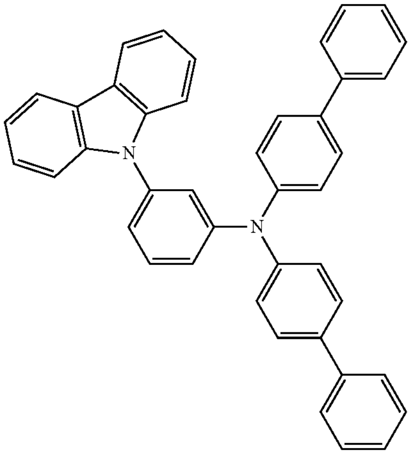
HT6
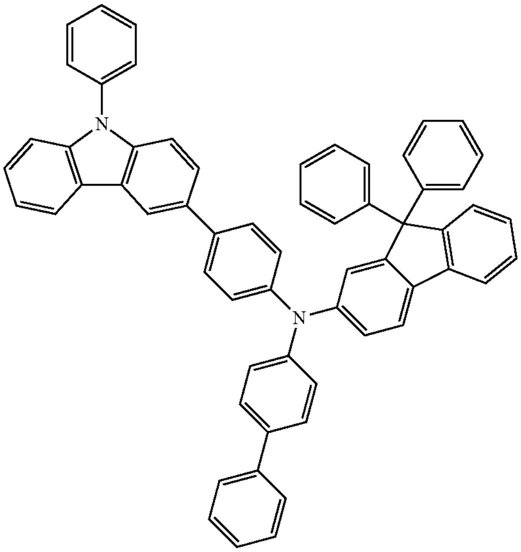

-continued
HT7
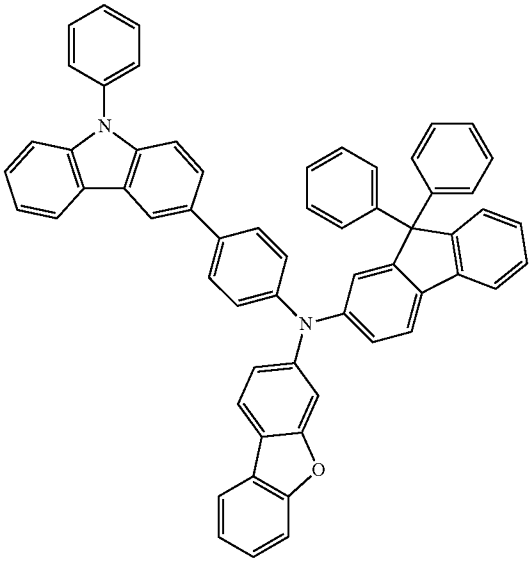
HT8
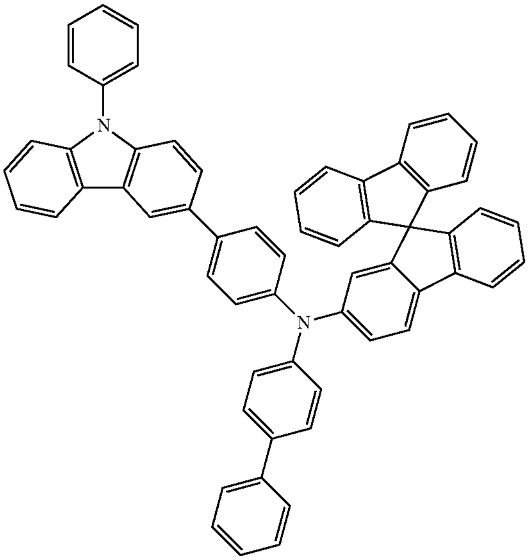
HT9
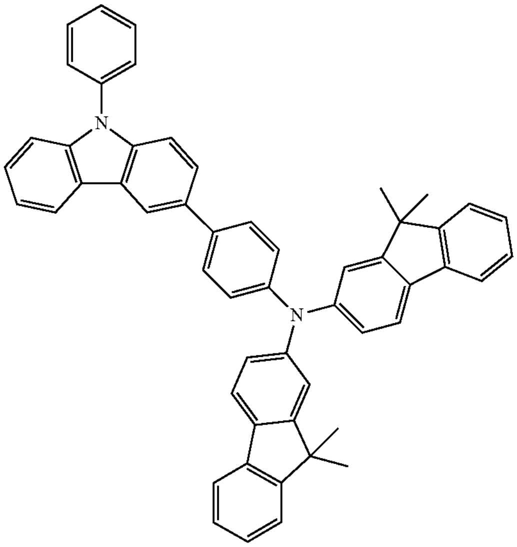
HT10
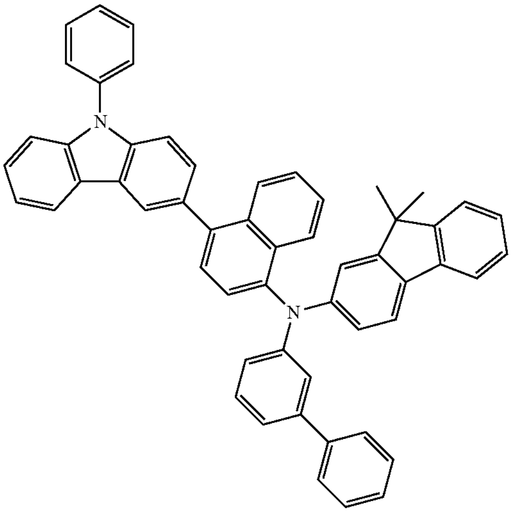
HT11
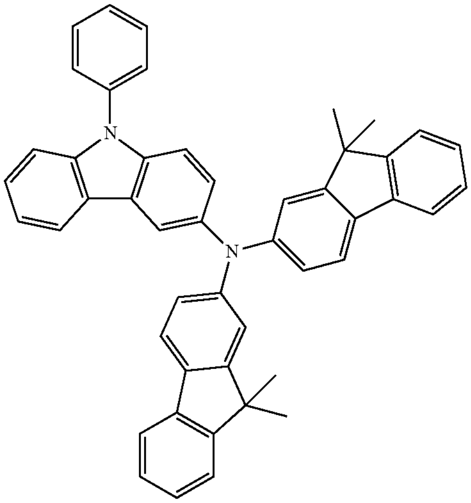
HT12
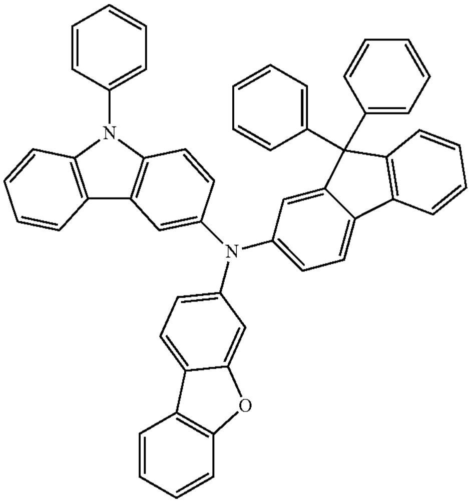

-continued
HT13
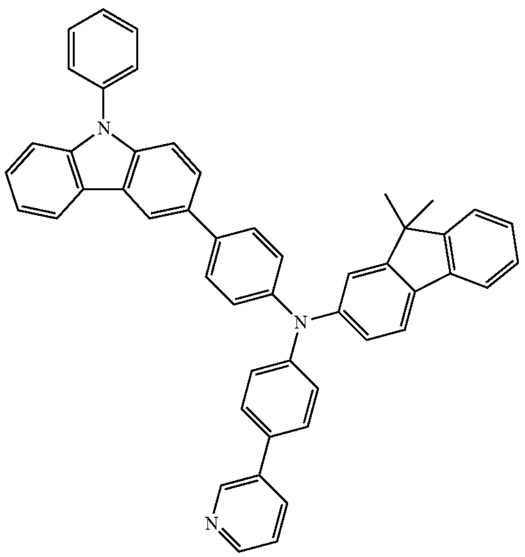
HT14
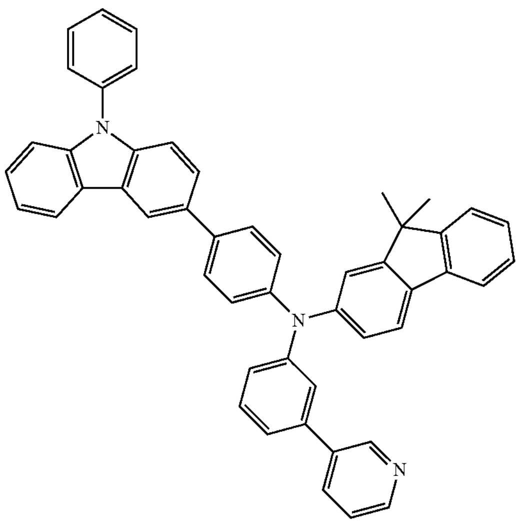
HT15
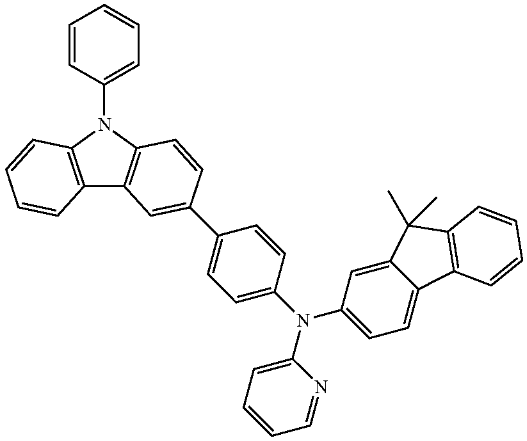
HT16
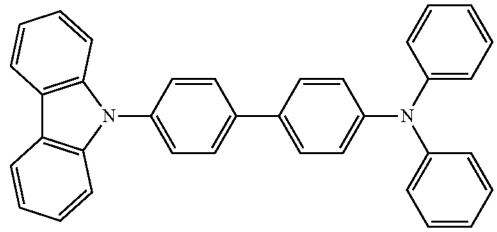
HT17
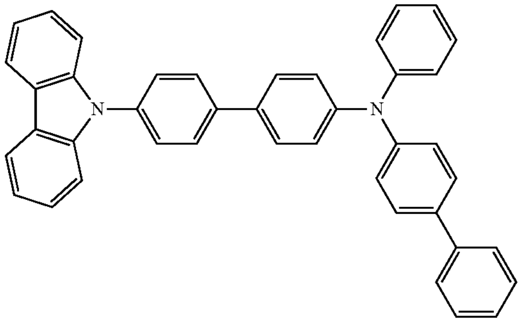
HT18
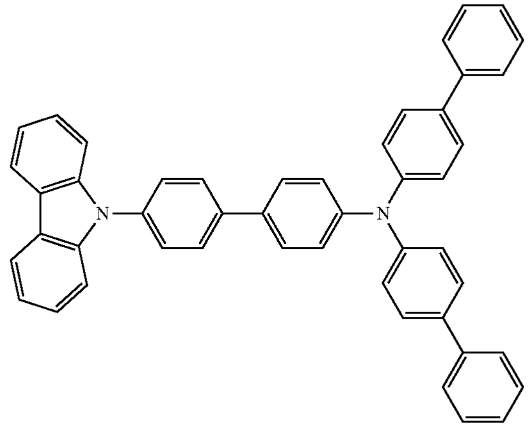

-continued
HT19
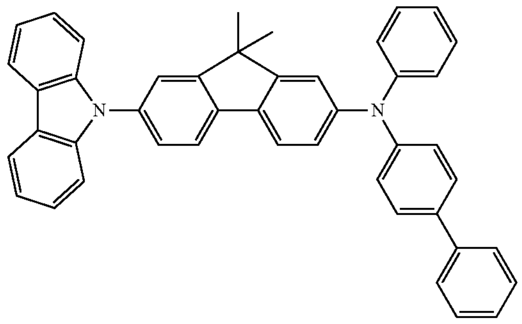
HT20
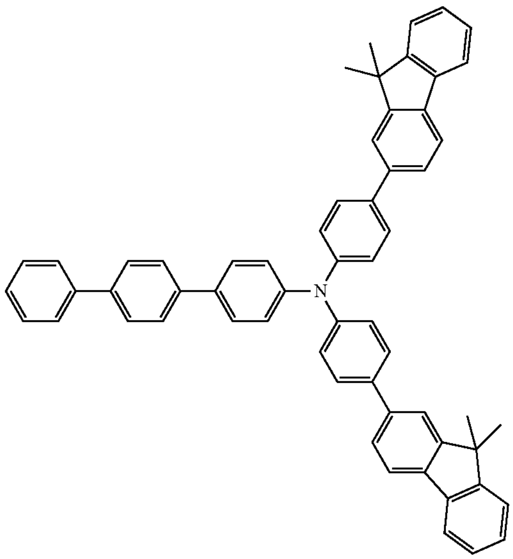
HT21
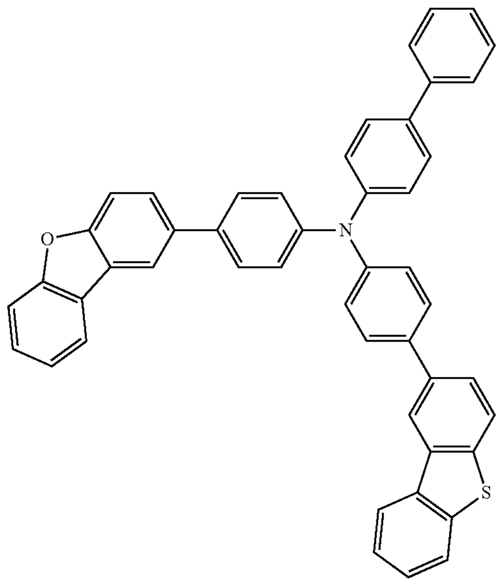
HT22
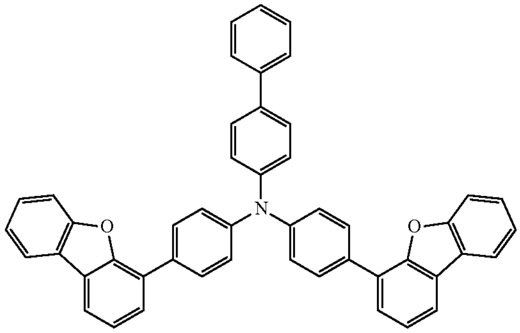
HT23
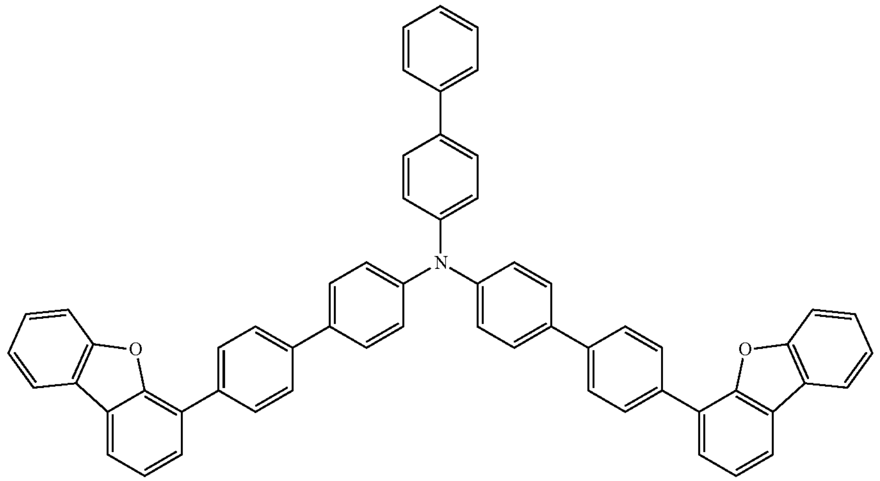

-continued
HT24
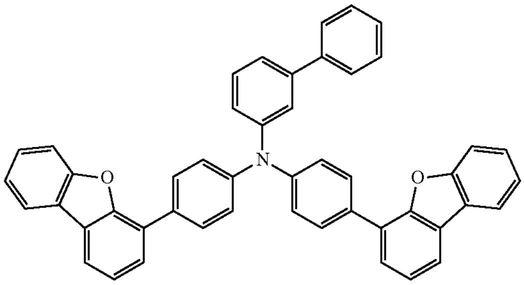
HT25
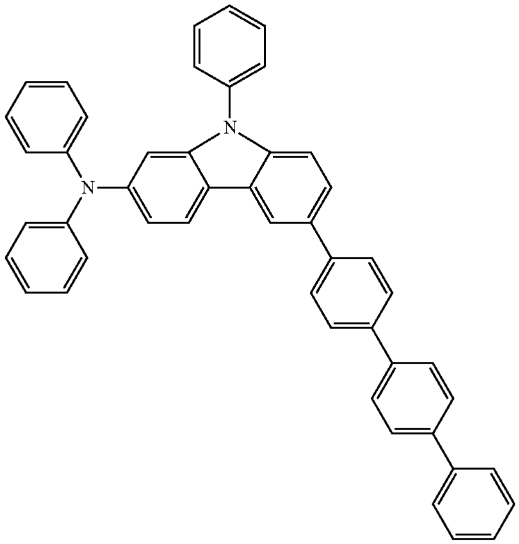
HT26
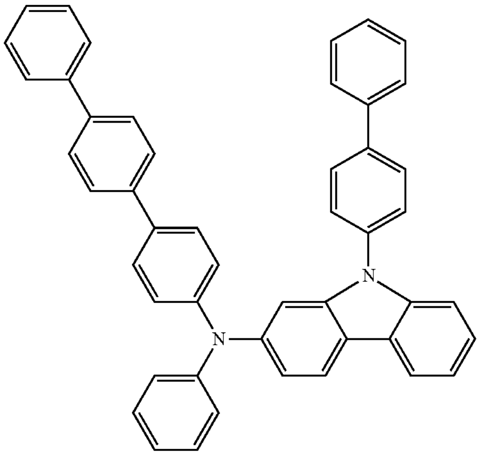
HT27
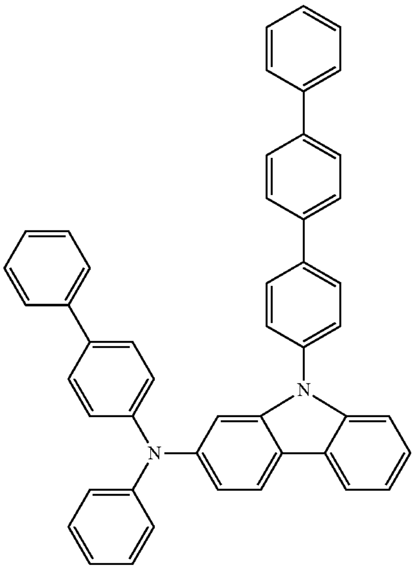
HT28
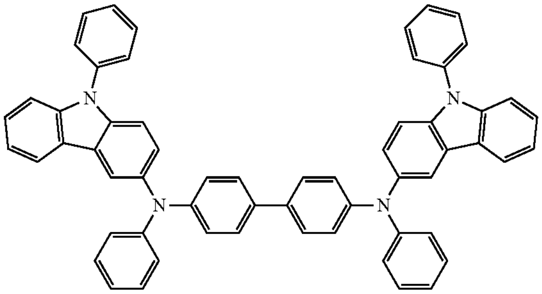
HT29
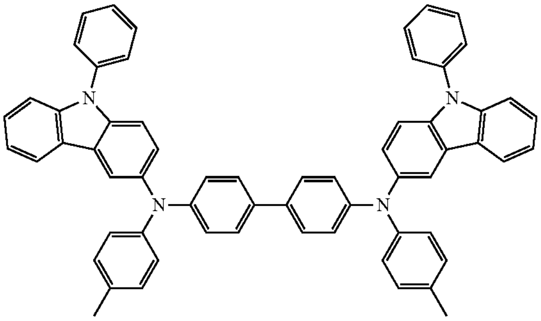

-continued
HT30
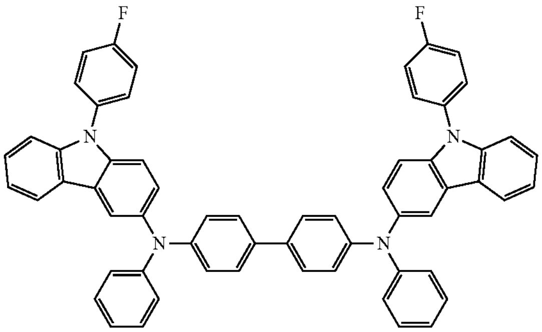
HT31
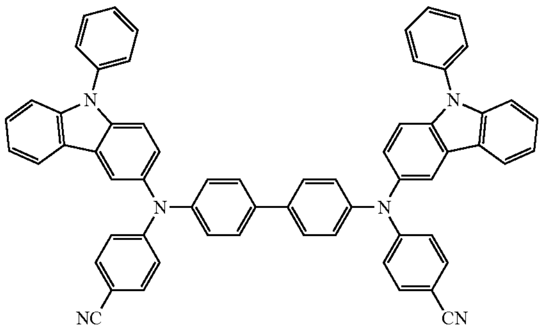
HT32
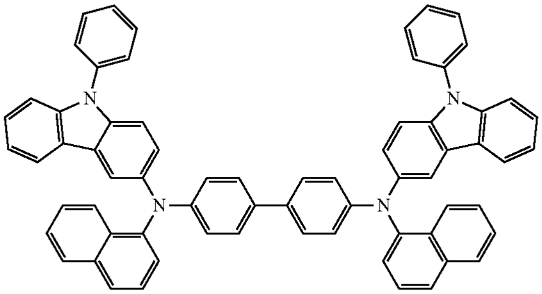
HT33
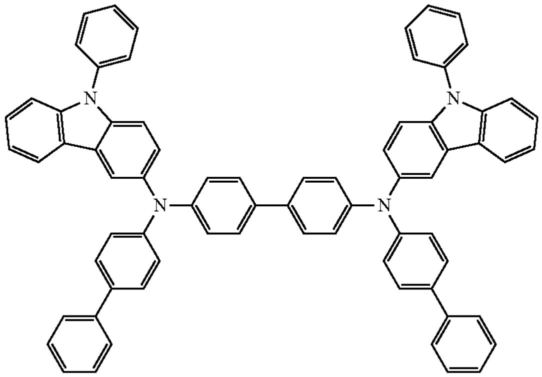
HT34
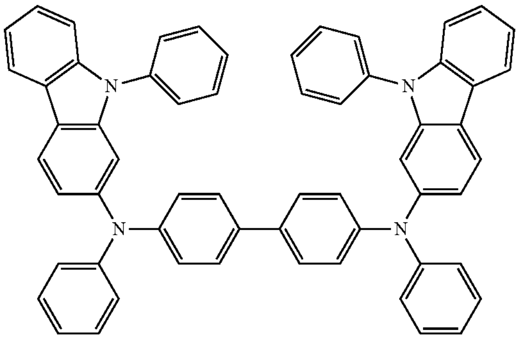
HT35
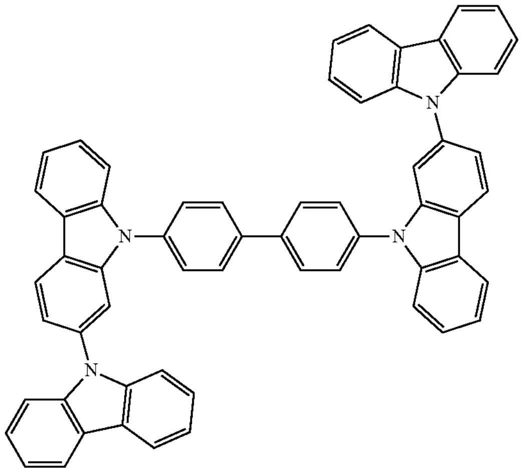

-continued

HT36

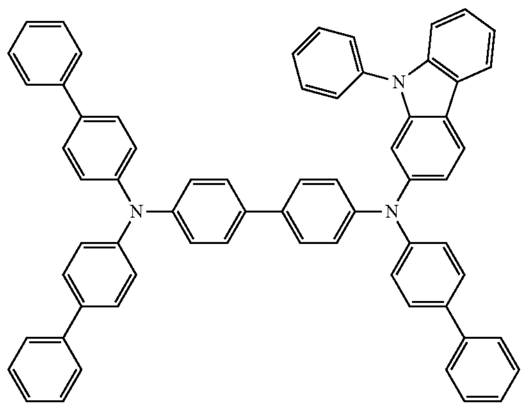

HT37

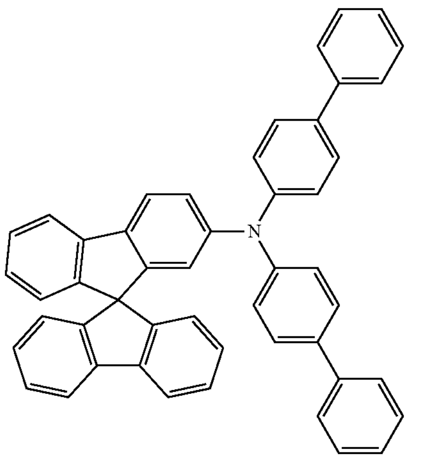

HT38

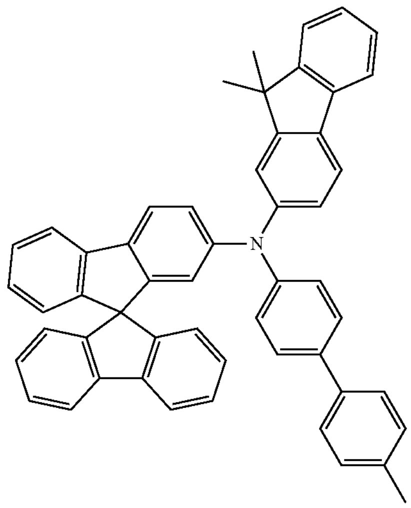

HT39

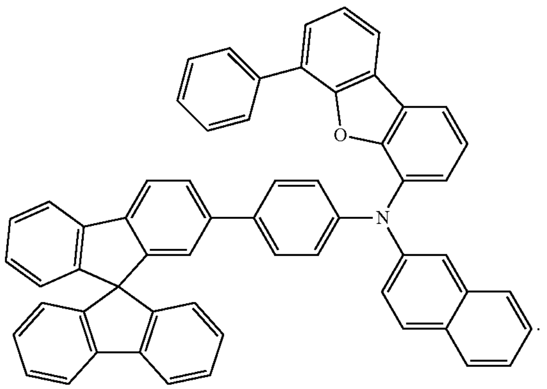

In one or more embodiments, the hole transport region 12 of the organic light-emitting device 10 may further include a p-dopant. When the hole transport region 12 further includes a p-dopant, the hole transport region 12 may have a matrix (for example, at least one of compounds represented by Formulae 201 to 205) and a p-dopant included in the matrix. The p-dopant may be uniformly or non-uniformly doped in the hole transport region 12.

In an embodiment, a lowest unoccupied molecular orbital (LUMO) energy level of the p-dopant may be −3.5 eV or less.

The p-dopant may include a quinone derivative, a metal oxide, a cyano group-containing compound, or any combination thereof.

For example, the p-dopant may include:

a quinone derivative, such as tetracyanoquinodimethane (TCNQ), 2,3,5,6-tetrafluoro-7,7,8,8-tetracyanoquinodimethane (F4-TCNQ), or F6-TCNNQ;

a metal oxide, such as a tungsten oxide or a molybdenum oxide;

1,4,5,8,9,12-hexaazatriphenylene-hexacarbonitrile (HAT-CN);

a compound represented by Formula 221; or any combination thereof:

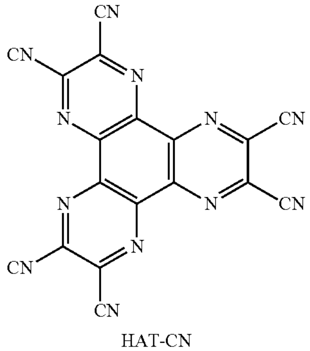

HAT-CN

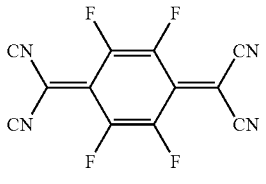

F4-TCNQ

-continued

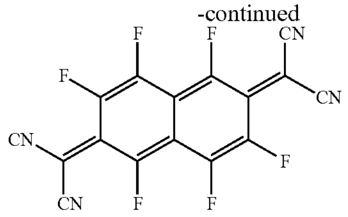

F6-TCNNQ

Formula 221

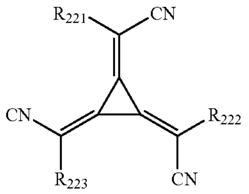

wherein, in Formula 221, $R_{221}$ to $R_{223}$ may each independently a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, wherein at least one substituent of $R_{221}$ to $R_{223}$ may be: a cyano group; —F; —Cl; —Br; —I; a $C_1$-$C_{20}$ alkyl group substituted with —F; a $C_1$-$C_{20}$ alkyl group substituted with —Cl; a $C_1$-$C_{20}$ alkyl group substituted with —Br; a $C_1$-$C_{20}$ alkyl group substituted with —I; or any combination thereof.

The compound represented by Formula 221 may include, for example, Compound HT-D2:

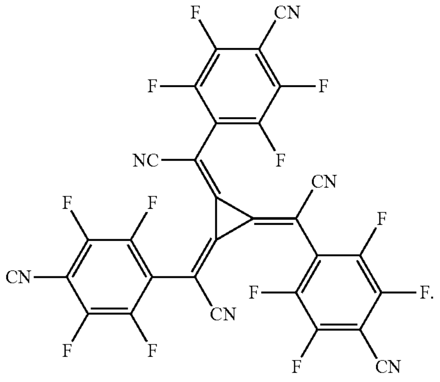

HT-D2

The hole transport region 12 may have a thickness in a range of about 100 Å to about 10,000 Å, for example, about 400 Å to about 2,000 Å, and the emission layer 15 may have a thickness in a range of about 100 Å to about 3,000 Å, for example, about 300 Å to about 1,000 Å. When the thicknesses of the hole transport region 12 and the emission layer 15 are within the ranges described above, satisfactory hole-transporting characteristics and/or luminescence characteristics may be obtained without a substantial increase in driving voltage.

The hole transport region 12 may further include a buffer layer.

The buffer layer may compensate for an optical resonance distance according to a wavelength of light emitted from the emission layer 15 to increase efficiency.

The hole transport region 12 may further include an electron blocking layer. The electron blocking layer may include a known material, for example, mCP or DBFPO:

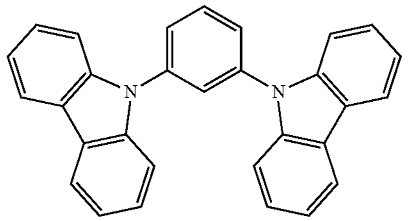

mCP

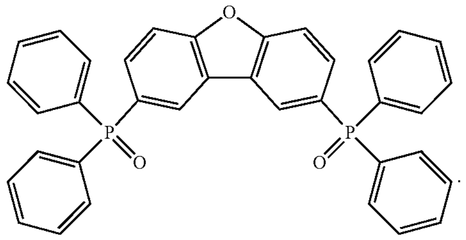

DBFPO

[Electron Transport Region 17]

The electron transport region 17 is disposed between the emission layer 15 and the second electrode 19 of the organic light-emitting device 10.

The electron transport region 17 may have a single-layered structure or a multi-layered structure.

For example, the electron transport region 17 may have an electron transport layer, an electron transport layer/electron injection layer structure, a buffer layer/electron transport layer structure, hole blocking layer/electron transport layer structure, a buffer layer/electron transport layer/electron injection layer structure, or a hole blocking layer/electron transport layer/electron injection layer structure. The electron transport region 17 may further include an electron control layer.

The electron transport region 17 may include a known electron transport material.

The electron transport region 17 (for example, a buffer layer, a hole blocking layer, an electron control layer, or an electron transport layer in the electron transport region) may include a metal-free compound containing at least one π electron-deficient nitrogen-containing $C_1$-$C_{60}$ cyclic group. The π electron-deficient nitrogen-containing $C_1$-$C_{60}$ cyclic group is the same as described in the present specification.

For example, the electron transport region 17 may include a compound represented by Formula 601:

$$[Ar_{601}]_{xe11}\text{-}[(L_{601})_{xe1}\text{-}R_{601}]_{xe21} \quad \text{Formula 601}$$

wherein, in Formula 601, $Ar_{601}$ and $L_{601}$ may each independently be a $C_5$-$C_{60}$ carbocyclic group unsubstituted or substituted with at least one $R_{601a}$ or a $C_1$-$C_{60}$ heterocyclic group unsubstituted or substituted with at least one $R_{601a}$, xe11 may be 1, 2, or 3, xe1 may be an integer from 0 to 5, $R_{601a}$ and $R_{601}$ may each independently be a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{601}$)($Q_{602}$)($Q_{603}$)-, —C(═O)($Q_{601}$), —S(═O)$_2$($Q_{601}$), or —P(═O)($Q_{601}$)($Q_{602}$), $Q_{601}$ to $Q_{603}$ may each independently be a $C_1$-$C_{10}$ alkyl group, a $C_1$-$C_{10}$ alkoxy group, a phenyl group, a biphenyl group, a terphenyl group, or a naphthyl group, and xe21 may be an integer from 1 to 5.

In an embodiment, at least one of $Ar_{601}$(s) in the number of xe11 and $R_{601}$(s) in the number of xe21 may include the π electron-deficient nitrogen-containing $C_1$-$C_{60}$ cyclic group.

In an embodiment, $Ar_{601}$ and $L_{601}$ in Formula 601 may each independently be a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, —Si($Q_{31}$)($Q_{32}$)($Q_{33}$), —S(═O)$_2$($Q_{31}$), —P(═O)($Q_{31}$)($Q_{32}$), or any combination thereof, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

When xe11 in Formula 601 is 2 or more, two or more of $Ar_{601}$(s) may be linked to each other via a single bond.

In one or more embodiments, $Ar_{601}$ in Formula 601 may be an anthracene group.

In one or more embodiments, the compound represented by Formula 601 may be represented by Formula 601-1:

Formula 601-1

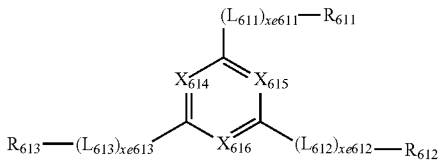

wherein, in Formula 601-1, $X_{614}$ may be N or C($R_{614}$), $X_{615}$ may be N or C($R_{615}$), $X_{616}$ may be N or C($R_{616}$), and at least one of $X_{614}$ to $X_{616}$ may be N, $L_{611}$ to $L_{613}$ are each independently the same as described in connection with $L_{601}$, xe611 to xe613 are each independently the same as described in connection with xe1, $R_{611}$ to $R_{613}$ are each independently the same as described in connection with $R_{601}$, and $R_{614}$ to $R_{616}$ may each independently be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, or a naphthyl group.

In one or more embodiments, xe1 and xe611 to xe613 in Formulae 601 and 601-1 may each independently be 0, 1, or 2.

In one or more embodiments, $R_{601}$ and $R_{611}$ to $R_{613}$ in Formulae 601 and 601-1 may each independently be a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, or an azacarbazolyl group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a fluoranthenyl group, a triphenylenyl group, a pyrenyl group, a chrysenyl group, a perylenyl group, a pentaphenyl group, a hexacenyl group, a pentacenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, an imidazolyl group, a pyrazolyl group, a thiazolyl group, an isothiazolyl group, an oxazolyl group, an isoxazolyl group, a thiadiazolyl group, an oxadiazolyl group, a pyrazinyl group, a pyrimidinyl group, a pyridazinyl group, a triazinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, an isobenzothiazolyl group, a benzoxazolyl group, an isobenzoxazolyl group, a triazolyl group, a tetrazolyl group, an imidazopyridinyl group, an imidazopyrimidinyl group, an azacarbazolyl group, or any combination thereof; or —S(=O)$_2$($Q_{601}$) or —P(=O)($Q_{601}$)($Q_{602}$), wherein $Q_{601}$ and $Q_{602}$ are the same as described in the present specification.

The electron transport region 17 may include one of Compounds ET1 to ET36 or any combination thereof:

ET1

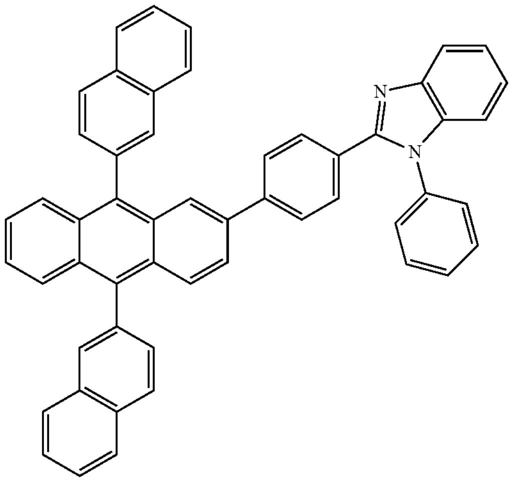

-continued

ET2

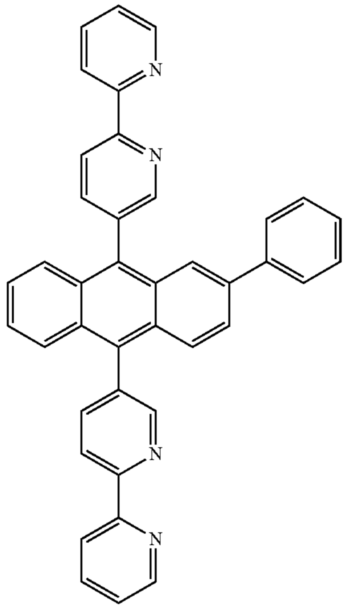

ET3

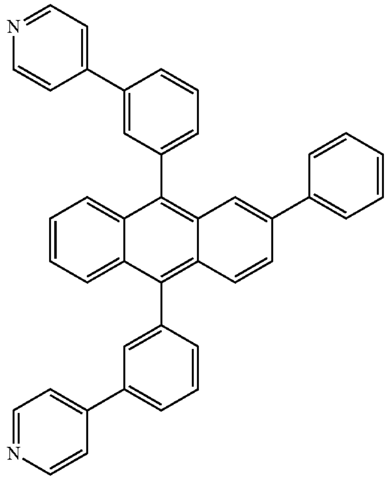

ET4

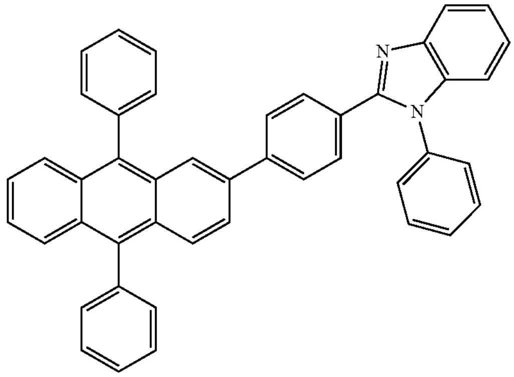

-continued
ET5
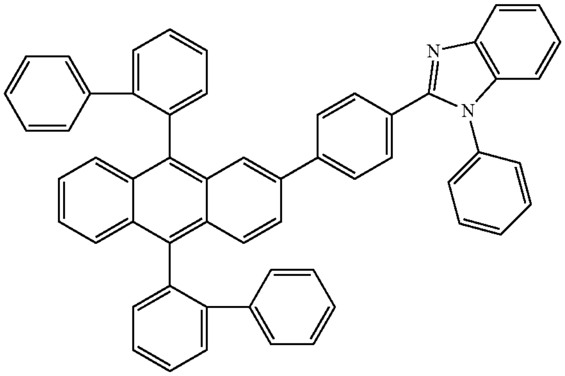
ET6
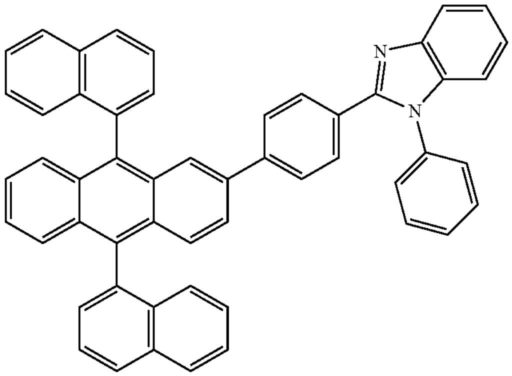
ET7
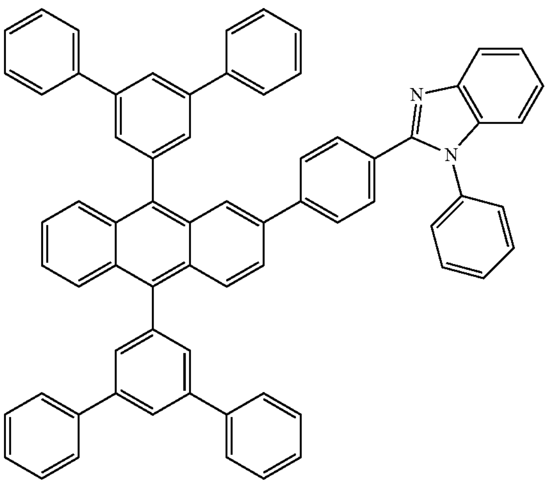
-continued
ET8
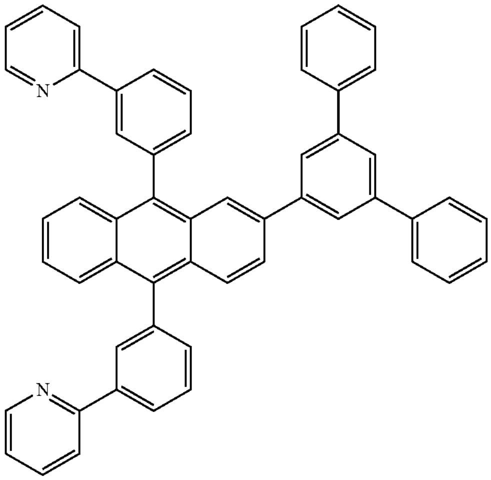
ET9
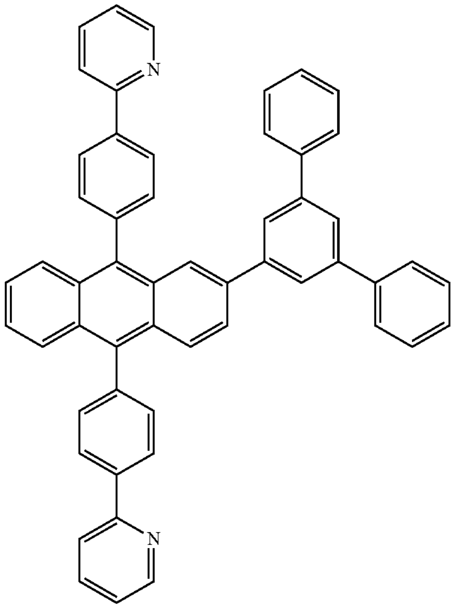

-continued
ET10
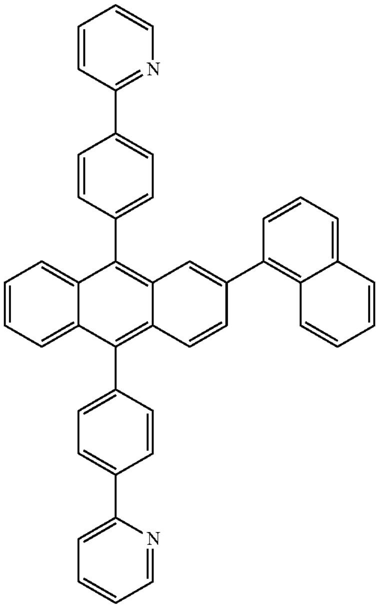
ET11
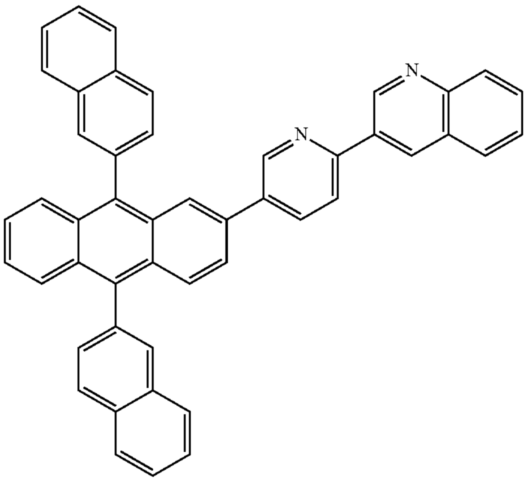
ET12
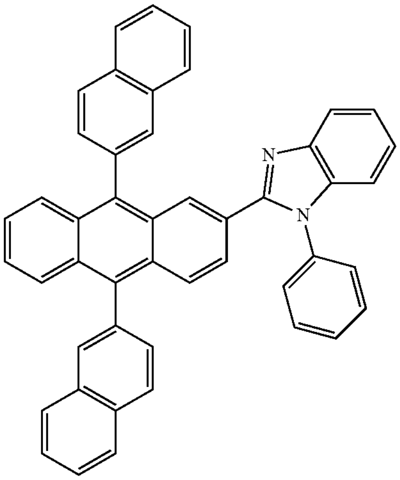
-continued
ET13
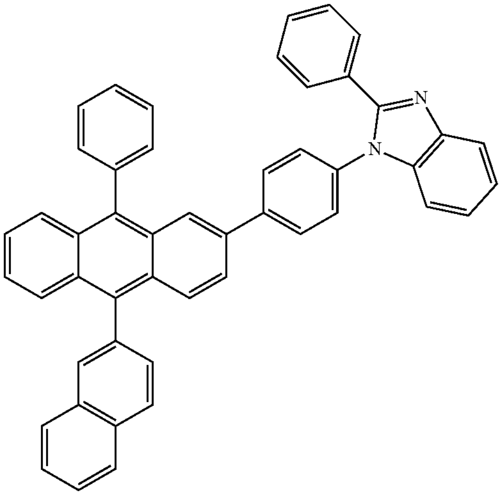
ET14
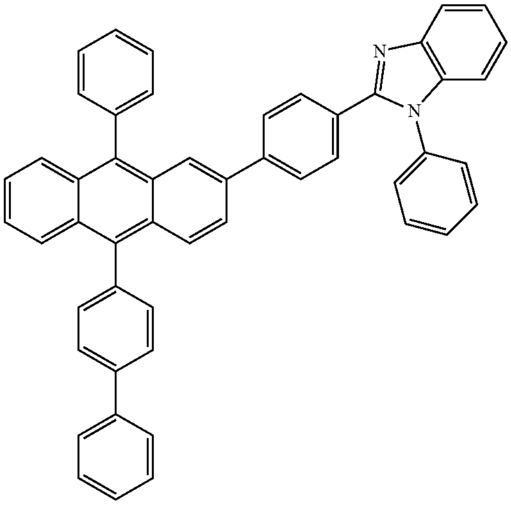
ET15
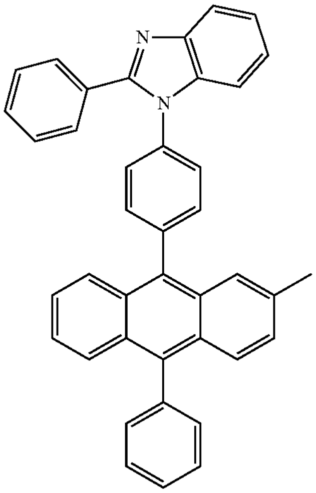

-continued
ET16
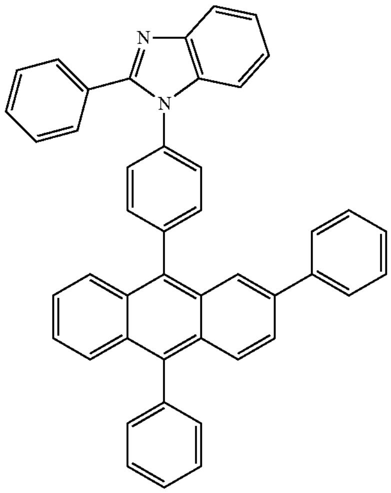
ET17
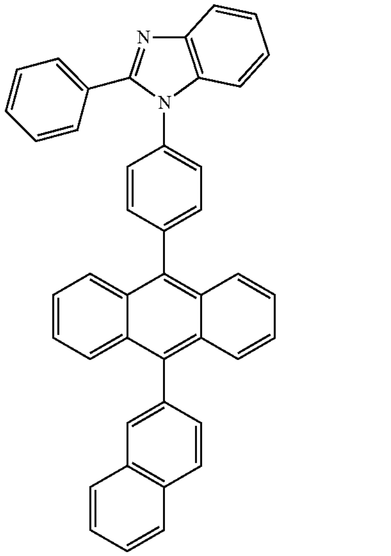
ET18
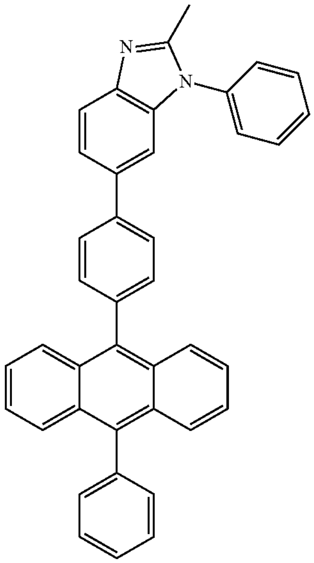
-continued
ET19
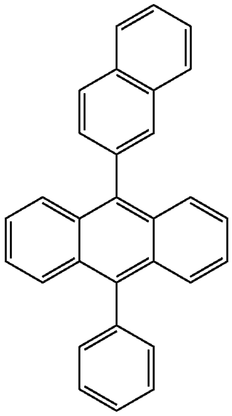
ET20
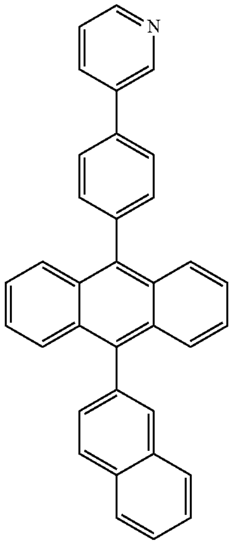
ET21
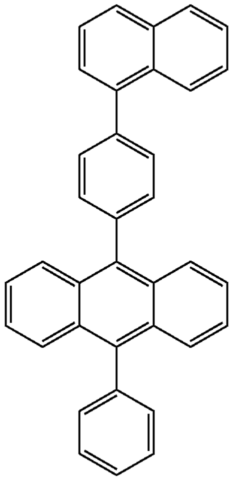

-continued
ET22
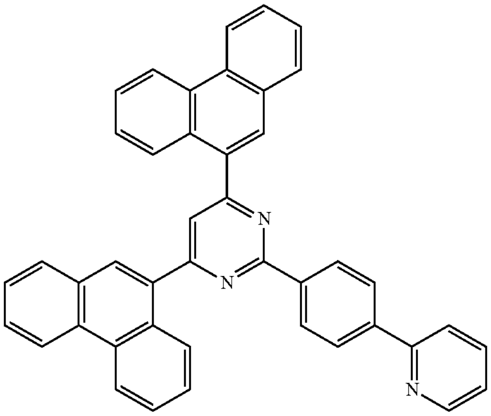
ET23
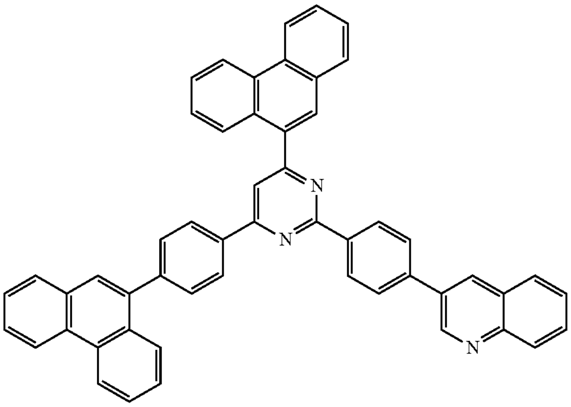
ET24
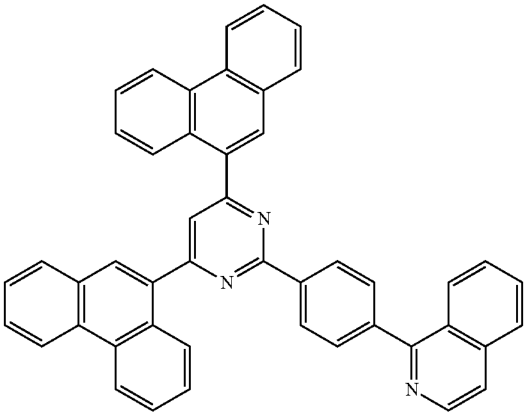
-continued
ET25
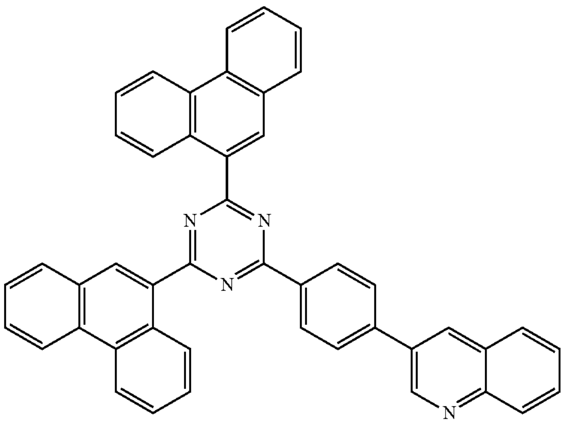
ET26
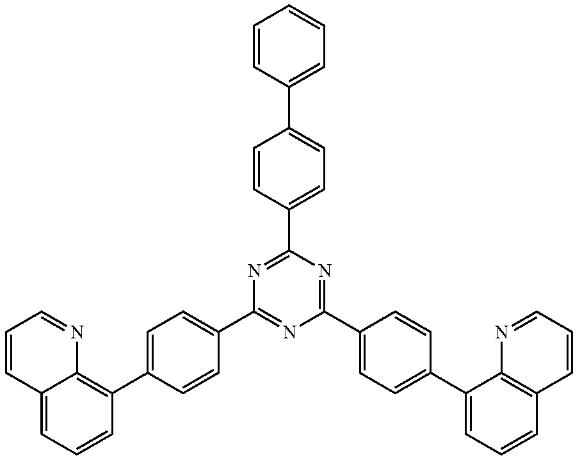
ET27
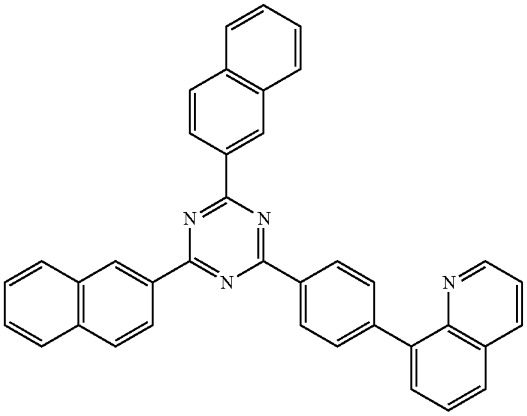

-continued
ET28
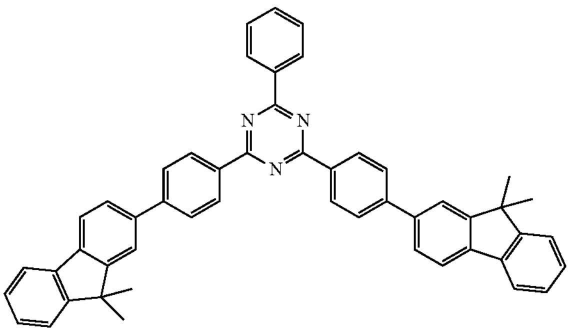
ET29
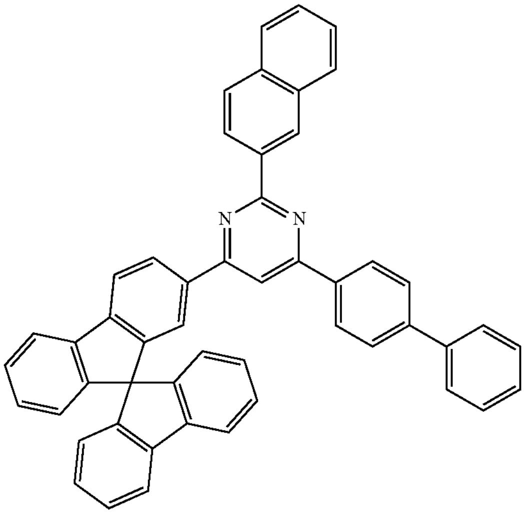
ET30
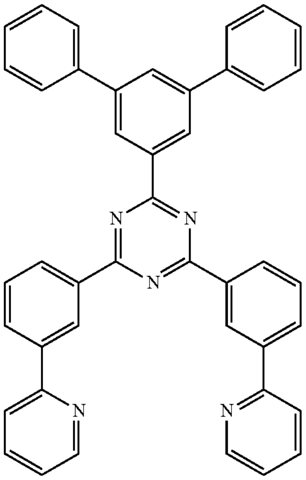
-continued
ET31
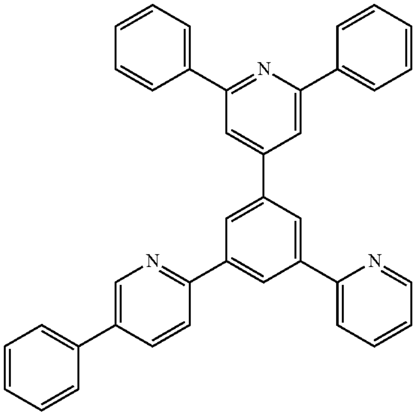
ET32
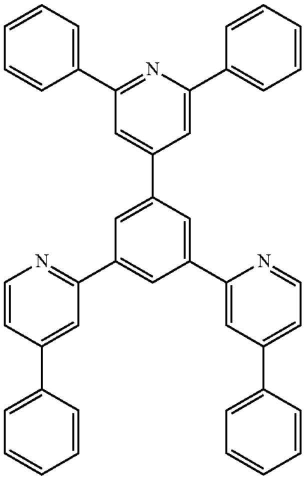
ET33
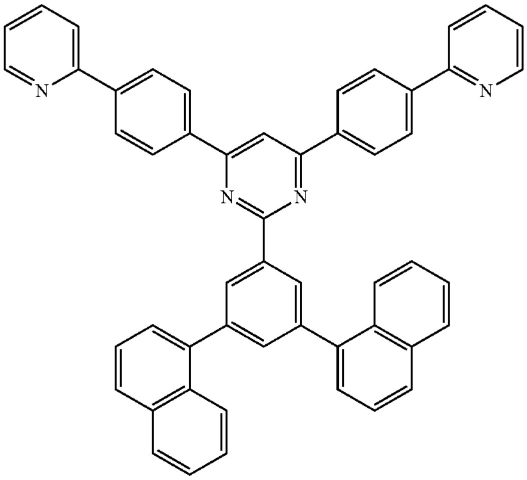

-continued

ET34

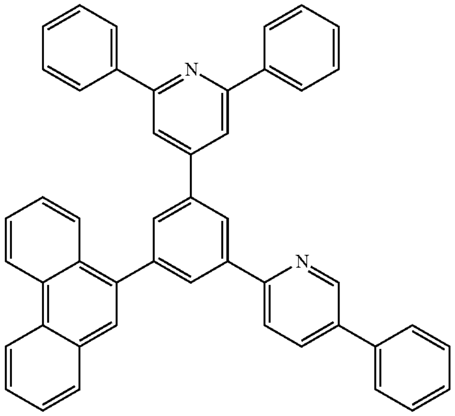

ET35

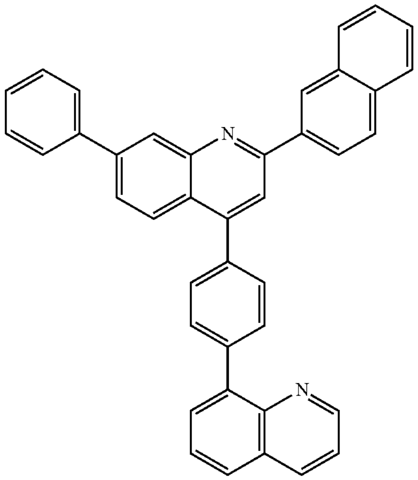

ET36

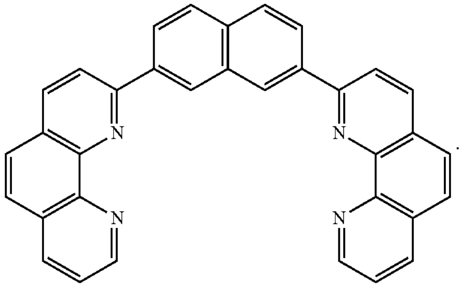

In one or more embodiments, the electron transport region 17 may include 2,9-dimethyl-4,7-diphenyl-1,10-phenanthroline (BCP), 4,7-dphenyl-1,10-phenanthroline (Bphen), $Alq_3$, BAlq, 3-(biphenyl-4-yl)-5-(4-tert-butylphenyl)-4-phenyl-4H-1,2,4-triazole (TAZ), NTAZ, DBFPO, or any combination thereof. For example, when the electron transport region 17 includes a hole blocking layer, the hole blocking layer may include BCP or Bphen:

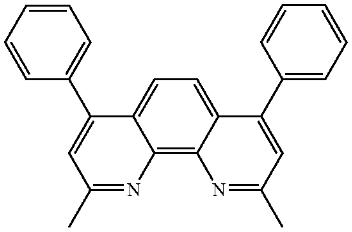

BCP

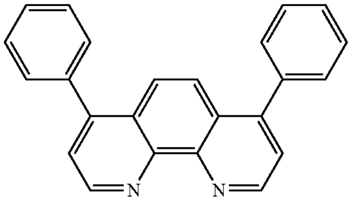

Bphen

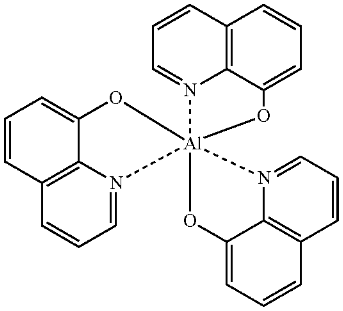

$Alq_3$

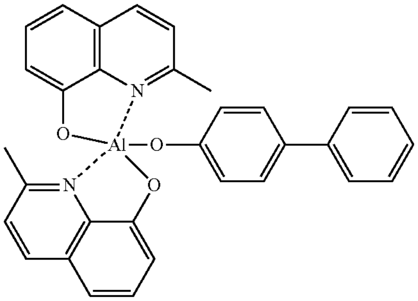

BAlq

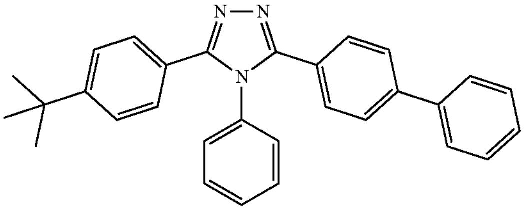

TAZ

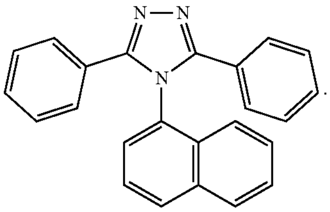

NTAZ

Thicknesses of the buffer layer, the hole blocking layer, and the electron control layer may each independently be in a range of about 20 Å to about 1,000 Å, for example, about 30 Å to about 300 Å. When the thicknesses of the buffer layer, the hole blocking layer, and the electron control layer are within the range described above, excellent hole blocking characteristics or excellent electron control characteristics may be obtained without a substantial increase in driving voltage.

A thickness of the electron transport layer may be in a range of about 100 Å to about 1,000 Å, for example, about 150 Å to about 500 Å. When the thickness of the electron transport layer is within the range described above, satisfactory electron transporting characteristics may be obtained without a substantial increase in driving voltage.

The electron transport region 17 (for example, the electron transport layer in the electron transport region 17) may further include, in addition to the materials described above, a metal-containing material.

The metal-containing material may include an alkali metal complex, an alkaline earth metal complex, or any combination thereof. A metal ion of the alkali metal complex may include a Li ion, a Na ion, a K ion, a Rb ion, a Cs ion, or any combination thereof, and a metal ion of the alkaline earth metal complex may include a Be ion, a Mg ion, a Ca ion, a Sr ion, a Ba ion, or any combination thereof. Each ligand coordinated with the metal ion of the alkali metal complex and the alkaline earth metal complex may independently be hydroxyquinoline, hydroxyisoquinoline, hydroxybenzoquinoline, hydroxyacridine, hydroxyphenanthridine, hydroxyphenyloxazole, hydroxyphenylthiazole, hydroxyphenyloxadiazole, hydroxyphenylthiadiazole, hydroxyphenylpyridine, hydroxyphenylbenzimidazole, hydroxyphenylbenzothiazole, bipyridine, phenanthroline, cyclopentadiene, or any combination thereof.

For example, the metal-containing material may include a Li complex. The Li complex may include, for example, Compound ET-D1 (LiQ) or ET-D2:

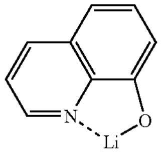

ET-D1

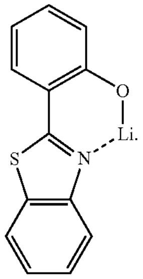

ET-D2

The electron transport region 17 may include an electron injection layer that facilitates the injection of electrons from the second electrode 19. The electron injection layer may be in direct contact with the second electrode 19.

The electron injection layer may have i) a single-layered structure including a single layer including a single material, ii) a single-layered structure including a single layer including a plurality of different materials, or iii) a multi-layered structure having a plurality of layers including a plurality of different materials.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or any combination thereof.

The alkali metal may include Li, Na, K, Rb, Cs, or any combination thereof. In an embodiment, the alkali metal may be Li, Na, or Cs. In one or more embodiments, the alkali metal may be Li or Cs.

The alkaline earth metal may include Mg, Ca, Sr, Ba, or any combination thereof.

The rare earth metal may include Sc, Y, Ce, Tb, Yb, Gd, or any combination thereof.

The alkali metal compound, the alkaline earth metal compound, and the rare earth metal compound may include oxides and halides (for example, fluorides, chlorides, bromides, or iodides) of the alkali metal, the alkaline earth metal, and the rare earth metal, or any combination thereof.

The alkali metal compound may include: one of alkali metal oxides such as $Li_2O$, $Cs_2O$, or $K_2O$; one of alkali metal halides such as LiF, NaF, CsF, KF, LiI, NaI, CsI, or KI; or any combination thereof. In an embodiment, the alkali metal compound may include LiF, $Li_2O$, NaF, LiI, NaI, CsI, KI, or any combination thereof.

The alkaline earth metal compound may include one of alkaline earth metal oxides such as BaO, SrO, CaO, $Ba_xSr_{1-x}O$ (0<x<1), or $Ba_xCa_{1-x}O$ (0<x<1), or any combination thereof. In an embodiment, the alkaline earth metal compound may include BaO, SrO, CaO, or any combination thereof.

The rare earth metal compound may include $YbF_3$, $ScF_3$, $Sc_2O_3$, $Y_2O_3$, $Ce_2O_3$, $GdF_3$, $TbF_3$, or any combination thereof. In an embodiment, the rare earth metal compound may include $YbF_3$, $ScF_3$, $TbF_3$, $YbI_3$, $ScI_3$, $TbI_3$, or any combination thereof.

The alkali metal complex, the alkaline earth metal complex, and the rare earth metal complex may include an ion of alkali metal, alkaline earth metal, and rare earth metal as described above, and a ligand coordinated with a metal ion of the alkali metal complex, the alkaline earth metal complex, or the rare earth metal complex may include hydroxy quinoline, hydroxy isoquinoline, hydroxy benzoquinoline, hydroxy acridine, hydroxy phenanthridine, hydroxy phenyloxazole, hydroxy phenylthiazole, hydroxy diphenyloxadiazole, hydroxy diphenylthiadiazole, hydroxy phenylpyridine, hydroxy phenylbenzimidazole, hydroxy phenylbenzothiazole, bipyridine, phenanthroline, cyclopentadiene, or any combination thereof.

The electron injection layer may include an alkali metal, an alkaline earth metal, a rare earth metal, an alkali metal compound, an alkaline earth metal compound, a rare earth metal compound, an alkali metal complex, an alkaline earth metal complex, a rare earth metal complex, or any combination thereof, as described above. In one or more embodiments, the electron injection layer may further include an organic material. When the electron injection layer further includes an organic material, an alkali metal, an alkaline earth metal, a rare earth metal, an alkali metal compound, an alkaline earth metal compound, a rare earth metal compound, an alkali metal complex, an alkaline earth metal complex, a rare earth metal complex, or any combination thereof may be homogeneously or non-homogeneously dispersed in a matrix including the organic material.

A thickness of the electron injection layer may be in a range of about 1 Å to about 100 Å, for example, about 3 Å to about 90 Å. When the thickness of the electron injection layer is within the range described above, satisfactory electron injection characteristics may be obtained without a substantial increase in driving voltage.

[Second Electrode 19]

The second electrode 19 is located on the intermediate layer. The second electrode 19 may be a cathode which is an electron injection electrode, and in this regard, a material for forming the second electrode 19 may be a metal, an alloy, an electrically conductive compound, or a combination thereof, which have a relatively low work function.

The second electrode 19 may include lithium (Li), silver (Ag), magnesium (Mg), aluminum (Al), aluminum-lithium (Al—Li), calcium (Ca), magnesium-indium (Mg—In), magnesium-silver (Mg—Ag), ITO, IZO, or any combination thereof. The second electrode 19 may be a transmissive electrode, a semi-transmissive electrode, or a reflective electrode.

The second electrode 19 may have a single-layered structure or a multi-layered structure including a plurality of layers.

Chemical Definitions

The term "bonded via an N atom" means that an N atom of one carbazole-derived group, e.g., a bridging nitrogen, is bonded directly to a neighboring carbazole-derived group, or an N atom of one carbazole-derived group, e.g., a bridging nitrogen, is bonded indirectly to a neighboring carbazole-derived group via a linker, e.g., an alkylene, arylene, heteroarylene or a combination thereof. For example, one carbazole-derived groups may be linked via a N atom of the carbazole-derived group via a linker, e.g., a phenylene, which is then bonded to a neighboring carbazole-derived group.

The term "$C_1$-$C_{60}$ alkyl group" as used herein refers to a linear or branched saturated aliphatic hydrocarbons monovalent group having 1 to 60 carbon atoms, and the term "$C_1$-$C_{60}$ alkylene group" as used here refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group may include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, or a tert-decyl group, each unsubstituted or substituted with a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, or any combination thereof. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, a propoxy group, a butoxy group, or a pentoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms, and the term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group may include a cyclopropyl group, a cyclobutyl group, a cyclopentyl, cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, or a bicyclo[2.2.2]octyl group.

The term "$C_1$-$C_{10}$ heterocycloalkyl group" as used herein refers to a monovalent monocyclic group that includes at least one heteroatom that may be N, O, P, Si, S, Se, Ge, or B as a ring-forming atom and 1 to 10 carbon atoms, and the term "the $C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group may include a silolanyl group, a silinanyl group, tetrahydrofuranyl group, a tetrahydro-2H-pyranyl group, and a tetrahydrothiophenyl group.

The term "$C_3$-$C_{10}$ cycloalkenyl group" as used herein refers to a monovalent cyclic group that includes 3 to 10 carbon atoms and at least one carbon-carbon double bond in the ring thereof and has no aromaticity, and examples thereof include a cyclopentenyl group, a cyclohexenyl group, or a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that includes at least one heteroatom that may be from N, O, P, Si, S, Se, Ge, or B as a ring-forming atom, 1 to 10 carbon atoms, and at least one double bond in the ring thereof. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group that includes a carbocyclic aromatic system having 6 to 60 carbon atoms, and the term "$C_6$-$C_{60}$ arylene group" as used herein refers to a divalent group that includes a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, or a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group that includes at least one heteroatom that may be N, O, P, Si, S, Se, Ge, or B as a ring-forming atom and a heterocyclic aromatic system having 1 to 60 carbon atoms, and the term "$C_1$-$C_{60}$ heteroarylene group" as used herein refers to a divalent group that includes at least one heteroatom that may be N, O, P, Si, S, Se, Ge, or B as a ring-forming atom and a heterocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, or an isoquinolinyl group. When the $C_6$-$C_{60}$ heteroaryl group and the $C_6$-$C_{60}$ heteroarylene group each include two or more rings, the rings may be fused to each other.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "monovalent non-aromatic condensed polycyclic group" as used herein refers to a monovalent group having two or more rings condensed with each other, only carbon atoms (for example, having 8 to 60 carbon atoms) as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group having two or more rings condensed with each other, a heteroatom that may be N, O, P, Si, S, Se, Ge, or B, other than carbon atoms (for example, having 1 to 60 carbon atoms), as a ring-forming atom, and no aromaticity in its entire molecular structure. Examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group described above.

The term "π electron-deficient nitrogen-containing $C_1$-$C_{60}$ cyclic group" as used herein refers to a cyclic group that has 1 to 60 carbon atoms and includes at least one *—N=*' (wherein * and *' each indicate a binding site to a neighboring atom) as a ring-forming moiety, and may be, for example, a) a first ring, b) a condensed ring in which two or more first rings are condensed with each other, or c) a condensed ring in which at least one first ring is condensed with at least one second ring.

The term "π electron-rich $C_3$-$C_{60}$ cyclic group" as used herein refers to a cyclic group that has 3 to 60 carbon atoms and does not include *—N=*' (wherein * and *' each indicate a binding site to a neighboring atom) as a ring-forming moiety, and may be, for example, a) a second ring or b) a condensed ring in which two or more second rings are condensed with each other.

The term "$C_5$-$C_{60}$ carbocyclic group" as used herein refers to a saturated or unsaturated cyclic group including 5 to 60 carbon atoms as ring-forming carbons. The $C_5$-$C_{60}$ carbocyclic group may be a monocyclic group or a polycyclic group, and may be, for example, a) a third ring or b) a condensed ring in which two or more third rings are condensed with each other.

The term "$C_1$-$C_{60}$ heterocyclic group" as used herein refers to a monocyclic or polycyclic group that has 1 to 60 carbon atoms and includes at least one heteroatom, and may be, for example, a) a fourth ring, b) a condensed ring in which two or more fourth rings are condensed with each other, or c) a condensed ring in which at least one third ring is condensed with at least one fourth ring. The "first ring" as used herein may be an imidazole group, a pyrazole group, a thiazole group, an isothiazole group, an oxazole group, an isoxazole group, a pyridine group, a pyrazine group, a pyridazine group, a pyrimidine group, a triazole group, a tetrazole group, an oxadiazole group, a triazine group, or a thiadiazole group.

The "second ring" as used herein may be a benzene group, a cyclopentadiene group, a pyrrole group, a furan group, a thiophene group, or a silole group.

The "third ring" as used herein may be a cyclopentane group, a cyclopentadiene group, an indene group, an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclohexane group, a cyclohexene group, or a benzene group.

The "fourth ring" as used herein may be a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, a triazasilole group, a pyridine group, a pyrimidine group, a pyrazine group, a pyridazine group, or a triazine group.

For example, the π electron-deficient nitrogen-containing $C_1$-$C_{60}$ cyclic group may be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, an acridine group, a phenanthroline group, a phenazine group, a benzimidazole group, an isobenzothiazole group, a benzoxazole group, a benzoisoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, an acridine group, or a pyridopyrazine group.

For example, the π electron-rich $C_3$-$C_{60}$ cyclic group may be a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, a triindolobenzene group, a pyrrolophenanthrene group, a furanophenanthrene group, a thienophenanthrene group, a benzonaphthofuran group, a benzonapthothiophene group, an indolophenanthrene group, a benzofuranophenanthrene group, or a benzothienophenanthrene group. The π electron-rich $C_3$-$C_{60}$ cyclic group may be monovalent or divalent.

For example, the $C_5$-$C_{60}$ carbocyclic group may be a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, cyclopentadiene group, an indene group, a fluorene group, an adamantane group, a norbornane group, or a norbornene group.

For example, the $C_1$-$C_{60}$ heterocyclic group may be a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group. The $C_1$-$C_{60}$ heterocyclic group may be monovalent or divalent.

The term "a π electron-deficient nitrogen-containing $C_1$-$C_{60}$ cyclic group, a π electron-rich $C_3$-$C_{60}$ cyclic group, a $C_5$-$C_{60}$ carbocyclic group, and a $C_1$-$C_{60}$ heterocyclic group" may be part of a condensed cycle or may be a monovalent, a divalent, a trivalent, a tetravalent, a pentavalent, or a hexavalent group, depending on the formula structure.

The terms "fluorinated $C_1$-$C_{60}$ alkyl group (or, a fluorinated $C_1$-$C_{20}$ alkyl group or the like)", "fluorinated $C_3$-$C_{10}$ cycloalkyl group", "fluorinated $C_1$-$C_{10}$ heterocycloalkyl group," and "fluorinated phenyl group" as used herein respectively refer to a $C_1$-$C_{60}$ alkyl group (or, a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one fluoro group (—F). For example, the term "fluorinated $C_1$ alkyl group (that is, a fluorinated methyl group)" includes —$CF_3$, —$CF_2H$, and —$CFH_2$. The "fluorinated $C_1$-$C_{60}$ alkyl group (or, a fluorinated $C_1$-$C_{20}$ alkyl group or the like)", "the fluorinated $C_3$-$C_{10}$ cycloalkyl group", "the fluorinated $C_1$-$C_{10}$ heterocycloalkyl group", or "the fluorinated a phenyl group" may be i) a fully fluorinated $C_1$-$C_{60}$ alkyl group (or, a fully fluorinated $C_1$-$C_{20}$ alkyl group or the like), a fully fluorinated $C_3$-$C_{10}$ cycloalkyl group, a fully fluorinated $C_1$-$C_{10}$ heterocycloalkyl group, or a fully fluorinated phenyl group, wherein, in each group, all hydrogen included therein is substituted with a fluoro group, or ii) a partially fluorinated $C_1$-$C_{60}$ alkyl group (or, a partially fluorinated $C_1$-$C_{20}$ alkyl group or the like), a partially fluorinated $C_3$-$C_{10}$ cycloalkyl group, a partially fluorinated $C_1$-$C_{10}$ heterocycloalkyl group, or a partially fluorinated phenyl group, wherein, in each group, all hydrogen included therein is not substituted with a fluoro group.

The terms "deuterated $C_1$-$C_{60}$ alkyl group (or, a deuterated $C_1$-$C_{20}$ alkyl group or the like)", "deuterated $C_3$-$C_{10}$ cycloalkyl group", "deuterated $C_1$-$C_{10}$ heterocycloalkyl group," and "deuterated phenyl group" as used herein respectively refer to a $C_1$-$C_{60}$ alkyl group (or, a $C_1$-$C_{20}$ alkyl group or the like), a $C_3$-$C_{10}$ cycloalkyl group, a $C_1$-$C_{10}$ heterocycloalkyl group, and a phenyl group, each substituted with at least one deuterium. For example, the "deuterated $C_1$ alkyl group (that is, a deuterated methyl group)" may include —$CD_3$, —$CD_2H$, and —$CDH_2$. The "deuterated $C_1$-$C_{60}$ alkyl group (or, the deuterated $C_1$-$C_{20}$ alkyl group or the like)", "the deuterated $C_3$-$C_{10}$ cycloalkyl group", "the deuterated $C_1$-$C_{10}$ heterocycloalkyl group", or "the deuterated phenyl group" may be i) a fully deuterated $C_1$-$C_{60}$ alkyl group (or, a fully deuterated $C_1$-$C_{20}$ alkyl group or the like), a fully deuterated $C_3$-$C_{10}$ cycloalkyl group, a fully deuterated $C_1$-$C_{10}$ heterocycloalkyl group, or a fully deuterated phenyl group, in which, in each group, all hydrogen included therein is substituted with deuterium, or ii) a partially deuterated $C_1$-$C_{60}$ alkyl group (or, a partially deuterated $C_1$-$C_{20}$ alkyl group or the like), a partially deuterated $C_3$-$C_{10}$ cycloalkyl group, a partially deuterated $C_1$-$C_{10}$ heterocycloalkyl group, or a partially deuterated phenyl group, in which, in each group, all hydrogen included therein is not substituted with deuterium.

The term "($C_1$-$C_{20}$ alkyl) 'X' group" as used herein refers to a 'X' group that is substituted with at least one $C_1$-$C_{20}$ alkyl group. For example, the term "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the term "($C_1$-$C_{20}$ alkyl)phenyl group" as used herein refers to a phenyl group substituted with at least one $C_1$-$C_{20}$ alkyl group. An example of the term ($C_1$ alkyl) phenyl group is a toluyl group.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" respectively refer to heterocyclic groups having the same backbones as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, and a dibenzothiophene 5,5-dioxide group," in which, in each group, at least one carbon of the ring-forming carbons is substituted by nitrogen.

Substituents of the substituted π electron-deficient nitrogen-containing $C_1$-$C_{60}$ cyclic group, the substituted π electron-rich $C_3$-$C_{60}$ cyclic group, the substituted $C_5$-$C_{60}$ carbocyclic group, the substituted $C_1$-$C_{60}$ heterocyclic group, the substituted $C_1$-$C_{60}$ alkylene group, the substituted $C_2$-$C_{60}$ alkenylene group, the substituted $C_2$-$C_{60}$ alkynylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkylaryl group, a $C_6$-$C_{60}$ aryloxy group, a $C_6$-$C_{60}$ arylthio group, a $C_1$-$C_{60}$ heteroaryl group, a $C_2$-$C_{60}$ alkylheteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof.

$Q_1$ to $Q_9$, $Q_{11}$ to $Q_{19}$, $Q_{21}$ to $Q_{29}$, and $Q_{31}$ to $Q_{39}$ used herein may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

For example, $Q_1$ to $Q_9$, $Q_{11}$ to $Q_{19}$, $Q_{21}$ to $Q_{29}$ and $Q_{31}$ to $Q_{39}$ described herein may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

The term "room temperature" used herein refers to a temperature of about 25° C.

The terms “a biphenyl group, a terphenyl group, and a quaterphenyl group” used herein respectively refer to monovalent groups in which two, three, or four phenyl groups which are linked together via a single bond.

Hereinafter, a compound and an organic light-emitting device according to embodiments are described in detail with reference to Synthesis Examples and Examples. However, the present disclosure is not limited thereto. The wording “‘B’ was used instead of ‘A’” used in describing Synthesis Examples means that an amount of ‘A’ used was identical to an amount of ‘B’ used, in terms of a molar equivalent.

EXAMPLES

Synthesis Example 1 (Compound H1)

Compound H1 was synthesized according to the following reaction scheme.

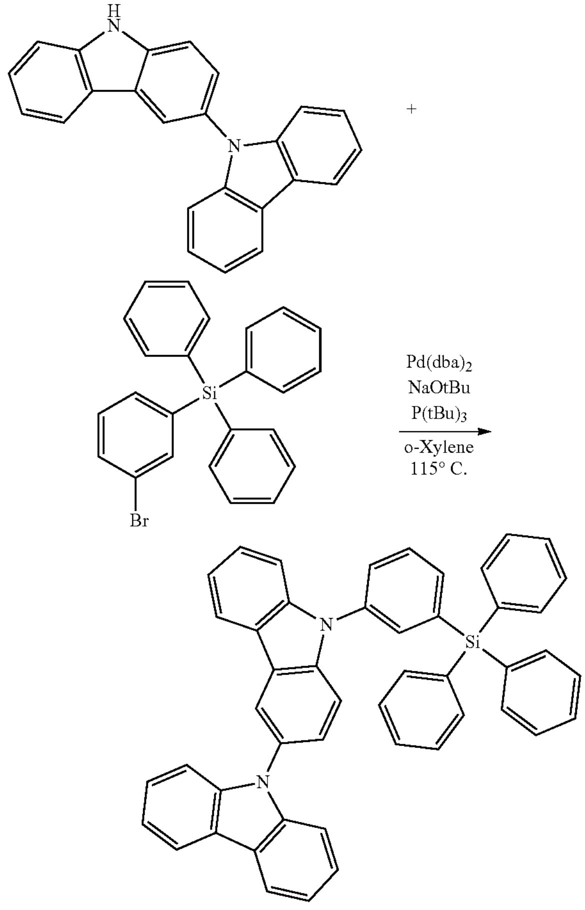

H1

9H-3,9'-bicarbazole (7.48 g, 22.49 mmol), (3-bromophenyl)triphenylsilane (11.21 g, 26.99 mmol), Bis(dibenzylideneacetone)palladium(0)(Pd(dba)$_2$) (1.29 g, 2.25 mmol), P(tBu)$_3$ (tri(t-butyl) phosphine) (50 wt % of toluene solution, 1.82 g, 4.50 mmol), and NaOtBu (sodium t-butoxide) (4.32 g, 44.98 mmol) were dissolved in 56 ml of o-xylene. The mixture was heated and stirred under reflux for 12 hours. After completion of the reaction, the temperature was lowered to room temperature, and 1,000 ml of methanol was added to the reaction mixture. The resulting solid was filtered and purified by silica gel column chromatography to obtain 10 g (yield of 67%) of [Compound H1]. LC-Mass (calculated: 666.25 g/mol, found: M+1=667 g/mol)

Synthesis Example 2 (Compound H8)

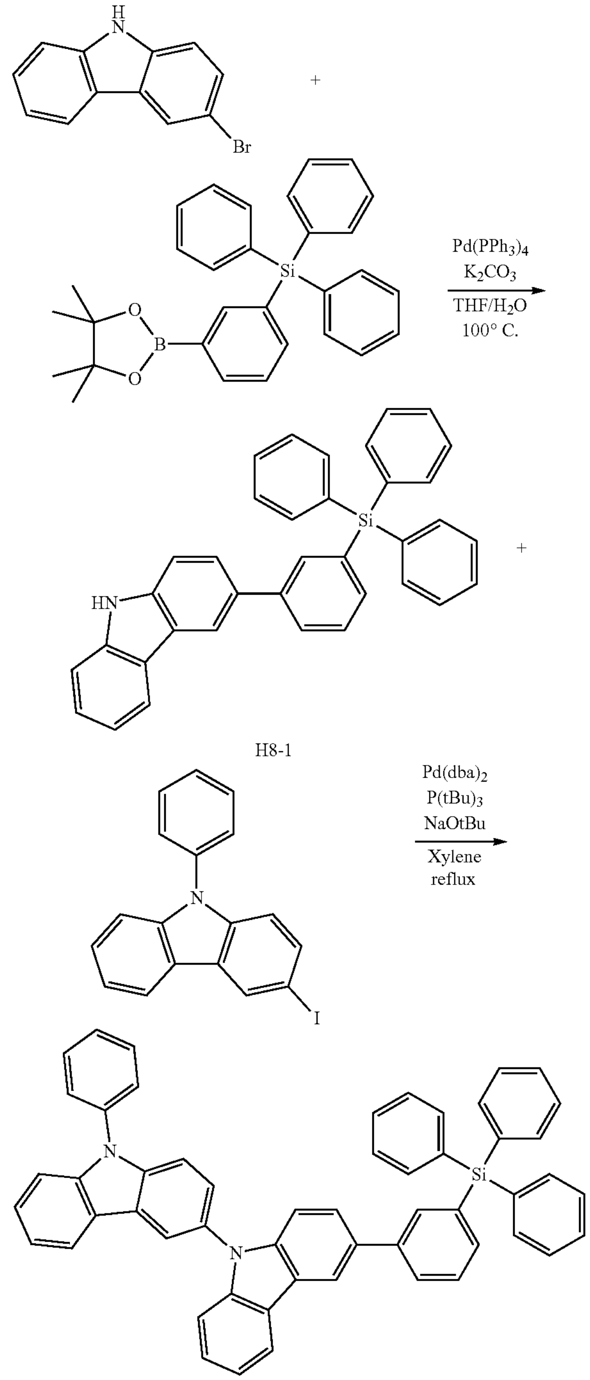

H8

Synthesis of [Intermediate H8-1]

3-Bromo-9H-carbazole (4.00 g, 16.3 mmol), triphenyl(3-(4,4,5,5-tetramethyl-1,3,2-dioxaborolan-2-yl)phenyl)silane (8.27 g, 17.9 mmol), $Pd(PPh_3)_4$ (tetra(triphenyl phosphine) palladium) (0.57 g, 0.49 mmol), and $K_2CO_3$ (2.92 g, 21.1 mmol) were dissolved in 125 ml/25 ml of THF/distilled water. The mixture was heated and stirred under reflux for 12 hours. After completion of the reaction, the temperature was lowered to room temperature, and ethyl acetate and a saturated aqueous ammonium chloride solution were added to the reaction mixture. The resulting organic solution layer was extracted using ethyl acetate, dried using anhydrous $MgSO_4$, and filtered. The filtrate was concentrated and purified by silica gel column chromatography to obtain 5.54 g (yield of 68%) of [Intermediate H8-1]. LC-Mass (calculated: 501.19 g/mol, found: M+1=502 g/mol)

Synthesis of [Compound H8]

Intermediate H8-1 (5.00 g, 9.97 mmol), 3-Iodo-9-phenyl-9H-carbazole (4.05 g, 11.0 mmol), $Pd(dba)_2$ (0.29 g, 0.50 mmol), $P(tBu)_3$ (50 wt % of toluene solution, 0.50 ml, 1.0 mmol), and NaOtBu (1.44 g, 21.1 mmol) were dissolved in 125 ml of xylene. The mixture was heated and stirred under reflux for 12 hours. After completion of the reaction, the temperature was lowered to room temperature, and ethyl acetate and a saturated aqueous ammonium chloride solution were added to the reaction mixture. The resulting organic solution layer was extracted using ethyl acetate, dried using anhydrous $MgSO_4$, and then filtered. The filtrate was concentrated and purified by silica gel column chromatography to obtain 5.62 g (yield of 76%) of [Compound H8].

LC-Mass (calculated: 742.28 g/mol, found: M+1=743 g/mol)

Synthesis Example 3 (Compound E1)

Compound E1 was synthesized according to the following reaction scheme.

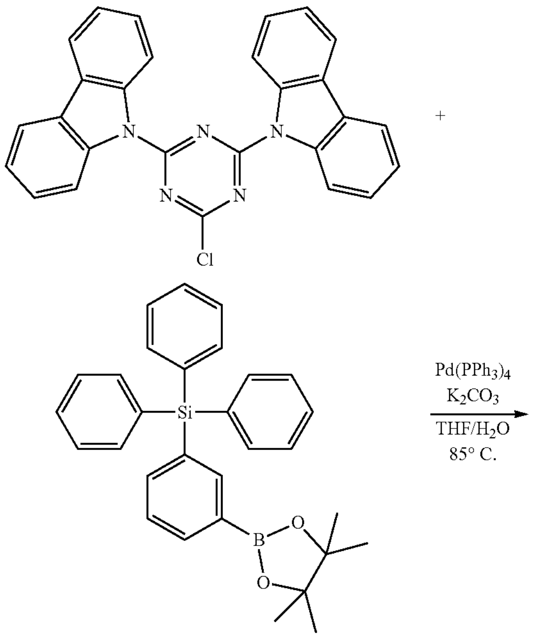

-continued

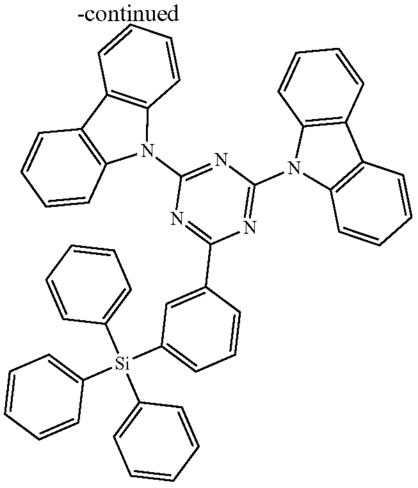

E1

9,9'-(6-Chloro-1,3,5-triazine-2,4-diyl)bis(9H-carbazole) (9.56 g, 21.45 mmol), triphenyl(3-(4,4,5,5-tetramethyl-1,3,2-dioxaborolan-2-yl)phenyl)silane (10.91 g, 23.59 mmol), $Pd(PPh_3)_4$ (2.48 g, 2.14 mmol), and $K_2CO_3$ (5.93 g, 42.90 mmol) were dissolved in 54 ml/22 ml of THF/distilled water. The mixture was heated and stirred under reflux for 12 hours. After completion of the reaction, the temperature was lowered to room temperature, and 1,000 ml of methanol was added to the reaction mixture. The resulting solid was filtered and purified by silica gel column chromatography to obtain 8.50 g (yield of 53%) of [Compound E1].

LC-Mass (calculated: 745.27 g/mol, found: M+1=746 g/mol)

Synthesis Example 4 (Compound E2)

Compound E2 was synthesized according to the following reaction scheme.

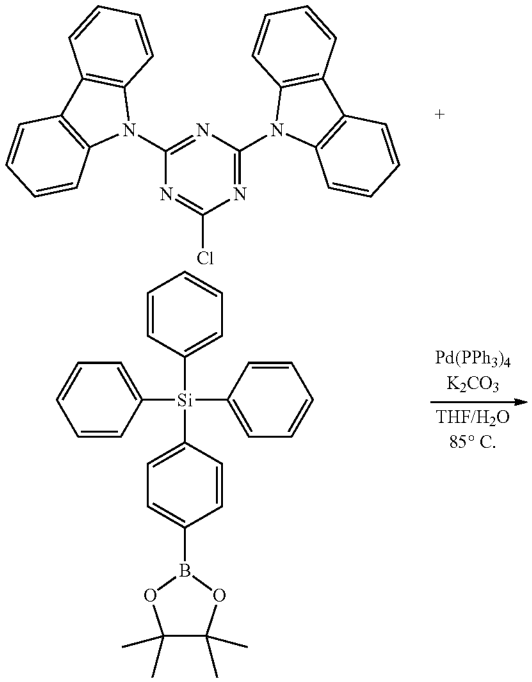

-continued

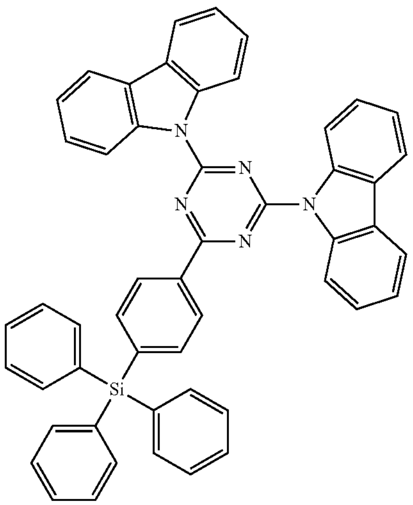

E2

Compound E2 (yield of 24%) was synthesized in the same manner as in Synthesis Example 4, except that triphenyl(4-(4,4,5,5-tetramethyl-1,3,2-dioxaborolan-2-yl)phenyl)silane was used instead of triphenyl(3-(4,4,5,5-tetramethyl-1,3,2-dioxaborolan-2-yl)phenyl)silane.

LC-Mass (calculated: 745.27 g/mol, found: M+1=746 g/mol)

Synthesis Example 5 (Compound E3)

Compound E3 was synthesized according to the following reaction scheme.

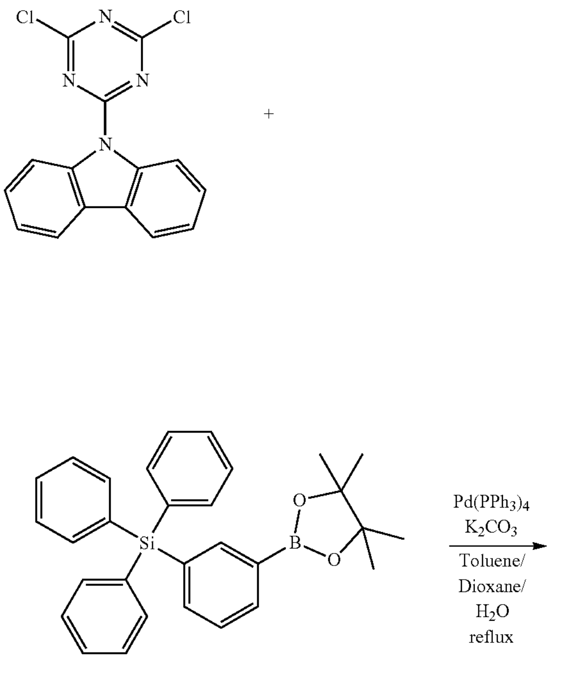

-continued

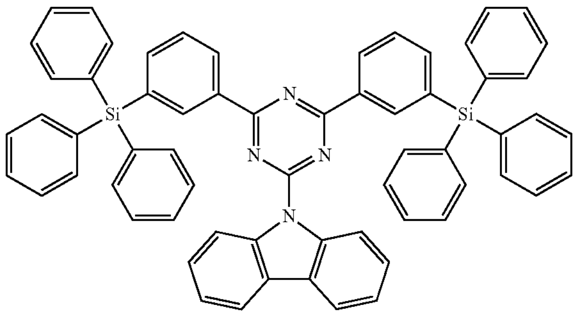

E3

9-(4,6-Dichloro-1,3,5-triazin-2-yl)-9H-carbazole (3.5 g, 11.1 mmol), triphenyl(3-(4,4,5,5-tetramethyl-1,3,2-dioxaborolan-2-yl)phenyl)silane (12.8 g, 27.8 mmol), $Pd(PPh_3)_4$ (0.77 g, 0.67 mmol), and $K_2CO_3$ (4.3 g, 31.1 mmol) were dissolved in 100 ml/100 ml/50 ml of toluene/dioxane/distilled water. The mixture was heated and stirred under reflux for 12 hours. After completion of the reaction, the temperature was lowered to room temperature, and 1,200 ml of methanol was added to the reaction mixture. The resulting solid was filtered and then purified by silica gel column chromatography to obtain 4.8 g (yield of 47%) of [Compound E3].

LC-Mass (calculated: 914.33 g/mol, found: M+1=915 g/mol)

Synthesis Example 6 (Compound E4)

Compound E4 was synthesized according to the following reaction scheme.

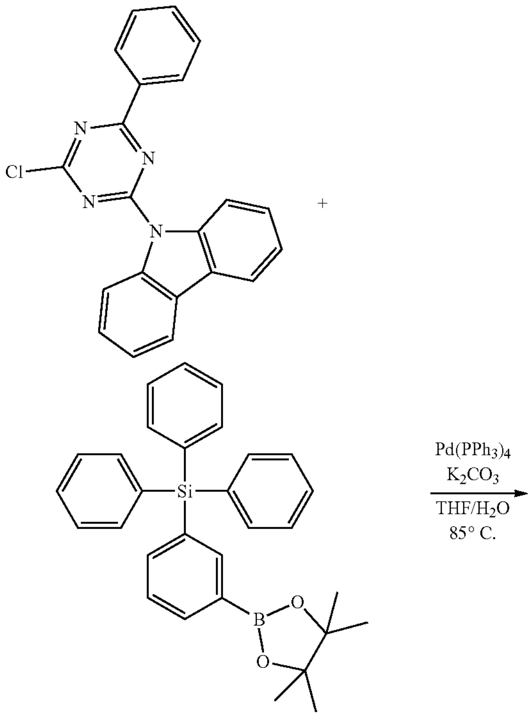

-continued

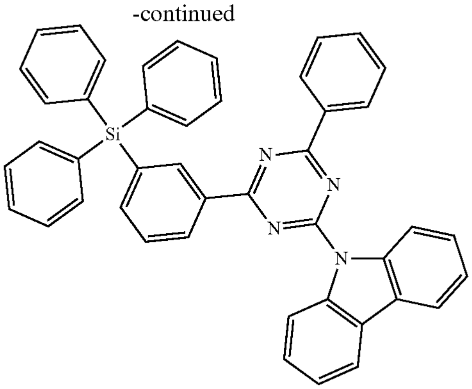

E4

Compound E4 (yield of 42%) was synthesized in the same manner as in Synthesis Example 4, except that 9-(4-chloro-6-phenyl-1,3,5-triazine-2-yl)-9H-carbazole was used instead of 9,9'-(6-chloro-1,3,5-triazine-2,4-diyl)bis(9H-carbazole).

LC-Mass (calculated: 656.24 g/mol, found: M+1=657 g/mol)

Synthesis Example 7 (Compound E5)

Compound E5 was synthesized according to the following reaction scheme.

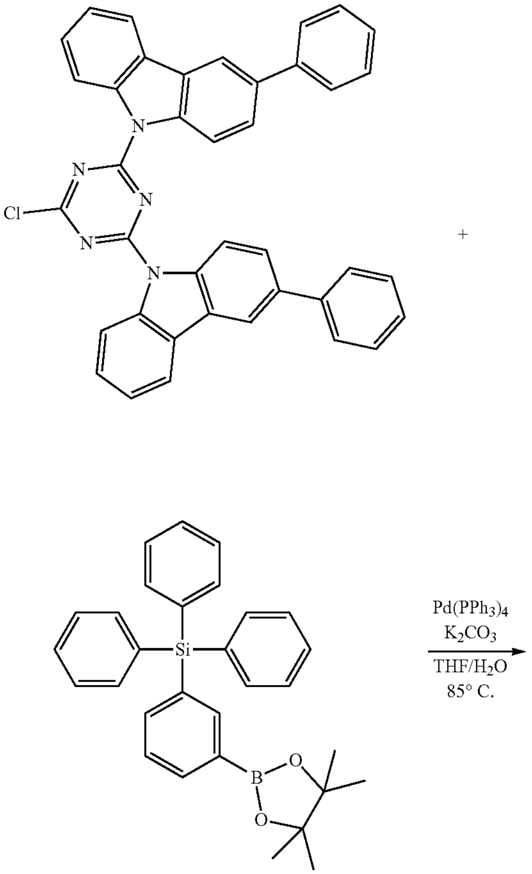

-continued

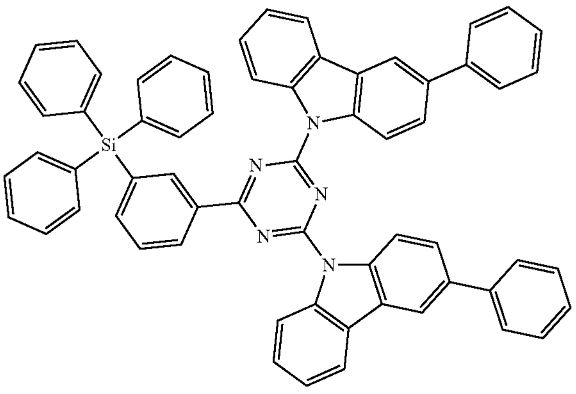

E5

Compound E5 (yield of 47%) was synthesized in the same manner as in Synthesis Example 4, except that 9,9'-(6-chloro-1,3,5-triazine-2,4-diyl)bis(3-phenyl-9H-carbazole) was used instead of 9,9'-(6-chloro-1,3,5-triazine-2,4-diyl)bis(9H-carbazole).

LC-Mass (calculated: 897.33 g/mol, found: M+1=898 g/mol)

Synthesis Example 8 (Compound E6)

Compound E6 was synthesized according to the following reaction scheme.

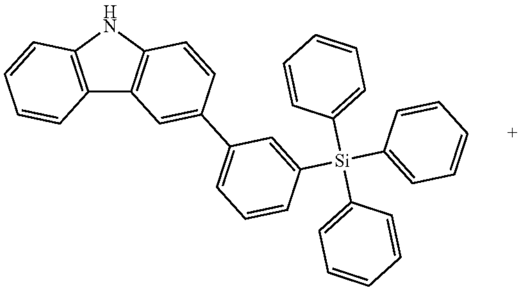

H8-1

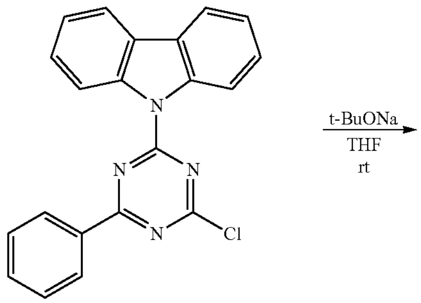

-continued

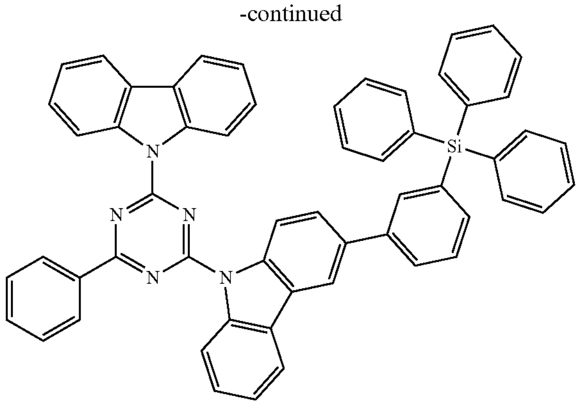

E6

Intermediate H8-1 (5.10 g, 10.2 mmol), 9-(4-chloro-6-phenyl-1,3,5-triazin-2-yl)-9H-carbazole (4.35 g, 12.2 mmol), and sodium tert-butoxide (t-BuONa) (1.27 g, 13.2 mmol) were added to 250 ml of THF, and then, the mixture was stirred at room temperature for 20 hours. After completion of the reaction, the reaction mixture was filtered by passing through silica gel under reduced pressure, and the filtrate was concentrated under reduced pressure. The product was separated by silica gel column chromatography to obtain Compound E6 (6.05 g, yield of 72%).

LC-Mass (calculated: 821.30 g/mol, found: M+1=822 g/mol)

Synthesis Example 9 (Compound E7)

Compound E7 was synthesized according to the following reaction scheme.

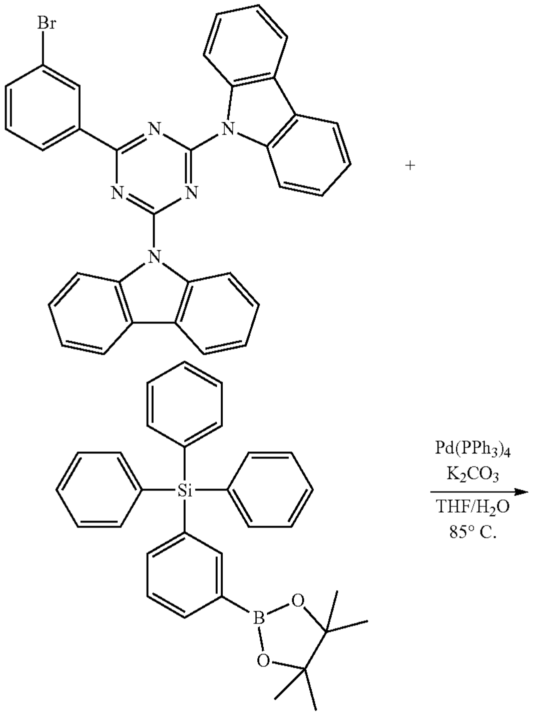

-continued

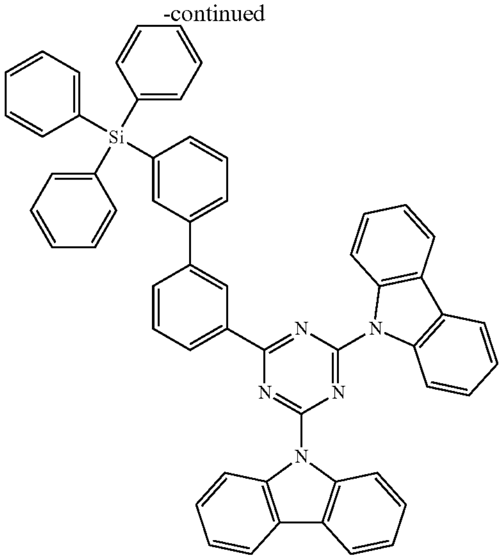

E7

Compound E7 (yield of 40%) was synthesized in the same manner as in Synthesis Example 4, except that 9,9'-(6-(3-bromophenyl)-1,3,5-triazine-2,4-diyl)bis(9H-carbazole) was used instead of 9,9'-(6-chloro-1,3,5-triazine-2,4-diyl)bis (9H-carbazole).

LC-Mass (calculated: 821.30 g/mol, found: M+1=822 g/mol)

Synthesis Example 10 (Compound E8)

Compound E8 was synthesized according to the following reaction scheme.

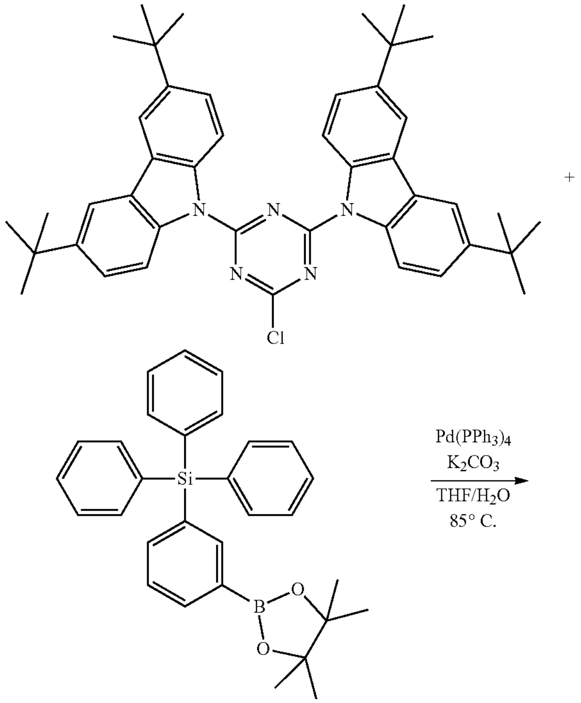

-continued

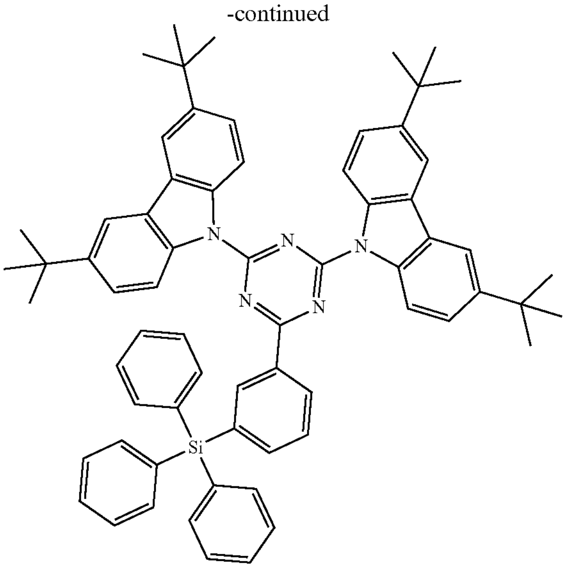

E8

Compound E8 (yield of 67%) was synthesized in the same manner as in Synthesis Example 4, except that 9,9'-(6-chloro-1,3,5-triazine-2,4-diyl)bis(3,6-di-tert-butyl-9H-carbazole) was used instead of 9,9'-(6-chloro-1,3,5-triazine-2,4-diyl)bis(9H-carbazole).

LC-Mass (calculated: 969.52 g/mol, found: M+1=970 g/mol)

Evaluation Example 1: Evaluation of $T_1$ Energy Level

The $T_1$ energy levels of Compounds H1 to H16 and E1 to E8, which were used as hosts of the present disclosure, and known host Compounds C1 to C37 for comparison were evaluated by a density functional theory (DFT). For example, the $T_1$ energy levels of the compounds were evaluated by using a DFT that was structurally optimized at a level of B3LYP/6-31G(d,p) (for example, the DFT method of the Gaussian program, T1 adiabatic), and the results thereof are shown in Table 1.

TABLE 1

| Compound | T (eV) |
|---|---|
| H1 | 3.024 |
| H2 | 3 |
| H3 | 3.026 |
| H4 | 3.552 |
| H5 | 2.951 |
| H6 | 2.979 |
| H7 | 3.054 |
| H8 | 2.813 |
| H9 | 2.827 |
| H10 | 2.877 |
| H11 | 2.815 |
| H12 | 2.896 |
| H13 | 3.016 |
| H14 | 2.839 |
| H15 | 2.822 |
| E1 | 2.994 |
| E2 | 2.983 |
| E3 | 3.033 |
| E4 | 3.025 |
| E5 | 2.837 |
| E6 | 2.812 |
| E7 | 2.848 |
| E8 | 2.891 |
| C1 | 2.57 |
| C2 | 2.474 |
| C3 | 2.218 |
| C4 | 2.359 |
| C5 | 2.292 |
| C6 | 2.576 |
| C7 | 2.333 |
| C8 | 2.283 |
| C9 | 2.566 |
| C10 | 2.567 |
| C11 | 2.57 |
| C12 | 2.687 |
| C13 | 2.64 |
| C14 | 2.518 |
| C15 | 2.617 |
| C16 | 2.617 |
| C17 | 2.688 |
| C18 | 2.601 |
| C19 | 2.582 |
| C20 | 2.533 |
| C21 | 2.572 |
| C22 | 2.804 |
| C23 | 2.689 |
| C24 | 2.171 |
| C25 | 2.659 |
| C26 | 2.805 |
| C27 | 2.801 |
| C28 | 2.575 |
| C29 | 2.425 |
| C30 | 2.425 |
| C31 | 2.424 |
| C32 | 2.428 |
| C33 | 2.57 |
| C34 | 2.572 |
| C35 | 2.572 |
| C36 | 2.474 |
| C37 | 2.485 |

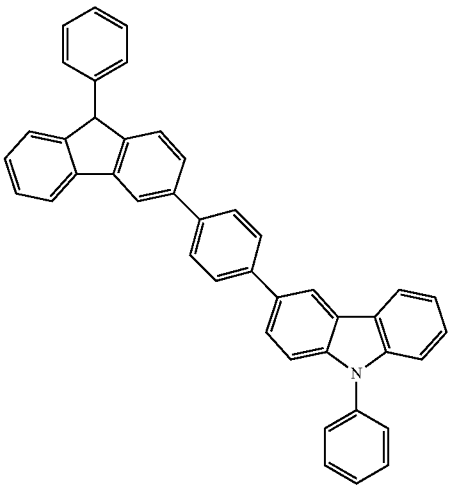 [SMILES: c1ccc(C2c3ccccc3-c3cc(-c4ccc(-c5ccc6c(c5)c5ccccc5n6-c5ccccc5)cc4)ccc32)cc1]

C1

TABLE 1-continued
| Compound | T (eV) |
|---|---|
| 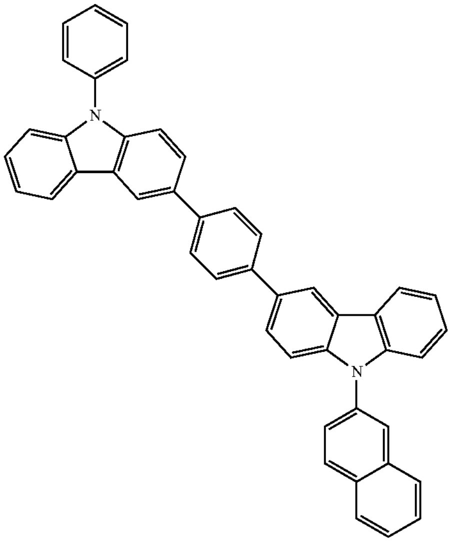 C2 | |
| 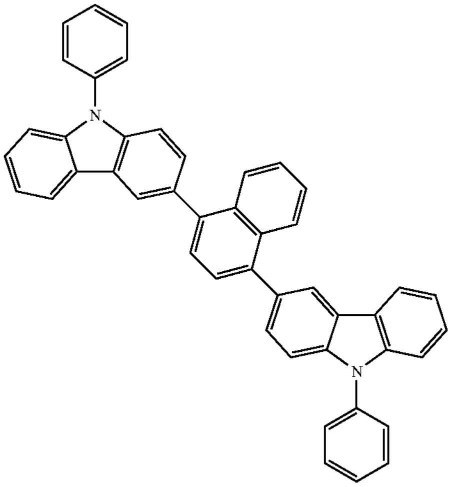 C3 | |
| 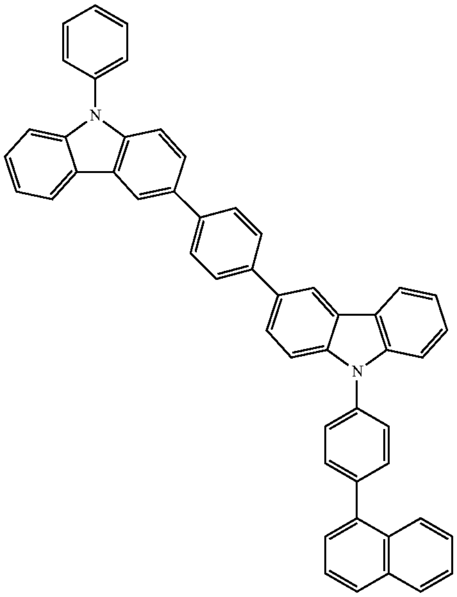 C4 | |
TABLE 1-continued
| Compound | T (eV) |
|---|---|
| 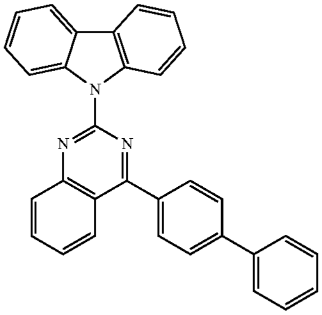 C5 | |
| 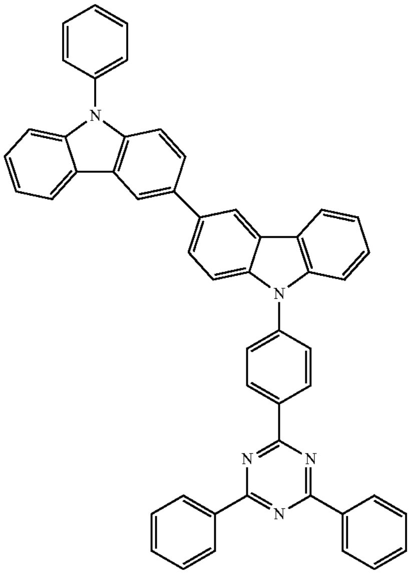 C6 | |
| 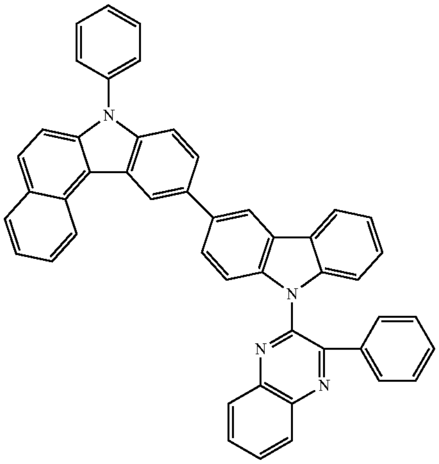 C7 | |

TABLE 1-continued
| Compound | T (eV) |
| --- | --- |
| 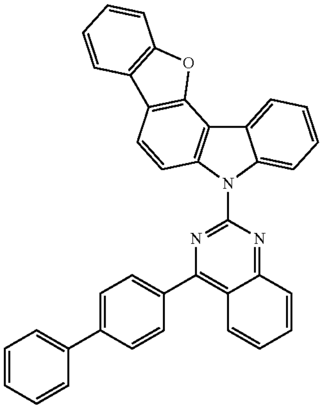 C8 | |
| 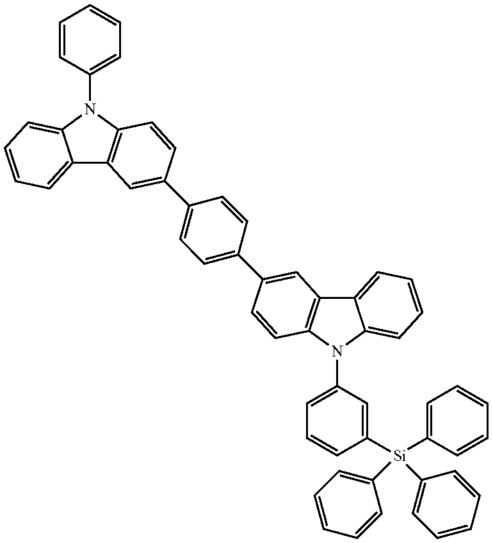 C9 | |
| 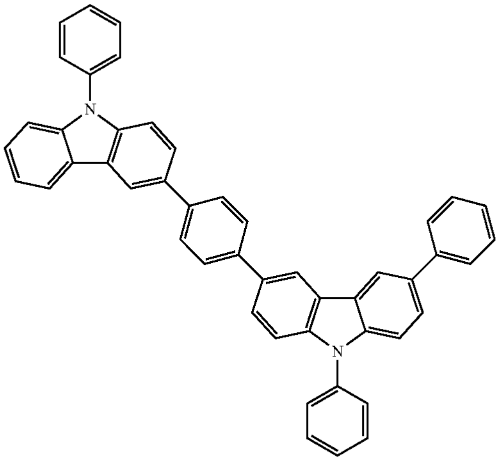 C10 | |
TABLE 1-continued
| Compound | T (eV) |
| --- | --- |
| 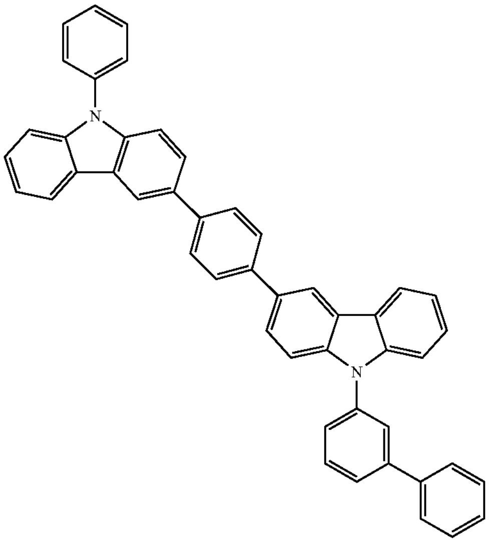 C11 | |
| 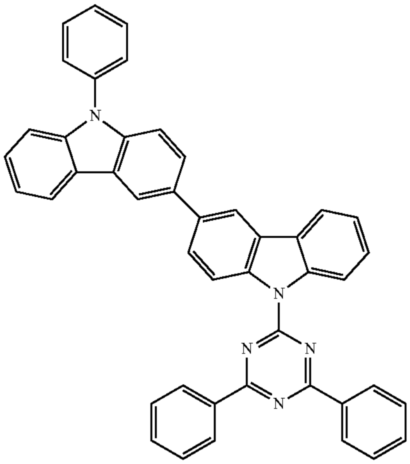 C12 | |
| 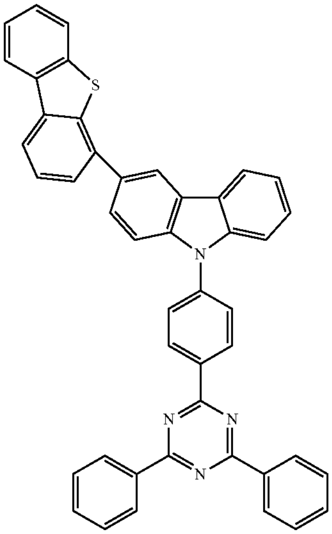 C13 | |

TABLE 1-continued
| Compound | T (eV) |
| --- | --- |
| 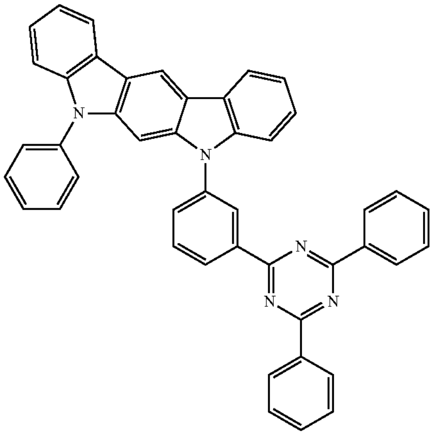 C14 | |
| 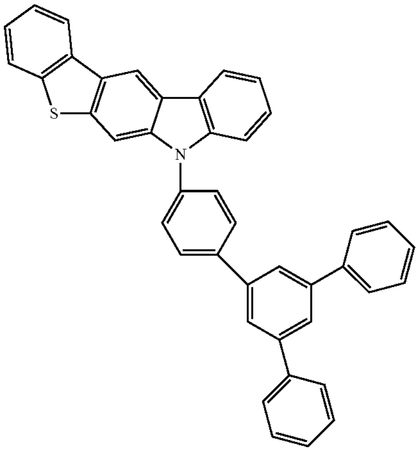 C15 | |
| 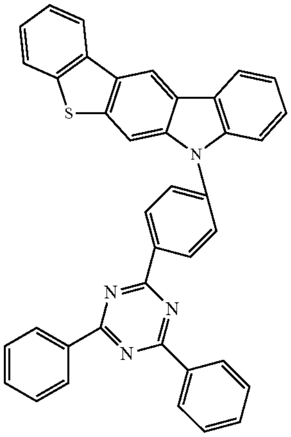 C16 | |
TABLE 1-continued
| Compound | T (eV) |
| --- | --- |
| 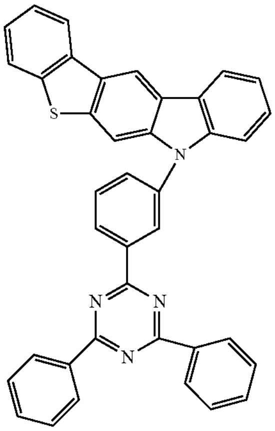 C17 | |
| 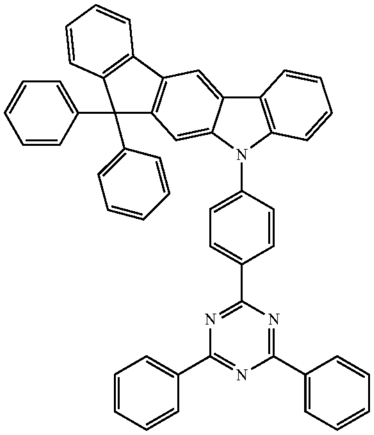 C18 | |
| 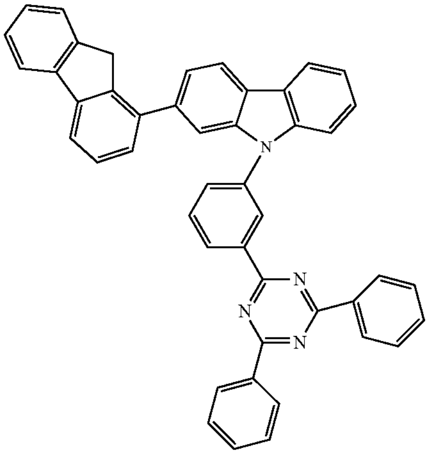 C19 | |

TABLE 1-continued
| Compound | T (eV) |
|---|---|
| 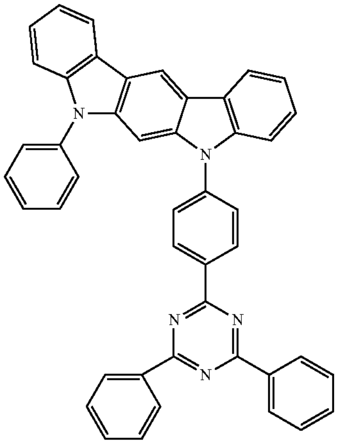 C20 | |
| 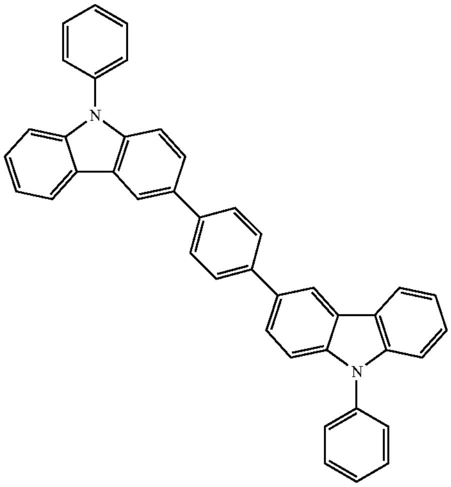 C21 | |
| 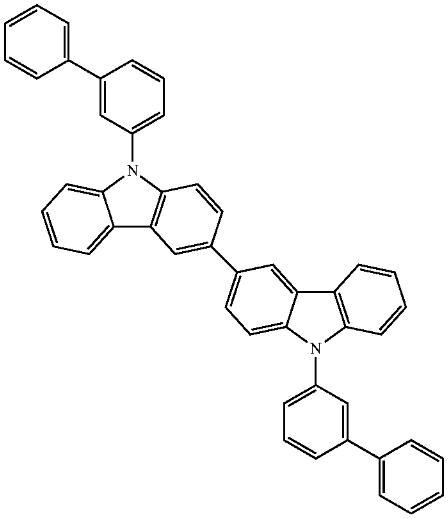 C22 | |
TABLE 1-continued
| Compound | T (eV) |
|---|---|
| 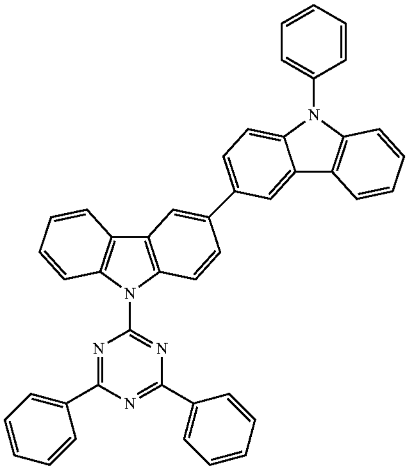 C23 | |
| 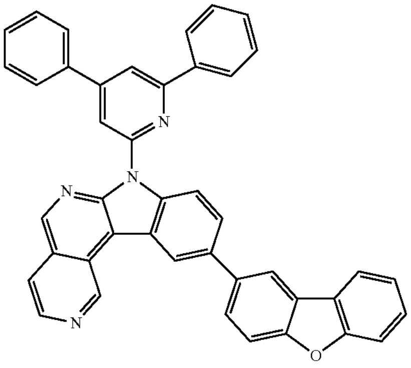 C24 | |
| 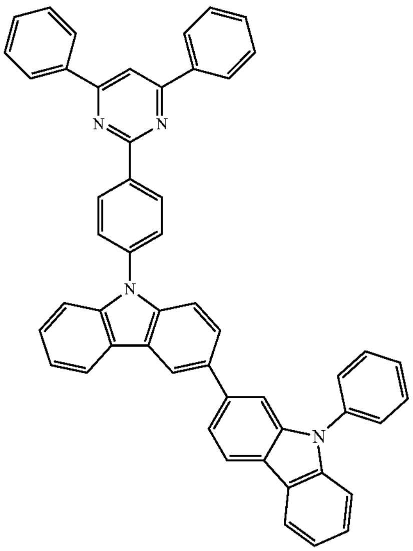 C25 | |

TABLE 1-continued
| Compound | T (eV) |
|---|---|
| 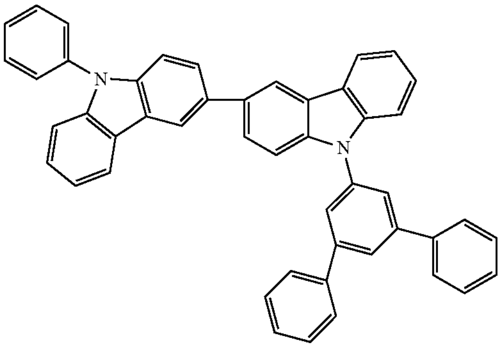 C26 | |
| 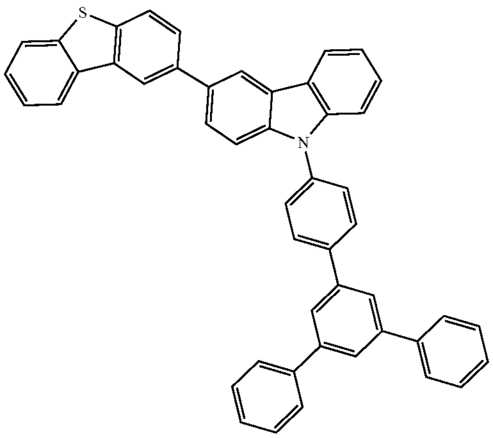 C27 | |
| 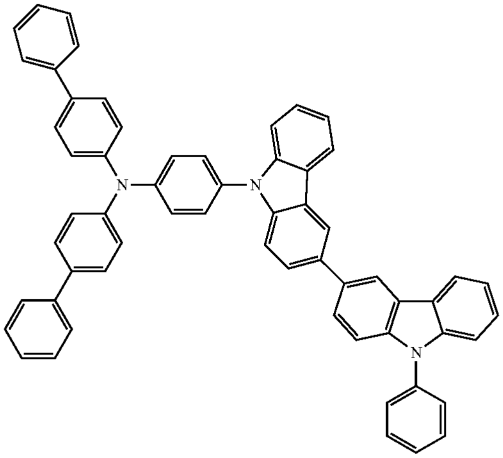 C28 | |
TABLE 1-continued
| Compound | T (eV) |
|---|---|
| 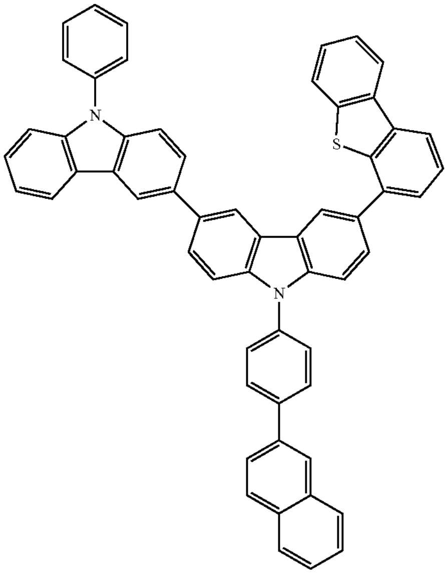 C29 | |
| 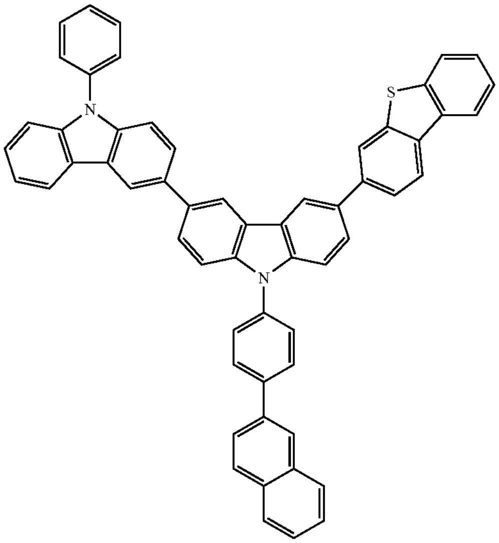 C30 | |
| 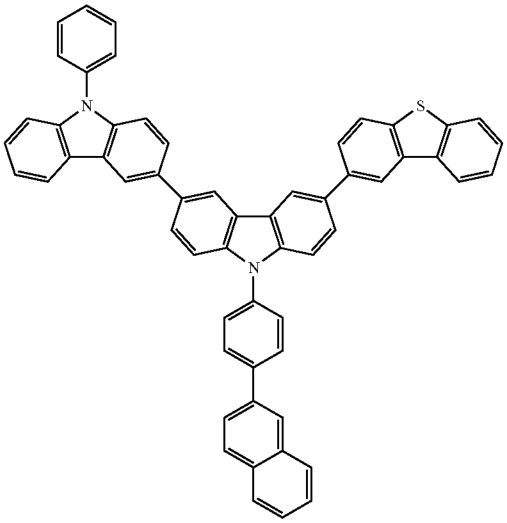 C31 | |

TABLE 1-continued

| Compound | T (eV) |
|---|---|
| 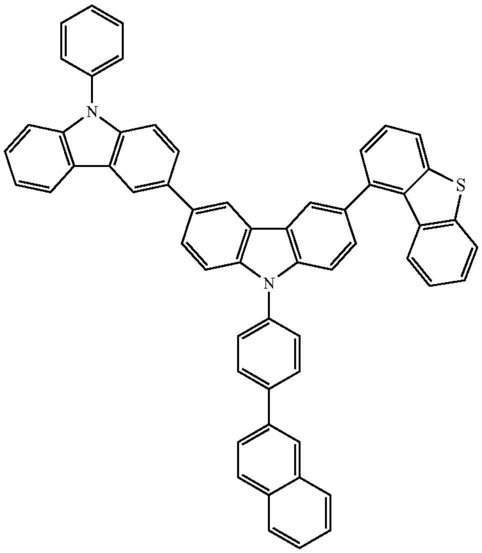 C32 | |
| 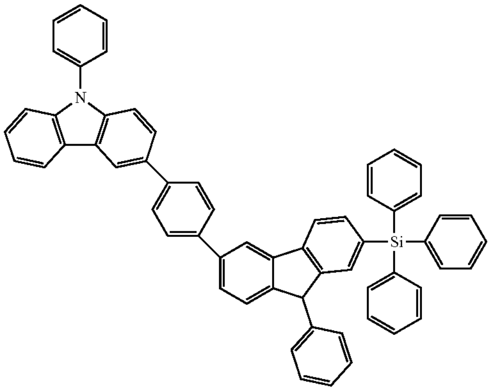 C33 | |
| 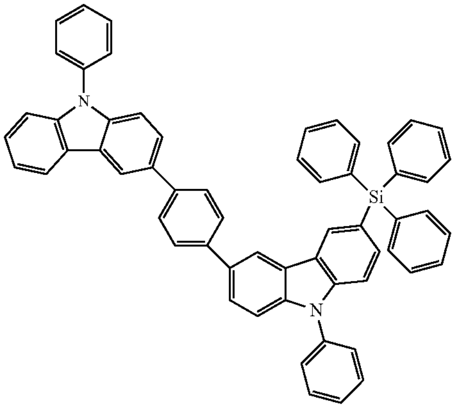 C34 | |
| 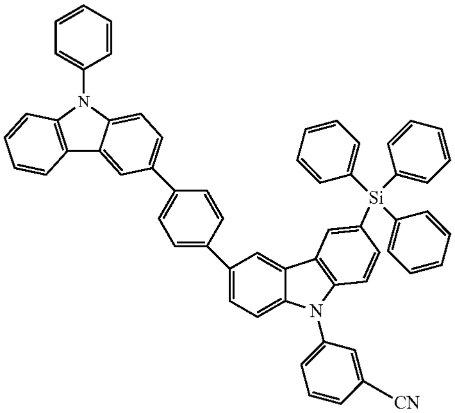 C35 | |
| 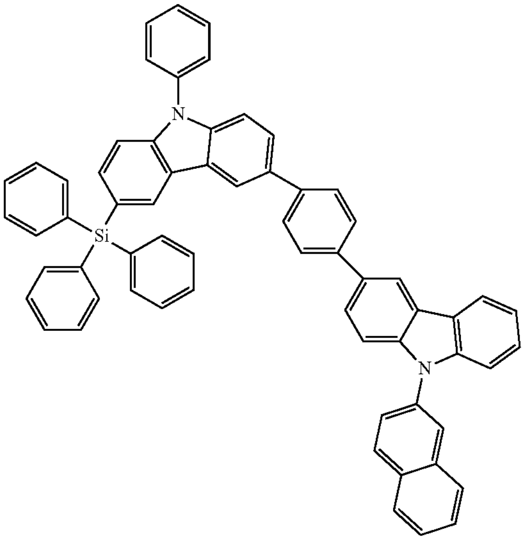 C36 | |
| 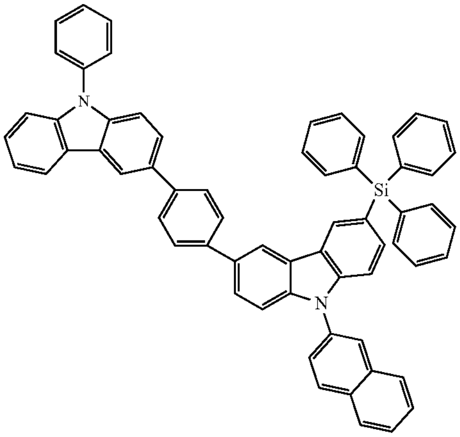 C37 | |

Referring to Table 1, DFT calculations confirmed that among Compounds C1 to C37, which are compounds including two carbazole groups (a carbazole-derived group) and having a structure in which the benzo rings of a first carbazole are linked to a benzo ring of another carbazole, have a $T_1$ energy level of less than 2.81 eV. Moreover, that same is true even if the compound includes a silyl group-containing group of Formula A (see, C9). Moreover, a compound having a structure in which triazine is bonded to the ninth N atom of carbazole had a $T_1$ energy level of less than 2.81 eV if the compound did not include a silyl group.

Figure 2:
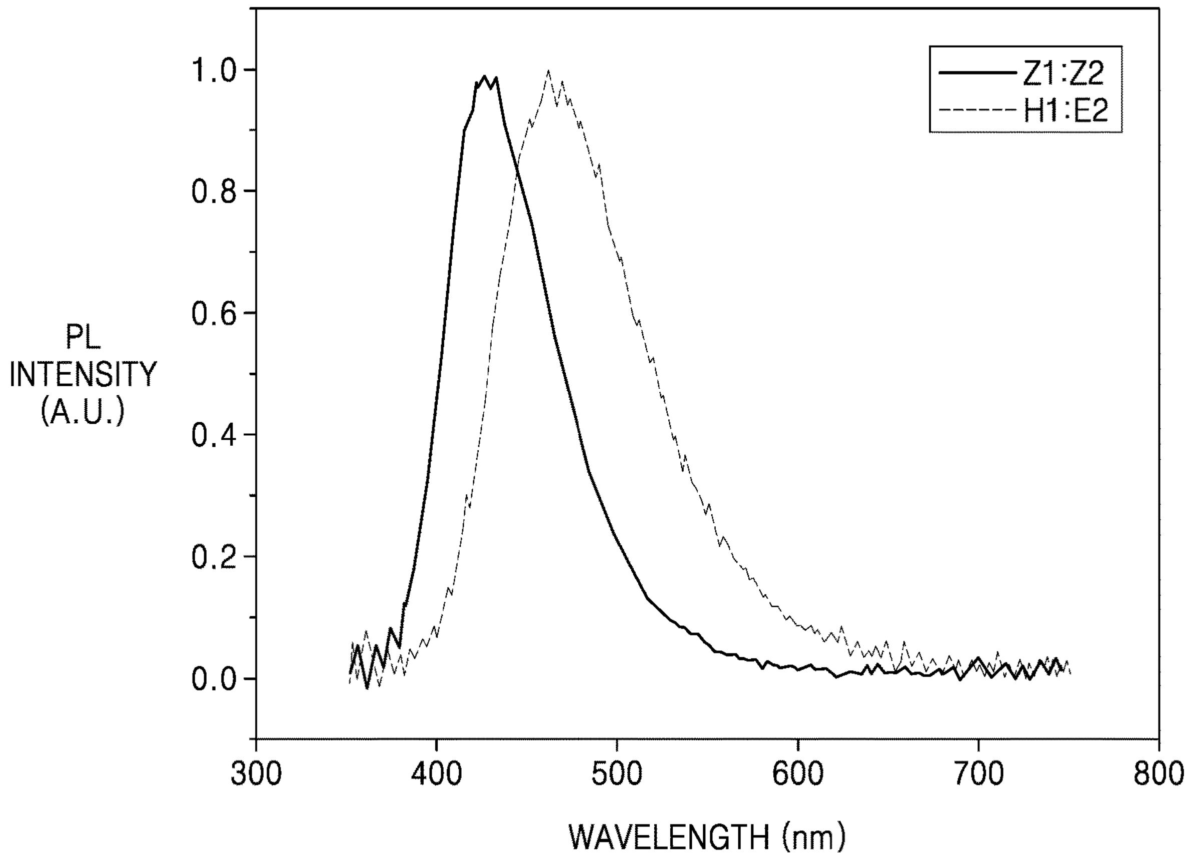
FIG. 2 shows photoluminescence (PL) curves of a thin film on which Compounds H1 and E2 are co-deposited, and on which Compounds Z1 and Z2 are co-deposited.

Evaluation Example 2: Evaluation of Photoluminescence (PL) Curve of Host Exciplex On a quartz substrate, Compounds Z1 and Z2 were co-deposited at a weight ratio of 50:50 to prepare a thin film having a thickness of 50 nm, and Compounds H1 and E2 were co-deposited at a weight ratio of 50:50 to prepare a thin film having a thickness of 50 nm. PL was measured for the prepared thin films by using a HITACHI F7000 fluorescence spectrometer. A graph of the measurement results is shown in FIG. 2 below.

The H1:E2 host thin film (exciplex energy=2.683 eV) had lower exciplex energy than the Z1:Z2 host thin film (exciplex energy=2.917 eV), and thus was observed to have a longer wavelength of the PL curve, which suggests an increase in device lifespan due to increased host stability.

Z1

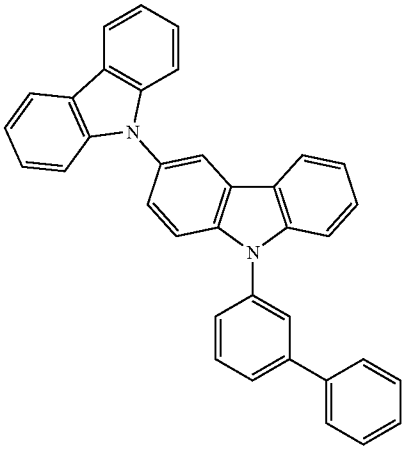

Z2

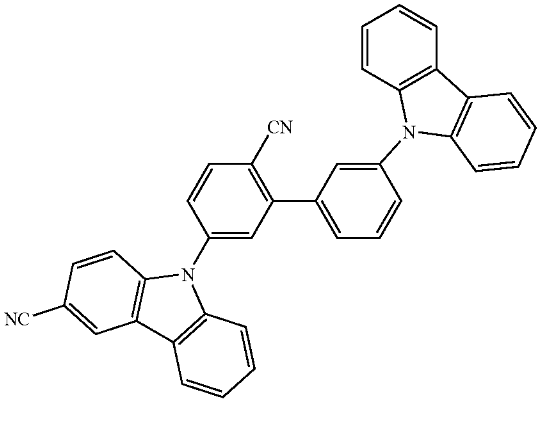

Evaluation Example 3: Evaluation of ET Host and Dopant Interaction

Compounds Z1 and Z2 (weight ratio of 60:40) and Compound P8, which was a dopant, were co-deposited on a quartz substrate in an amount of 15 wt % each to prepare a thin film having a thickness of 50 nm, as a control sample thin film.

Example sample thin films were prepared in the same manner as the control sample thin film, except that, for use as a host compound, a combination of Compound H1 and one of Compounds E1 to E6, E9, and E11 to E13 was used, respectively.

The change in the $2^{nd}$ peak was observed for the control sample thin film and ten Example sample thin films by using a HITACHI F7000 fluorescence spectrometer, and the amount of change in lifespan characteristics according to the ET host change was observed. Results thereof are shown in FIGS. 3A and 3B.

Figure 3A:
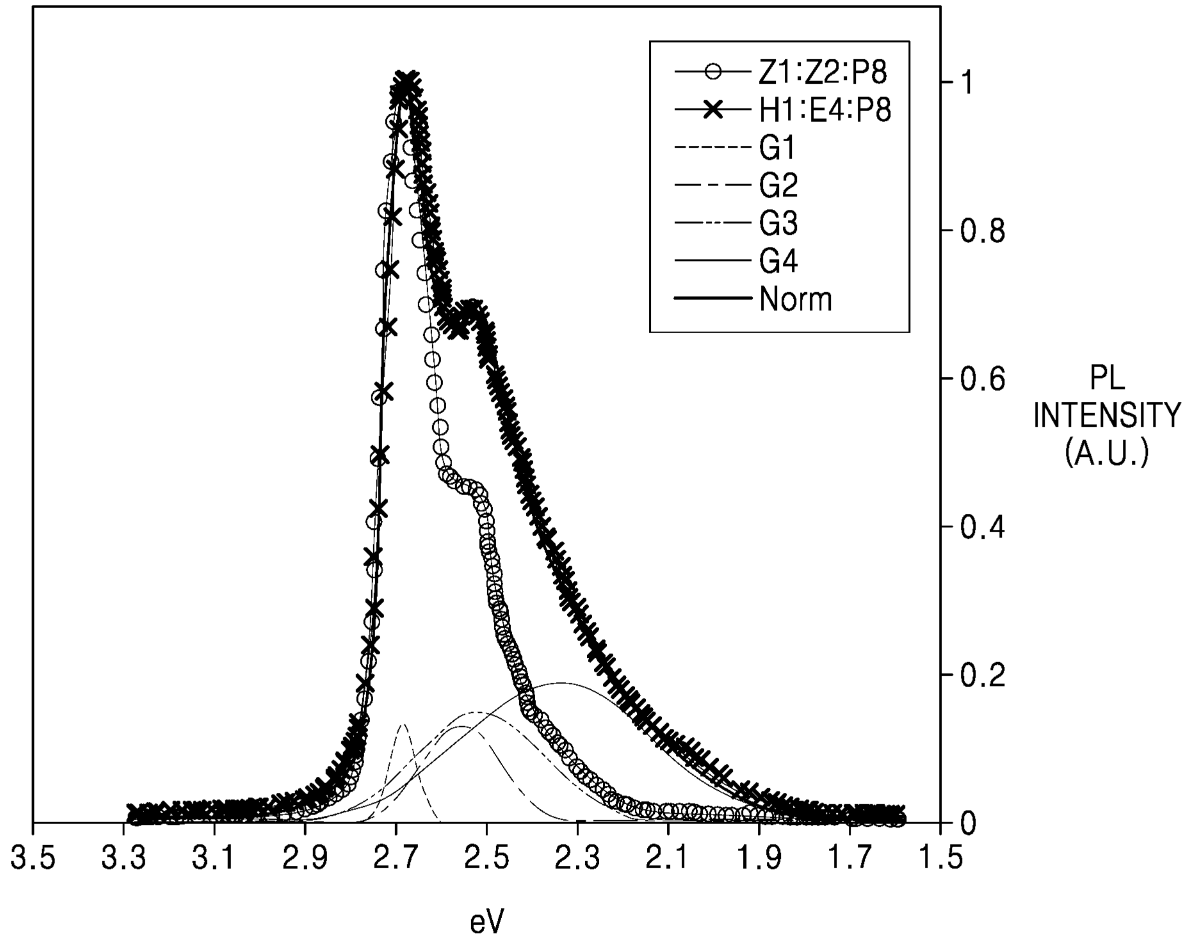
FIG. 3A is a deconvolution of PL curves of emission layers prepared by co-depositing Z1:Z2:P8 and H1:E1:P8, respectively.
Figure 3B:
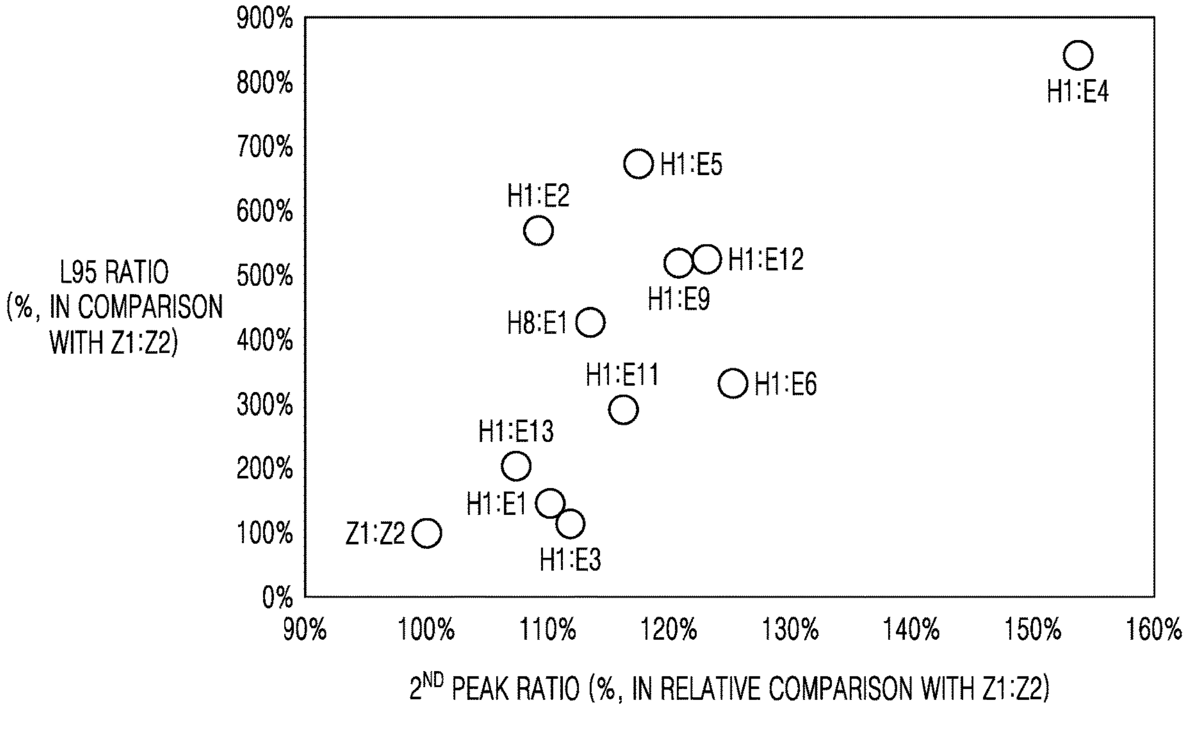
FIG. 3B is a plot showing a L95 lifespan ratio with respect to a $2^{nd}$ peak ratio in PL curves of an emission layer prepared by co-depositing Z1:Z2:P8 and an emission layer prepared by co-depositing H1, any one of E1 to E6, E9, and E11 to E13, and P8, and co-depositing H8, E1 and P8.

As shown in FIGS. 3A and 3B, low exciplex energy due to the interaction between the ET host and the dopant was observed in the Compound E4 host, and as a result, the device lifespan characteristics were increased by about 850% or less.

Evaluation Example 4: Device Evaluation of Light-Emitting Device (1)

Examples 1 to 9 and Comparative Example 1

A glass substrate with a 1,500 Å-thick indium tin oxide (ITO) electrode (first electrode, anode) formed thereon was cleaned by distilled water ultrasonication. After the distilled water ultrasonication, ultrasonic cleaning was performed with a solvent such as isopropyl alcohol, acetone, and methanol, and the glass substrate was dried and transferred to a plasma cleaner. The glass substrate was cleaned by using oxygen plasma for 5 minutes, and then transferred to a vacuum laminator.

Compound HT3 and Compound HT-D2 were co-deposited on the ITO electrode on the glass substrate to form a hole injection layer having a thickness of 100 Å, Compound HT3 was deposited on the hole injection layer to form a hole transport layer having a thickness of 1,300 Å, and mCP was deposited on the hole transport layer to form an electron blocking layer having a thickness of 100 Å, thereby completing the manufacture of a hole transport region.

Corresponding host compounds (weight ratio of 60:40) and phosphorescent dopants (15%) shown in Table 2 were co-deposited on the hole transport region to form an emission layer having a thickness of 400 Å.

BCP was vacuum-deposited on the emission layer to form a hole blocking layer having a thickness of 100 Å, Compound ET3 and LiQ were co-vacuum-deposited on the hole blocking layer to form an electron transport layer having a thickness of 300 Å, LiQ was deposited on the electron transport layer to form an electron injection layer having a thickness of 10 Å, and an Al second electrode (cathode) having a thickness of 1,200 Å was formed on the electron injection layer, thereby completing the manufacture of an organic light-emitting device.

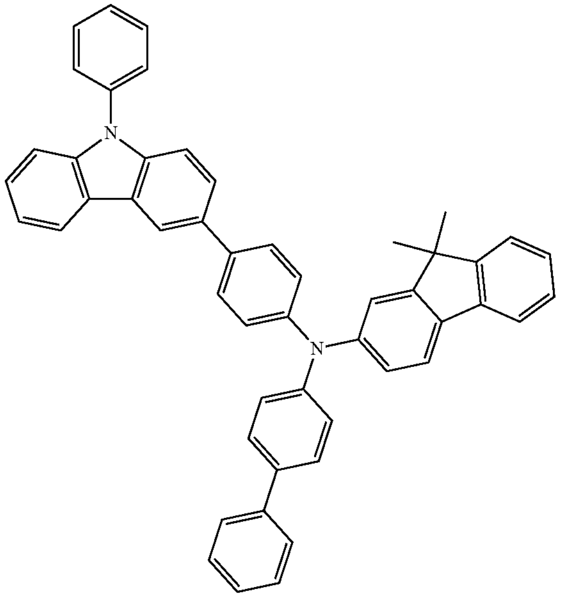

HT3

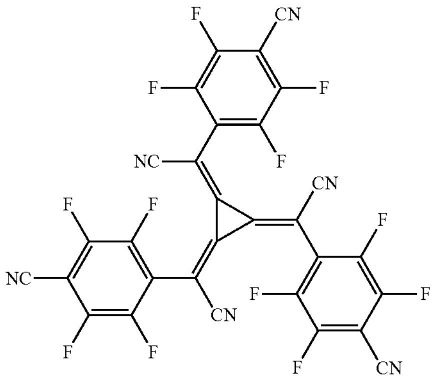

HT-D2

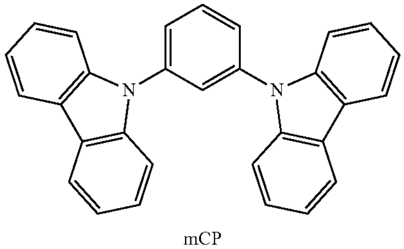

mCP

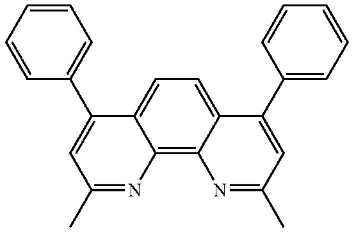

BCP

-continued

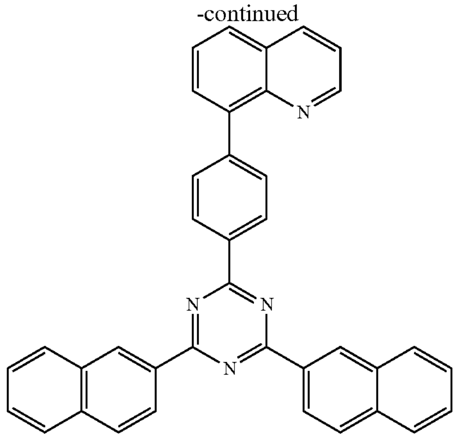

ET3

The $T_{95}$ lifespan characteristics, which is the time taken until the initial luminance is reduced to 95%, and EQE of the organic light-emitting devices manufactured in Examples 1 to 9 and Comparative Example 1 were measured, and the measurements were expressed as relative values with respect to the $T_{95}$ lifespan characteristics and EQE of Comparative Example 1 in Table 2.

TABLE 2

| | Host Materials | | Phosphorescent dopant | EQE ratio (%) | $T_{95}$ ratio (%) |
|---|---|---|---|---|---|
| Comparative Example 1 | Z1 | Z2 | P7 | 100 | 100 |
| Example 1 | H1 | E1 | P7 | 98 | 571 |
| Example 2 | H1 | E2 | P7 | 75 | 842 |
| Example 3 | H1 | E3 | P7 | 107 | 674 |
| Example 4 | H1 | E4 | P7 | 106 | 333 |
| Example 5 | H1 | E5 | P7 | 84 | 519 |
| Example 6 | H1 | E6 | P7 | 93 | 293 |
| Example 7 | H1 | E7 | P7 | 92 | 523 |
| Example 8 | H1 | E8 | P7 | 93 | 201 |
| Example 9 | H8 | E1 | P7 | 105 | 429 |

Referring to Table 2, it was confirmed that, as compared with Comparative Example 1 including Compounds Z1 and Z2 which did not include a silyl group, an organic light-emitting device including an emission layer including a combination of the HT-host and ET-host of the present disclosure, which included a silyl group, had significantly improved $T_{95}$ lifespan characteristics. In particular, in the case of Example 2, the lifespan characteristics were improved by 842%.

Evaluation Example 5: Device Evaluation of Light-Emitting Device (2)

Examples 10 to 27 and Comparative Examples 2 to 19

A glass substrate with a 1,500 Å-thick indium tin oxide (ITO) electrode (first electrode, anode) formed thereon was cleaned by distilled water ultrasonication. After the distilled water ultrasonication, ultrasonic cleaning was performed with a solvent such as isopropyl alcohol, acetone, and methanol, and the glass substrate was dried and transferred to a plasma cleaner. The glass substrate was cleaned by using oxygen plasma for 5 minutes, and then transferred to a vacuum laminator.

Compound HT3 and Compound HT-D2 were co-deposited on the ITO electrode on the glass substrate to form a hole injection layer having a thickness of 100 Å, Compound HT3 was deposited on the hole injection layer to form a hole transport layer having a thickness of 1,300 Å, and mCP was deposited on the hole transport layer to form an electron blocking layer having a thickness of 100 Å, thereby completing the manufacture of a hole transport region.

Corresponding host compounds (weight ratio of 60:40) and TADF dopant compounds (1.5 wt %) shown in Tables 3 to 20 were co-deposited on the hole transport region to form an emission layer having a thickness of 400 Å.

BCP was vacuum-deposited on the emission layer to form a hole blocking layer having a thickness of 100 Å, Compound ET3 and LiQ were co-vacuum-deposited on the hole blocking layer to form an electron transport layer having a thickness of 300 Å, LiQ was deposited on the electron transport layer to form an electron injection layer having a thickness of 10 Å, and an Al second electrode (cathode) having a thickness of 1,200 Å was formed on the electron injection layer, thereby completing the manufacture of an organic light-emitting device.

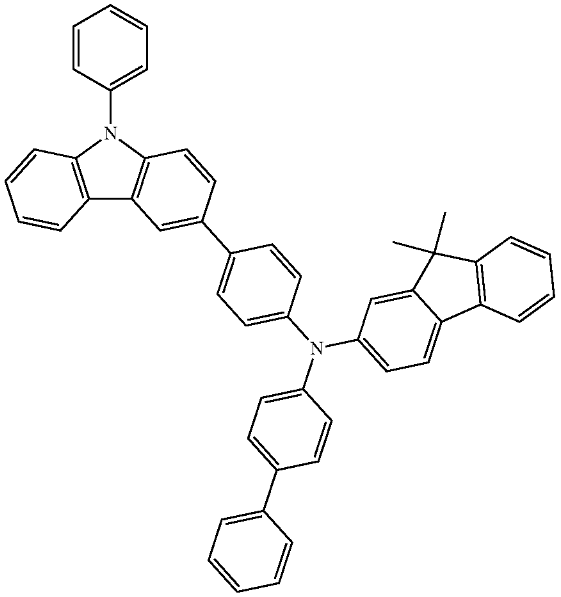

HT3

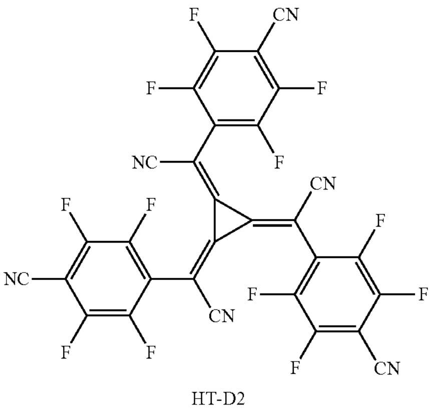

HT-D2

-continued

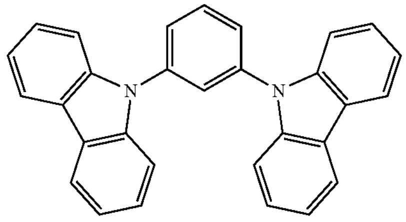

mCP

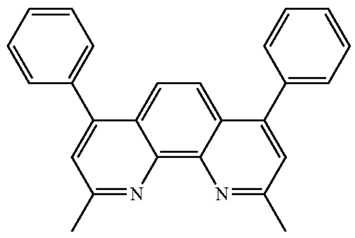

BCP

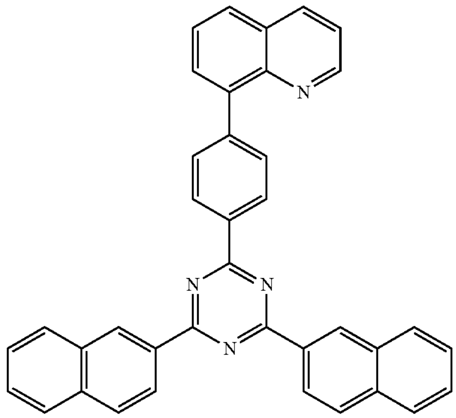

ET3

The $T_{95}$ lifespan characteristics, which is the time taken until the initial luminance is reduced to 95%, and EQE of the organic light-emitting devices manufactured in Example 10 and Comparative Example 2 were measured, and the measurements were expressed as relative values with respect to the $T_{95}$ lifespan characteristics and EQE of Comparative Example 2 in Table 3.

TABLE 3

| | Host Materials | | TADF dopant | EQE ratio (%) | $T_{95}$ ratio (%) |
|---|---|---|---|---|---|
| Comparative Example 2 | Z1 | Z2 | D1 | 100 | 100 |
| Example 10 | H1 | E1 | D1 | 134 | 526 |

The $T_{95}$ lifespan characteristics, which is the time taken until the initial luminance is reduced to 95%, and EQE of the organic light-emitting devices manufactured in Example 11 and Comparative Example 3 were measured, and the measurements were expressed as relative values with respect to the $T_{95}$ lifespan characteristics and EQE of Comparative Example 3 in Table 4.

TABLE 4

| | Host Materials | | TADF dopant | EQE ratio (%) | $T_{95}$ ratio (%) |
|---|---|---|---|---|---|
| Comparative Example 3 | Z1 | Z2 | D2 | 100 | 100 |
| Example 11 | H1 | E1 | D2 | 101 | 185 |

The $T_{95}$ lifespan characteristics, which is the time taken until the initial luminance is reduced to 95%, and EQE of the organic light-emitting devices manufactured in Examples 12 and Comparative Example 4 were measured, and the measurements were expressed as relative values with respect to the $T_{95}$ lifespan characteristics and EQE of Comparative Example 4 in Table 5.

TABLE 5

| | Host Materials | | TADF dopant | EQE ratio (%) | $T_{95}$ ratio (%) |
|---|---|---|---|---|---|
| Comparative Example 4 | Z1 | Z2 | D3 | 100 | 100 |
| Example 12 | H1 | E1 | D3 | 94 | 163 |

The $T_{95}$ lifespan characteristics, which is the time taken until the initial luminance is reduced to 95%, and EQE of the organic light-emitting devices manufactured in Example 13 and Comparative Example 5 were measured, and the measurements were expressed as relative values with respect to the $T_{95}$ lifespan characteristics and EQE of Comparative Example 5 in Table 6.

TABLE 6

| | Host Materials | | TADF dopant | EQE ratio (%) | $T_{95}$ ratio (%) |
|---|---|---|---|---|---|
| Comparative Example 5 | Z1 | Z2 | D4 | 100 | 100 |
| Example 13 | H1 | E1 | D4 | 96 | 174 |

The $T_{95}$ lifespan characteristics, which is the time taken until the initial luminance is reduced to 95%, and EQE of the organic light-emitting devices manufactured in Example 14 and Comparative Example 6 were measured, and the measurements were expressed as relative values with respect to the $T_{95}$ lifespan characteristics and EQE of Comparative Example 6 in Table 7.

TABLE 7

| | Host Materials | | TADF dopant | EQE ratio (%) | $T_{95}$ ratio (%) |
|---|---|---|---|---|---|
| Comparative Example 6 | Z1 | Z2 | D5 | 100 | 100 |
| Example 14 | H1 | E1 | D5 | 106 | 239 |

The $T_{95}$ lifespan characteristics, which is the time taken until the initial luminance is reduced to 95%, and EQE of the organic light-emitting devices manufactured in Example 15 and Comparative Example 7 were measured, and the measurements were expressed as relative values with respect to the $T_{95}$ lifespan characteristics and EQE of Comparative Example 7 in Table 8.

TABLE 8

| | Host Materials | | TADF dopant | EQE ratio (%) | $T_{95}$ ratio (%) |
|---|---|---|---|---|---|
| Comparative Example 7 | Z1 | Z2 | D6 | 100 | 100 |
| Example 15 | H1 | E1 | D6 | 109 | 263 |

The $T_{95}$ lifespan characteristics, which is the time taken until the initial luminance is reduced to 95%, and EQE of the organic light-emitting devices manufactured in Example 16 and Comparative Example 8 were measured, and the measurements were expressed as relative values with respect to the $T_{95}$ lifespan characteristics and EQE of Comparative Example 8 in Table 9.

TABLE 9

| | Host Materials | | TADF dopant | EQE ratio (%) | $T_{95}$ ratio (%) |
|---|---|---|---|---|---|
| Comparative Example 8 | Z1 | Z2 | D7 | 100 | 100 |
| Example 16 | H1 | E1 | D7 | 92 | 158 |

The $T_{95}$ lifespan characteristics, which is the time taken until the initial luminance is reduced to 95%, and EQE of the organic light-emitting devices manufactured in Example 17 and Comparative Example 9 were measured, and the measurements were expressed as relative values with respect to the $T_{95}$ lifespan characteristics and EQE of Comparative Example 9 in Table 10.

TABLE 10

| | Host Materials | | TADF dopant | EQE ratio (%) | $T_{95}$ ratio (%) |
|---|---|---|---|---|---|
| Comparative Example 9 | Z1 | Z2 | D8 | 100 | 100 |
| Example 17 | H1 | E1 | D8 | 96 | 163 |

The $T_{95}$ lifespan characteristics, which is the time taken until the initial luminance is reduced to 95%, and EQE of the organic light-emitting devices manufactured in Example 18 and Comparative Example 10 were measured, and the measurements were expressed as relative values with respect to the $T_{95}$ lifespan characteristics and EQE of Comparative Example 10 in Table 11.

TABLE 11

| | Host Materials | | TADF dopant | EQE ratio (%) | $T_{95}$ ratio (%) |
|---|---|---|---|---|---|
| Comparative Example 10 | Z1 | Z2 | D9 | 100 | 100 |
| Example 18 | H1 | E1 | D9 | 100 | 217 |

The $T_{95}$ lifespan characteristics, which is the time taken until the initial luminance is reduced to 95%, and EQE of the organic light-emitting devices manufactured in Example 19 and Comparative Example 11 were measured, and the measurements were expressed as relative values with respect to the $T_{95}$ lifespan characteristics and EQE of Comparative Example 11 in Table 12.

TABLE 12

| | Host Materials | | TADF dopant | EQE ratio (%) | $T_{95}$ ratio (%) |
|---|---|---|---|---|---|
| Comparative Example 11 | Z1 | Z2 | D10 | 100 | 100 |
| Example 19 | H1 | E1 | D10 | 108 | 248 |

The $T_{95}$ lifespan characteristics, which is the time taken until the initial luminance is reduced to 95%, and EQE of the organic light-emitting devices manufactured in Example 20 and Comparative Example 12 were measured, and the measurements were expressed as relative values with respect to the $T_{95}$ lifespan characteristics and EQE of Comparative Example 12 in Table 13.

TABLE 13

| | Host Materials | | TADF dopant | EQE ratio (%) | $T_{95}$ ratio (%) |
|---|---|---|---|---|---|
| Comparative Example 12 | Z1 | Z2 | D11 | 100 | 100 |
| Example 20 | H1 | E1 | D11 | 111 | 295 |

The $T_{95}$ lifespan characteristics, which is the time taken until the initial luminance is reduced to 95%, and EQE of the organic light-emitting devices manufactured in Example 21 and Comparative Example 13 were measured, and the measurements were expressed as relative values with respect to the $T_{95}$ lifespan characteristics and EQE of Comparative Example 13 in Table 14.

TABLE 14

| | Host Materials | | TADF dopant | EQE ratio (%) | $T_{95}$ ratio (%) |
|---|---|---|---|---|---|
| Comparative Example 13 | Z1 | Z2 | D12 | 100 | 100 |
| Example 21 | H1 | E1 | D12 | 90 | 108 |

The $T_{95}$ lifespan characteristics, which is the time taken until the initial luminance is reduced to 95%, and EQE of the organic light-emitting devices manufactured in Example 22 and Comparative Example 14 were measured, and the measurements were expressed as relative values with respect to the $T_{95}$ lifespan characteristics and EQE of Comparative Example 14 in Table 15.

TABLE 15

| | Host Materials | | TADF dopant | EQE ratio (%) | $T_{95}$ ratio (%) |
|---|---|---|---|---|---|
| Comparative Example 14 | Z1 | Z2 | D13 | 100 | 100 |
| Example 22 | H1 | E1 | D13 | 95 | 196 |

The $T_{95}$ lifespan characteristics, which is the time taken until the initial luminance is reduced to 95%, and EQE of the organic light-emitting devices manufactured in Example 23 and Comparative Example 15 were measured, and the measurements were expressed as relative values with respect to the $T_{95}$ lifespan characteristics and EQE of Comparative Example 15 in Table 16.

TABLE 16

| | Host Materials | | TADF dopant | EQE ratio (%) | $T_{95}$ ratio (%) |
|---|---|---|---|---|---|
| Comparative Example 15 | Z1 | Z2 | D14 | 100 | 100 |
| Example 23 | H1 | E1 | D14 | 115 | 269 |

The $T_{95}$ lifespan characteristics, which is the time taken until the initial luminance is reduced to 95%, and EQE of the organic light-emitting devices manufactured in Example 24 and Comparative Example 16 were measured, and the measurements were expressed as relative values with respect to the $T_{95}$ lifespan characteristics and EQE of Comparative Example 16 in Table 17.

TABLE 17

| | Host | | TADF dopant | EQE ratio (%) | $T_{95}$ ratio (%) |
|---|---|---|---|---|---|
| Comparative Example 16 | Z1 | Z2 | D15 | 100 | 100 |
| Example 24 | H1 | E1 | D15 | 97 | 198 |

The $T_{95}$ lifespan characteristics, which is the time taken until the initial luminance is reduced to 95%, and EQE of the organic light-emitting devices manufactured in Example 25 and Comparative Example 17 were measured, and the measurements were expressed as relative values with respect to the $T_{95}$ lifespan characteristics and EQE of Comparative Example 17 in Table 18.

TABLE 18

| | Host Materials | | TADF dopant | EQE ratio (%) | $T_{95}$ ratio (%) |
|---|---|---|---|---|---|
| Comparative Example 17 | Z1 | Z2 | D16 | 100 | 100 |
| Example 25 | H1 | E1 | D16 | 90 | 206 |

The $T_{95}$ lifespan characteristics, which is the time taken until the initial luminance is reduced to 95%, and EQE of the organic light-emitting devices manufactured in Example 26 and Comparative Example 18 were measured, and the measurements were expressed as relative values with respect to the $T_{95}$ lifespan characteristics and EQE of Comparative Example 18 in Table 19.

TABLE 19

| | Host Materials | | TADF dopant | EQE ratio (%) | $T_{95}$ ratio (%) |
|---|---|---|---|---|---|
| Comparative Example 18 | Z1 | Z2 | D17 | 100 | 100 |
| Example 26 | H1 | E1 | D17 | 98 | 245 |

The $T_{95}$ lifespan characteristics, which is the time taken until the initial luminance is reduced to 95%, and EQE of the organic light-emitting devices manufactured in Example 27 and Comparative Example 19 were measured, and the measurements were expressed as relative values with respect to the $T_{95}$ lifespan characteristics and EQE of Comparative Example 19 in Table 20.

TABLE 20

| | | Host Materials | TADF dopant | EQE ratio (%) | $T_{95}$ ratio (%) |
|---|---|---|---|---|---|
| Comparative Example 19 | Z1 | Z2 | D18 | 100 | 100 |
| Example 27 | H1 | E1 | D18 | 93 | 179 |

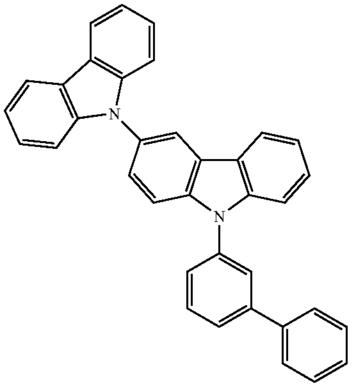 [SMILES: c1ccc(-c2cccc(-n3c4ccccc4c4cc(-n5c6ccccc6c6ccccc65)ccc43)c2)cc1]

Z1

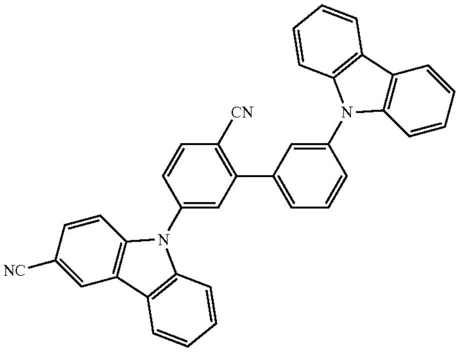 [SMILES: N#Cc1ccc2c(c1)c1ccccc1n2-c1ccc(C#N)c(-c2cccc(-n3c4ccccc4c4ccccc43)c2)c1]

Z2

Referring to Tables 3 to 20, it was confirmed that, as compared with Comparative Examples 2 to 19 including Compounds Z1 and Z2 which did not include a silyl group, an organic light-emitting device including an emission layer including a combination of the HT-host and ET-host of the present disclosure, which included a silyl group, had significantly improved $T_{95}$ lifespan characteristics while maintaining EQE. In particular, in the case of Example 10, it was confirmed that the lifespan characteristics were significantly improved by 526%.

Examples 28 to 38 and Comparative Examples 20 and 21

A glass substrate with a 1,500 Å-thick indium tin oxide (ITO) electrode (first electrode, anode) formed thereon was cleaned by distilled water ultrasonication. After the distilled water ultrasonication, ultrasonic cleaning was performed with a solvent such as isopropyl alcohol, acetone, and methanol, and the glass substrate was dried and transferred to a plasma cleaner. The glass substrate was cleaned by using oxygen plasma for 5 minutes, and then transferred to a vacuum laminator.

Compound HT3 and Compound HT-D2 were co-deposited on the ITO electrode on the glass substrate to form a hole injection layer having a thickness of 100 Å, Compound HT3 was deposited on the hole injection layer to form a hole transport layer having a thickness of 1,300 Å, and mCP was deposited on the hole transport layer to form an electron blocking layer having a thickness of 100 Å, thereby completing the manufacture of a hole transport region.

Corresponding host compounds (weight ratio of 60:40), sensitizer compounds (15%), and dopant compounds (1.5%) shown in Tables 21 and 22 were co-deposited on the hole transport region to form an emission layer having a thickness of 400 Å.

BCP was vacuum-deposited on the emission layer to form a hole blocking layer having a thickness of 100 Å, Compound ET3 and LiQ were co-vacuum-deposited on the hole blocking layer to form an electron transport layer having a thickness of 300 Å, LiQ was deposited on the electron transport layer to form an electron injection layer having a thickness of 10 Å, and an Al second electrode (cathode) having a thickness of 1,200 Å was formed on the electron injection layer, thereby completing the manufacture of an organic light-emitting device.

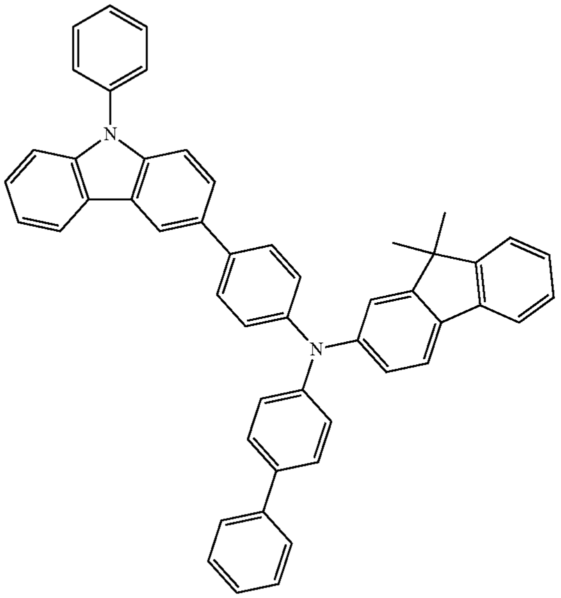

HT3

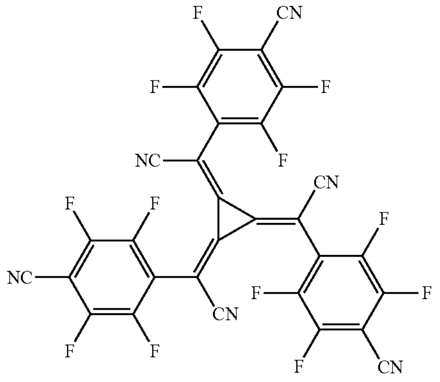

HT-D2

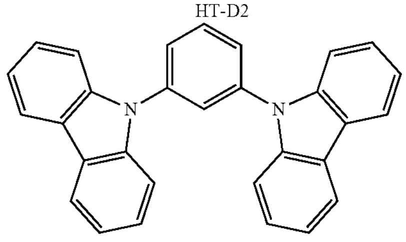

mCP

-continued

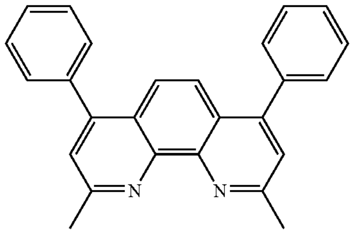

BCP

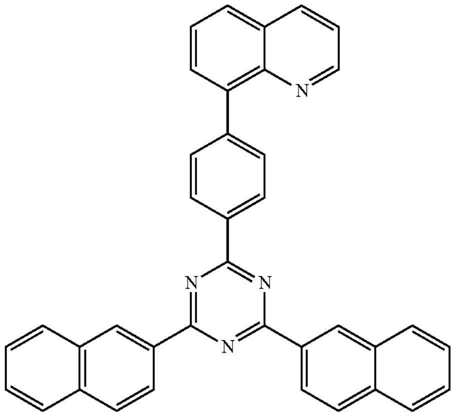

ET3

The $T_{95}$ lifespan characteristics, which is the time taken until the initial luminance is reduced to 95%, and EQE of the organic light-emitting devices manufactured in Examples 28 to 34 and Comparative Example 20 were measured, and the measurements were expressed as relative values with respect to the $T_{95}$ lifespan characteristics and EQE of Comparative Example 20 in Table 21.

TABLE 21

| | Host Materials | | Sensitizer | Dopant | EQE ratio (%) | $T_{95}$ ratio (%) |
|---|---|---|---|---|---|---|
| Comparative Example 20 | Z1 | Z2 | P7 | D19 | 100 | 100 |
| Example 28 | H1 | E1 | P7 | D19 | 97 | 279 |
| Example 29 | H1 | E2 | P7 | D19 | 73 | 262 |
| Example 30 | H1 | E3 | P7 | D19 | 103 | 202 |
| Example 31 | H1 | E4 | P7 | D19 | 101 | 124 |
| Example 32 | H1 | E5 | P7 | D19 | 87 | 183 |
| Example 33 | H1 | E7 | P7 | D19 | 98 | 209 |
| Example 34 | H8 | E1 | P7 | D19 | 91 | 224 |

The $T_{95}$ lifespan characteristics, which is the time taken until the initial luminance is reduced to 95%, and EQE of the organic light-emitting devices manufactured in Examples 35 to 38 and Comparative Example 21 were measured, and the measurements were expressed as relative values with respect to the $T_{95}$ lifespan characteristics and EQE of Comparative Example 21 in Table 22.

TABLE 22

| | Host Materials | | Sensitizer | Dopant | EQE ratio (%) | $T_{95}$ ratio (%) |
|---|---|---|---|---|---|---|
| Comparative Example 21 | Z1 | Z2 | P7 | D3 | 100 | 100 |
| Example 35 | H1 | E1 | P7 | D3 | 95 | 325 |
| Example 36 | H1 | E3 | P7 | D3 | 99 | 458 |
| Example 37 | H1 | E6 | P7 | D3 | 93 | 307 |
| Example 38 | H1 | E8 | P7 | D3 | 94 | 124 |

Referring to Tables 21 and 22, it was confirmed that, as compared with Comparative Examples 20 and 21 including, as a host, Compounds Z1 and Z2 do did not include a silyl group, an organic light-emitting device including an emission layer including a combination of the HT-host and ET-host of the present disclosure, which does include a silyl group, has significantly improved $T_{95}$ lifespan characteristics. In the case of Examples 28 and 36, the lifespan characteristics were significantly improved by 279% and 458%, respectively.

According to an aspect of an embodiment, an organic light-emitting device may include a first compound and a second compound, and since at least one compound of the first compound and the second compound has a $T_1$ energy level of 2.81 eV or more, transfer of excitons to a blue light-emitting emitter compound may be facilitated, thereby suppressing device deterioration. As a result, an organic light-emitting device having high efficiency and a long lifespan may be manufactured.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting device comprising:

a first electrode and a second electrode each having a surface opposite the other; and an intermediate layer disposed between the first electrode and the second electrode, the intermediate layer comprising a first compound and a second compound, wherein the intermediate layer comprises an emission layer, and the emission layer comprises the first compound, the second compound, and at least one dopant compound, wherein the first compound comprises a silyl group-containing group and at least two carbazole-derived groups, wherein one carbazole-derived group of the at least two carbazole-derived groups is bonded via a N atom to another carbazole-derived group and is represented by Formula 1-2, and the second compound comprises a silyl group-containing group, a triazine group, and a carbazole-derived group, and Formula 1-2

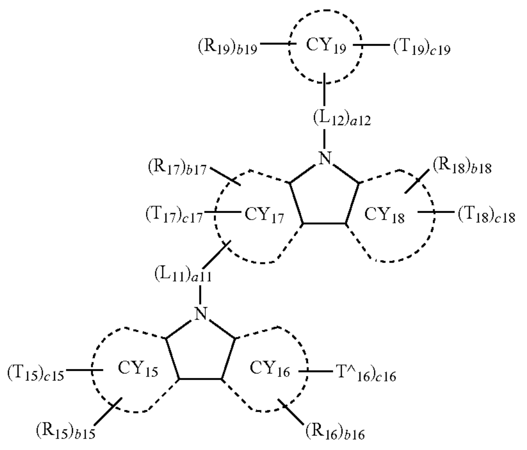

wherein, in Formula 1-2, $CY_{15}$ to $CY_{19}$ are each independently a $C_5$-$C_{30}$ carbocyclic group or a $C_1$-$C_{30}$ heterocyclic group, $T_{15}$ to $T_{19}$ are each independently a group represented by Formula A, and c15 to c18 are each independently an integer from 0 to 10, and c19 is 0, where the sum of the sum of c15, c16, c17, and c18 is 1 or more, and in Formula 1-2 and Formula A, Formula A

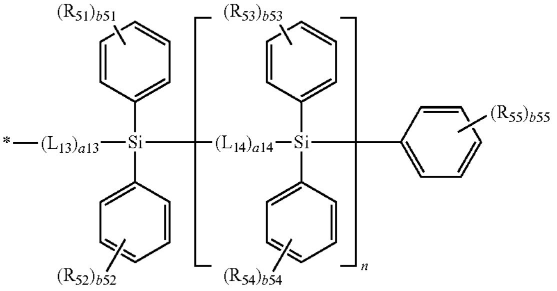

$L_{11}$ to $L_{14}$ are each independently a substituted or unsubstituted $C_1$-$C_{20}$ alkylene group, a substituted or unsubstituted $C_2$-$C_{20}$ alkenylene group, a substituted or unsubstituted $C_5$-$C_{60}$ carbocyclic group, or a substituted or unsubstituted $C_1$-$C_{60}$ heterocyclic group, a11 to a14 are each independently an integer from 0 to 5, when a11 is 0, $L_{11}$ is not present, and the N atom of one carbazole-derived group is directly bonded to $CY_{17}$, when a12 is 0, $L_{12}$ is not present, and the N atom of one carbazole-derived group is directly bonded to $CY_{19}$, when a13 is 0, $L_{13}$ is not present, and a Si atom of the first silyl group-containing group of Formula A is directly bonded to $CY_{10}$ to $CY_{19}$, or when a14 is 0, $L_{14}$ is not present, and a Si atom of the first silyl group-containing group of Formula A is directly bonded to a neighboring Si atom of the first silyl group-containing group of Formula A, n is an integer from 0 to 3, $R_{15}$ to $R_{19}$ and $R_{51}$ to $R_{55}$ are each independently hydrogen, deuterium, —F, —Cl, —Br, —I, $—SF_5$, a hydroxy group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $—N(Q_1)(Q_2)$, $—Ge(Q_3)(Q_4)(Q_5)$, $—B(Q_6)(Q_7)$, $—P(=O)(Q_8)(Q_9)$, or $—P(Q_8)(Q_9)$, b15 to b19 are each independently an integer from 0 to 10, b51 to b55 are each independently an integer from 0 to 5, and a substituent of each of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Ge(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Ge(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Ge(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organic light-emitting device of claim 1, wherein the second compound has a structure in which the silyl group-containing group of the second compound is bonded to a ring carbon of the triazine group.

3. The organic light-emitting device of claim 1, wherein the first compound is a hole-transporting host compound, and the second compound is an electron-transporting host compound.

4. The organic light-emitting device of claim 1, wherein the at least one dopant compound comprises a third compound, a fourth compound, or a combination thereof.

5. The organic light-emitting device of claim 1, wherein $CY_{15}$ to $CY_{19}$ are each independently a benzene group, a naphthalene group, an anthracene group, a phenanthrene group, a pyrene group, a furan group, a thiophene group, a pyrrole group, a silole group, a benzofuran group, a benzothiophene group, an indole group, an indene group, a benzosilole group, a dibenzofuran group, a dibenzothiophene group, a carbazole group, a fluorene group, a dibenzosilole group, an azabenzofuran group, an azabenzothiophene group, an azaindole group, an azaindene group, an azabenzosilole group, an azadibenzofuran group, an azadibenzothiophene group, an azacarbazole group, an azafluorene group, or an azadibenzosilole group.

6. The organic light-emitting device of claim 1, wherein the first compound is represented by Formulae 1-2-1, 1-2-2, 1-2-3, or 1-2-4:

Formula 1-2-1

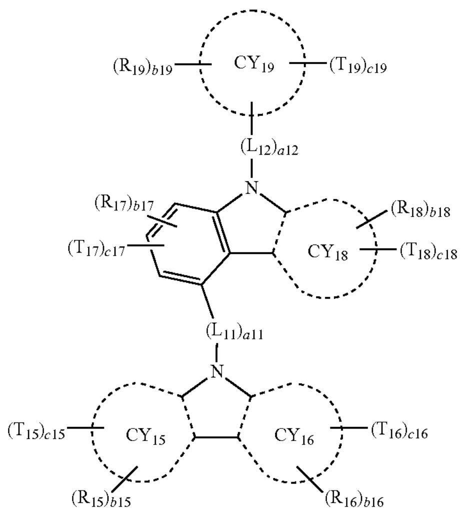

Formula 1-2-2

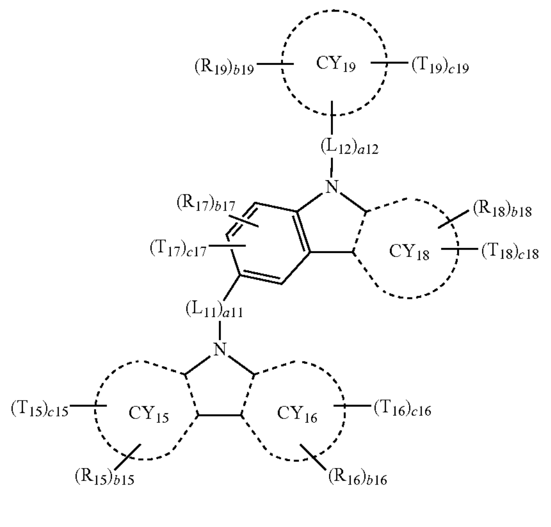

-continued
Formula 1-2-3
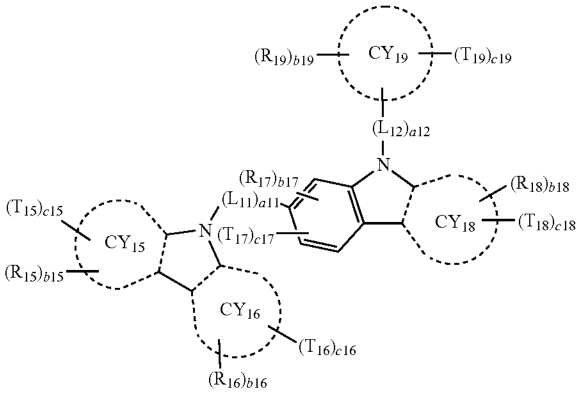
Formula 1-2-4
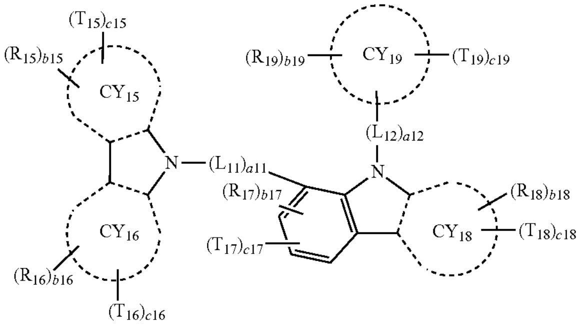
wherein, in Formulae 1-2-1, 1-2-2, 1-2-3, and 1-2-4,
$CY_{15}$, $CY_{16}$, $CY_{18}$, $CY_{19}$, $R_{15}$ to $R_{19}$, $T_{15}$ to $T_{19}$, $L_{11}$, $L_{12}$, a11, a12, $b_{15}$, b16, b18, b19, to c 15, c16, c18, and c19 are each the same as described in claim 1, and
b17 is an integer from 0 to 3, c17 is an integer from 0 to 3, and the sum of b17 and c17 is 3.
7. The organic light-emitting device of claim 1, wherein the first compound is one or more of Compounds H8 to H11 and H13 to H15:
H8
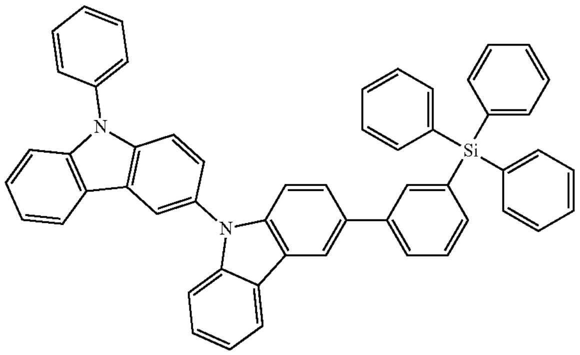
-continued
H9
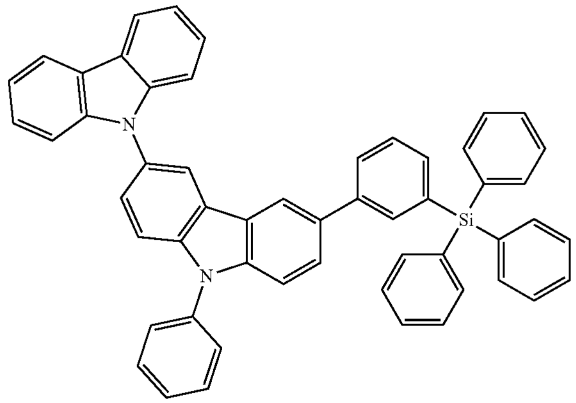
H10
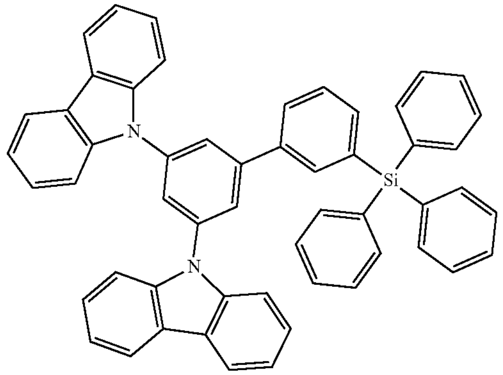
H11
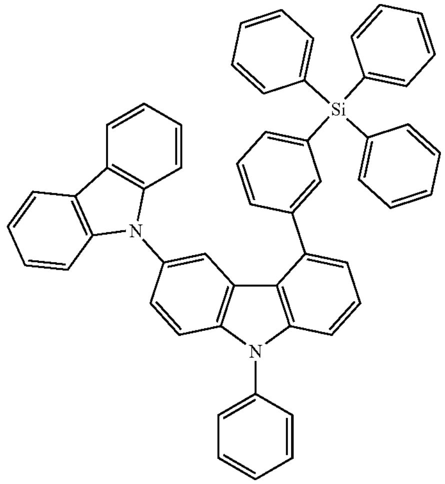

-continued

H13

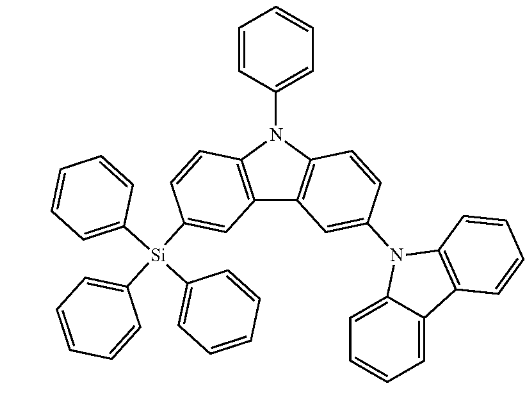

H14

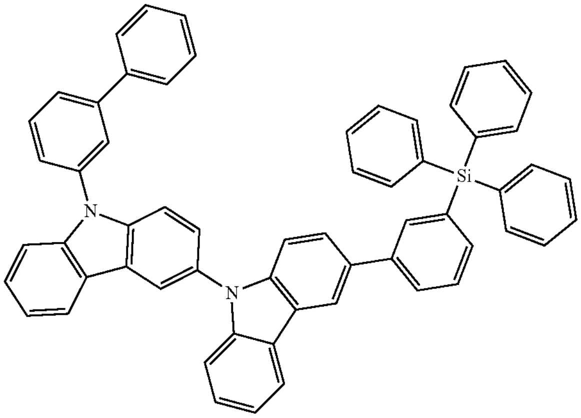

H15

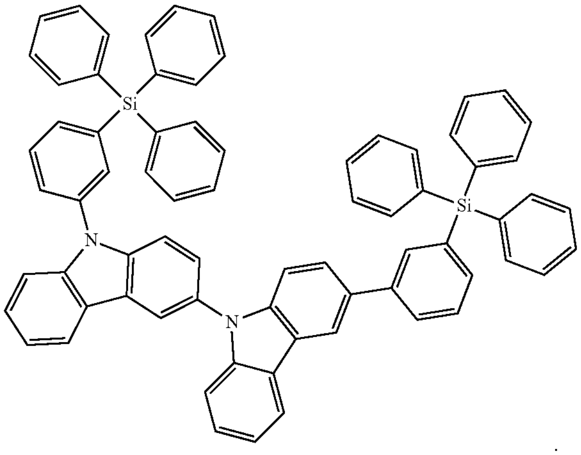

.

8. The organic light-emitting device of claim 1, wherein the second compound comprises a compound represented by Formula 2-1:

Formula 2-1

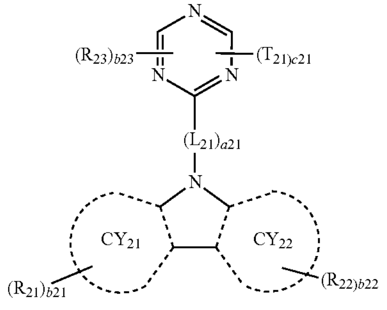

Formula A

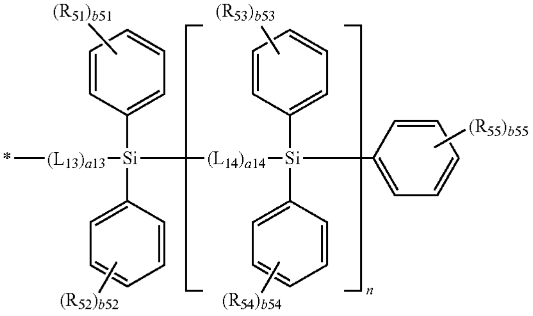

wherein, in Formulae 2-1 and A, $CY_{21}$ and $CY_{22}$ are each independently a $C_5$-$C_{30}$ carbocyclic group or a $C_1$-$C_{30}$ heterocyclic group, $L_{13}$, $L_{14}$, and $L_{21}$ are each independently a substituted or unsubstituted $C_1$-$C_{20}$ alkylene group, a substituted or unsubstituted $C_2$-$C_{20}$ alkenylene group, a substituted or unsubstituted $C_5$-$C_{60}$ carbocyclic group, or a substituted or unsubstituted $C_1$-$C_{60}$ heterocyclic group, a13, a14, and a21 are each independently an integer from 0 to 5, when a13 is 0, $L_{13}$ is not present and a Si atom of the second silyl group-containing group of Formula A is directly bonded to a ring carbon of the triazine group, when a14 is 0, $L_{14}$ is not present and a Si atom of second silyl group-containing group of Formula A is directly bonded to a neighboring Si atom of the second silyl group-containing group, and when a21 is 0, $L_{21}$ is not present and a N atom of one carbazole-derived group is directly bonded to a ring carbon of the triazine group, $T_{21}$ is a group represented by Formula A, c21 is 1 or 2, n is an integer from 0 to 3, $R_{21}$ to $R_{23}$ and $R_{51}$ to $R_{55}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Ge($Q_3$)($Q_4$)($Q_3$), —B($Q_6$)($Q_7$), —P(═O)($Q_8$)($Q_9$), or —P($Q_8$)($Q_9$), b21 and b22 are each independently an integer from 0 to 10, b23 is 0 or 1, b51 to b55 are each independently an integer from 0 to 5, and a substituent of each of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

9. The organic light-emitting device of claim 8, wherein $CY_{21}$ and $CY_{22}$ are each independently a benzene group, a naphthalene group, an anthracene group, a phenanthrene group, a pyrene group, a furan group, a thiophene group, a pyrrole group, a silole group, a benzofuran group, a benzothiophene group, an indole group, an indene group, a benzosilole group, a dibenzofuran group, a dibenzothiophene group, a carbazole group, a fluorene group, a dibenzosilole group, an azabenzofuran group, an azabenzothiophene group, an azaindole group, an azaindene group, an azabenzosilole group, an azadibenzofuran group, an azadibenzothiophene group, an azacarbazole group, an azafluorene group, or an azadibenzosilole group.

10. The organic light-emitting device of claim 8, wherein the second compound comprises a compound represented by Formula 2-1-1 or Formula 2-2-2:

Formula 2-1-1

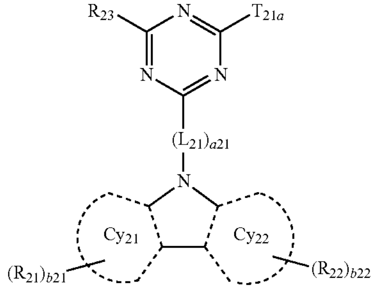

-continued
Formula 2-2-2
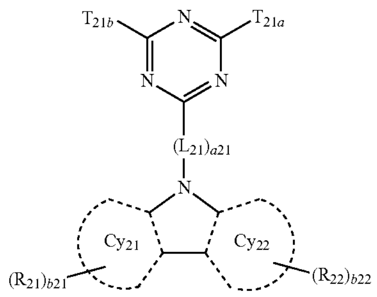
wherein, in Formulae 2-1-1 and 2-2-2,
$CY_{21}$, $CY_{22}$, $L_{21}$, a21, $R_{21}$, $R_{22}$, b21, b22, and $R_{23}$ are respectively the same as described in claim 8, and
$T_{21a}$ and $T_{21b}$ are each the same as described in connection with $T_{21}$ in claim 8.
11. The organic light-emitting device of claim 1, wherein the second compound is one or more of Compounds E1 to E17:
E1
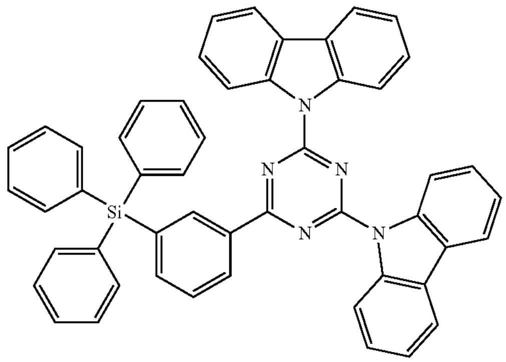
E2
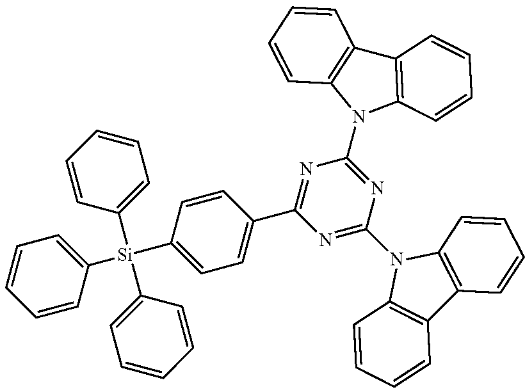
-continued
E3
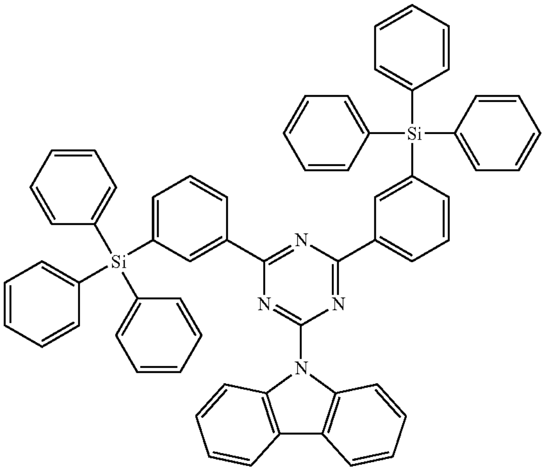
E4
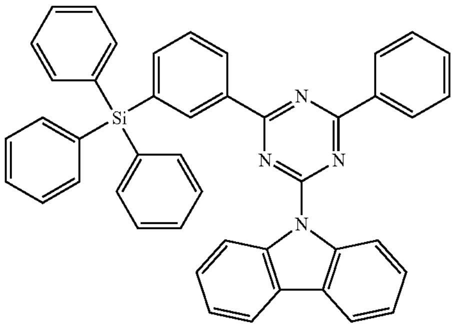
E5
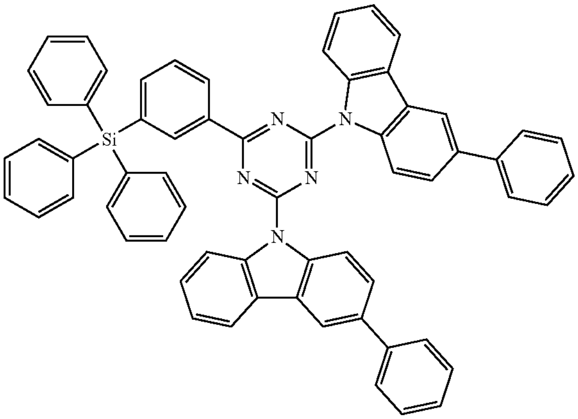

-continued
E6
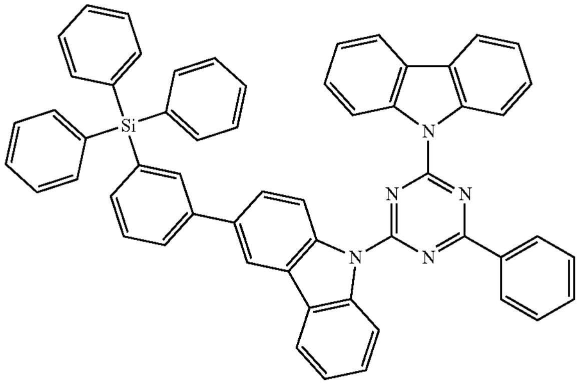
E7
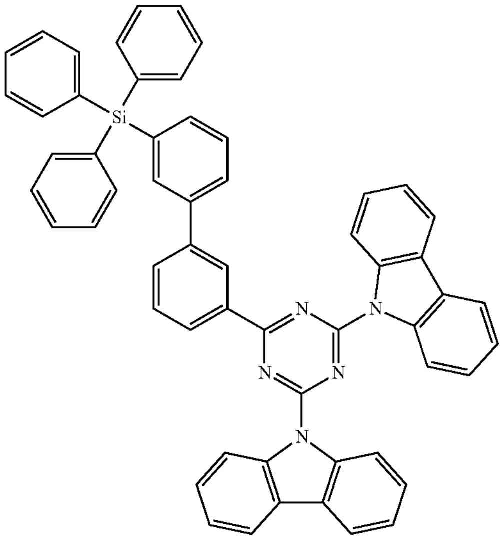
E8
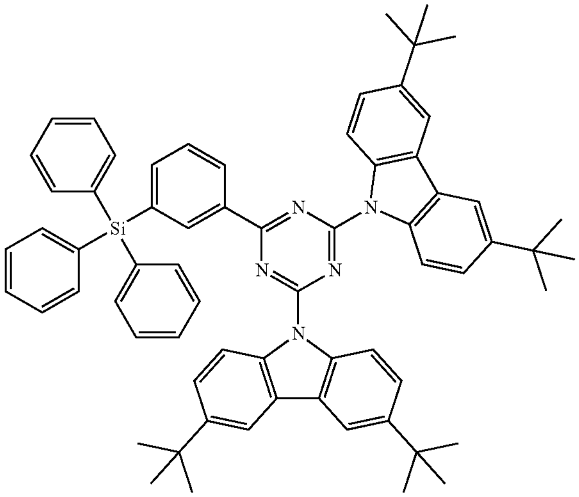
-continued
E9
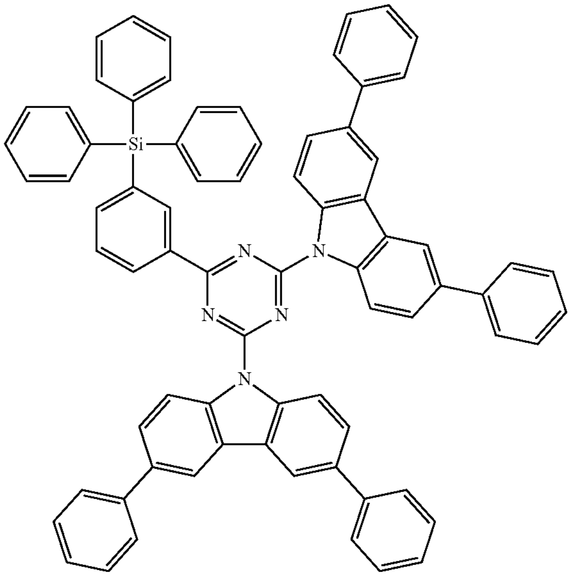
E10
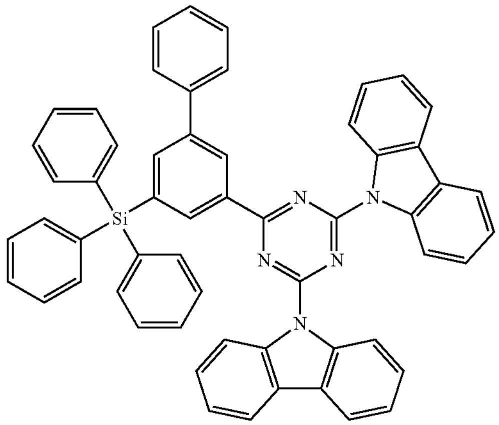
E11
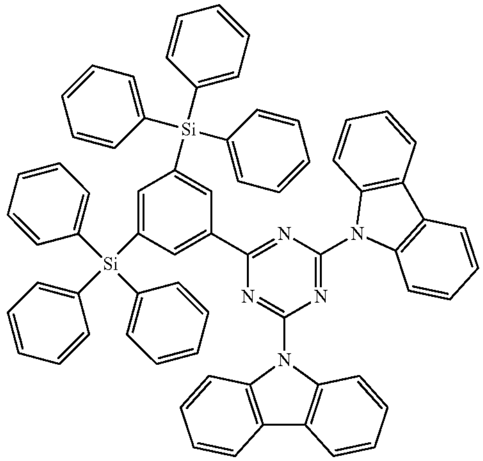

-continued
E12
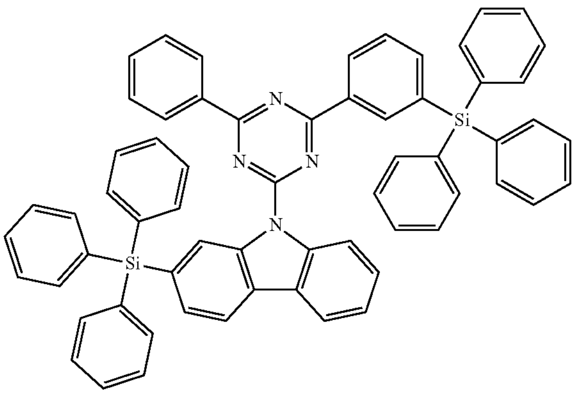
E13
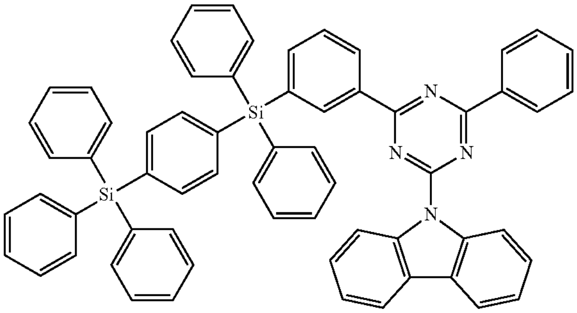
E14
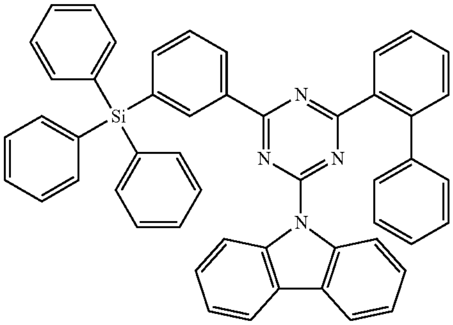
E15
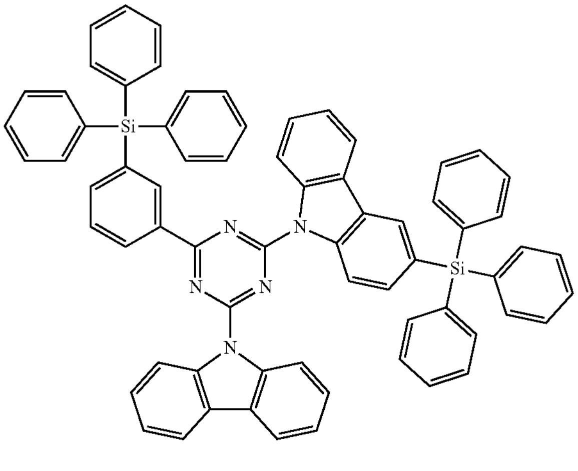
-continued
E16
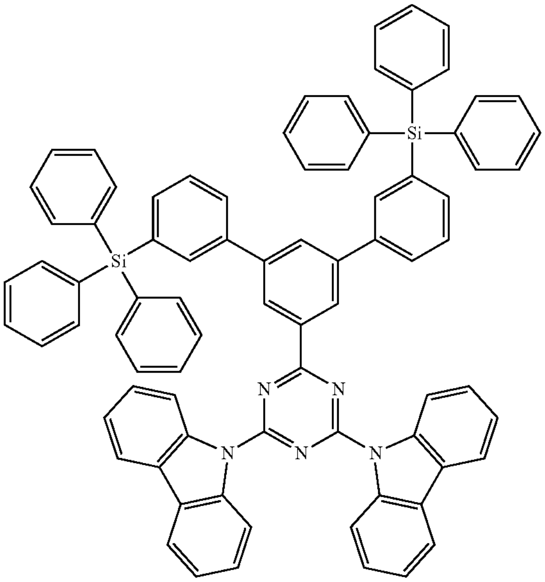
E17
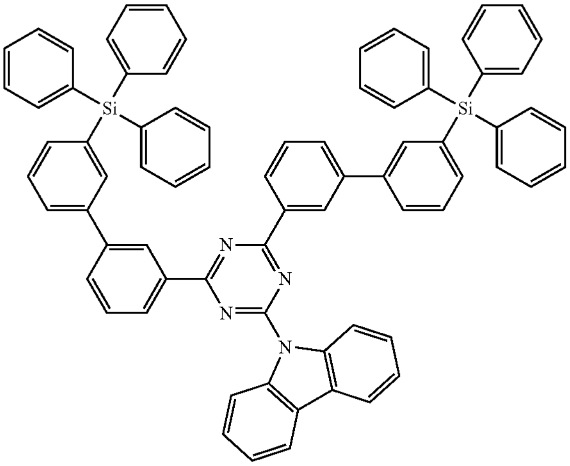
.
12. The organic light-emitting device of claim 4, including the third compound, the third compound being an organometallic compound represented by Formula 3 or Formula 5:
Formula 3
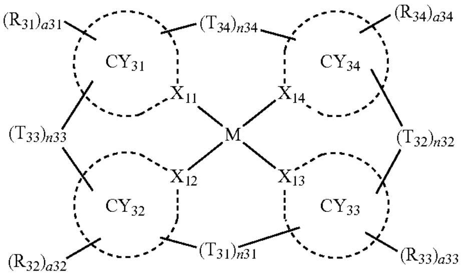
wherein, in Formula 3,
M is a transition metal,
$X_{11}$ to $X_{14}$ are each independently C or N, two bonds of a bond between $X_{11}$ and M, a bond between $X_{12}$ and M, a bond between $X_{13}$ and M, and a bond between $X_{14}$ and M are coordinate bonds and two bonds are covalent bonds, ring $CY_{31}$ to ring $CY_{34}$ are each independently a $C_5$-$C_{30}$ carbocyclic group or a $C_1$-$C_{30}$ heterocyclic group, $T_{31}$ is a single bond, a double bond, *—N($R_{35a}$)—*', *—B($R_{35a}$)—*', *—P($R_{35a}$)—*', *—C($R_{35a}$)($R_{35b}$)—*', *—Si($R_{35a}$)($R_{35b}$)—*', *—Ge($R_{35a}$)($R_{35b}$)—*', *—S—*', *—Se—*', *—O—*', *—C(=O)—*', *—S(=O)—*', *—S(=O)$_2$—*', *—C($R_{35a}$)=*', *=C($R_{35a}$)—*', *—C($R_{35a}$)=C($R_{35b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_{32}$ is a single bond, a double bond, *—N($R_{36a}$)—*', *—B($R_{36a}$)—*', *—P($R_{36a}$)—*', *—C($R_{36a}$)($R_{36b}$)—*', *—Si($R_{36a}$)($R_{36b}$)—*', *—Ge($R_{36a}$)($R_{36b}$)—*', *—S—*', *—Se—*', *—O—*', *—C(=O)—*', *—S(=O)—*', *—S(=O)$_2$—*', *—C($R_{36a}$)=*', *=C($R_{36a}$)—*', *—C($R_{36a}$)=C($R_{36b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_{33}$ is a single bond, a double bond, *—N($R_{37a}$)—*', *—B($R_{37a}$)—*', *—P($R_{37a}$)—*', *—C($R_{37a}$)($R_{37b}$)—*', *—Si($R_{37a}$)($R_{37b}$)—*', *—Ge($R_{37a}$)($R_{37b}$)—*', *—S—*', *—Se—*', *—O—*', *—C(=O)—*', *—S(=O)—*', *—S(=O)$_2$—*', *—C($R_{37a}$)=*', *=C($R_{37a}$)—*', *—C($R_{37a}$)=C($R_{37b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_{34}$ is a single bond, a double bond, *—N($R_{38a}$)—*', *—B($R_{38a}$)—*', *—P($R_{38a}$)—*', *—C($R_{38a}$)($R_{38b}$)—*', *—Si($R_{38a}$)($R_{38b}$)—*', *—Ge($R_{38a}$)($R_{38b}$)—*', *—S—*', *—Se—*', *—O—*', *—C(=O)—*', *—S(—O)—*', *—S(=O)$_2$—*', *—C($R_{38a}$)—*', *—C($R_{38a}$)—*', *—C($R_{38a}$)=C($R_{38b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, n31 to n34 are each independently an integer from 0 to 5, and three or more of n31 to n34 are each independently an integer from 1 to 5, when n31 is 0, $T_{31}$ is not present, when n32 is 0, $T_{32}$ is not present, when n33 is 0, $T_{33}$ is not present, and when n34 is 0, $T_{34}$ is not present, when n31 is 2 or more, two or more of $T_{31}$(s) are identical to or different from each other, when n32 is 2 or more, two or more of $T_{32}$(s) are identical to or different from each other, when n33 is 2 or more, two or more of $T_{33}$(s) are identical to or different from each other, and when n34 is 2 or more, two or more of $T_{34}$(s) are identical to or different from each other, $R_{31}$ to $R_{34}$, $R_{35a}$, $R_{35b}$, $R_{36a}$, $R_{36b}$, $R_{37a}$, $R_{37b}$, $R_{38a}$, and $R_{38b}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), a31 to a34 are each independently an integer from 0 to 20, two or more of adjacent $R_{31}$(s) are optionally bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of adjacent $R_{32}$(s) are optionally bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of adjacent $R_{33}$(s) are optionally bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of adjacent $R_{34}$(s) are optionally bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two or more of $R_{31}$, $R_{32}$, $R_{33}$, $R_{34}$, $R_{35a}$, $R_{35b}$, $R_{36a}$, $R_{36b}$, $R_{37a}$, $R_{37b}$, $R_{38a}$, and $R_{38b}$ in adjacent rings and/or T groups are optionally bonded to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is the same as described in connection with $R_{31}$,

* and *' each indicate a binding site to a neighboring atom, a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group, $M_{51}(L_{51})_{n51}(L_{52})_{n52}$   Formula 5 in Formula 5, $M_{51}$ is a transition metal, $L_{51}$ is a ligand represented by Formula 5A, and $L_{52}$ is a ligand represented by Formula 5B, Formula 5A

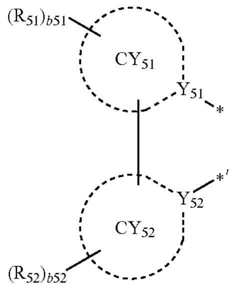

Formula 5B

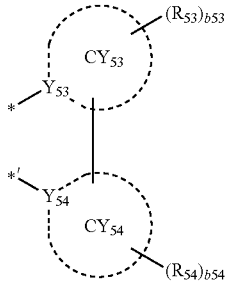

n51 is 1, 2, or 3, and n52 is 0, 1, or 2, $Y_{51}$ to $Y_{54}$ are each independently C or N, ring $CY_{51}$ to ring $CY_{54}$ are each independently a $C_5$-$C_{30}$ carbocyclic group or a $C_1$-$C_{30}$ heterocyclic group, $R_{51}$ to $R_{54}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_{51})(Q_{52})$, —$Si(Q_{53})(Q_{54})(Q_{55})$, $Ge(Q_{53})(Q_{54})(Q_{55})$, —$B(Q_{56})(Q_{57})$, —$P(=O)(Q_{58})(Q_{59})$, or —$P(Q_{58})(Q_{59})$, b51 to b54 are each independently an integer from 0 to 20, and $Q_{51}$ to $Q_{59}$ are each independently:

$-CH_3$, $-CD_3$, $-CD_2H$, $-CDH_2$, $-CH_2CH_3$, $-CH_2CD_3$, $-CH_2CD_2H$, $-CH_2CDH_2$, $-CHDCH_3$, $-CHDCD_2H$, $-CHDCDH_2$, $-CHDCD_3$, $-CD_2CD_3$, $-CD_2CD_2H$, or $-CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

13. The organic light-emitting device of claim 12, wherein the third compound is one or more of Compounds P1 to P42:

P1

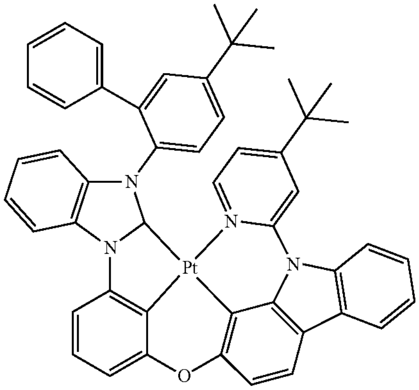

P2

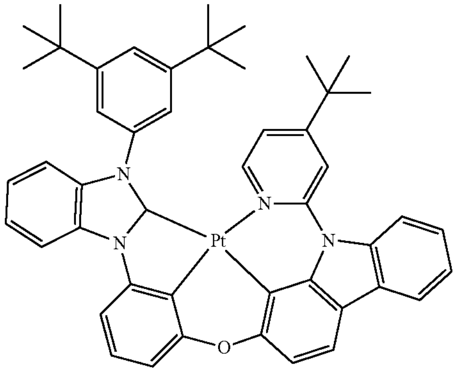

P3

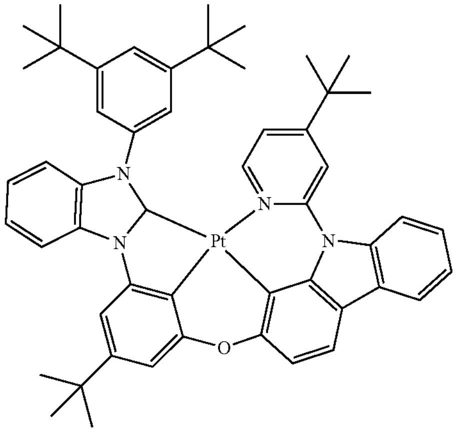

-continued

P4

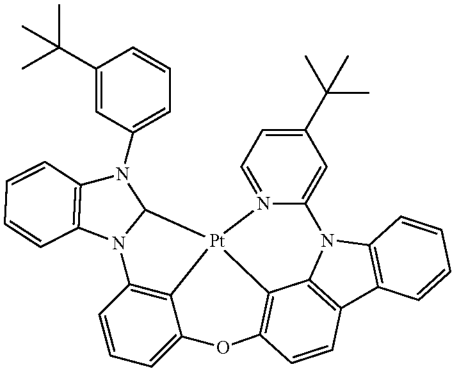

P5

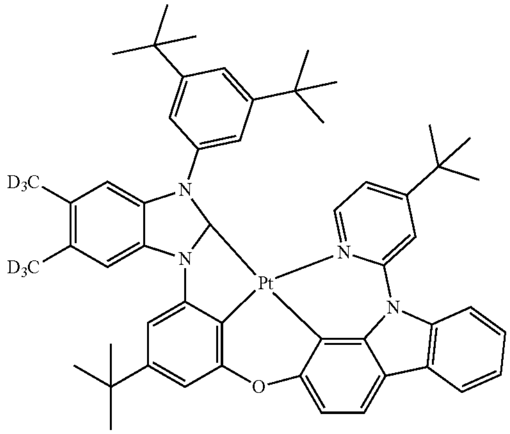

P6

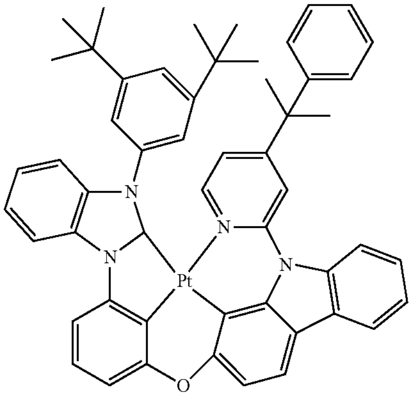

P7

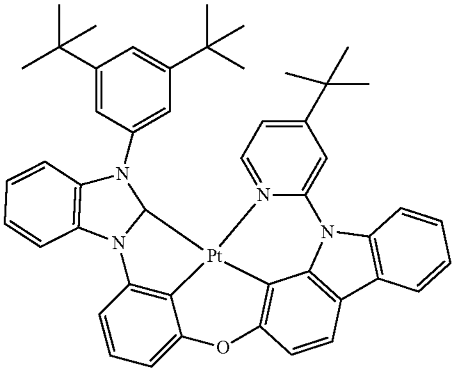

-continued
P8
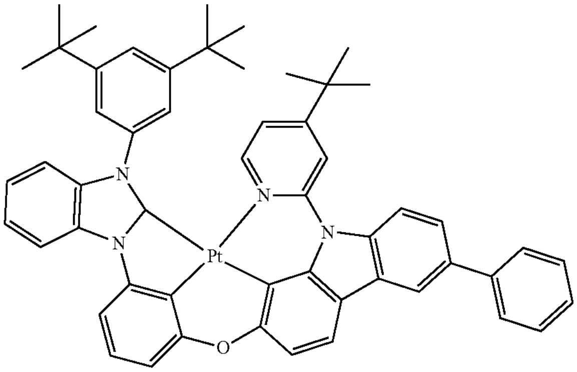
P9
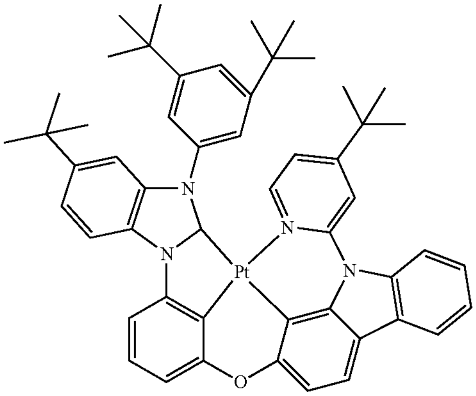
P10
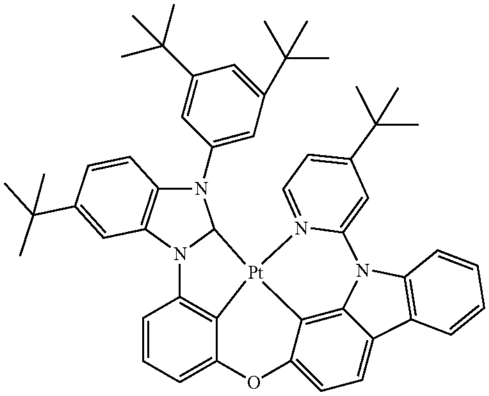
P11
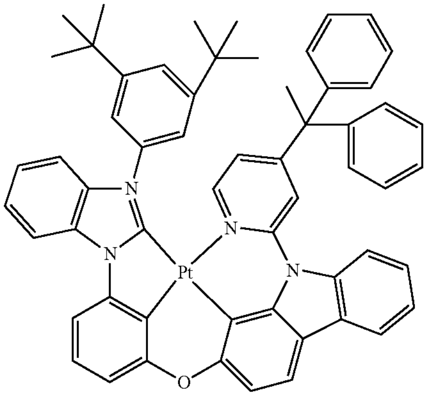
-continued
P12
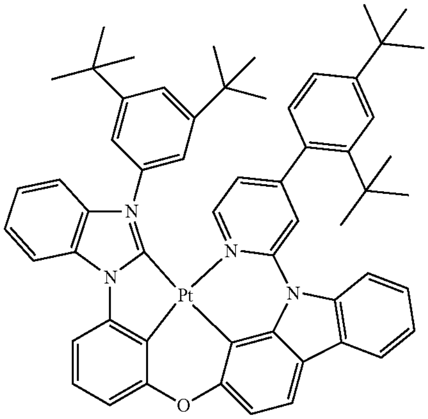
P13
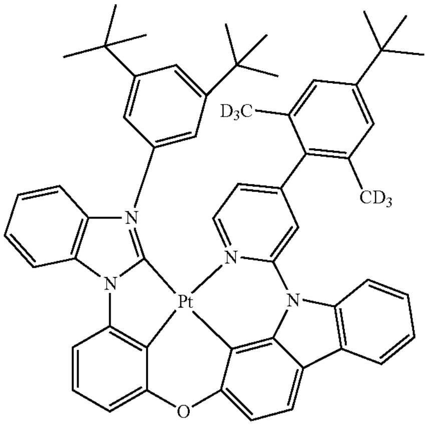
P14
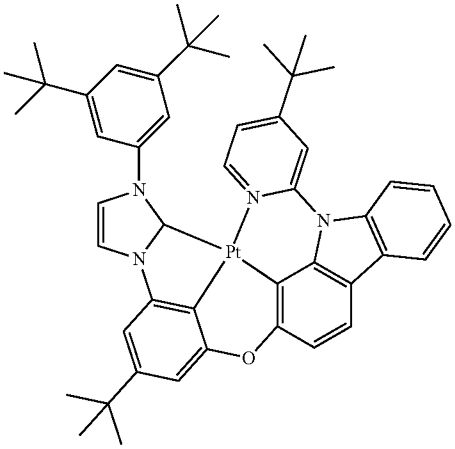
P15
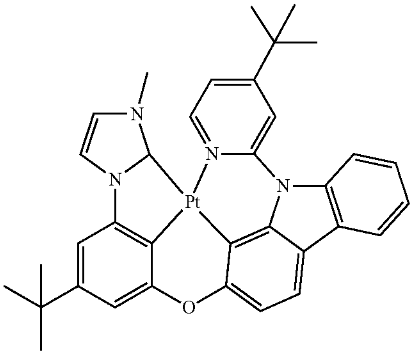

-continued
P16
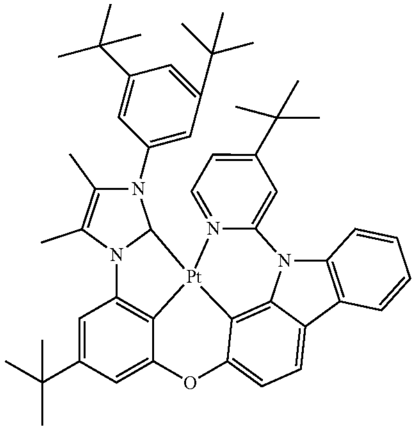
P17
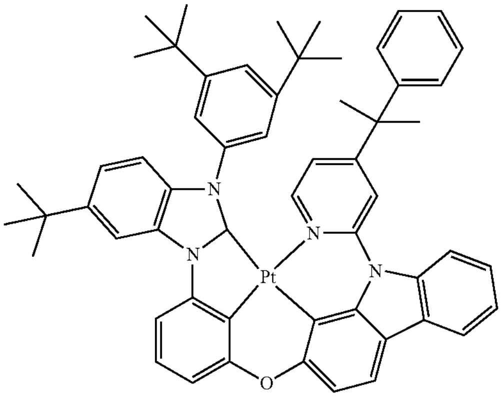
P18
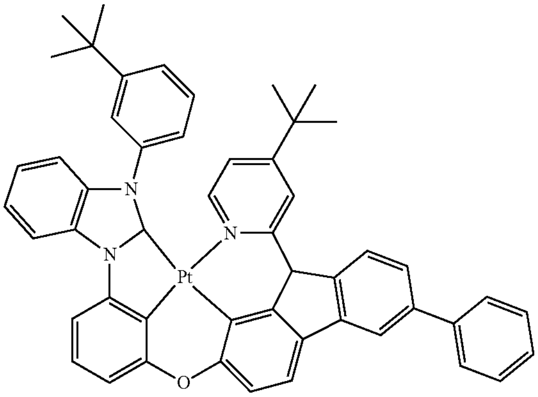
-continued
P19
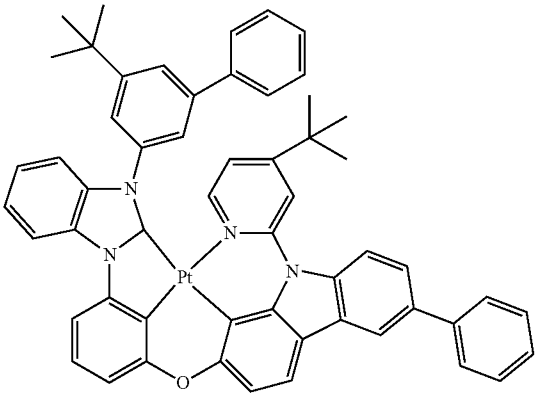
P20
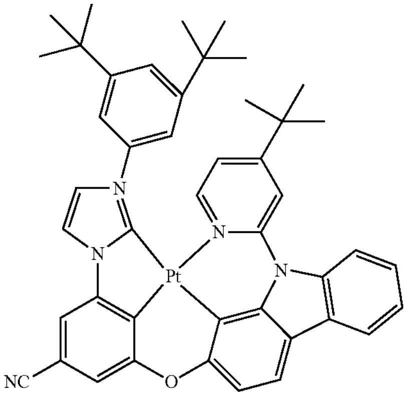
P21
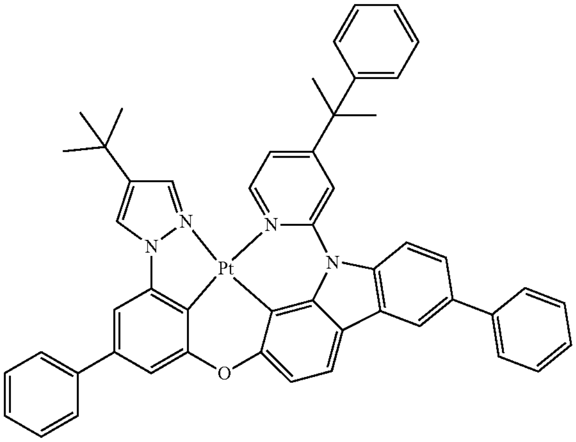

-continued
P22
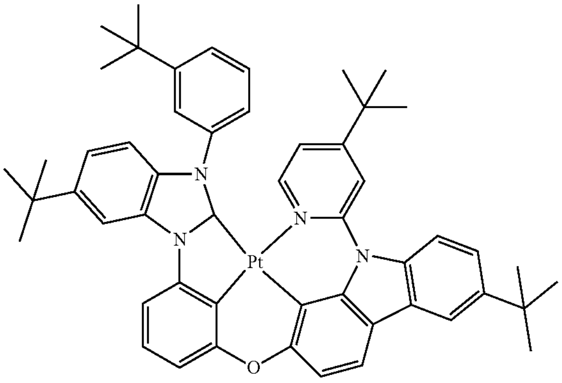
P23
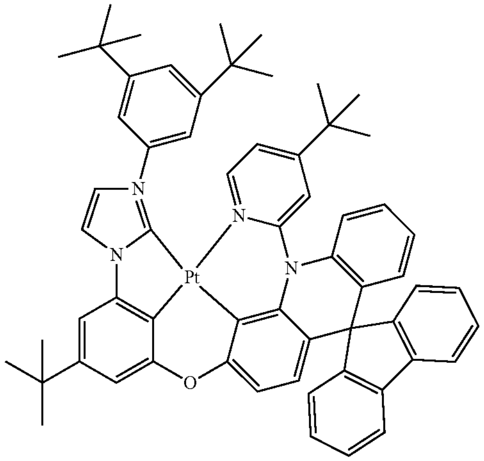
P24
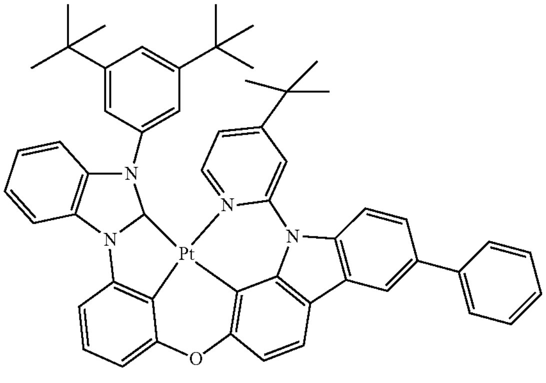
-continued
P25
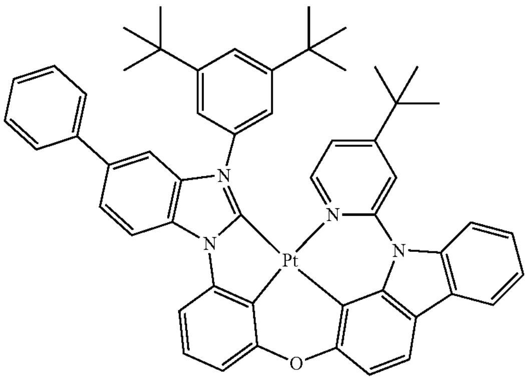
P26
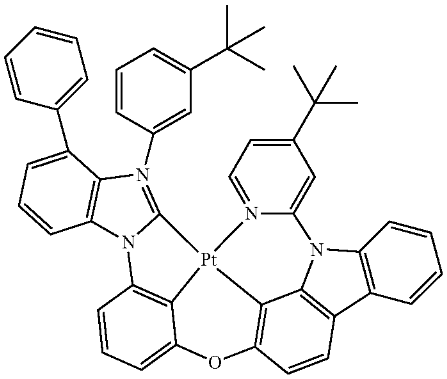
P27
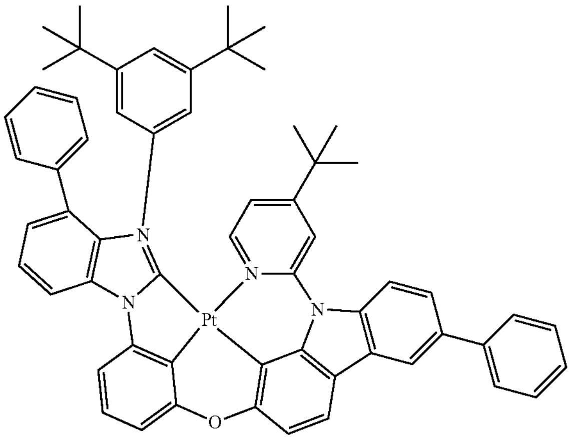

-continued
P28
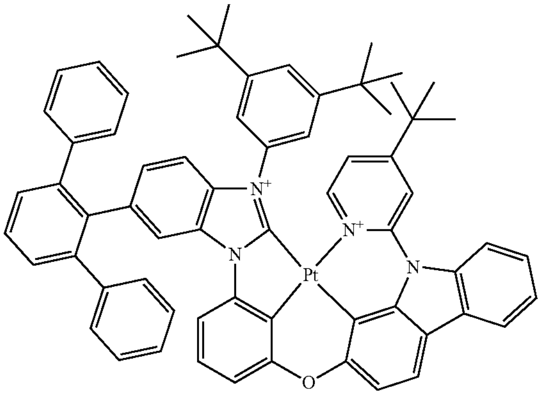
P29
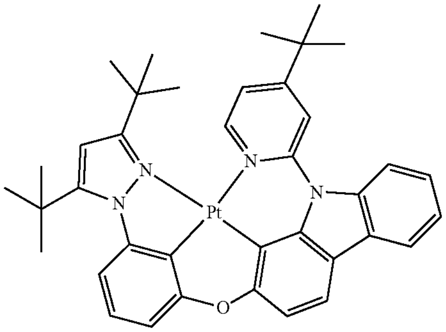
P30
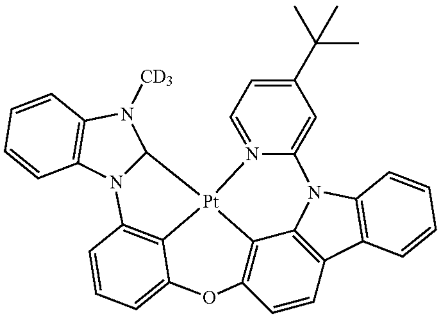
P31
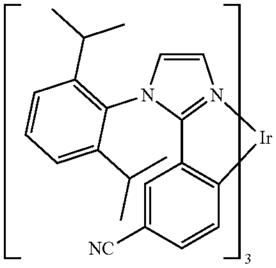
-continued
P32
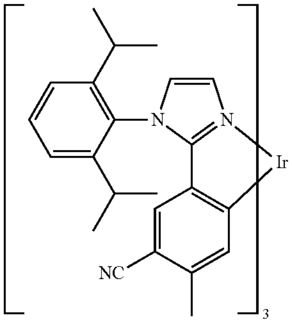
P33
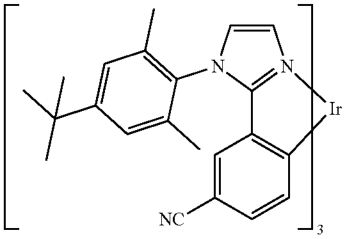
P34
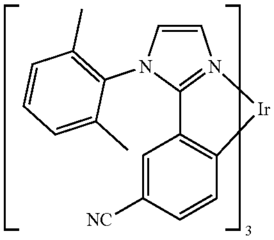
P35
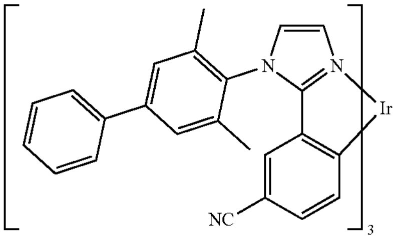
P36
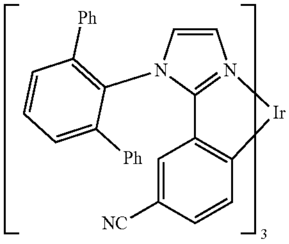
P37
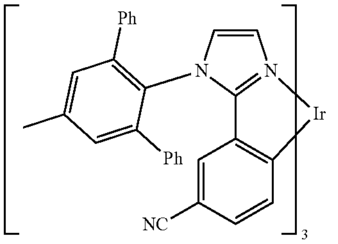

-continued

P38

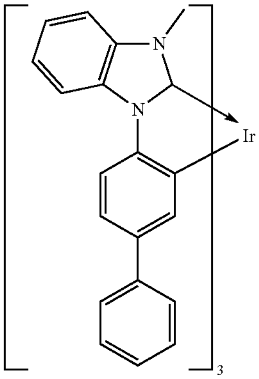

P39

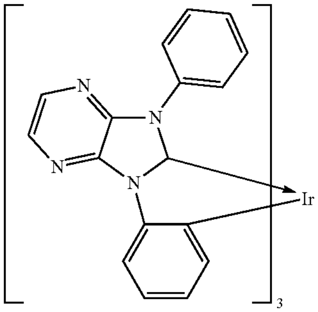

P40

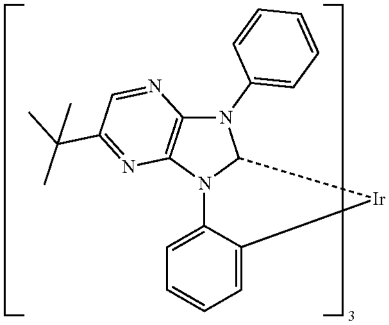

P41

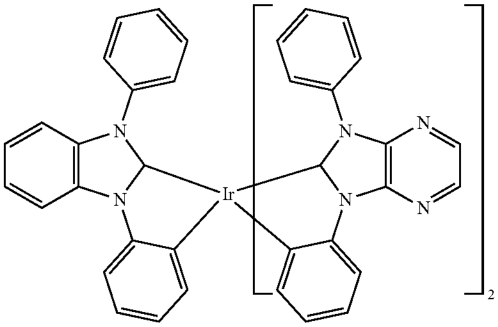

-continued

P42

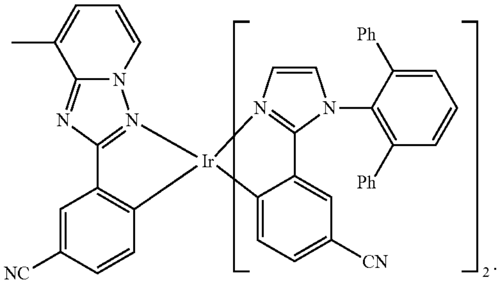

14. The organic light-emitting device of claim 4, including the fourth compound, the fourth compound being a polycyclic compound represented by Formula 4:

Formula 4

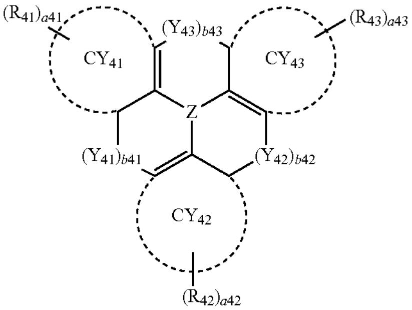

wherein, in Formula 4,

Z is B or N, ring $CY_{41}$ to ring $CY_{43}$ are each independently a $C_5$-$C_{30}$ carbocyclic group or a $C_1$-$C_{30}$ heterocyclic group, $Y_{41}$ is *—N($R_{44}$)—*', *—B($R_{44}$)—*', *—P($R_{44}$)—*', *—C($R_{44}$)($R_{45}$)—*', *—Si($R_{44}$)($R_{45}$)—*', *—Ge($R_{44}$)($R_{45}$)—*', *—O—*', *—S—*', *—Se—*', *—C(═O)—*', or *—S(═O)$_2$—*', $Y_{42}$ is *—N($R_{46}$)—*', *—B($R_{46}$)—*', *—P($R_{46}$)—*', *—C($R_{46}$)($R_{47}$)—*', *—Si($R_{46}$)($R_{47}$)—*', *—Ge($R_{46}$)($R_{47}$)—*', *—O—*', *—S—*', *—Se—*', *—C(—O)—*', or *—S(═O)$_2$—*', $Y_{43}$ is *—N($R_{48}$)—*', *—B($R_{48}$)—*', *—P($R_{48}$)—*', *—C($R_{48}$)($R_{49}$)—*', *—Si($R_{48}$)($R_{49}$)—*', *—Ge($R_{48}$)($R_{49}$)—*', *—O—*', *—S—*', *—Se—*', *—C(═O)—*', or *—S(—O)$_2$—*', b41, b42, and b43 are each independently 0 or 1, when b41 is 0, $Y_{41}$ is not present, when b42 is 0, $Y_{42}$ is not present, and when b43 is 0, $Y_{43}$ is not present, $R_{41}$ to $R_{49}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted t non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), a41, a42, and a43 are each independently an integer from 0 to 20, two or more adjacent $R_{41}$(s) are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more adjacent $R_{42}$(s) are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more adjacent $R_{43}$(s) are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more of $R_{41}$ to $R_{49}$ of adjacent rings and/or Y groups are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, $R_{10b}$ is the same as described in connection with $R_{41}$,

* and *' each indicate a binding site to a neighboring atom, and a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

15. The organic light-emitting device of claim 14, wherein the fourth compound is one or more of Compounds D1 to D30:
D1
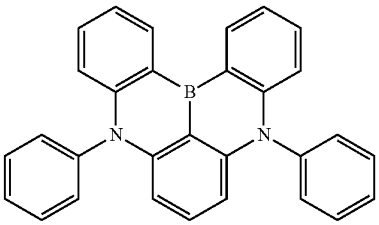
D2
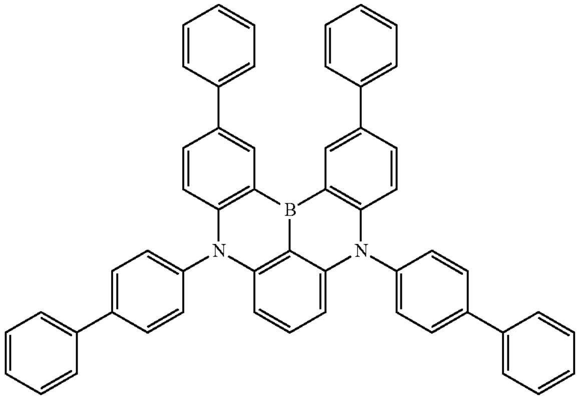
D3
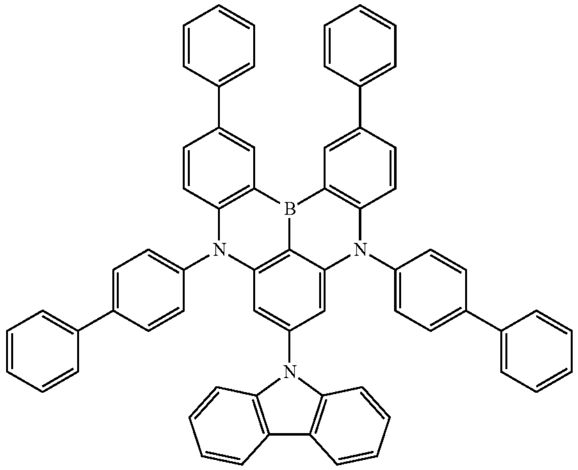
-continued
D4
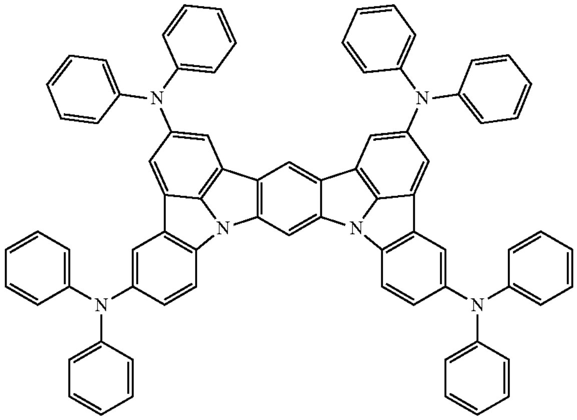
D5
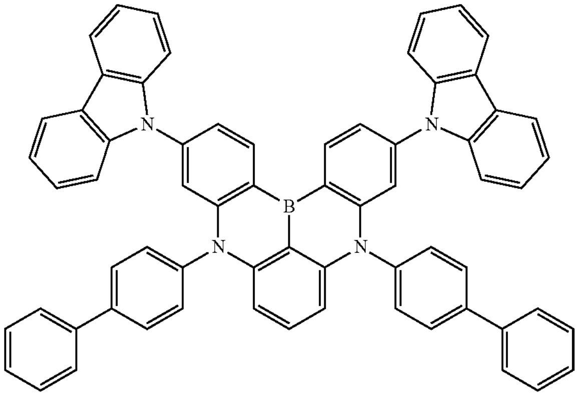
D6
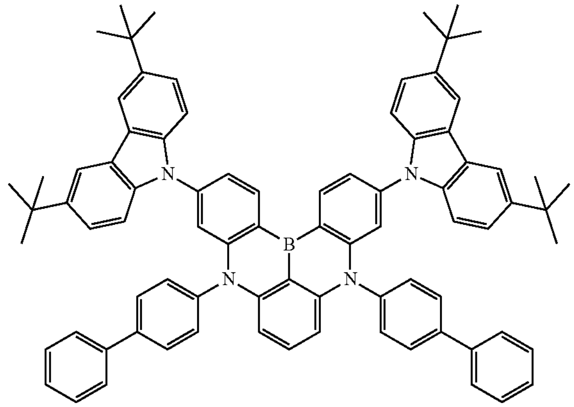

-continued
D7
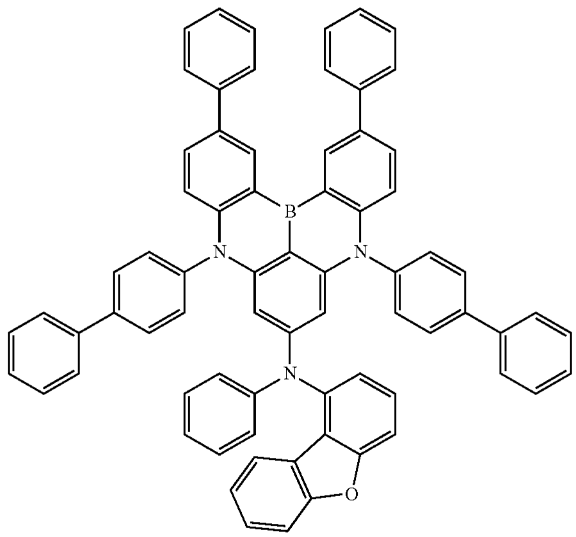
D8
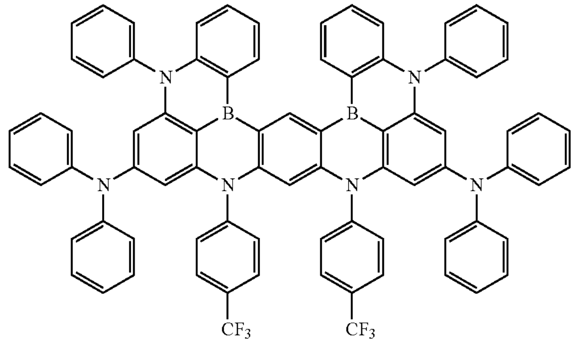
D9
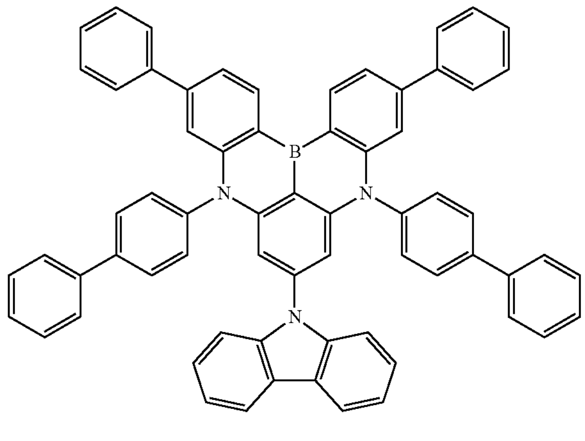
-continued
D10
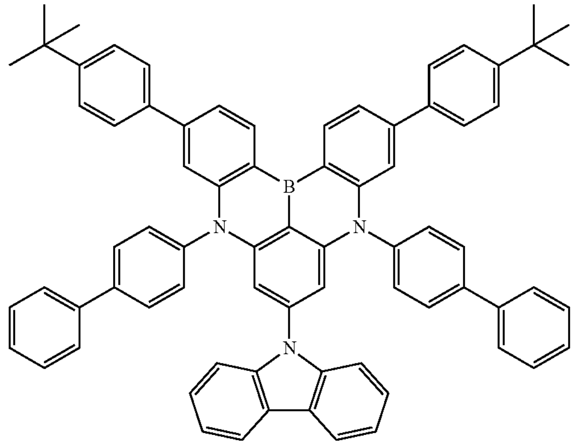
D11
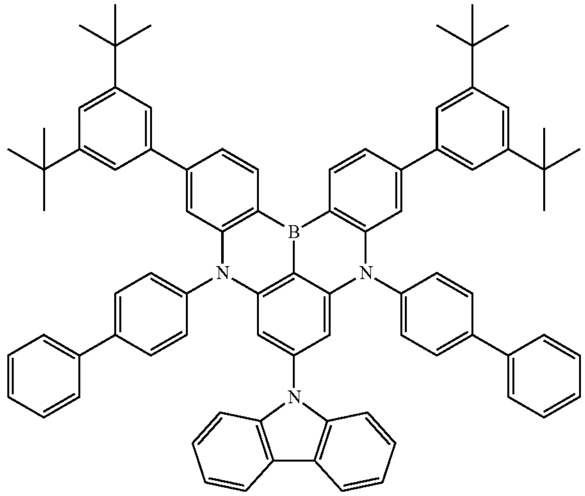
D12
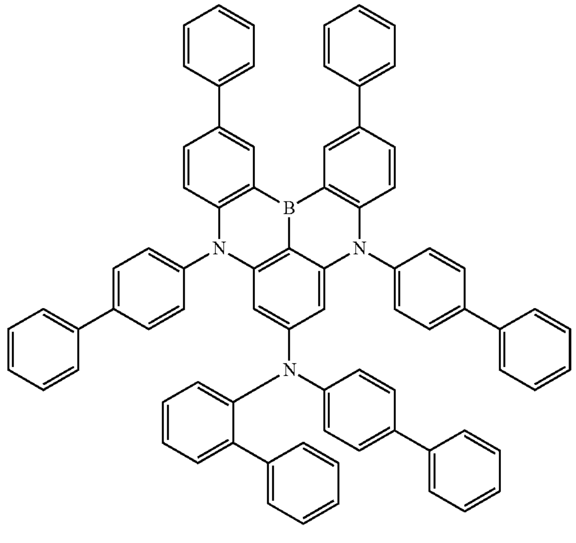

-continued
D13
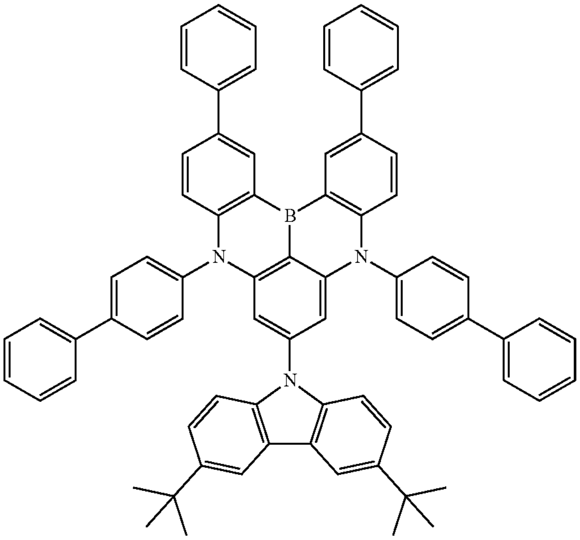
D14
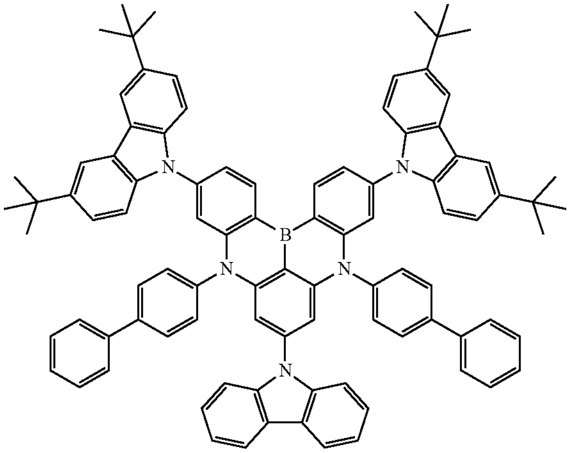
D15
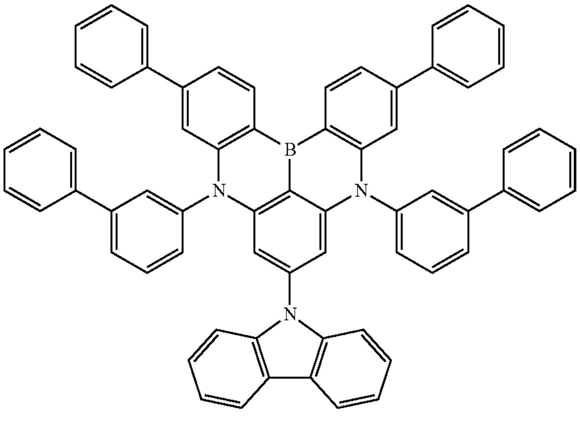
-continued
D16
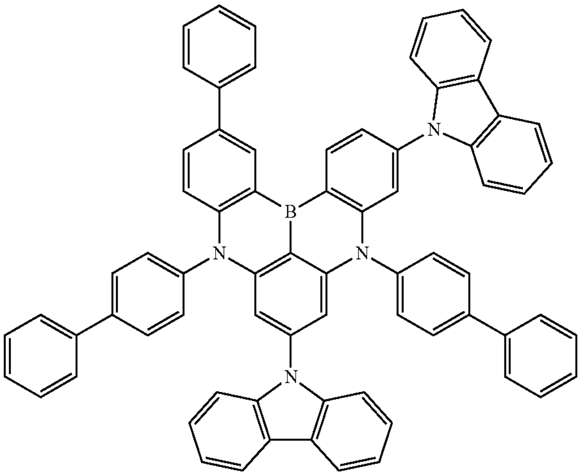
D17
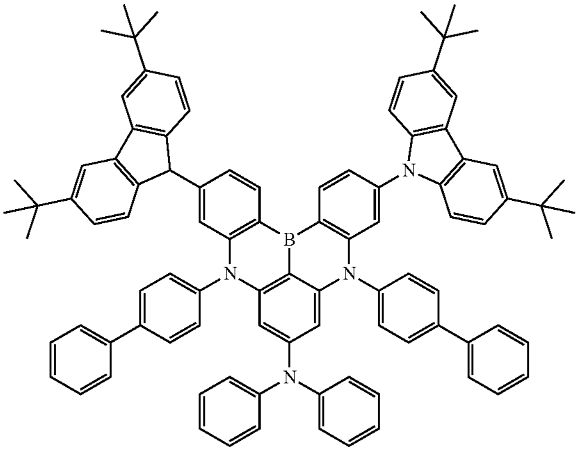
D18
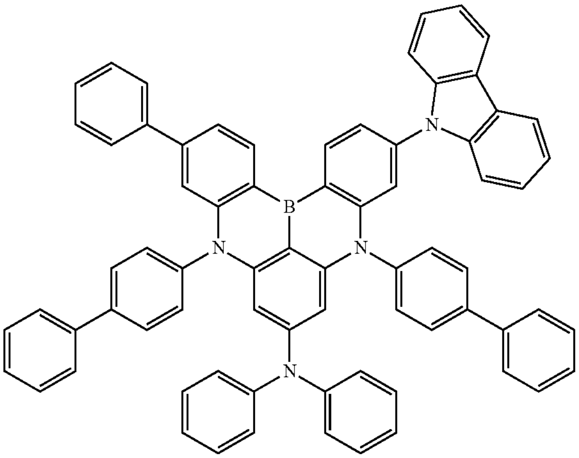

-continued
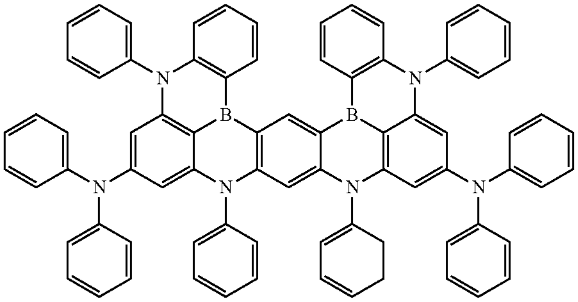
D19
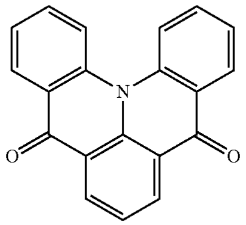
D20
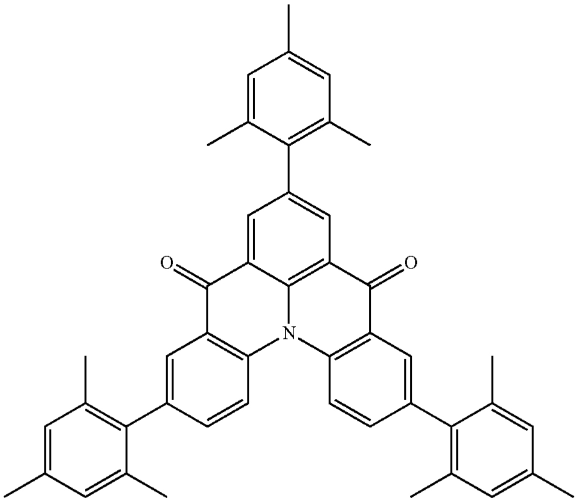
D21
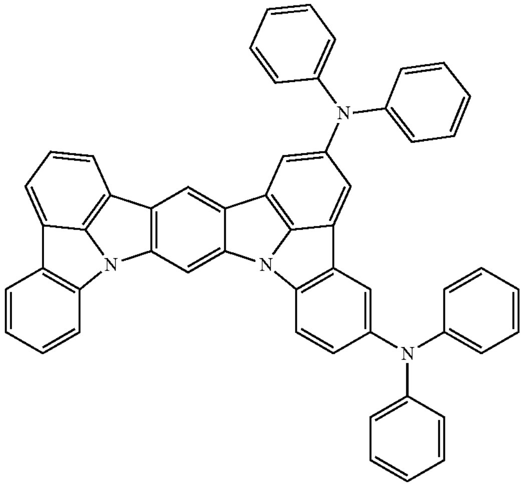
D22
-continued
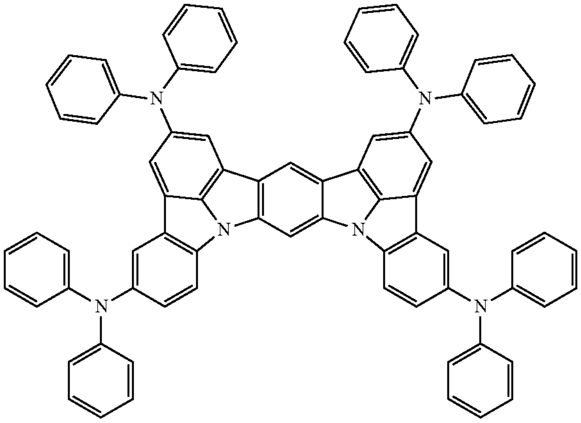
D23
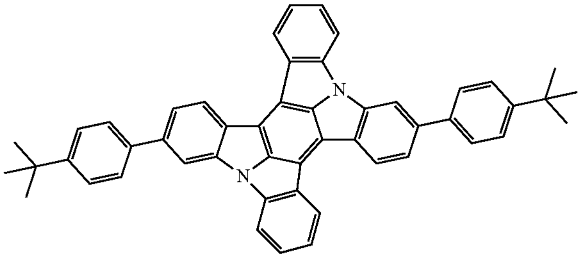
D24
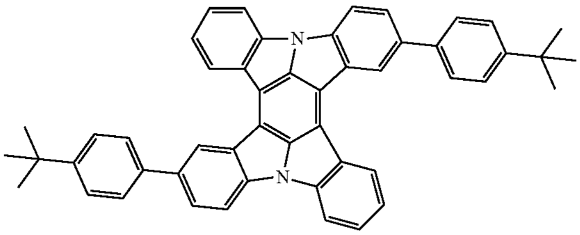
D25
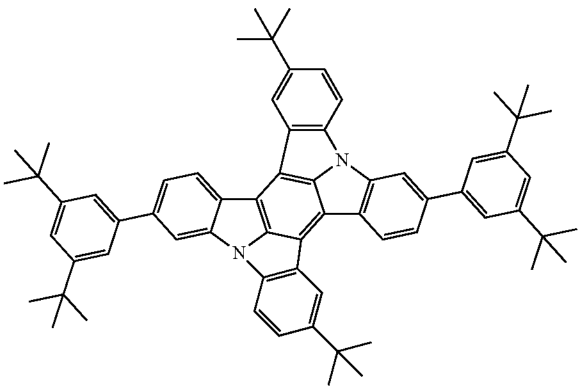
D26

-continued

D27

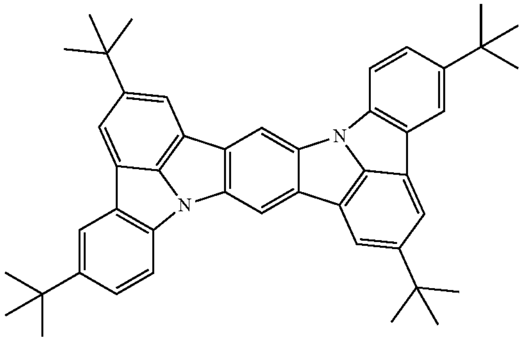

D28

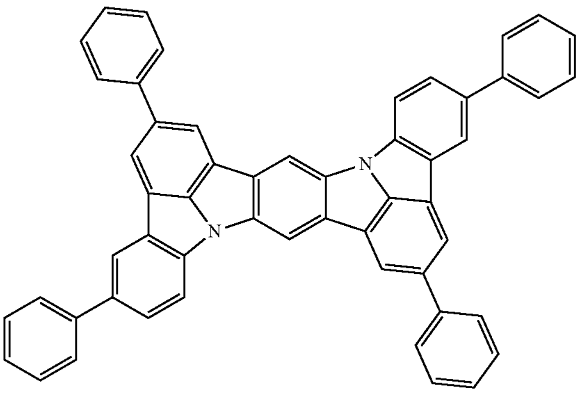

D29

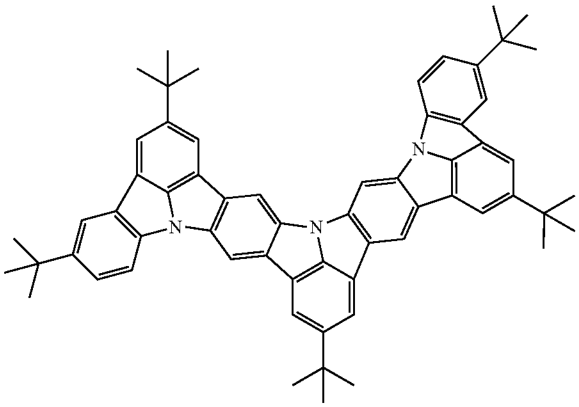

D30

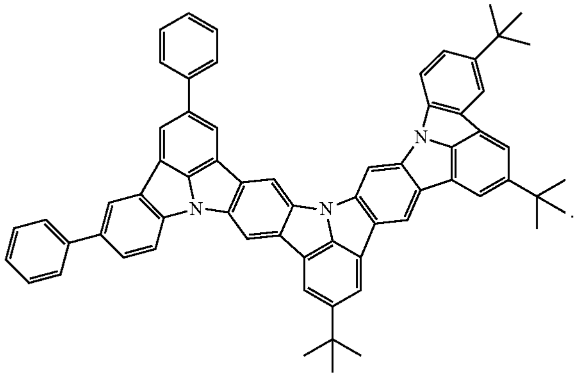

16. An organic light-emitting device comprising:

a first electrode, and a second electrode each having a surface opposite the other; and an intermediate layer disposed between the first electrode and the second electrode, the intermediate layer comprising an emission layer comprising a first compound, a second compound, and a fourth compound, wherein the first compound comprises a silyl group-containing group and at least two carbazole-derived groups, wherein one carbazole-derived group of the at least two carbazole-derived groups is bonded via a N atom to another carbazole-derived group, the second compound comprises a silyl group-containing group, a triazine group, and a carbazole-derived group, and the fourth compound comprises a polycyclic compound represented by Formula 4:

Formula 4

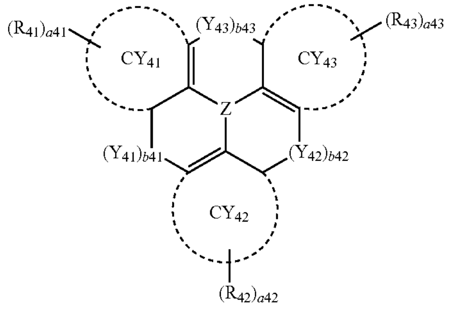

wherein, in Formula 4,

Z is B or N, ring $CY_{41}$, $CY_{42}$, and ring $CY_{43}$ are each independently a $C_5$-$C_{30}$ carbocyclic group or a $C_1$-$C_{30}$ heterocyclic group, $Y_{41}$ is *—N($R_{44}$) -*', *—B($R_{44}$)—*', *—P($R_{44}$)—*', *—C($R_{44}$)($R_{45}$)—*', *—Si($R_{44}$)($R_{45}$)—*', *—Ge($R_{44}$)($R_{45}$)—*', *—O—*', *—S—*', *—Se—*', *—C(=O)—*', or *—S(=O)$_2$—*', $Y_{42}$ *—B($R_{46}$)—*', *—P($R_{46}$)—*', *—C($R_{46}$)($R_{47}$)—*', *—Si($R_{46}$)($R_{47}$)—*, *—Ge($R_{46}$)($R_{47}$)—*', *—O—*', *—S—*', *—Se—*', *—C(=O)—*', or *—S(=O)$_2$—*', $Y_{43}$ is *—B($R_{48}$)—*', *—P($R_{48}$)—*', *—C($R_{48}$)($R_{49}$)—*', *—Si($R_{48}$)($R_{49}$)—*', *—Ge($R_{48}$)($R_{49}$)—*', *—O—*', *—S—*', *—Se—*', *—C(=O)—*', or *—S(=O)$_2$—*', b41, b42, and b43 are each independently 0 or 1, and the sum of b41, b42, and b43 is 2, when b41 is 0, $Y_{41}$ is not present, when b42 is 0, $Y_{42}$ is not present, and when b43 is 0, $Y_{43}$ is not present, $R_{41}$ to $R_{49}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkylaryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkylheteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, a41 to a43 are each independently an integer from 0 to 20, two or more adjacent $R_{41}$(s) are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more adjacent $R_{42}$(s) are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more adjacent $R_{43}$(s) are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, two or more of $R_{41}$ to $R_{49}$ of adjacent rings and/or Y groups are optionally bonded to each other to form a $C_5$-$C_{30}$ carbocyclic group unsubstituted or substituted with at least one $R_{10b}$ or a $C_1$-$C_{30}$ heterocyclic group unsubstituted or substituted with at least one $R_{10b}$, $R_{10b}$ is the same as described in connection with $R_{41}$,

* and *' each indicate a binding site to a neighboring atom, and a substituent of each of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkylaryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkylheteroaryl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

17. The organic light-emitting device of claim 16, wherein the first compound is represented by Formula 1-1 or Formula 1-2:

Formula 1-1

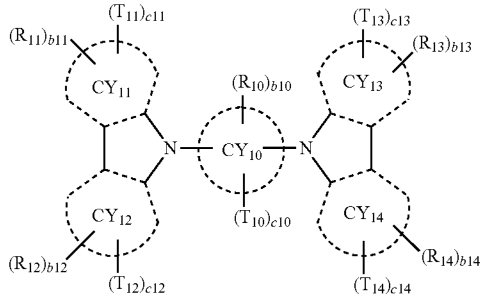

Formula 1-2

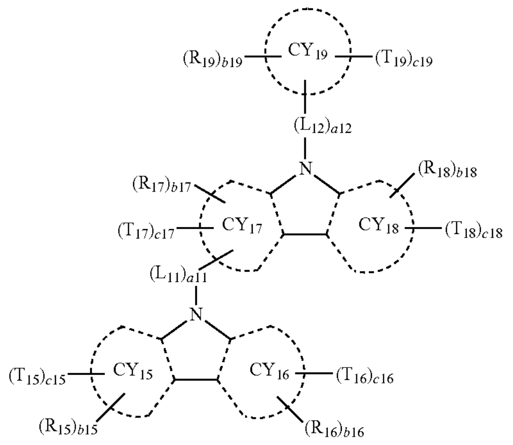

Formula A

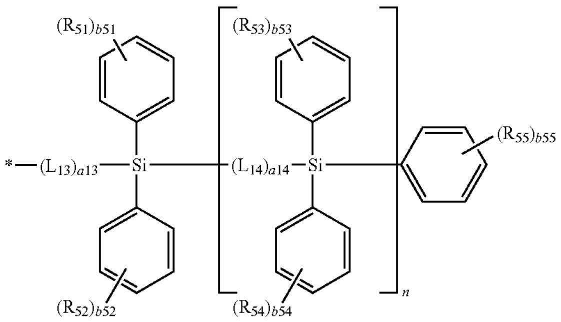

wherein, in Formulae 1-1, 1-2, and A, $CY_{10}$ to $CY_{19}$ are each independently a $C_5$-$C_{30}$ carbocyclic group or a $C_1$-$C_{30}$ heterocyclic group, $L_{11}$ to $L_{14}$ are each independently a substituted or unsubstituted $C_1$-$C_{20}$ alkylene group, a substituted or unsubstituted $C_2$-$C_{20}$ alkenylene group, a substituted or unsubstituted $C_5$-$C_{60}$ carbocyclic group, or a substituted or unsubstituted $C_1$-$C_{60}$ heterocyclic group, a11 to a14 are each independently an integer from 0 to 5, when a11 is 0, $L_{11}$ is not present, and the N atom of one carbazole-derived group is directly bonded to $CY_{17}$, when a12 is 0, $L_{12}$ is not present, and the N atom of one carbazole-derived group is directly bonded to $CY_{19}$, when a13 is 0, $L_{13}$ is not present, and a Si atom of the first silyl group-containing group of Formula A is directly bonded to $CY_{10}$ to $CY_{19}$, or when a14 is 0, $L_{14}$ is not present, and a Si atom of the first silyl group-containing group of Formula A is directly bonded to a neighboring Si atom of the first silyl group-containing group of Formula A, $T_{10}$ to $T_{19}$ are each independently a group represented by Formula A, c10 to c19 are each independently an integer from 0 to 10, where the sum of c10, c11, c12, c13, and c14 is 1 or more, and the sum of c15, c16, c17, c18, and c19 is 1 or more, n is an integer from 0 to 3, $R_{10}$ to $R_{19}$ and $R_{51}$ to $R_{55}$ are each independently hydrogen, deuterium, —F, —Cl, —Br, —I, —$SF_5$, a hydroxy group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Ge(Q_3)(Q_4)(Q_5)$, —$B(Q_6)(Q_7)$, —$P(=O)(Q_8)(Q_9)$, or —$P(Q_8)(Q_9)$, b10 to b19 are each independently an integer from 0 to 10, b51 to b55 are each independently an integer from 0 to 5, and a substituent of each of the substituted $C_5$-$C_{60}$ carbocyclic group, the substituted $C_1$-$C_{60}$ heterocyclic group, the substituted $C_1$-$C_{20}$ alkylene group, the substituted $C_2$-$C_{20}$ alkenylene group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_6$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof;

—$N(Q_{31})(Q_{32})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$; or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen;

deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group which is unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group which is unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

18. The organic light-emitting device of claim 17, wherein the second compound comprises a compound represented by Formula 2-1:

Formula 2-1

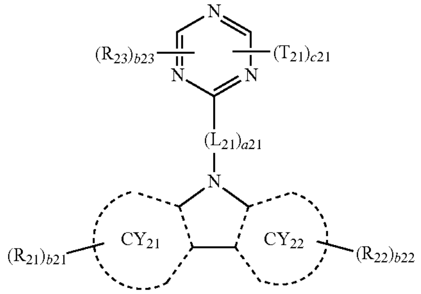

wherein, in Formulae 2-1, $CY_{21}$ and $CY_{22}$ are each independently a $C_5$-$C_{30}$ carbocyclic group or a $C_1$-$C_{30}$ heterocyclic group, $L_{21}$ is a substituted or unsubstituted $C_1$-$C_{20}$ alkylene group, a substituted or unsubstituted $C_2$-$C_{20}$ alkenylene group, a substituted or unsubstituted $C_5$-$C_{60}$ carbocyclic group, or a substituted or unsubstituted $C_1$-$C_{60}$ heterocyclic group, a21 is an integer from 0 to 5, and when a21 is 0, $L_{21}$ is not present and a N atom of one carbazole-derived group is directly bonded to a ring carbon of the triazine group, $R_{21}$, $R_{22}$, and $R_{23}$ are as defined as $R_{15}$, b21 and b22 are each independently an integer from 0 to 10, and b23 is 0 or 1.

19. The organic light-emitting device of claim 18, wherein the second compound is one or more of Compounds E1 to E17:

E1

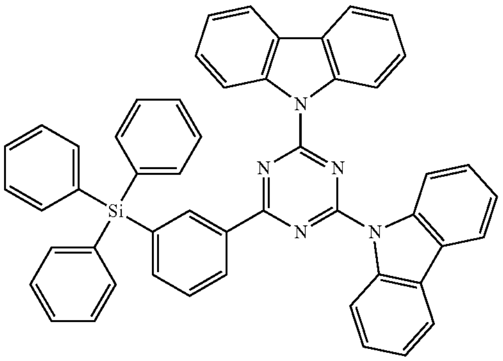

E2

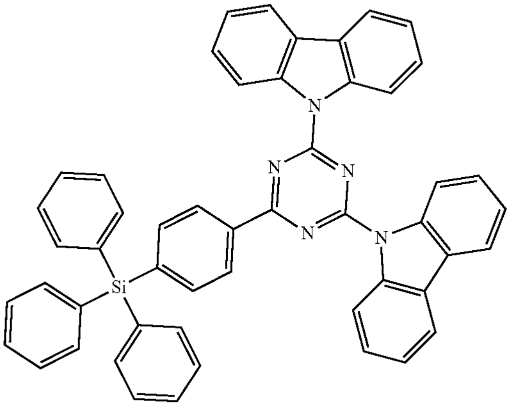

-continued
E3
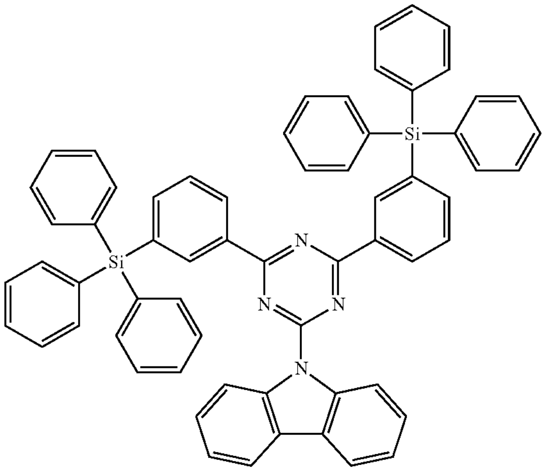
E4
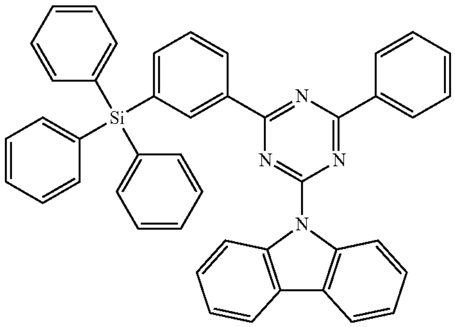
E5
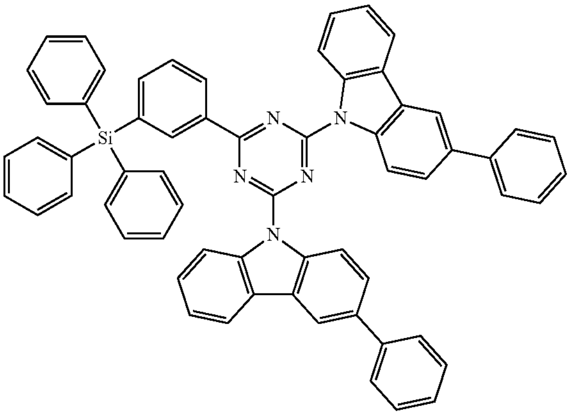
E6
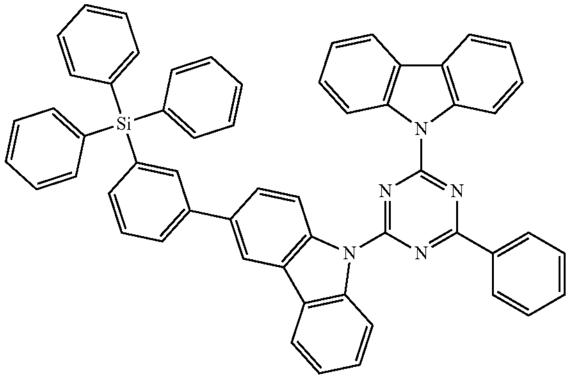
-continued
E7
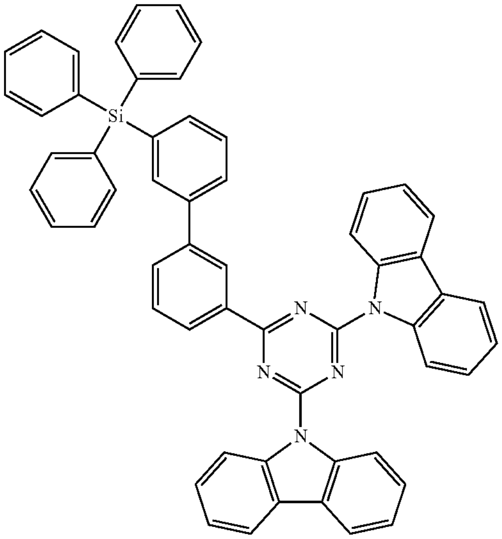
E8
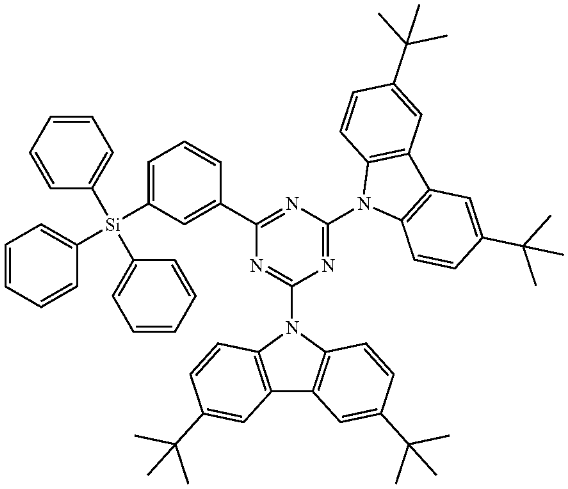
E9
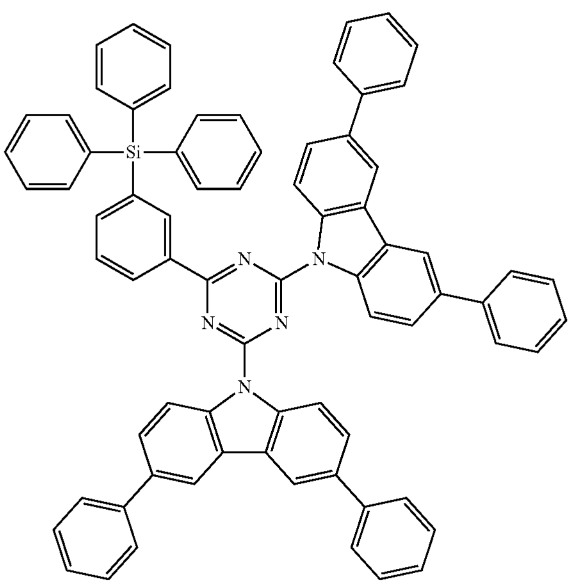

-continued
E10
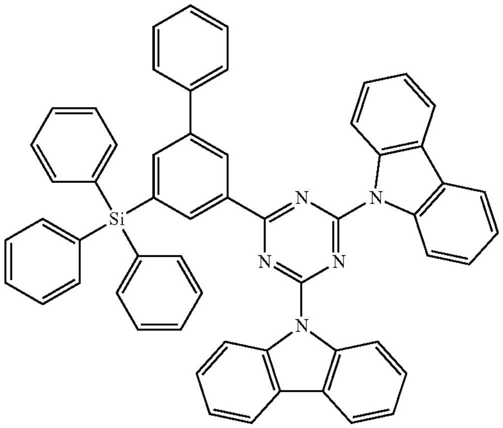
E11
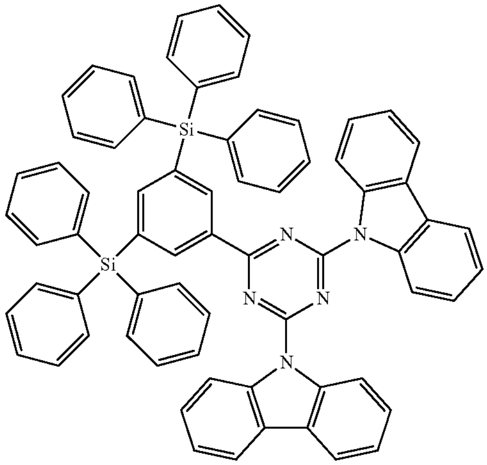
E12
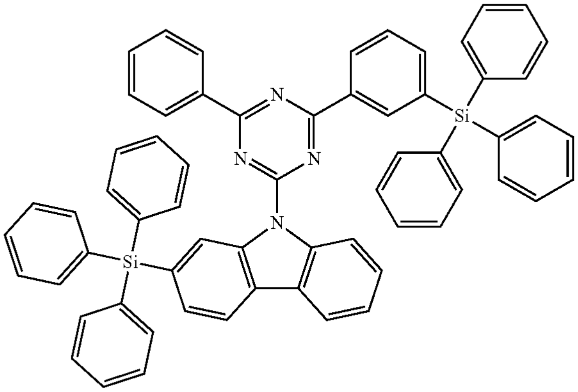
E13
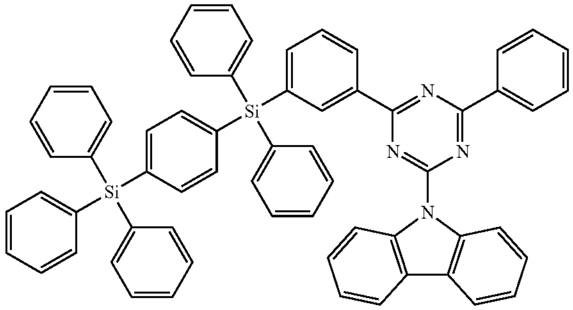
-continued
E14
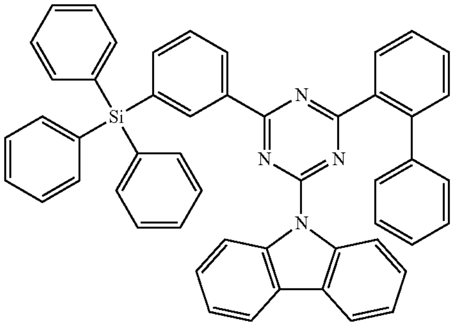
E15
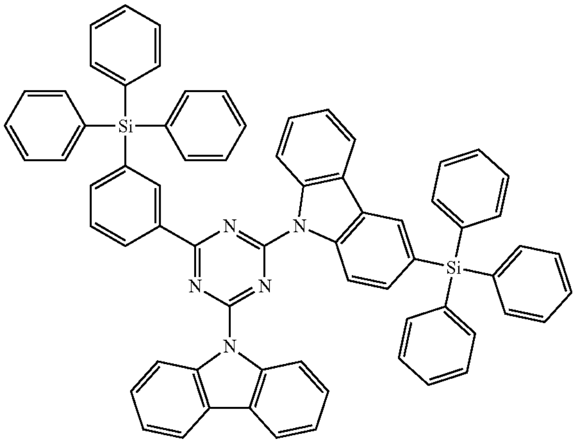
E16
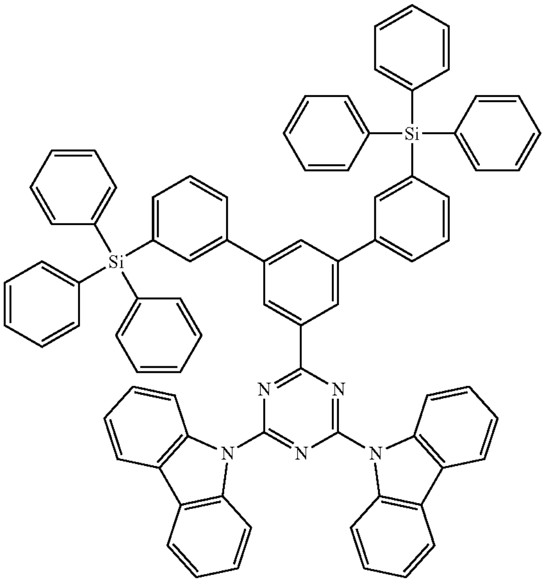

-continued
E17
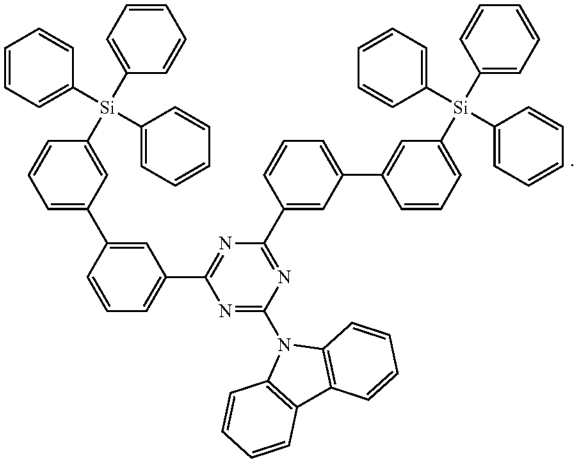
20. The organic light-emitting device of claim 16, wherein the emission layer further comprises a third compound represented by one or more of Compounds P1 to P42:
P1
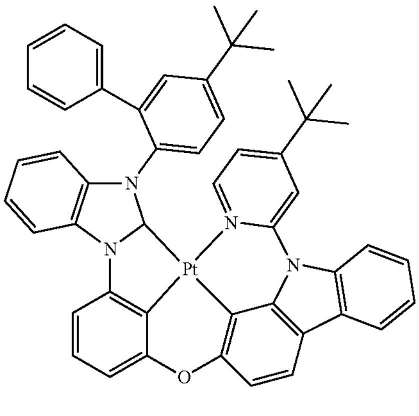
P2
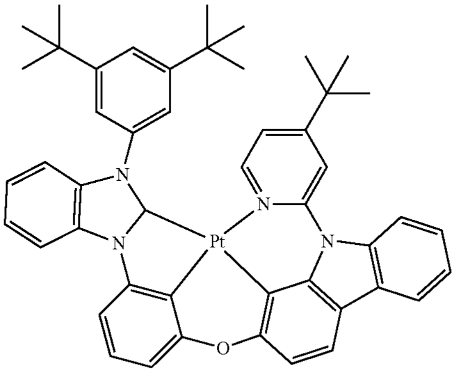
-continued
P3
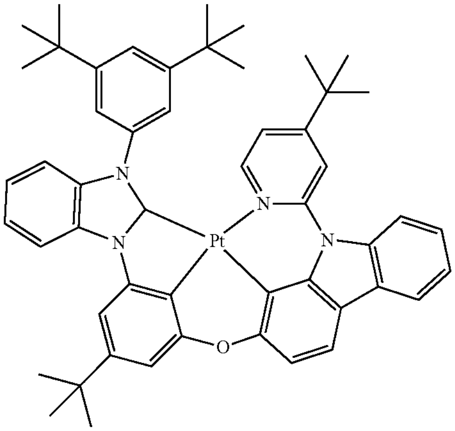
P4
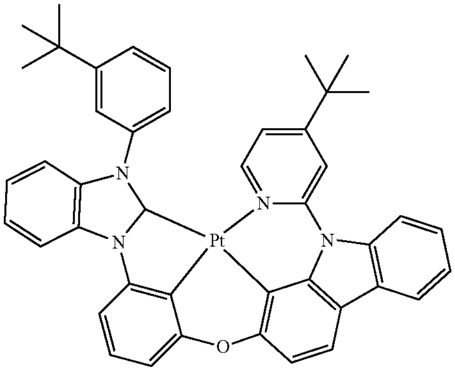
P5
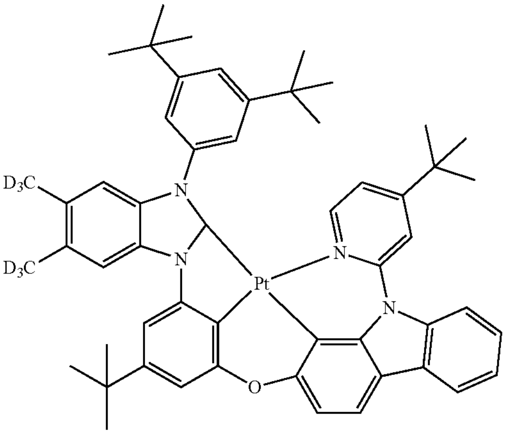

-continued
P6
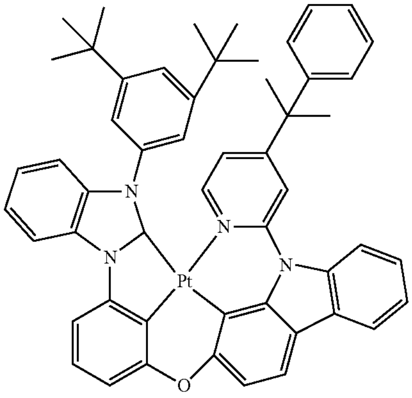
P7
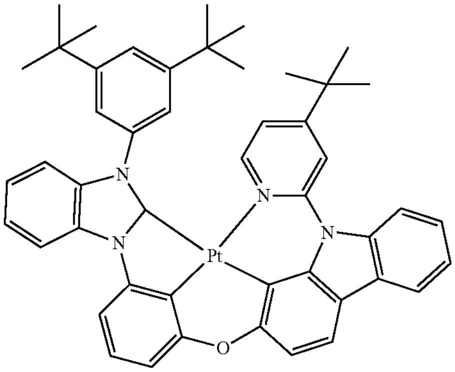
P8
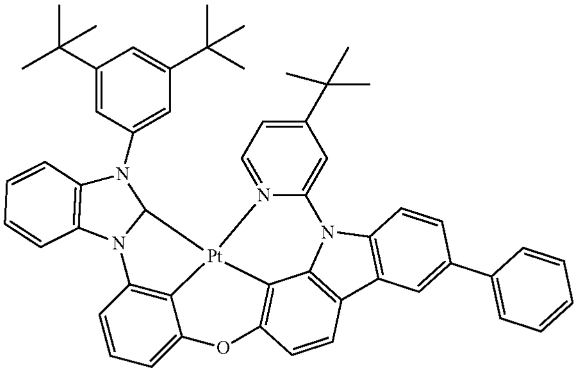
P9
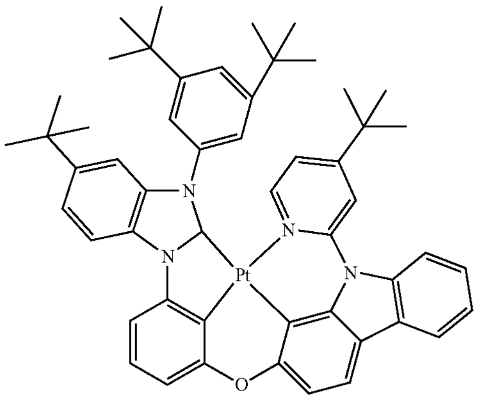
-continued
P10
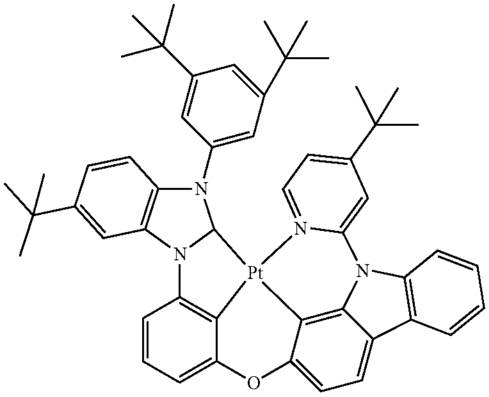
P11
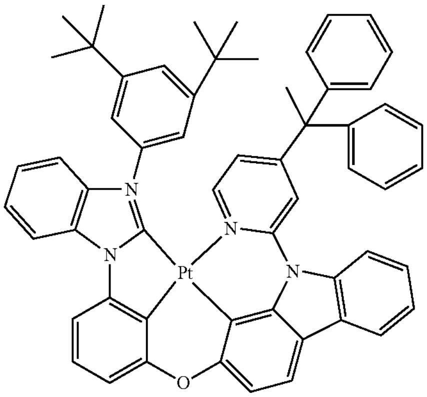
P12
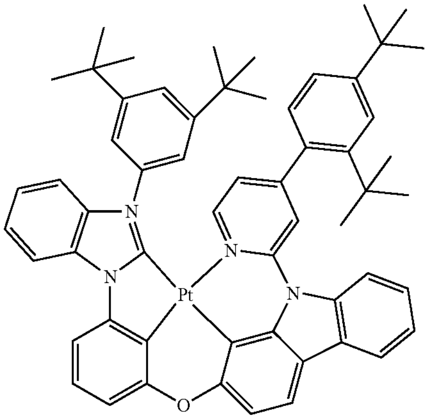

-continued
P13
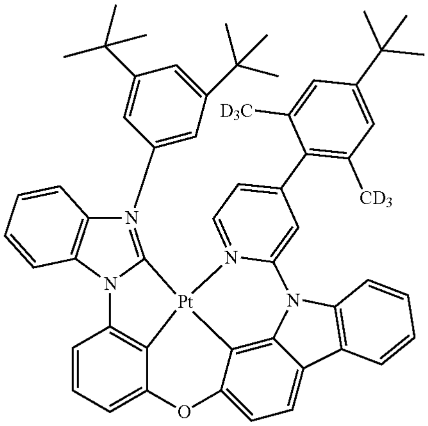
P14
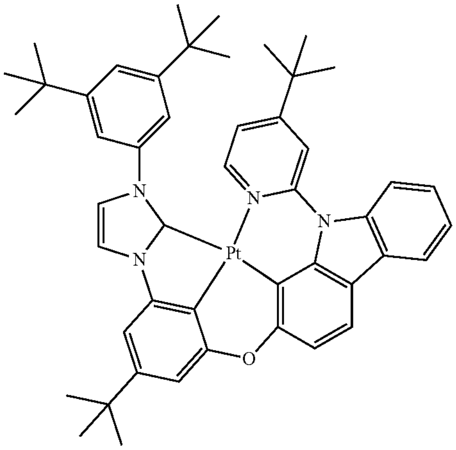
P15
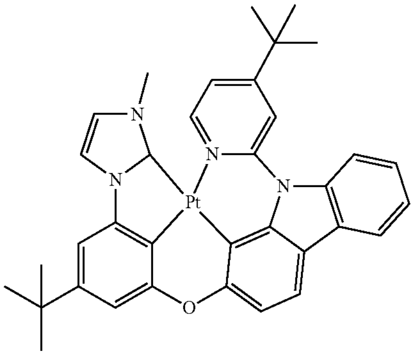
-continued
P16
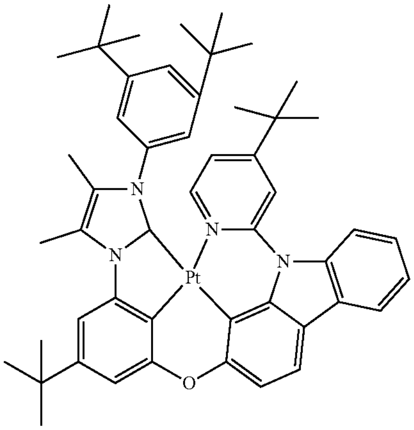
P17
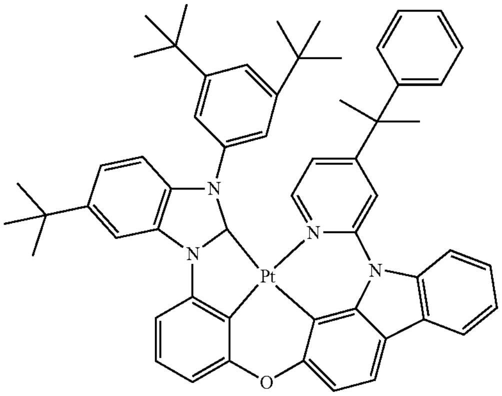
P18
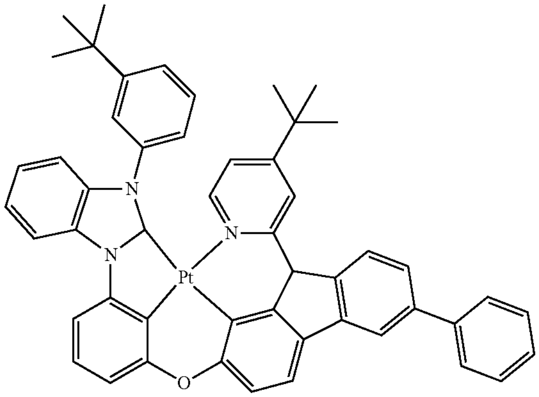

-continued
P19
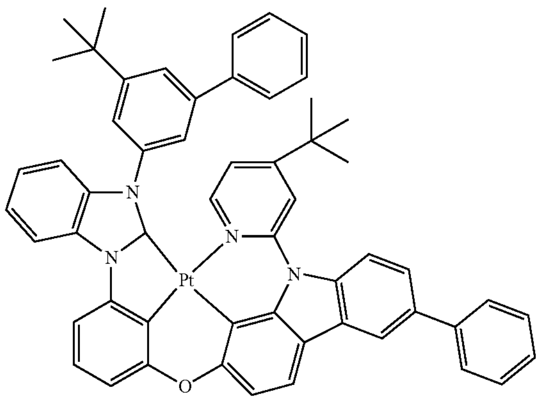
P20
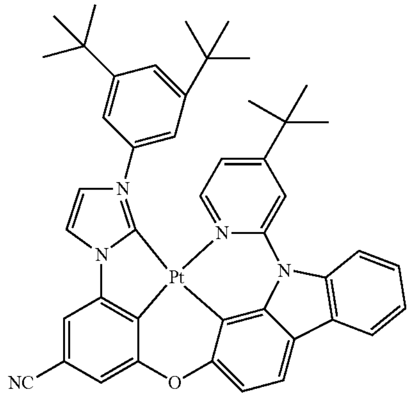
P21
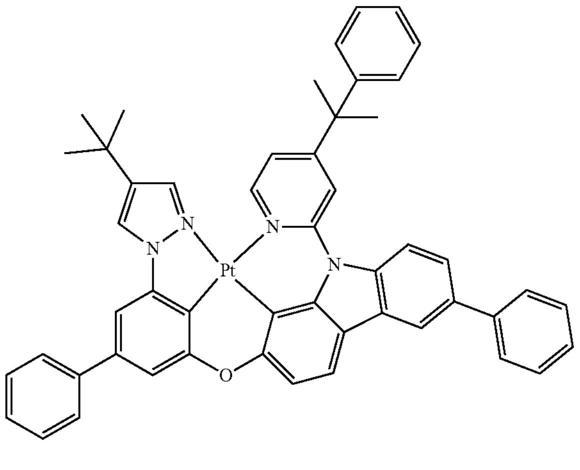
-continued
P22
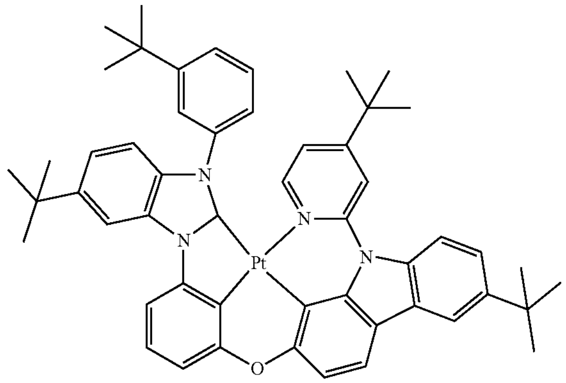
P23
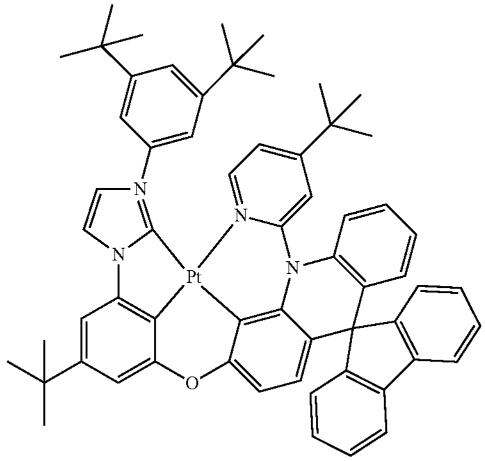
P24
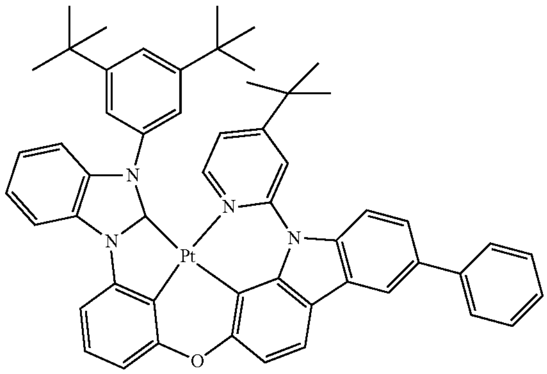

-continued
P25
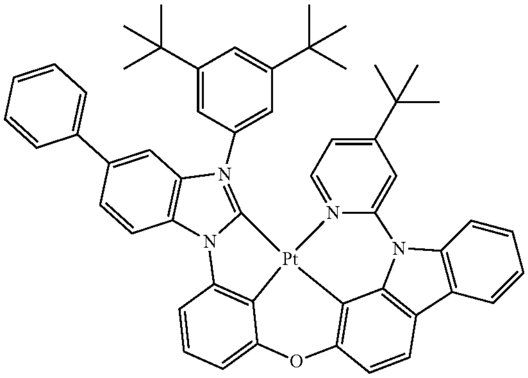
P26
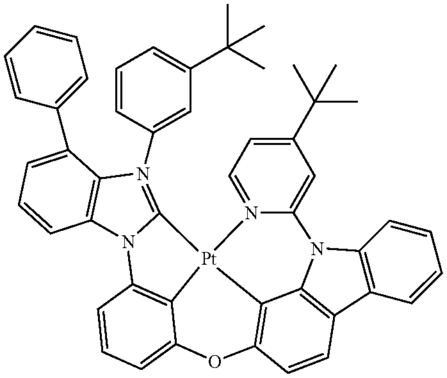
P27
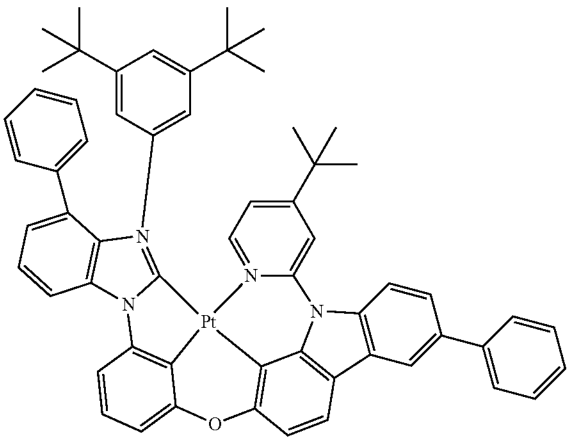
-continued
P28
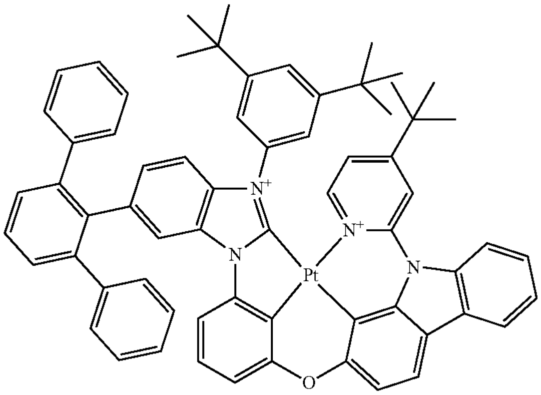
P29
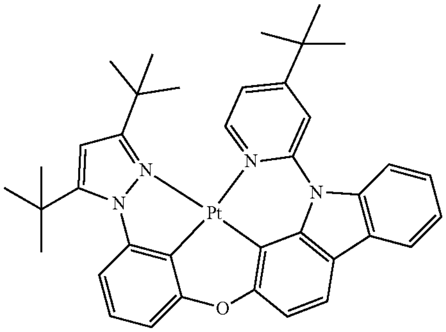
P30
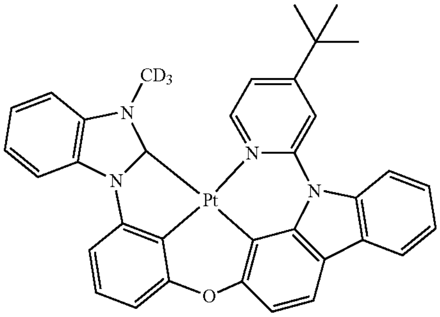
P31
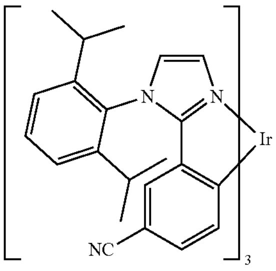

-continued
P32
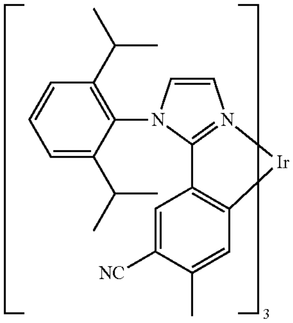
P33
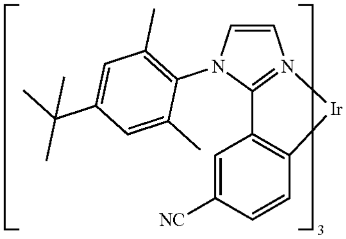
P34
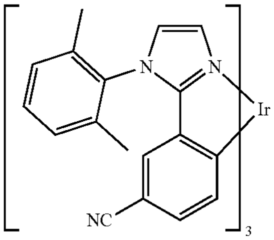
P35
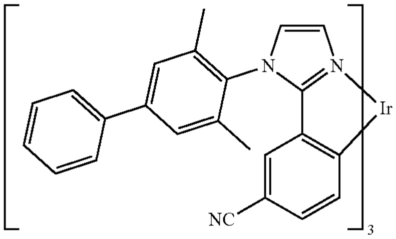
P36
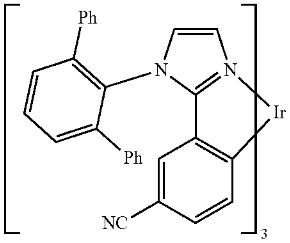
P37
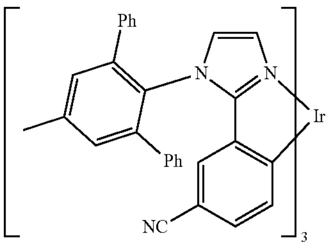
-continued
P38
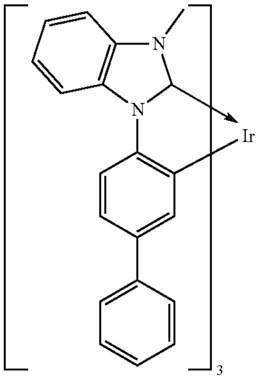
P39
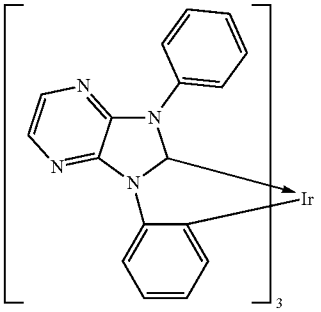
P40
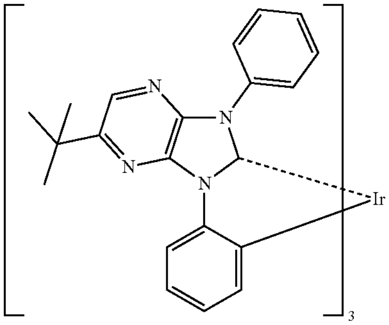
P41
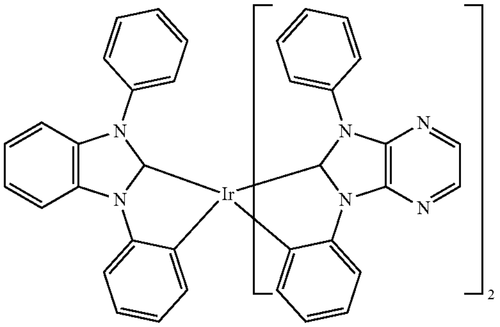

-continued
P42
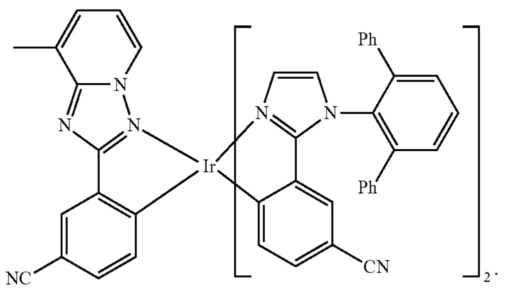
* * * * *